(12) United States Patent
Taninaka et al.

(10) Patent No.: US 6,388,696 B1
(45) Date of Patent: May 14, 2002

(54) LED ARRAY, AND LED PRINTER HEAD

(75) Inventors: Masumi Taninaka; Mitsuhiko Ogihara; Hiroshi Hamano; Takatoku Shimizu, all of Tokyo (JP)

(73) Assignee: Oki Electric Industry Co., LTD, Tokyo (JP)

( * ) Notice: Subject to any disclaimer, the term of this patent is extended or adjusted under 35 U.S.C. 154(b) by 0 days.

(21) Appl. No.: 09/084,324

(22) Filed: May 27, 1998

(30) Foreign Application Priority Data

May 28, 1997 (JP) .............................. 9-138061
May 28, 1997 (JP) .............................. 9-138067
Jun. 13, 1997 (JP) .............................. 9-156715

(51) Int. Cl.[7] .................................. B41J 2/45
(52) U.S. Cl. ..................... 347/238; 347/237; 257/88
(58) Field of Search ................... 347/237, 238, 347/130, 132, 145, 247; 257/88, 99

(56) References Cited

U.S. PATENT DOCUMENTS

| 3,703,670 A | | 11/1972 | Kunz | |
|---|---|---|---|---|
| 5,734,406 A | * | 3/1998 | Nakamura et al. | 347/132 |
| 6,121,994 A | * | 9/2000 | Kuribayashi et al. | 347/237 |
| 6,172,701 B1 | * | 1/2001 | Tokura et al. | 347/237 |

FOREIGN PATENT DOCUMENTS

| DE | 2949245 | 6/1981 |
|---|---|---|
| EP | 0821416 A2 A3 | 1/1998 |
| JP | 62152873 | 7/1987 |
| JP | 04263479 | 9/1992 |
| JP | 08078730 | 3/1996 |

* cited by examiner

*Primary Examiner*—N. Le
*Assistant Examiner*—Lamson D. Nguyen
(74) *Attorney, Agent, or Firm*—Venable; Norman N. Kunitz

(57) ABSTRACT

According to the present invention, a plurality of p-type semiconductor layers 13 are formed in a single row and a first layer insulating film 12 having first opening portions 16a and an n-side opening portion 17 is formed on the layers in an n-type semiconductor block 11. On the first layer insulating film 12, p-side electrodes 14 to connect to the p-type semiconductor layers 13 at the first opening portions 16a and an n-side electrode 55 (an n-side contact electrode 55a and an n-side pad electrode 55b) to connect with the n-type semiconductor block 11 at the n-side opening portion 17 are formed. Furthermore, p-side common wirings 4 to connect with specific p-side electrodes 14 are formed via a second layer insulating film 18. The p-side electrodes 14 and the n-side electrode 55 are formed using the same conductive film material through a single film formation and patterning process. An Au alloy film, for instance, may be used to form the conductive film that is to constitute the p-side electrodes 14 and the n-side electrode 55.

31 Claims, 93 Drawing Sheets

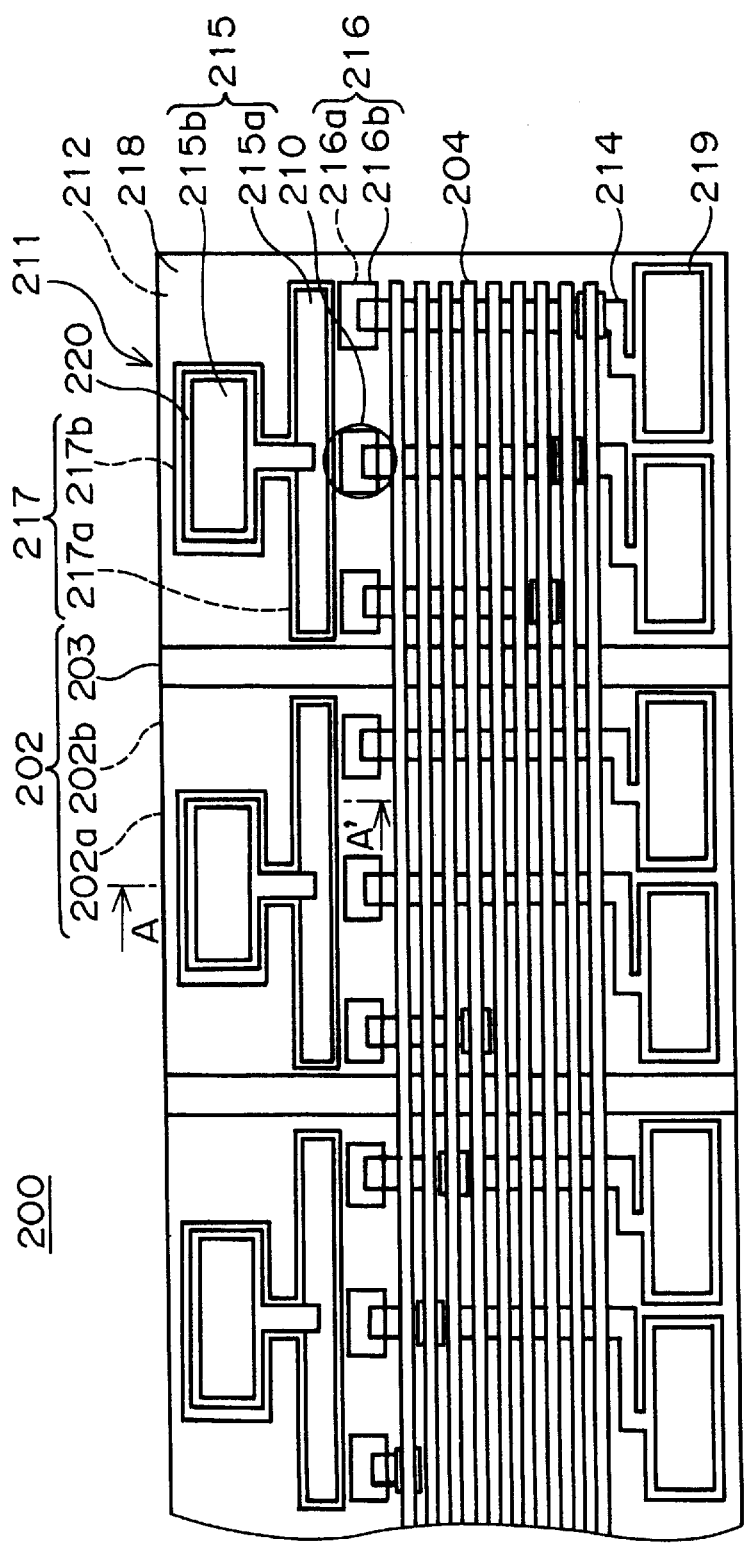
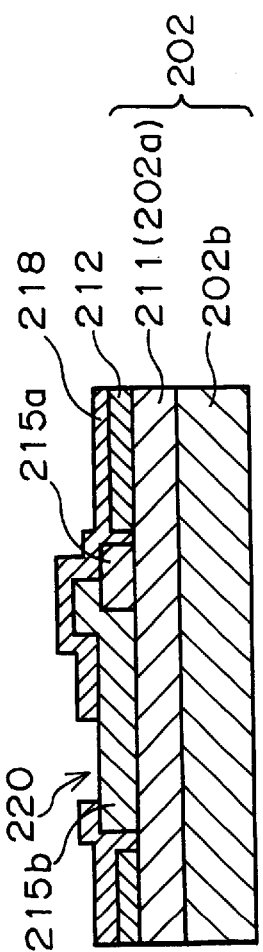
FIG. 33(a)
FIG. 33(b)

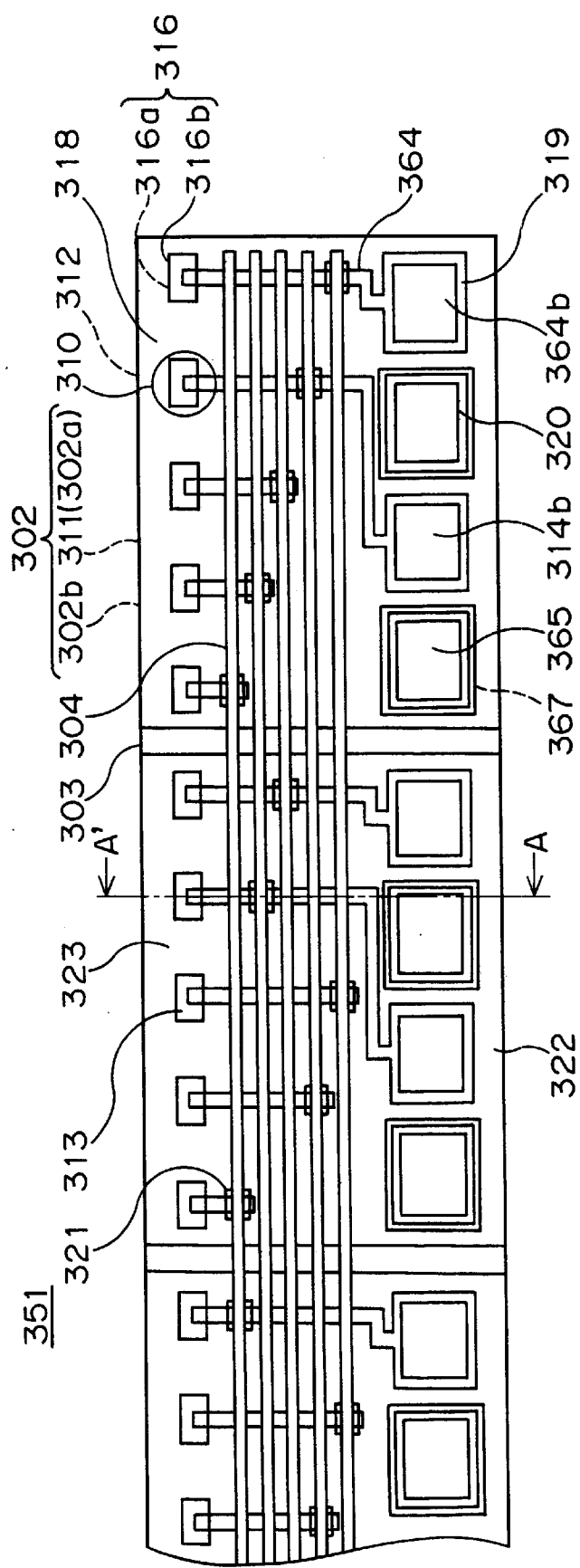
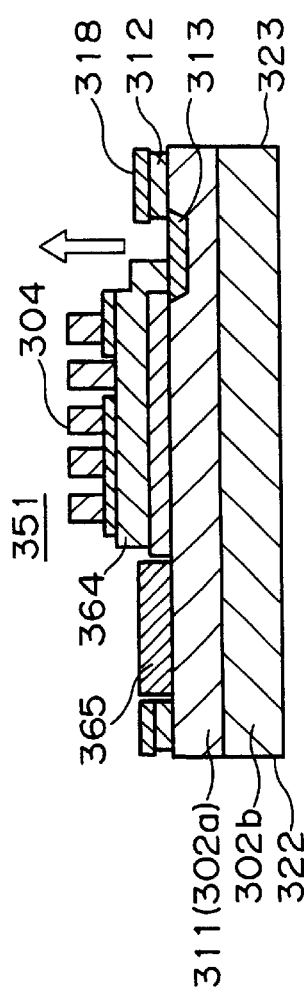
FIG. 79 (a)
FIG. 79 (b)

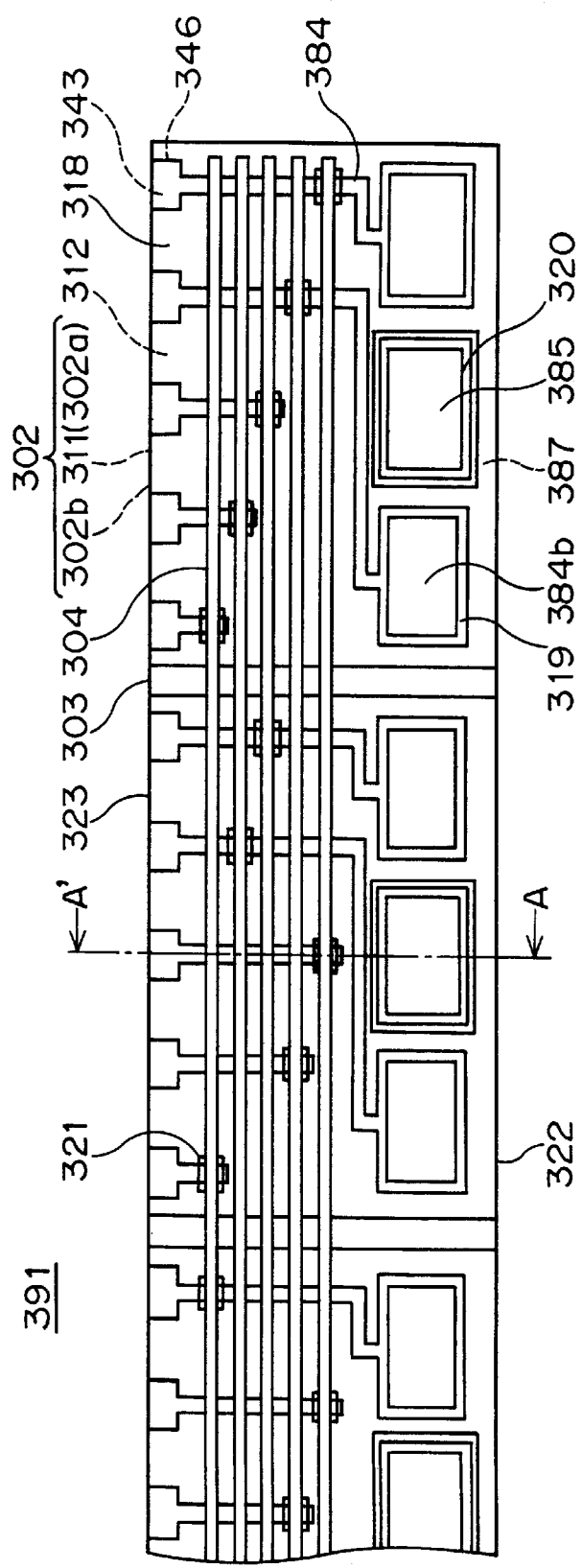
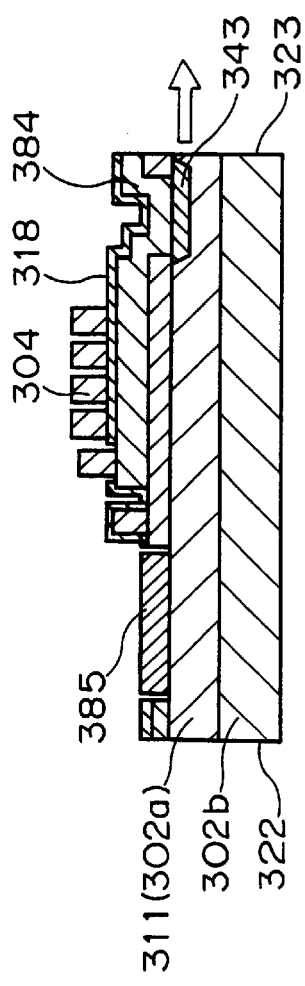
FIG. 89(a)
FIG. 89(b)

LED ARRAY, AND LED PRINTER HEAD

BACKGROUND OF THE INVENTION

The present invention relates to an LED array constituted by forming a plurality of LEDs (light emitting diodes) on a single semiconductor substrate, and an LED printer head constituted by employing this LED array, and in particular, it relates to an LED array that is capable of supporting a high density printer head of 1200 DPI (dots per inch) or higher.

Light emitting diode (hereafter referred to simply as LED) arrays are employed as exposure light sources (print heads) for the photosensitive drums in electrophotographic printers. FIG. 1 illustrates an example of an LED structure in the prior art, with FIG. 1(a) presenting its top view and FIG. 1(b) presenting a cross section through line A–A' in FIG. 1(a). The LED array illustrated in FIG. 1 supports a low density printer head with a resolution of 600 DPI or lower, and is constituted by simply providing LEDs 10 in a single row on an n-type semiconductor substrate 2.

In FIG. 1, a plurality of p-type semiconductor layers 13 are formed on the n-type semiconductor substrate 2, with a layer insulating film 12 having opening portions 16 formed at the surface of the n-type semiconductor substrate 2. On the layer insulating film 12, a plurality of p-side electrodes (discrete electrodes) 14 that are individually connected to a p-type semiconductor layer 13 at an opening portion 16 are formed. In addition, an n-side electrode (common electrode) 15 is formed over the entire rear surface of the n-type semiconductor substrate 2. When a voltage is applied between a p-side electrode 14 and the n-side electrode 15 at an LED 10, a phenomenon of light emission occurs at the bonding surface of the n-type semiconductor substrate or interface of the n-type semiconductor layer 13, and the emitted light is radiated to the outside through the surface of the p-type semiconductor layer 13. The p-side electrodes 14 are each constituted of an aluminum (Al) film or an Al alloy film, whereas the n-side electrode 15 is constituted an Au alloy film.

However, in a super-high density LED array of 1200 DPI or higher, the pitch of the p-side electrodes becomes narrower and the wiring space for the p-side electrodes becomes reduced, making it difficult to provide a bonding pad (p-side pad electrode) for each p-side electrode. Thus, an LED array supporting a high density of 1200 DPI or higher designs the structure illustrated in FIG. 2 to reduce the number of p-side pad electrodes. FIG. 2(a) is a top view illustrating an example of an LED array in the prior art the supports a high density of 1200 DPI. FIG. 2(b) presents a cross section through line A–A' in FIG. 2(a), and FIG. 2(c) presents a cross section through line B–B' in FIG. 2(a).

The LED array illustrated in FIG. 2 is achieved by providing a plurality of LEDs at each of a plurality of n-type semiconductors blocks 11 with the elements isolated from one another by a high resistance semiconductor substrate 32 and separating grooves 3. In each n-type semiconductor block 11, a plurality of p-type semiconductor layers 13, p-side electrodes 44 to be individually connected to the p-type semiconductor layers 13, an n-type contact electrode 45a to be connected to the n-type semiconductor block 11 and an n-side pad electrode 45b to be connected to the n-side contact electrode 45a are formed. Among the plurality of p-side electrodes 44 provided in the block, only a specific number of p-side electrodes are provided with a p-side pad electrode 44b (in FIG. 2, one p-side pad electrode 44b is formed in each block). An n-side electrode 45 constituted of the n-side contact electrode 45a and the n-side pad electrode 45b is a common electrode shared by all the LEDs within the block.

When a voltage is applied between a p-side electrode 44 and the n-side electrode 45, an LED causes a light emission phenomenon at the bonding surface of the n-type semiconductor substrate 32 and the p-type semiconductor layer 13, and this emitted light is radiated to the outside through the surface of the p-type semiconductor layer 13. The p-side electrodes 44 are each constituted of an aluminum (Al) film or an Al alloy film, whereas the p-side electrode 45 is constituted of an Au alloy film.

Furthermore, p-side common wirings 4 which connect with specific p-side electrodes 44 in the individual blocks at via holes 21 are formed, and through the p-side common wirings 4, p-side electrodes 44 that are not provided with a p-side pad electrode in a given block are connected to p-side electrode 44 having a p-side pad electrode in another n-type semiconductor block 11. A first layer insulating film 12 is formed between the n-type semiconductor blocks 11 and the p-side common wirings 4, and a second layer insulating film 48 is formed between the p-side common wirings 4 and the p-side electrodes 44.

However, in LED arrays in the prior art, since it is necessary to separately form the p-side electrodes and the n-side electrodes using different conductive film materials, the number of manufacturing steps is high, presenting a problem in that the production cost is high also. In particular, in the LED array illustrated in FIG. 2, which necessitates the n-side contact electrodes and the n-side pad electrodes to be formed separately, the number of manufacturing steps is further increased, to result in a further increase in production cost.

OBJECTS AND SUMMARY OF THE INVENTION

Accordingly, an object of the present invention is to provide a new and improved LED array, whose n-side contact electrodes and p-side electrodes, n-side contact electrodes and n-side pad electrodes or n-side contact electrodes, n-side pad electrodes and p-side electrodes can be formed using a single conductive film through a single manufacturing step to simplify the manufacturing process, to achieve a reduction in production cost and also to achieve a reduction in the inconsistency in characteristics among the individual substrates (wafers), and an LED printer head employing the LED array.

Another object of the present invention is to provide a new and improved LED array that achieves higher yield with peeling of the n-side pad electrodes prevented by forming the n-side pad electrodes at the n-side semiconductor substrate in close adherence, and an LED printer head employing the LED array.

Yet another object of the present invention is to provide a new and improved LED array that achieves a simplification in the manufacturing process and reduced production cost by constituting the n-side electrodes in a single-layer structure, and an LED printerhead employing the LED array.

A still further object of the present invention is to provide a new and improved LED array that achieves a reduction in the chip size by constituting the n-side electrodes in a simple graphic shape and the entire n-side electrodes as n-side pad electrodes, and an LED printer head employing the LED array.

A still further object of the present invention is to provide a new and improved LED array that can be achieved as an end surface light emitting LED array by providing the p-side pad electrodes and the n-side electrodes at the same side relative to the row of the light emitting portions that are formed at high density, to facilitate mounting at a printer head and to achieve a reduction in the width of the LED array, and an LED printer head employing the LED array.

A still further object of the present invention is to provide a new and improved LED array, and an LED printer head through which the head size of the printer head can be reduced by constituting the printer head employing the LED array described above.

In order to achieve the objects described above, in the LED array in a first aspect of the present invention, which is constituted by forming a second conductive-type semiconductor layer at a first conductive-type semiconductor substrate and forming a first conduction-side contact electrode to be connected to the semiconductor substrate and a second conduction-side electrode to be connected to the semiconductor layer at the surface of the semiconductor substrate on the side where the semiconductor layer is formed, the first conduction-side contact electrode and the second conduction-side electrode are constituted of one and the same conductive film material.

In the LED array in a second aspect of the present invention, which is achieved by forming a second conductive-type semiconductor layer on a first conductive-type semiconductor substrate and forming a first conduction-side electrode constituted of a first conduction-side contact electrode to be connected to the semiconductor substrate and a first conduction-side pad electrode to be connected to the first conduction-side contact electrode at the surface of the semiconductor substrate on the side where the semiconductor layer is formed, the first conduction-side electrode achieves a single-layer structure in which the first conduction-side contact electrode and the first conduction-side pad electrode are formed as an integrated electrode by using a single conductive film. It goes without saying that the first conduction-side contact electrode, the first conduction-side pad electrode and the second conduction-side electrode may be formed from a single conductive film. In addition, an Au film or an Au alloy film, for instance, may be used to constitute the conductive film.

In the LED array in a third aspect of the present invention, which is achieved by forming a second conductive-type semiconductor layer at a first conductive-type semiconductor substrate and forming a first conduction-side electrode which includes a first conduction-side pad electrode for connection with an external circuit is to be connected to the first conductive-type semiconductor substrate at the surface of the semiconductor substrate on the side where the semiconductor layer is formed, the first conduction-side pad electrode is formed and tightly bonded at the surface of the semiconductor substrate.

To be more specific, a structure achieved by, for instance, forming a layer insulating film having an n-side opening portion at the surface of a semiconductor substrate and forming a first conduction-side electrode that includes a first conduction-side pad electrode within the n-side opening portion to bond the entire first conduction-side electrode to the surface of the semiconductor substrate may be adopted. The first conduction-side electrode may adopt a single-layer structure constituted of one layer of conductive film so that the entire first conduction-side electrode constitutes the first conduction-side pad electrode. In addition, the first conduction-side electrode achieving the single-layer structure and the second conduction-side electrode may be constituted of the same conductive film material.

Moreover, in the LED array in a fourth aspect of the present invention, which is achieved by forming N (N is an integer equal to or larger than 2) light emitting portions constituted of a second conductive-type semiconductor layer in a single row at a first conductive-type semiconductor substrate at the substrate surface and forming a first conduction-side electrode that is to constitute a pad electrode to connect the semiconductor substrate with an external circuit and N second conduction-side electrodes that are to be individually connected with the light emitting portions on a surface of the semiconductor substrate with at least one of the N second conduction-side electrodes provided with a second conduction-side pad electrode for connection with an external circuit; the first conduction-side electrode is formed on the same side as the second conduction-side pad electrode relative to the row of light emitting portions and is connected with the semiconductor substrate at the same side as the second conduction-side pad electrode.

More specific examples of the LED array described above include, for instance, a matrix type LED array achieved by providing, in a single row, a plurality of semiconductor blocks constituted of the first conductive-type semiconductor substrate provided with the light emitting portions, the first conduction-side electrode and the second conduction-side electrodes, with the elements isolated from one another and forming common wirings for connecting specific second conduction-side electrodes formed in different semiconductor blocks.

Moreover, in the LED printer head according to the present invention, which is provided with the LED array described above and a drive circuit for driving the LED array, the wire bonded to the first conduction-side electrode and the wire bonded to the second conduction-side pad electrode are drawn out from one side of the LED array to be bonded to the drive circuit.

BRIEF DESCRIPTION OF THE DRAWINGS

The above and other features of the invention and the concomitant advantages will be better understood and appreciated by persons skilled in the field to which the invention pertains in view of the following description given in conjunct with the accompanying drawings which illustrate preffered embodiments.

FIG. 33 illustrates the structure of the LED array in a seventh embodiment of the present invention;

FIG. 79 illustrates the structure of the LED array in a twelfth embodiment of the present invention;

FIG. 89 illustrates the structure of the LED array in a fourteenth embodiment of the present invention.

DETAILED DESCRIPTION OF THE PREFERRED EMBODIMENTS

The following is a detailed explanation of preferred embodiments of the LED array, and the LED printer head according to the present invention in reference to the attached drawings. It is to be noted that in the following explanation and the attached drawings, the same reference numbers are assigned to components having essentially the same functions and structural features to preclude the necessity for repeated explanation thereof.

(First Embodiment)

Figure 1:
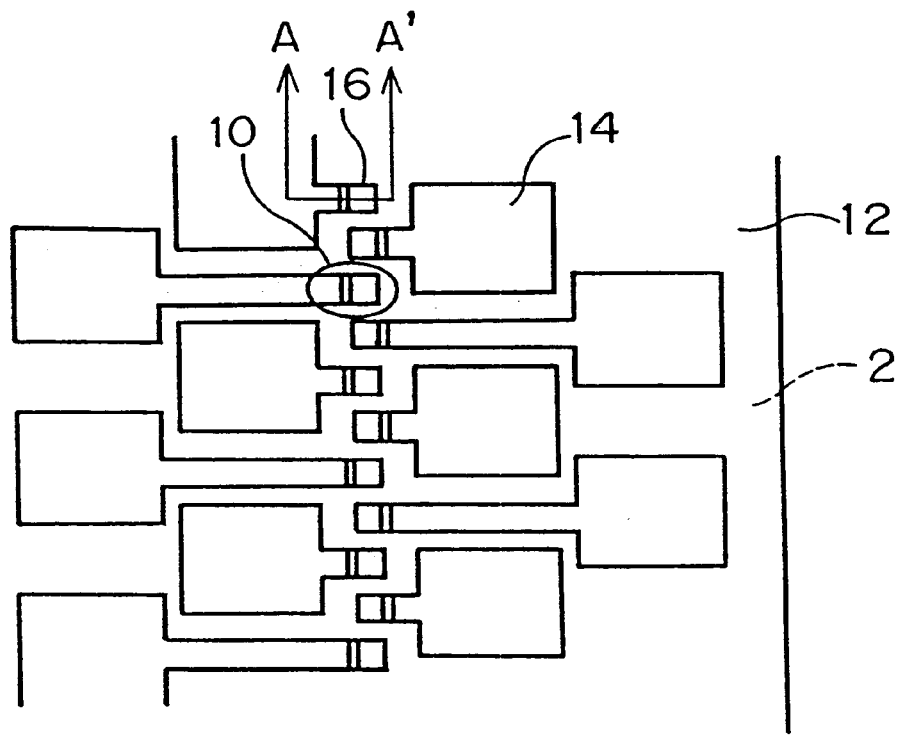
FIG. 1 illustrates the structure of an LED array supporting 600 DPI or lower in the prior art.
Figure 1:
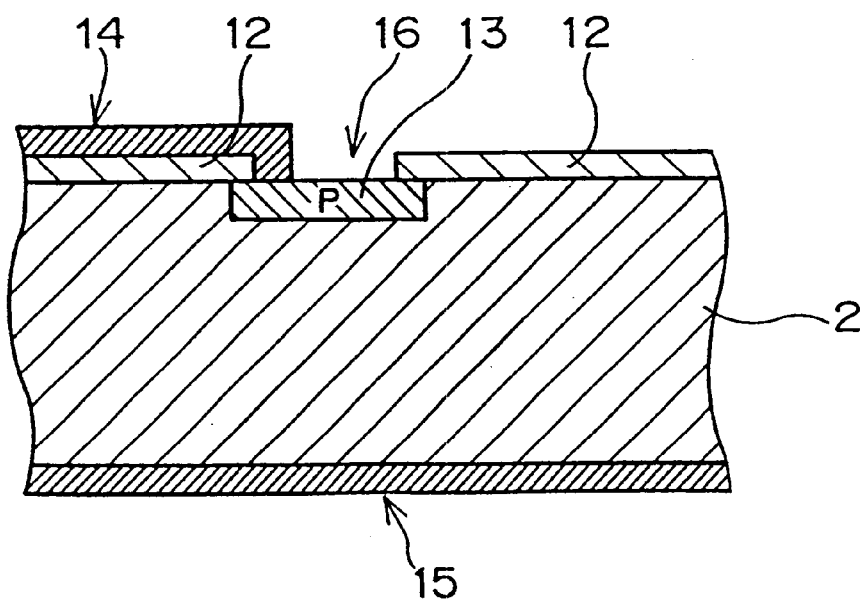
Figure 2:
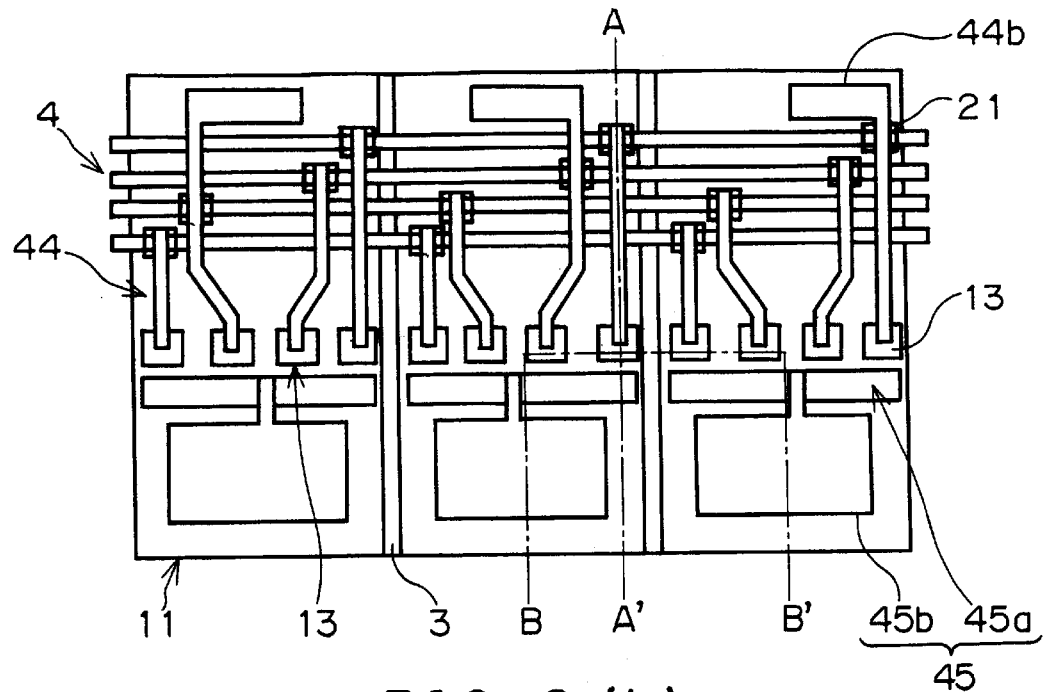
FIG. 2 illustrates the structure of an LED array supporting 1200 DPI in the prior art.
Figure 2:
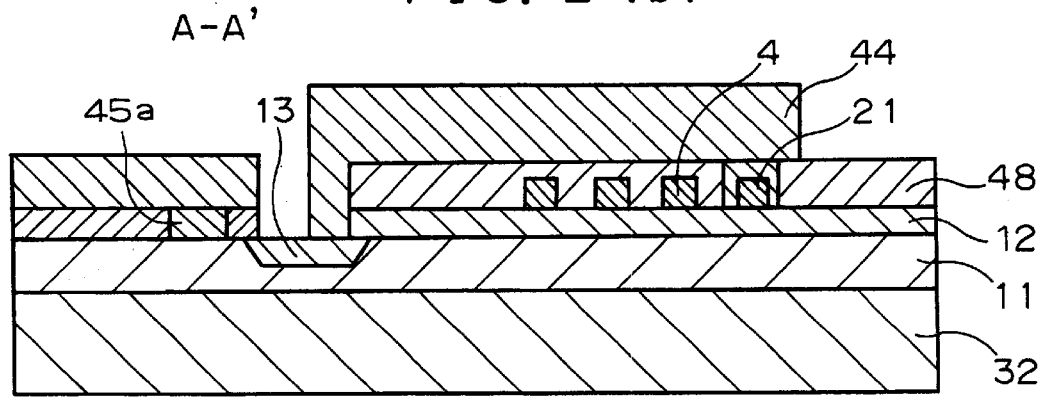
Figure 2:
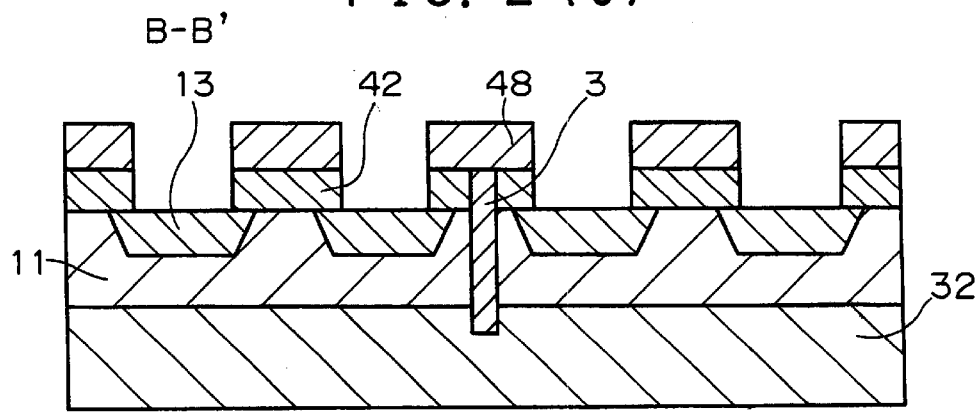
Figure 3:
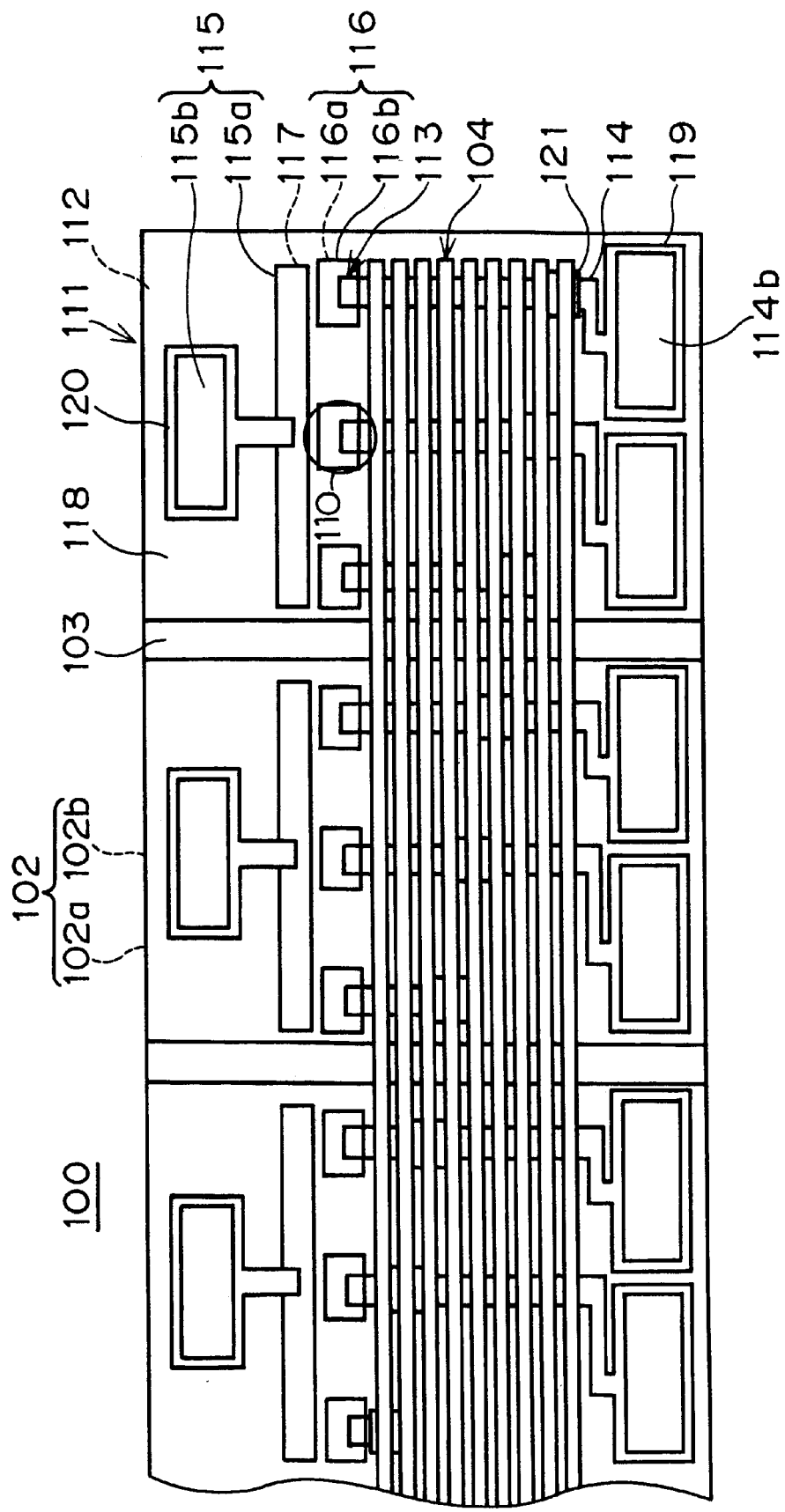
FIG. 3 is a top view illustrating the structure of the LED array in a first embodiment of the present invention.

FIG. 3 is a top view illustrating the structure of an LED array 100 in the first embodiment of the present invention. The LED array 100 supports 1200 DPI and is constituted by forming a plurality of LEDs 110 in each of n-type semiconductor blocks 111 that are provided in a single row on a semiconductor substrate 102. In addition, the LED array 100 assumes a structure in which p-side electrodes 114 and an n-side electrode 115 of the LEDs 110 are formed on the same surface of the semiconductor substrate 102. The semiconductor substrate 102 is constituted by forming an n-type semiconductor substrate 102a constituted of an epitaxial layer or the like on a high resistance semiconductor substrate 102b.

The n-type semiconductor blocks 111 are formed by dividing the n-type semiconductor substrate 102a. The n-type semiconductor blocks 111 are electrically isolated from one another by the high resistance semiconductor substrate 102b and separating grooves (etching grooves) 103. It is to be noted that in the LED array 100, a first conductive-type is assigned as n-type a second conductive-type is assigned as p-type.

In each n-type semiconductor block 111, N (N is a positive integer) LEDs 110 are formed in a single row. In FIG. 3, N=3. In the n-type semiconductor block 111, N p-type semiconductor layers (p-type semiconductor areas) 113 are formed in a single row through dispersion. In addition, on the n-type semiconductor block 111, a first insulating film layer 112 is formed. In the first insulating film layer 112, first opening portions 116a for exposing almost the entire surfaces of the p-type semiconductor layers 113 and an n-side opening portion 117 for exposing the surface of the n-type semiconductor block 111 are formed.

On the first insulating film layer 112, N p-side electrodes 114, an n-side contact electrode 115a and an n-side pad electrode 115b are formed. The p-side electrodes 114 are connected with the p-type semiconductor layers 113 at the first opening portions 116a. The n-side contact electrode 115a, which is formed on the n-side opening portion 117, is connected with the n-type semiconductor block 111. The n-side pad electrode 115b partially overlaps with the n-side contact electrode 115a and is connected with the n-side contact electrode 115a. The n-side contact electrode 115a and the n-side pad electrode 115b constitute an n-side electrode 115 having a laminated structure.

A second insulating film layer 118 is formed on the first insulating film layer 112 in which the p-side electrodes 114 and the n-side electrode 115 are formed. In the second insulating film layer 118, second opening portions 116b for exposing almost the entire areas of the first opening portions 116a, p-side pad opening portions 119 for exposing the pad electrodes of the p-side electrodes 114, an n-side pad opening portion 120 for exposing the n-side pad electrode 115b and via holes 121 for exposing the portions of the p-side electrodes 114 that are formed on the first layer insulating film 112 are formed. The first opening portions 116a and the second opening portions 116b constitute p-side opening portions 116. In addition, on the second insulating film layer 118, M (M is an integer equal to or greater than N) p-side common wirings 104 are formed. In the LED array 100 in FIG. 3, M=9. The p-side common wirings 104 are formed over all the n-type semiconductor blocks 111, and are connected with the p-side electrodes 114 at the via holes 121.

The LEDs 110 are constituted in an n-type semiconductor block 111 which is common to N LEDs 110, one of the p-side semiconductor layers 113 individually formed at the n-type semiconductor block, a p-side electrode 114 formed at the p-type semiconductor layer 113 and the n-type electrode 115 formed to be shared by the N LEDs 110 within the n-type semiconductor block 111. The depth of the p-type semiconductor layers 113 is less than the thickness of the n-type semiconductor block 111. Thus, the p-type semiconductor layers 113 are formed in a shoal at the n-type semiconductor block 111. When a voltage is applied between the p-side electrodes 114 an the n-type electrode 115, a light emitting phenomenon occurs at the bonding surface of the p-type semiconductor layers 113 and the n-type semiconductor block 111, and this emitted light is radiated to the outside through the surface of the p-type semiconductor layers 113.

In the LED array 115, the p-side electrodes 114 and the n-side contact electrode are formed by using the same conductive film material, and this differentiates it from LED arrays in the prior art. A conductive film that can achieve ohmic contact with both the p-type semiconductor layers 113 and the n-type semiconductor blocks 111 such as an Au alloy film, should be employed to constitute the p-side electrodes 114 and the n-side contact electrodes 115. The Au alloy film may be either a laminated metal film or a laminated alloy film. Such Au alloy films include a laminated metal film constituted of titanium (Ti), platinum (Pt) and Au (hereafter referred to as a Ti/Pt/Au film), a laminated alloy film constituted of an alloy film comprising Au, germanium (Ge) and nickel (Ni) and an Au film (hereafter referred to as AuGeNi/Au film) and a laminated alloy film constituted of an alloy film comprising Au and Ge, an Ni film and an Au film (hereafter referred to as an AuGe/Ni/Au film).

The following is an explanation of the manufacturing process for manufacturing the LED array 100 in the first embodiment illustrated in FIG. 3. FIGS. 6 through 17 illustrate individual steps in the manufacturing process for manufacturing the LED array 100. In these figures, (a) presents a top view and (b) presents a cross section through line A–A' in (a). In addition, FIG. 11(c) is a cross section through line B–B' in FIG. 11(a) and FIG. 13(c) is a cross section through line B–B' in FIG. 13(a).

Figure 5:
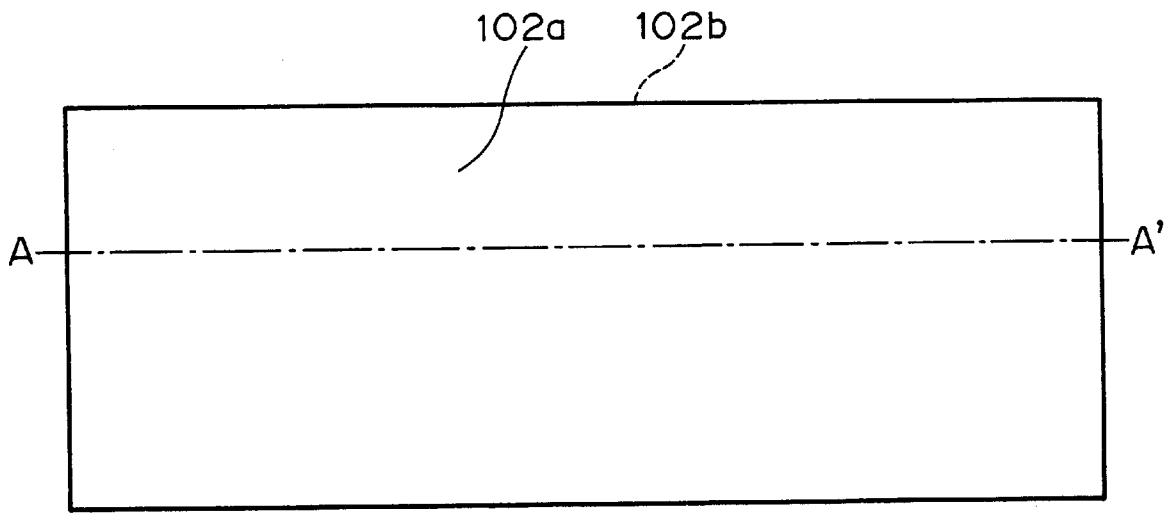
FIG. 5 illustrates a step in the process for manufacturing the LED array in the first embodiment.
Figure 5B:
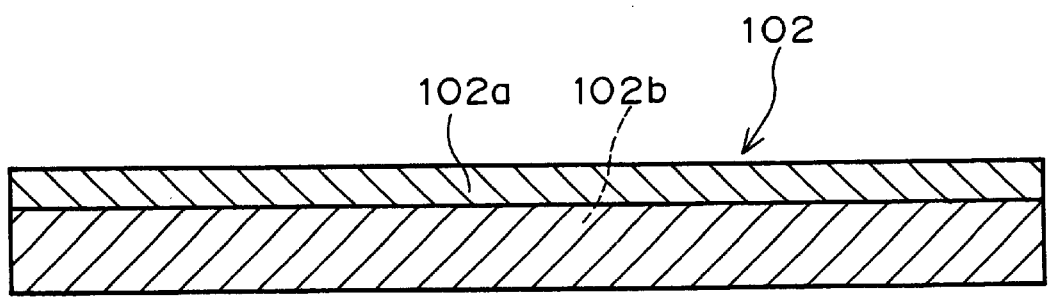

First, as shown in FIG. 5, the semiconductor substrate 102 constituted by providing the n-type semiconductor substrate 102a on the high resistance semiconductor substrate 102b is prepared. In this example, a semi-insulating GaAs substrate is employed to constitute the high resistance semiconductor substrate 102b. In addition, an n-type AlGaAs layer is formed through epitaxial growth on the semi-insulating GaAs substrate, and this AlGaAs epitaxial layer is used as the n-type semiconductor substrate 102a. The thickness of the n-type semiconductor substrate 102a (n-type epitaxial layer) may be, for instance, approximately 3 micro-meter.

Figure 6:
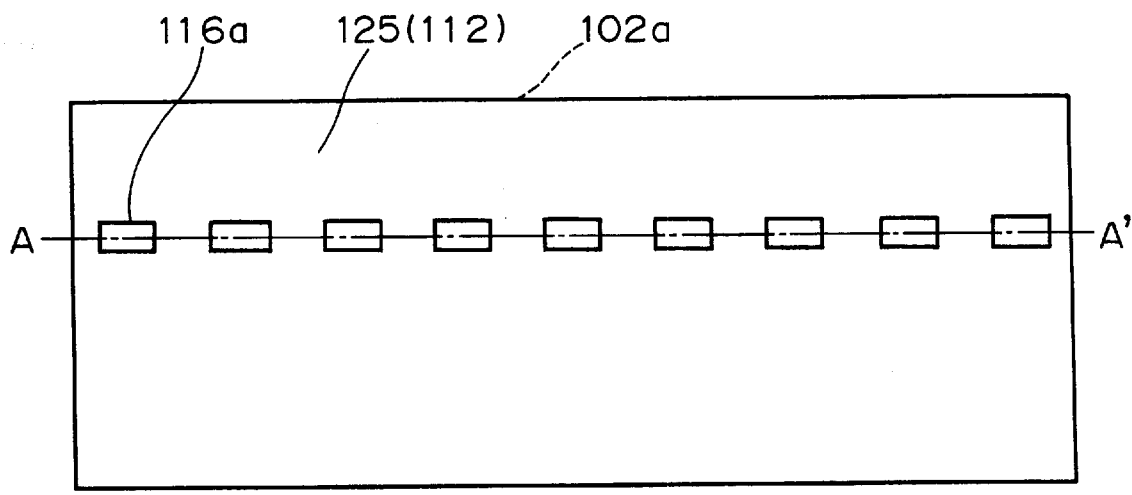
FIG. 6 illustrates a step in the process for manufacturing the LED array in the first embodiment of the present invention, which follows the step illustrated in FIG. 5.
Figure 6:
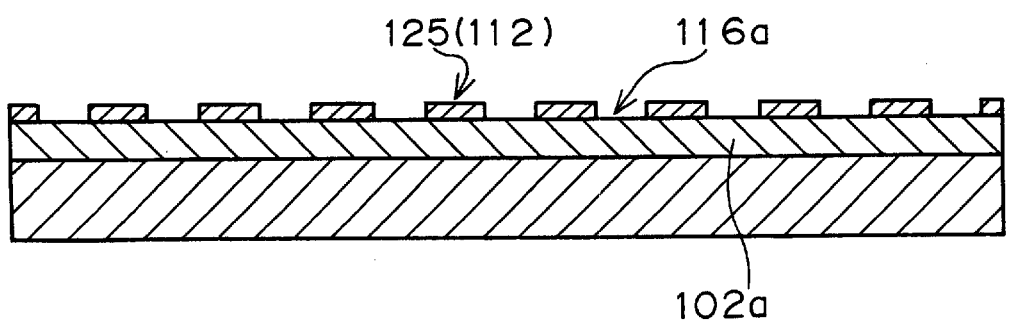
Figure 7A:
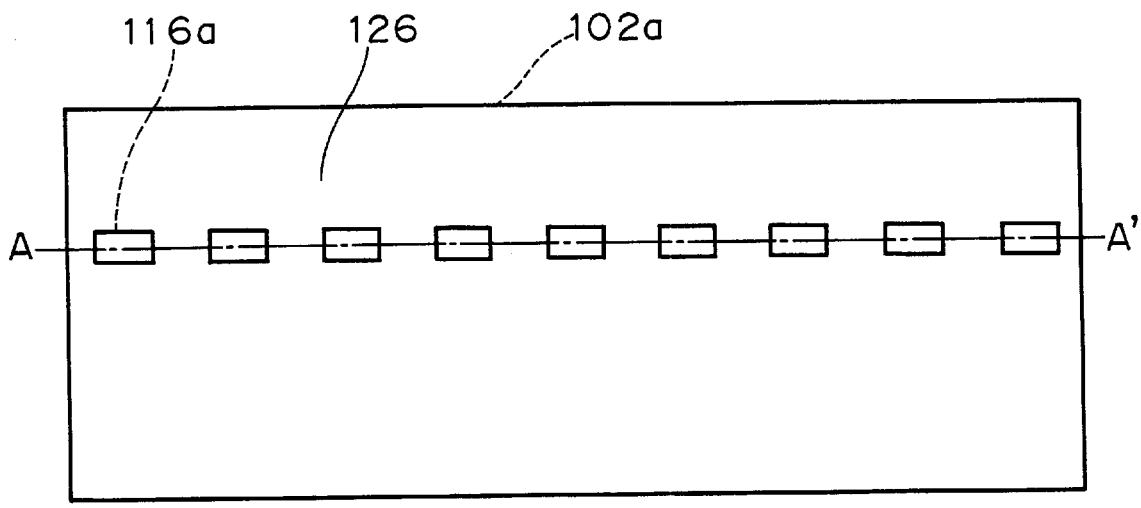
FIG. 7 illustrates a step in the process of manufacturing the LED array in the first embodiment of the present invention, which follows the step illustrated in FIG. 6.
Figure 7B:
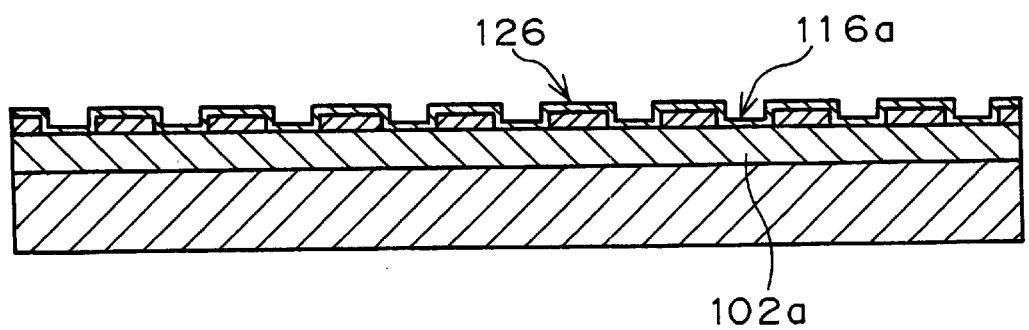
Figure 8A:
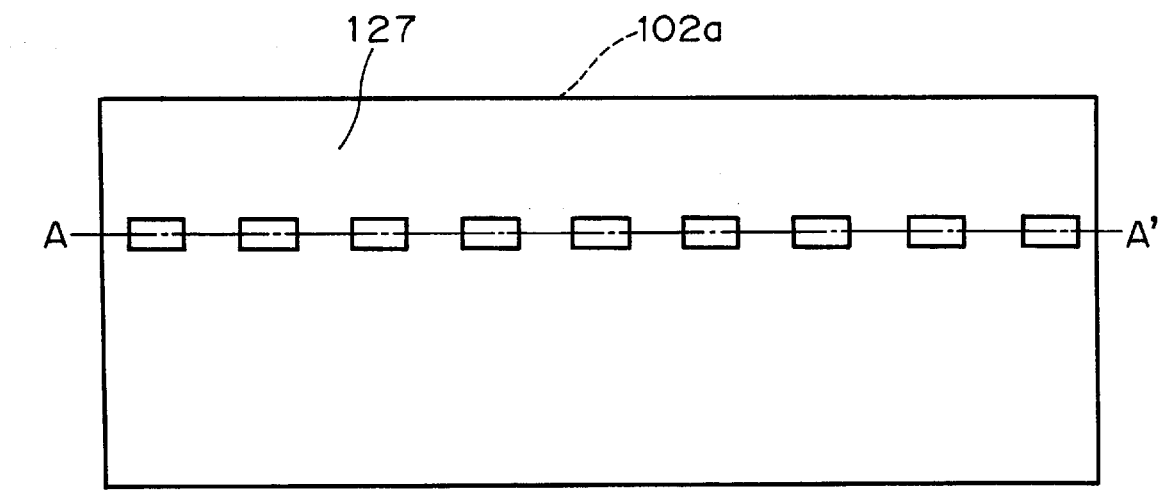
FIG. 8 illustrates a step in the process of manufacturing the LED array in the first embodiment of the present invention, which follows the step illustrated in FIG. 7.
Figure 8B:
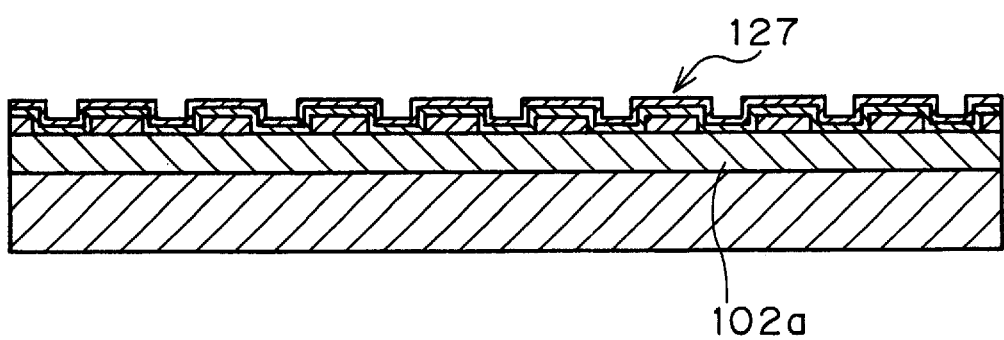
Figure 9:
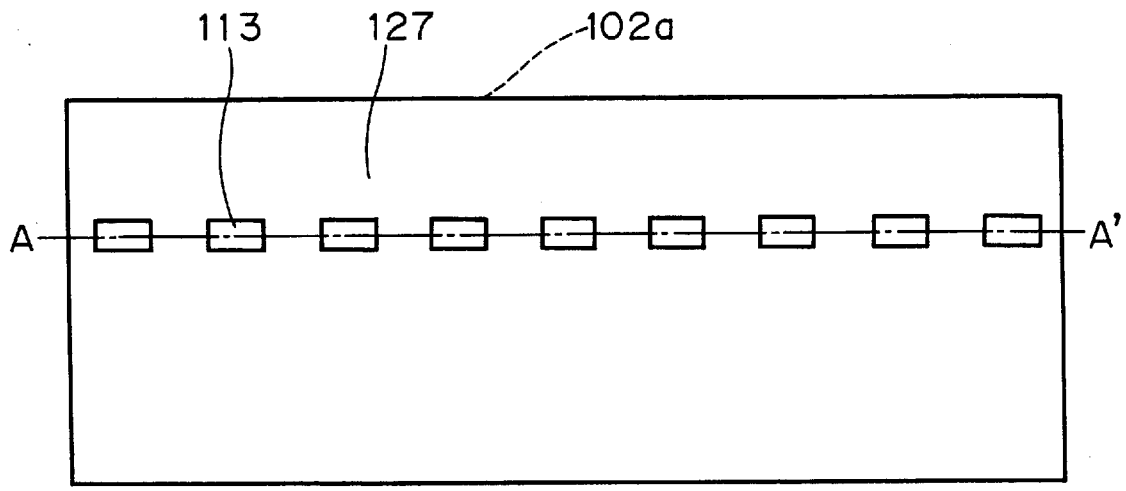
FIG. 9 illustrates a step in the process of manufacturing the LED array in the first embodiment of the present invention, which follows the step illustrated in FIG. 8.
Figure 9:
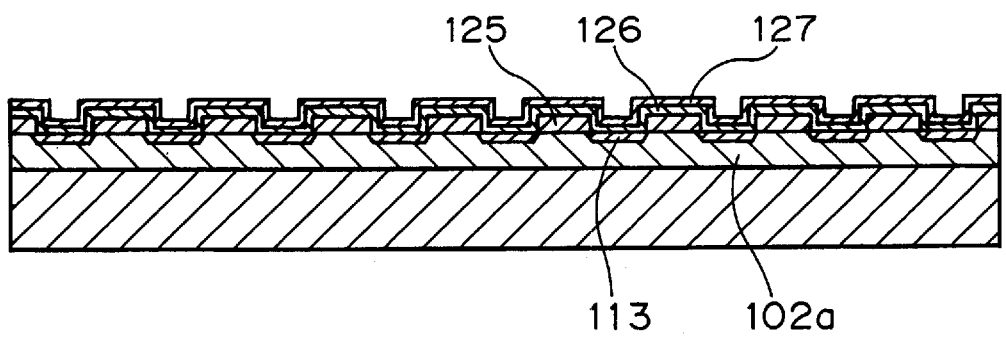

Next, as illustrated in FIG. 6, the first insulating film layer 112 which is to constitute a diffusion mask 125 is formed at a surface of the n-type semiconductor substrate 102a, and the first insulating film layer 112 is patterned through photolithography and etching to form the first opening portions 116a and the diffusion mask 125. A silicon nitride (SiN) film, for instance, may be used to constitute the first insulating film layer 112 (diffusion mask 125). The SiN film is formed through the CVD method, and its film thickness may be, for instance, 500–3000 angstrom.

Then, as illustrated in FIGS. 7, 8, 9 and 10, the p-type semiconductor layers 113 are formed at the n-type semiconductor substrate 102a, by adopting an Zn solid phase diffusion method in this embodiment. Namely, after the formation of the first opening portions 116a is completed, a Zn diffusion source film (FIG. 7) 126 is formed at the surface of the n-type semiconductor substrate 102a, and an anneal cap film 127 (FIG. 8) is formed over the Zn diffusion source film 126. A ZnO—$SiO_2$ compound film, for instance, may be formed to constitute the Zn diffusion source film 126. This ZnO—$SiO_2$ compound film is achieved by mixing zinc oxide (ZnO) and silicon oxide ($SiO_2$) at a ratio of 1:1 and is formed through sputtering. An aluminum nitride (AlN) film formed through, for instance, the sputtering, may be used to constitute the anneal cap film 127. The thickness of the ZnO—$SiO_2$ compound film may be approximately 500–3000 angstrom and the film thickness of the SiN film, too, may be set at approximately 500–3000 angstrom.

Next, high temperature annealing is implemented on the n-type semiconductor substrate 102a where the anneal cap film 127 has been formed, to diffuse Zn from the Zn different source film 126 into the n-type semiconductor substrate 102a. Since, while Zn becomes diffused into the n-type semiconductor substrate 102a at the first opening portions 116a, Zn is not diffused in the area where the diffusion mask 125 is formed, the p-type semiconductor layers 113 are selective formed in the areas that correspond to the first opening portions 116a of the n-type semiconductor substrate 102a. The high temperature annealing should be preformed at an annealing temperature of 700 C in a nitrogen environment, for instance, for two hours. Under these annealing conditions, the p-type semiconductor layers, 113 having a depth of approximately 1 micro-meter and a surface Zn concentration of $10^{20}$ cm$^3$ are formed. Since the thickness of the n-type semiconductor substrate 102a is approximately 3 micro-meter as mentioned earlier, the depth of the p-type semiconductor layers is smaller than the thickness of the n-type semiconductor substrate 102a. It is to be noted that the anneal cap film 127 prevents Zn from becoming diffused into an annealing atmosphere.

Figure 10:
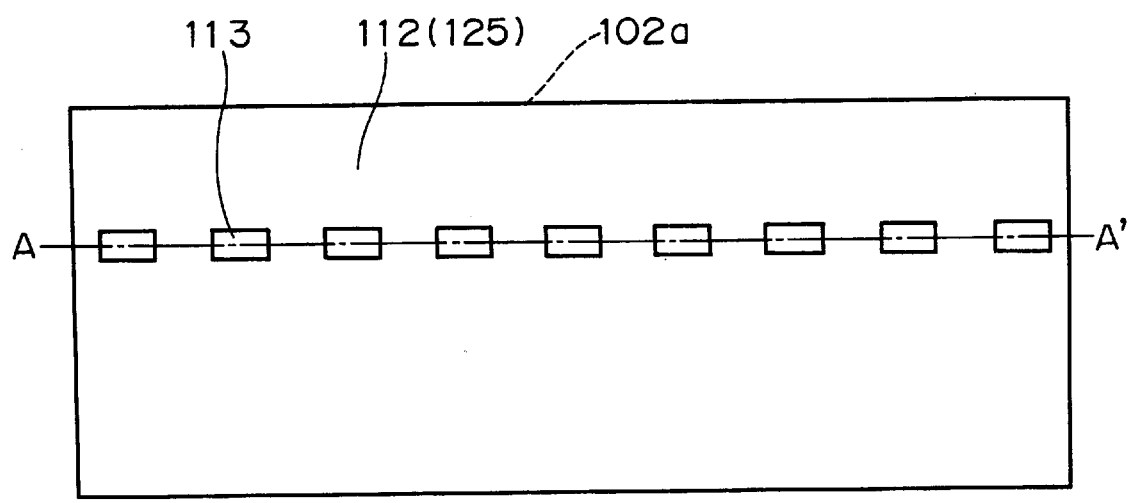
FIG. 10 illustrates a step in the process of manufacturing the LED array in the first embodiment of the present invention, which follows the step illustrated in FIG. 9.
Figure 10:
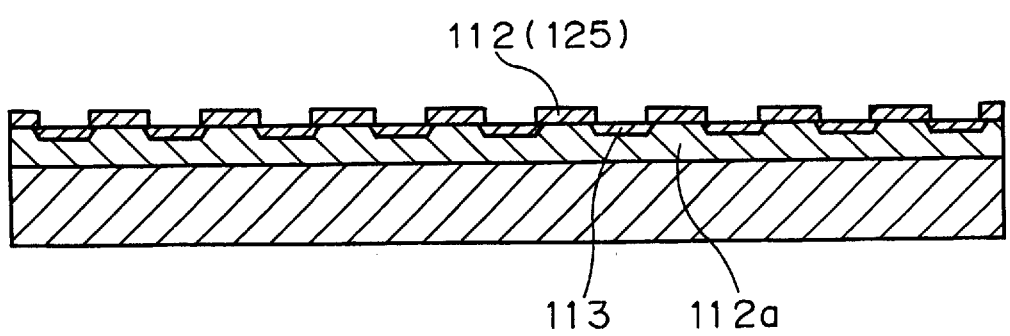
Figure 11:
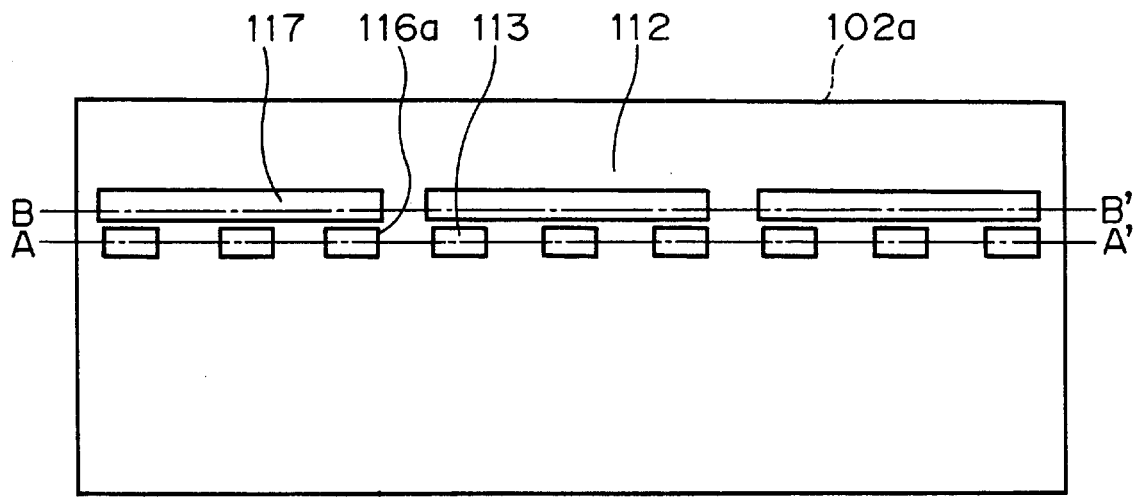
FIG. 11 illustrates a step in the process of manufacturing the LED array in the first embodiment of the present invention, which follows the step illustrated in FIG. 10.
Figure 11:
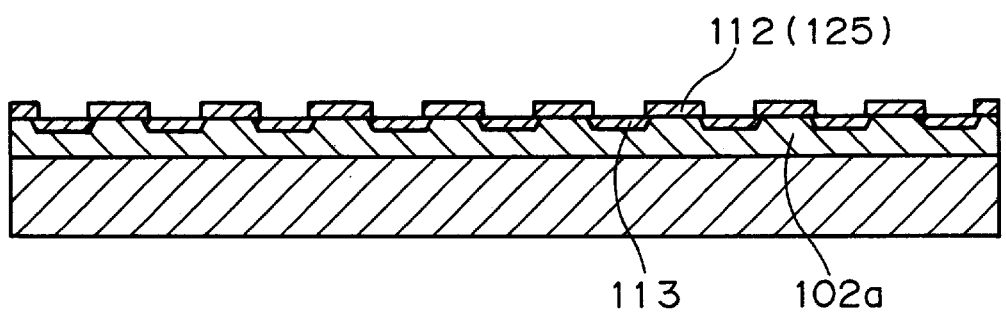
Figure 11:
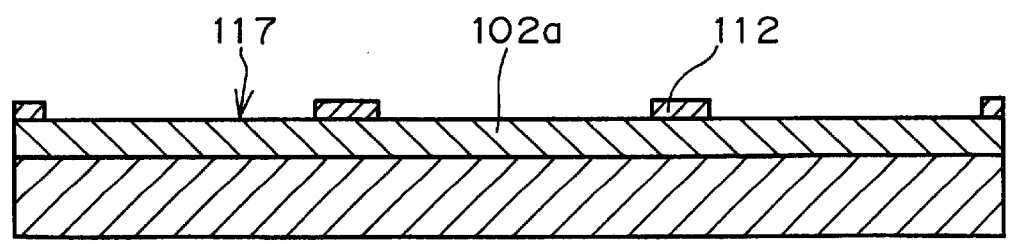

Next, as illustrated in FIG. 10, the diffusion source film 126 and the anneal cap film 127 formed at the surface of the n-type semiconductor substrate 102a where the formation of the p-type semiconductor layers 113 has been completed are completely removed by employing, for instance, a selective wet etching method, leaving only the first insulating film layer 112 (diffusion mask 125).

Then, as illustrated in FIG. 11, n-side opening portions 117 are formed at the insulating film layer 112 through photolithography and etching at the n-type semiconductor substrate 102a where the removal of the diffusion source film 126 and the anneal cap film 127 has been completed. The n-side opening portions 117 are each formed within an anticipated formation area of an n-type contact electrode 115a, and are provided to connect the n-type contact electrode 115a, which is to be formed subsequently, to the n-type semiconductor substrate 102a. With this, the first opening portions 116a opening at the surfaces of the p-type semiconductor layers 113 and n-side opening portions 117 opening at the surface of the n-type semiconductor substrate 102a have been formed at the insulating film layer 112.

Figure 12:
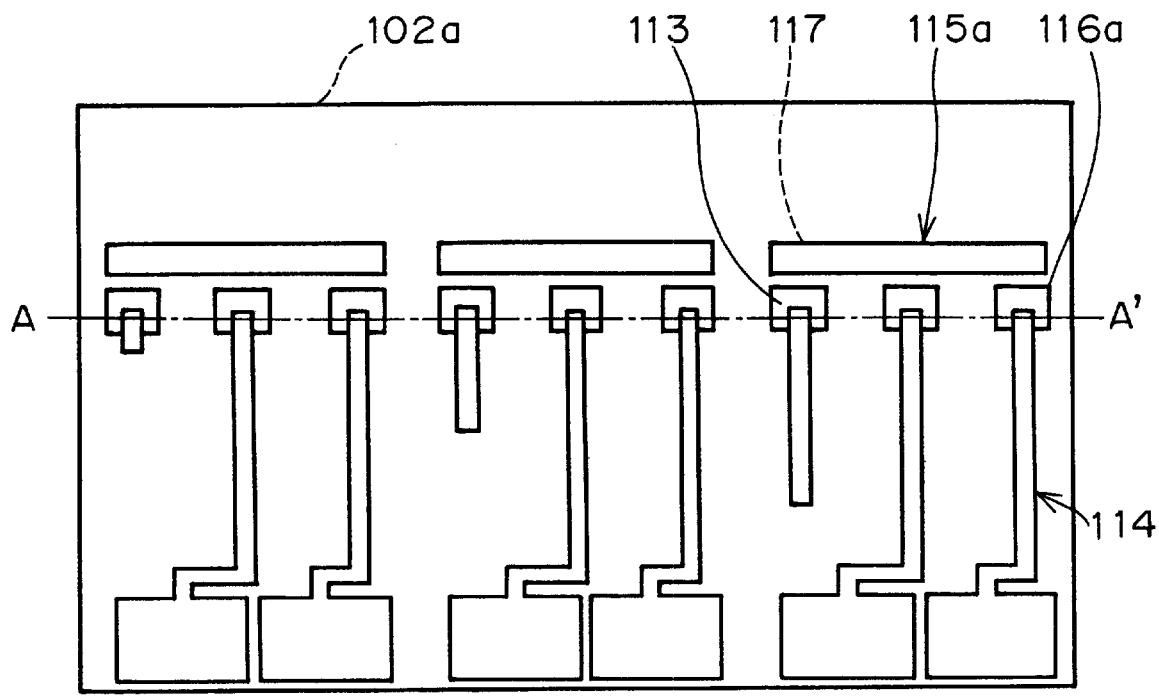
FIG. 12 illustrates a step in the process of manufacturing the LED array in the first embodiment of the present invention, which follows the step illustrated in FIG. 11.
Figure 12:
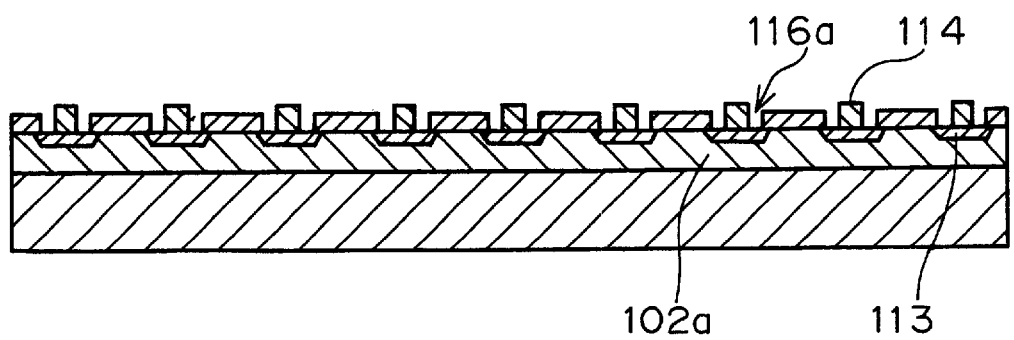
Figure 13:
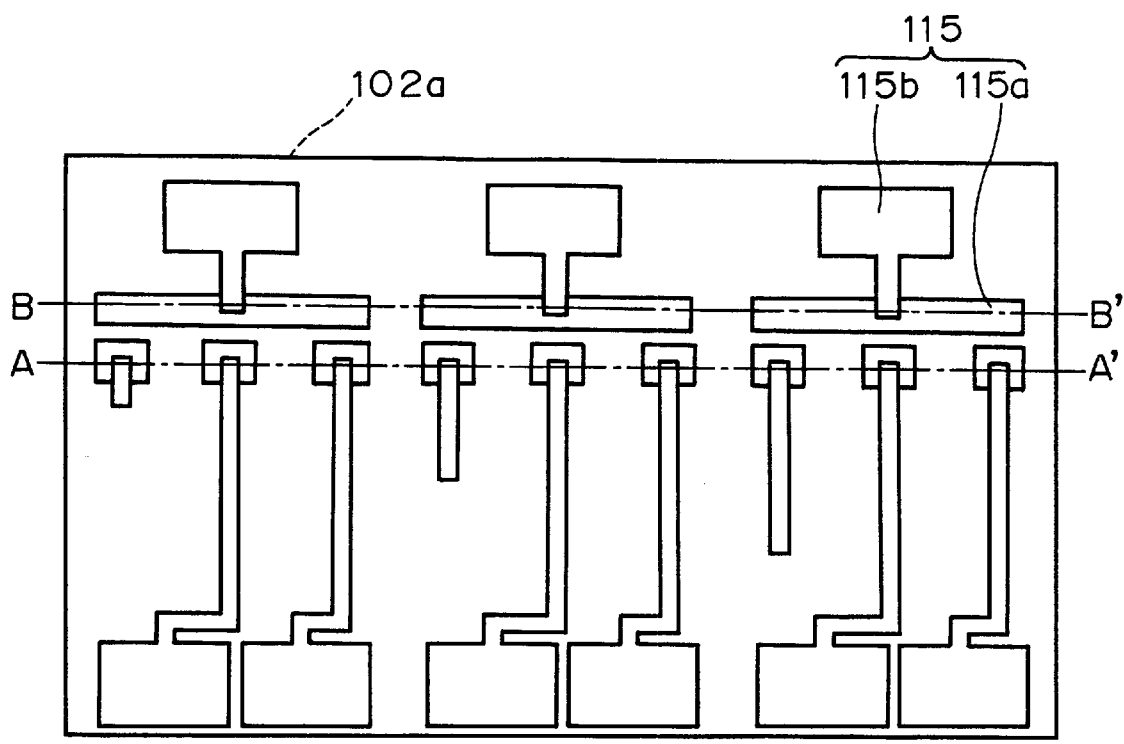
FIG. 13 illustrates a step in the process of manufacturing the LED array in the first embodiment of the present invention, which follows the step illustrated in FIG. 12.
Figure 13:
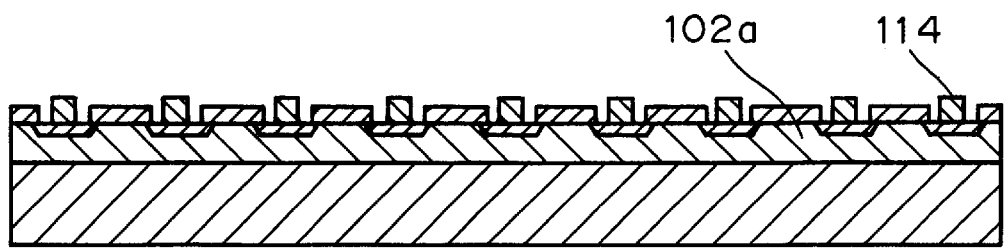
Figure 13:
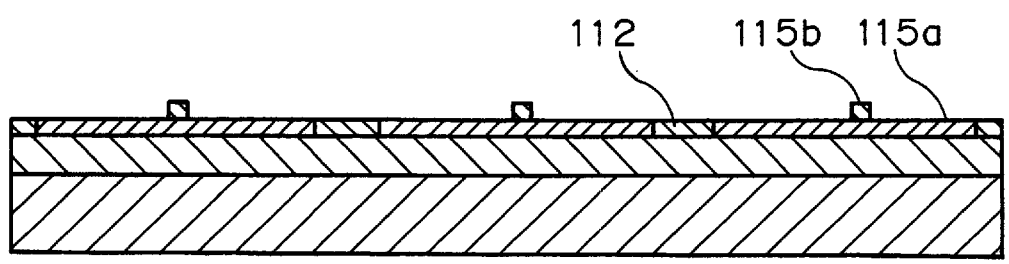

Next, as illustrated in FIG. 12, a conductive film which is to constitute the p-side electrodes 114 and the n-side contact electrodes 115a is formed over the entire surface of the n-type semiconductor substrate 102a where the formation of the n-side opening portions 117 has been completed, and the conductive film is patterned by adopting a lift-off method to form the p-side electrodes 114 and the n-side contact electrodes 115a. Namely, a photoresist pattern with areas other than anticipated formation areas for the p-side electrodes 114 and the n-side contact electrodes 115a formed as a blank pattern is formed, a conductive film that is to constitute the p-side electrodes 114 and the n-side contact electrodes 115a is formed over the entire upper surface of the photoresist pattern and the photoresist and the conductive film formed over it are lifted off to form the p-side electrodes 114 and the n-type contact electrodes 115a. The p-side electrodes 114 are formed to partially overlap the surfaces of the p-side semiconductor layers 113 at the first opening portions 116a and the n-type contact electrodes 115a are formed to cover the entire surface of the n-side opening portions 117. The Au alloy film mentioned earlier, for instance, should be used to form the conductive film for constituting the p-side electrodes 114 and the n-type contact electrodes 115a.

Thus, the process for manufacturing the LED array 100 differs from the processes for manufacturing LED arrays in the prior art in that a single conductive film material (an Au alloy in this example) is used to form the p-side electrodes 114 and the n-side contact electrodes 115a at the same time. While it is necessary to implement a process of forming the conductive film and patterning it twice when constituting the p-side electrodes and the n-side contact electrodes using different conductive film materials, as in the prior art, the film formation/patterning process described above only needs to be implemented once if a single conductive film material is used to form the p-side electrodes 114 and the n-side contact electrodes 115a as in the LED array 100 to simplify the manufacturing process.

Next, as illustrated in FIG. 13, a conductive film that is to constitute the n-side pad electrodes 115b is formed at the n-type semiconductor substrate 102a where the formation of the p-type electrodes 114 and the n-type contact electrodes 115a has been completed, and the conductive film is patterned through a lift-off method to form the n-side pad electrodes 115b. The n-side pad electrodes 115b are formed to partially overlap the n-side contact electrodes 115a, and are ohmic connected to the n-side contact electrodes 115a at their overlapping portions. Each set of the n-side contact electrodes 115a and the corresponding n-side pad electrode 115b constitutes an n-side electrode 115 having a laminated structure.

The same Au alloy film as that constituting the n-side contact electrodes 115a may be used to form the conductive film for constituting the n-side pad electrodes 115b. However, it is clear that an Au alloy film which is different from the Au alloy film constituting the n-side contact electrodes 115a or a metal or an alloy other than Au alloys may be used to constitute the n-type pad electrodes 115b. It is required of the material, though, that it be capable of achieving an ohmic contact with the n-side contact electrodes 115a and that no disconnection occur at the connecting portions where the material is connected with the n-side contact electrodes 115a or at the n-side contact electrodes 115a as a result of electromigration or the like.

Figure 14:
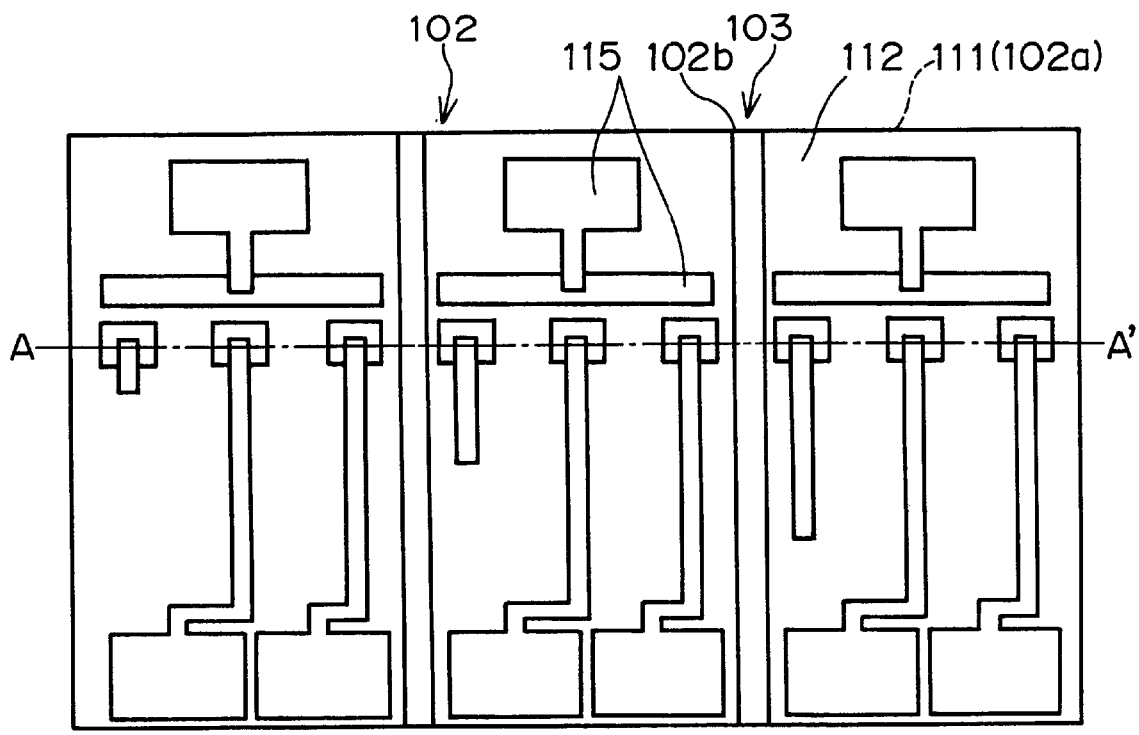
FIG. 14 illustrates a step in the process of manufacturing the LED array in the first embodiment of the present invention, which follows the step illustrated in FIG. 13.
Figure 14:
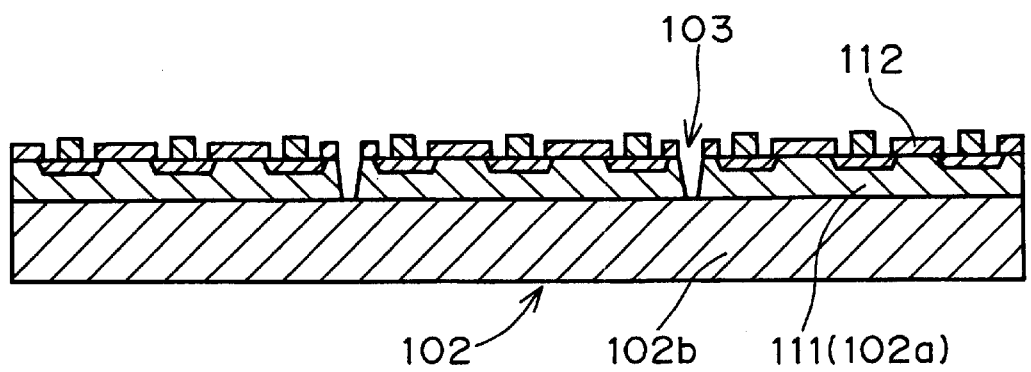

Next, as illustrated in FIG. 14, the separating grooves 103 that extend to the high resistance semiconductor substrate 102b are formed at the n-type semiconductor substrate 102a where the formation of the n-side electrodes 115 has been completed to divide the n-type semiconductor substrate 102a into a plurality of n-type semiconductor blocks 111. In other words, the first insulating film layer 112, formed in anticipated separating groove formation areas and the n-type semiconductor substrate 102a underneath are etched through photolithography and etching to expose the high resistance semiconductor substrate 102b. Thus, the n-type semiconductor blocks 111 are electrically isolated from one another by the separating grooves 103 and the high resistance semiconductor substrate 102b. The depth of the separating grooves 103 should be set at, for instance, approximately 3.5 micro-meter when the thickness of the n-type semiconductor blocks 111 (n-type semiconductor substrate 102a) is set at approximately 3 micro-meter and the first insulating film layer 112 is formed to have a film thickness of approximately 500–3000 angstrom. In addition, the width of the separating grooves 103 is subject to restriction imposed by the distance between the p-type semiconductor layers 113. In an LED array with a resolution of 1200 DPI, the pitch dimension of the p-type semiconductor layers 113 is approximately 21 micro-meter, and thus, the width of the separating grooves 103 must be less than 13 micro-meter when the width of the p-type semiconductor layers 113 is approximately 8 micro-meter.

Figure 15:
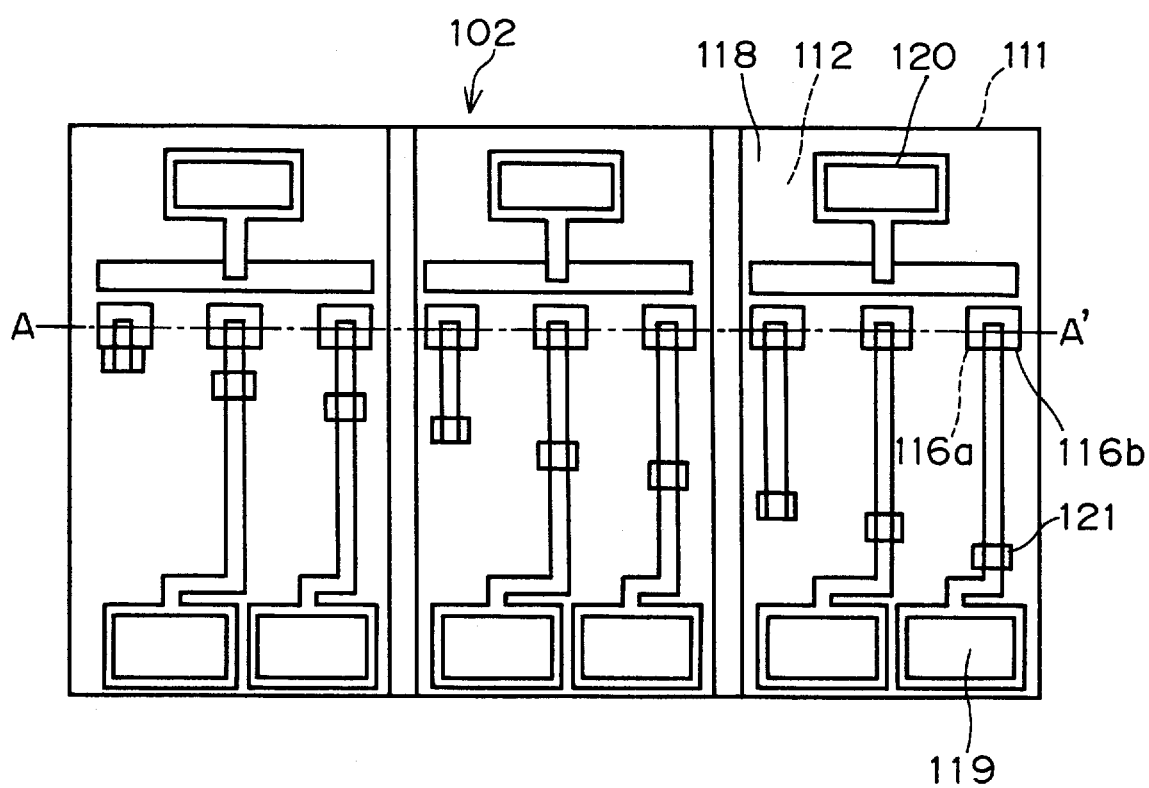
FIG. 15 illustrates a step in the process of manufacturing the LED array in the first embodiment of the present invention, which follows the step illustrated in FIG. 14.
Figure 15:
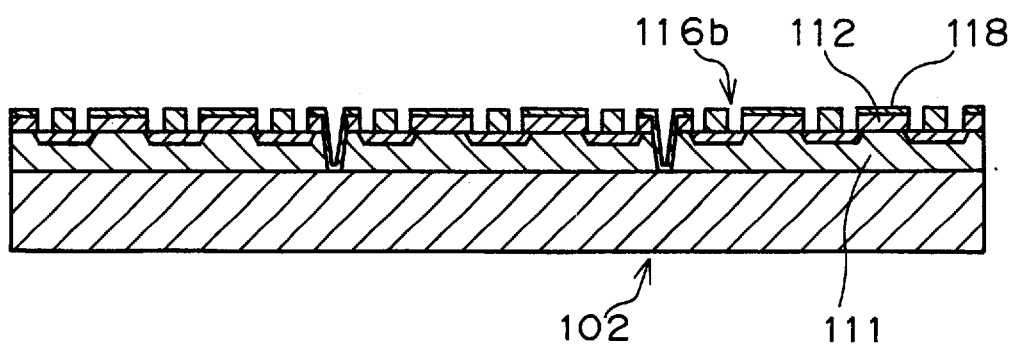

Then, as illustrated in FIG. 15, the second insulating film layer 118 is formed over the entire surface of the semiconductor substrate 102 where the formation of the separating grooves 103 has been completed, and the second opening portions 116b opening over almost the same areas as the first opening portions 116a, the p-side opening portions 119 opening at the pad electrode portions of the p-side electrodes 114, the n-side pad opening portions 120 opening at the n-side pad electrodes 115b and the via holes 121 reaching the n-side electrodes 114 are formed. A polyimide film, for instance, may be used to constitute the second insulating film layer 118. The polyimide film may be formed and patterned as described below by using polyimide that dissolves in a photoresist developing solution (alkaline solution). A polyimide source is spin coated onto the semiconductor substrate 102 (wafer) and pre-baking is performed at a temperature of approximately 100 C Next, a photoresist is spin coated over the polyimide film that has been pre-baked and exposure is performed on the photoresist in such a manner that the opening portions and the via holes 121 described above constituted an blank pattern. When developing the photoresist, the areas covered with the polyimide film where the resist is not formed, are also removed to pattern the polyimide film. Then, the remaining resist is peeled and the patterned polyimide film is baked at a temperature of approximately 350 C.

Figure 16:
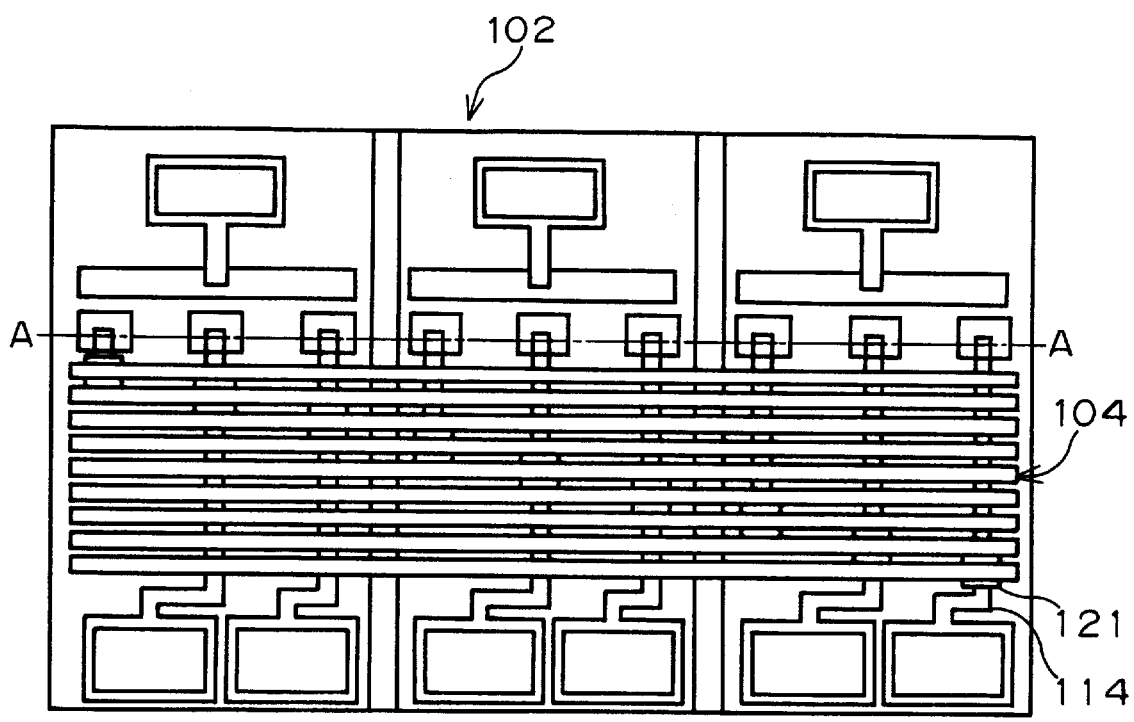
FIG. 16 illustrates a step in the process of manufacturing the LED array in the first embodiment of the present invention, which follows the step illustrated in FIG. 15.
Figure 16:
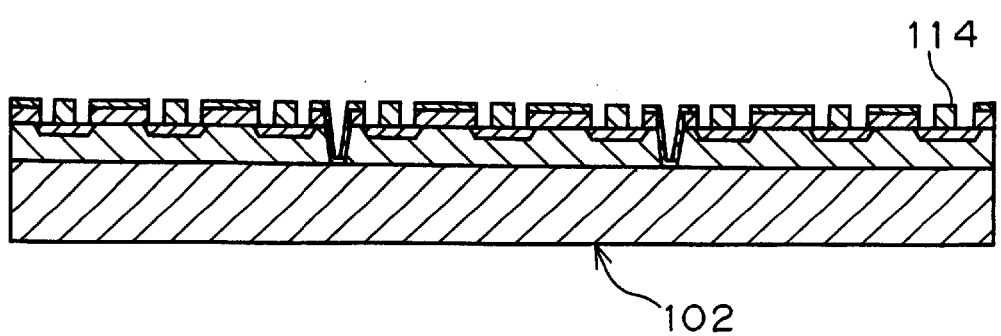

Finally, as illustrated in FIG. 16, a conductive film that is to constitute the p-side common wirings 104 is formed over the entire surface of the semiconductor substrate 102 where the patterning of the second insulating film layer 118 has been completed and the conductive film is patterned through a lift-off method to form the p-side common wirings 104. An Au alloy film, for instance, may be used to constitute the conductive film for forming the p-type common wirings 104. It is obvious, however, that a material other than an Au alloy film may be used to constitute the conductive film for forming the p-side common wirings 104, as long as the material can achieve ohmic contact with the p-side electrodes 114 and does not cause disconnection at the connecting portions. Through the steps described above, the LED array 100 illustrated in FIG. 3 is manufactured.

Now, a brief explanation is given on the operation of the LED array 100. The n-type semiconductor blocks 111 are assigned with reference numbers 111-1, 111-2, 111-3 . . . starting from the right side in FIG. 3. In addition, within each n-type semiconductor block 111, the individual LEDs 110 are assigned with reference numbers 110-1, 110-2, 110-3 from the right side in FIG. 3, the individual n-side electrodes 114 are assigned with reference numbers 114-1 , 114-2, 114-3 starting from the right side in FIG. 3 and the individual p-side pad electrodes 114b are assigned the reference numbers 114b-1, 114b-2 starting from the right side in FIG. 3. In addition, the individual p-side common wirings 104 are assigned with reference numbers 104-1, 104-2 . . . 104-9 starting from the bottom side in FIG. 3.

In the n-type semiconductor block 111-1, the p-side electrode 114-1 is connected to the p-side common wirings 104-1, the p-side electrode 114-2 is connected to the p-side common wirings 104-2 and the p-side electrode 114-3 is connected to the p-side common wirings 104-3. In the n-type semiconductor block 111-2, the p-side electrode 114-1 is connected to the p-side common wirings 104-4 and in the n-type semiconductor block 111-3, the n-side electrode 114-1 is connected to the p-side common wirings 104-7. Furthermore, in the n-side semiconductor block 111-4 (not shown), the p-side electrode 114-1 is connected to the p-side common wirings 104-1, the p-side electrode 114-2 is connected to the p-side common wirings 104-2 and the p-side electrode 114-3 is connected to the n-side common wirings 104-3 as in the n-type semiconductor block 111-1.

In each of the n-type semiconductor blocks 111-1–111-3, the p-side electrode 114-1 and the p-side electrode 114-2 are each provided with a p-side pad electrode.

For instance, in order to light the LED 110-1 at the n-type semiconductor block 111-1, a voltage must be applied between the p-side electrode 114-1 (its p-side pad electrode 114b-1) at the n-type semiconductor block 111-1 and the n-side electrode 115 (its n-side pad electrode 115b) of the n-type semiconductor block 111-1. At this point, the LED 110-1 of the n-type semiconductor block 111-4 (not shown) can be lit at the same time by setting the potential of the n-side electrode 115 of the n-type semiconductor block 111-4 equal to the potential at the n-side electrode 115 of the n-type semiconductor block 111-1, since the p-side electrode 114-1 of the n-type semiconductor block 111-4 is connected to the p-side electrode 114-1 of the n-type semiconductor block 111-1 through the p-side common wirings 104-1. The LED 110-1 of the n-type semiconductor block 111-4 can be left unlit while the LED 110-1 of the n-type semiconductor block 111-1 is lit by setting the n-side electrode 115 of the n-type semiconductor block 111-4 in an open state.

In addition, the LED 110-3 of the n-type semiconductor block 111-1 is lit by applying a voltage between a p-side electrode 114 of another n-type semiconductor block 111 that is connected to the p-side common wirings 104-3 and is provided with a p-side pad electrode 114b, e.g. the p-side electrode 114-3 of the n-type semiconductor block 111-4 (not shown), and the n-side electrode 115 of the n-type semiconductor block 111-1.

Thus, in the first embodiment, by forming the p-side electrodes 114 and the n-side contact electrodes 115a using a single conductive film through a single step, the manufacturing process can be simplified, thereby achieving a reduction in production cost. In addition, since the p-side electrodes 114 and the n-side contact electrodes 115a are formed through one and the same process, the degree of inconsistency in the characteristics among individual substrates (wafers) is reduced.

It is to be noted that while the LED array 100 in the first embodiment described above adopts a structure in which the p-side electrodes and the n-side pad electrodes are formed on opposite sides from each other relative to the p-type semiconductor layers, the n-side pad electrodes may be provided on the same side as the p-side electrodes relative to the p-type semiconductor layers.

Figure 4:
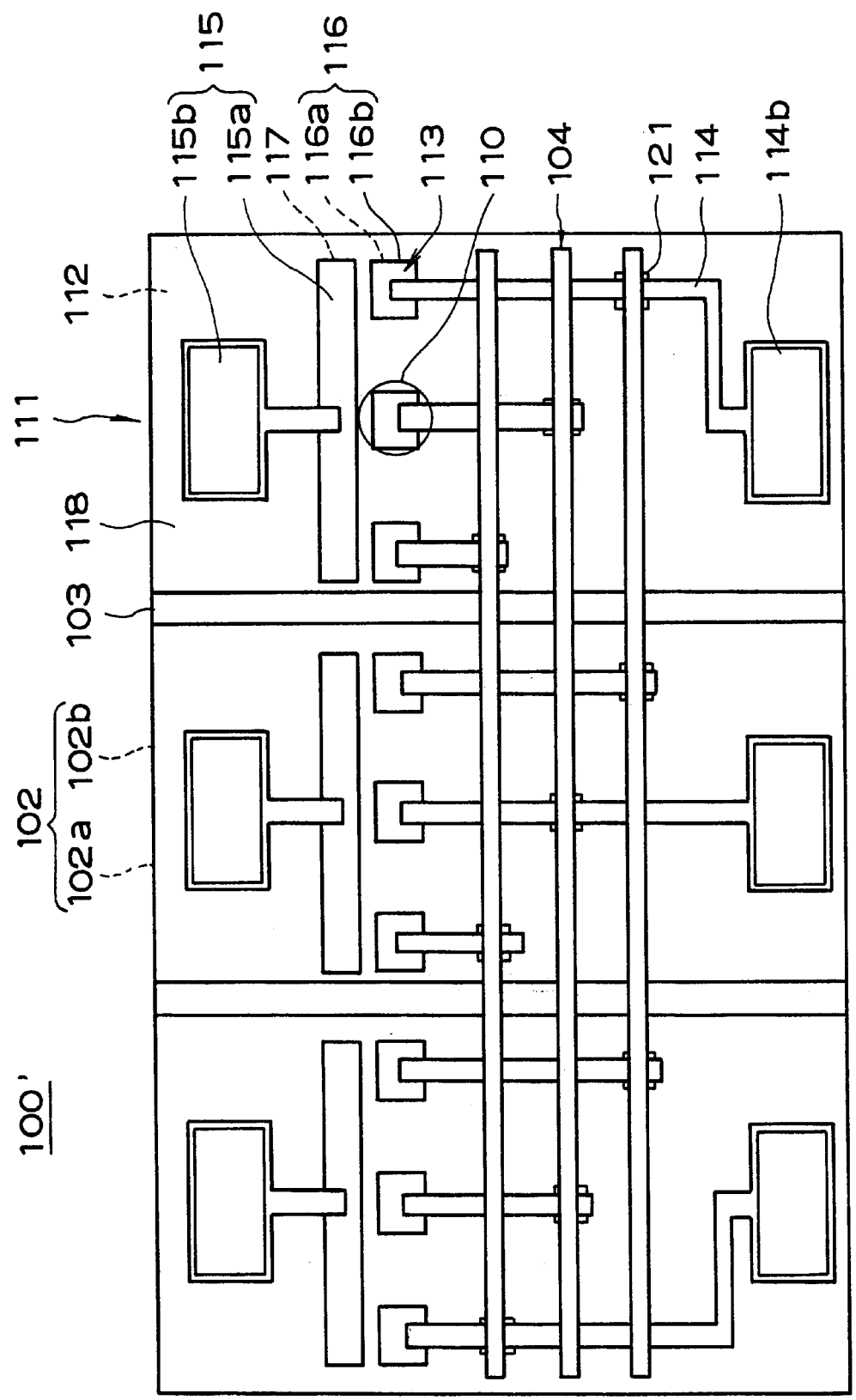
FIG. 4 illustrates another version of the first embodiment of the present invention illustrated in FIG. 3.

In the above embodiment, the structure of LED array 100 which has two p-side electrodes 114b in each n-type semiconductor block 111 is disclosed. The present invention, however, is not limited to such structure. The number of p-side electrodes is freely selected according to the design of the LED array. For, example, as illustrated in FIG. 4, the structure of LED array 100' which has single p-side electrode 114b in each n-type semiconductor block 111 is properly applied to the present invention.

(Second Embodiment)

Figure 17:
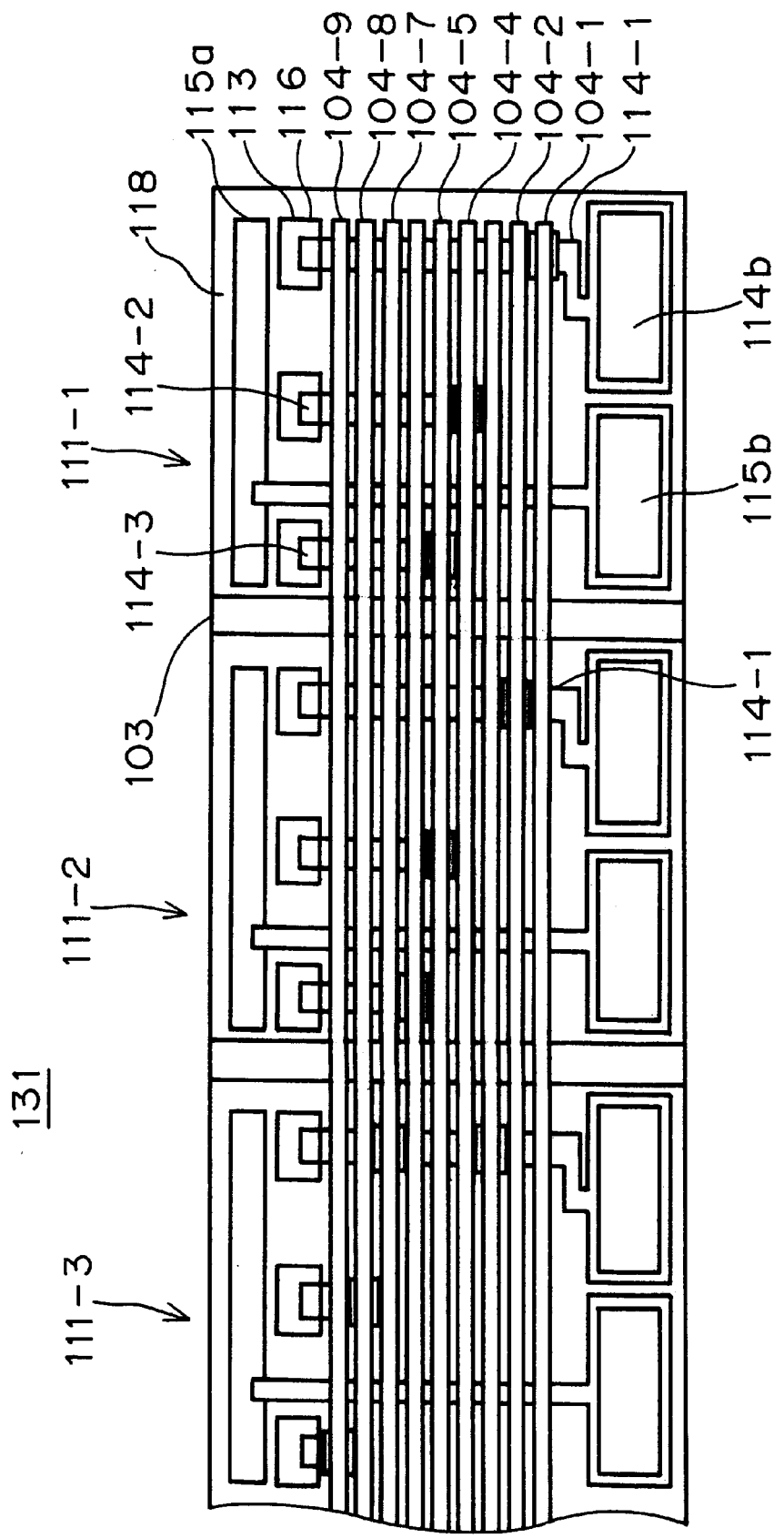
FIG. 17 is a top view illustrating the structure of the LED array in a second embodiment of the present invention.

FIG. 17 is a top view illustrating the structure of an LED array 131 in the second embodiment of the present invention. It is to be noted that in FIG. 17, the same reference numbers are assigned to components having essentially the same functions and structural features as those shown in FIG. 3. The LED array 131 is constituted by providing the n-side pad electrodes 115b in the LED array 100 in the first embodiment illustrated in FIG. 3 on the same side as the p-side electrodes 114 relative to the p-type semiconductor layers 113. Consequently, of the three p-side electrodes 114 in an n-type semiconductor block 111, the number of p-side electrodes 114 having a p-side pad electrode 114b is reduced from two to one. In other words, in the n-type semiconductor block 111, only the p-side electrode 114-1 is provided with a p-side pad electrode 114b. The p-side electrode 114-1 in the n-type semiconductor block 111-1 is connected to the p-side common wirings 104-1, whereas the p-side electrode 114-1 in the n-type semiconductor block 111-2 is connected to the p-side common wirings 104-2. Likewise, the p-side electrode 114-1 in the n-type semiconductor block 111-9 (not shown) is connected to the p-side common wirings 104-9. In addition, in the n-type semiconductor block 111-1, the p-side electrode 114-2 is connected to the p-side common wirings 104-4 and the p-side electrode 114-3 is connected to the p-side common wirings 104-5. It is to be noted that the LED array 131 may be manufactured by following through essentially the same manufacturing steps as those implemented in the first embodiment.

Thus, in the second embodiment, by adopting a structure in which the n-side pad electrodes 115b are provided on the same side as the p-side electrodes 114 relative to the p-type semiconductor layers 113, a reduction in the chip size compared to that in the first embodiment is achieved.

(Third Embodiment)

Figure 18:
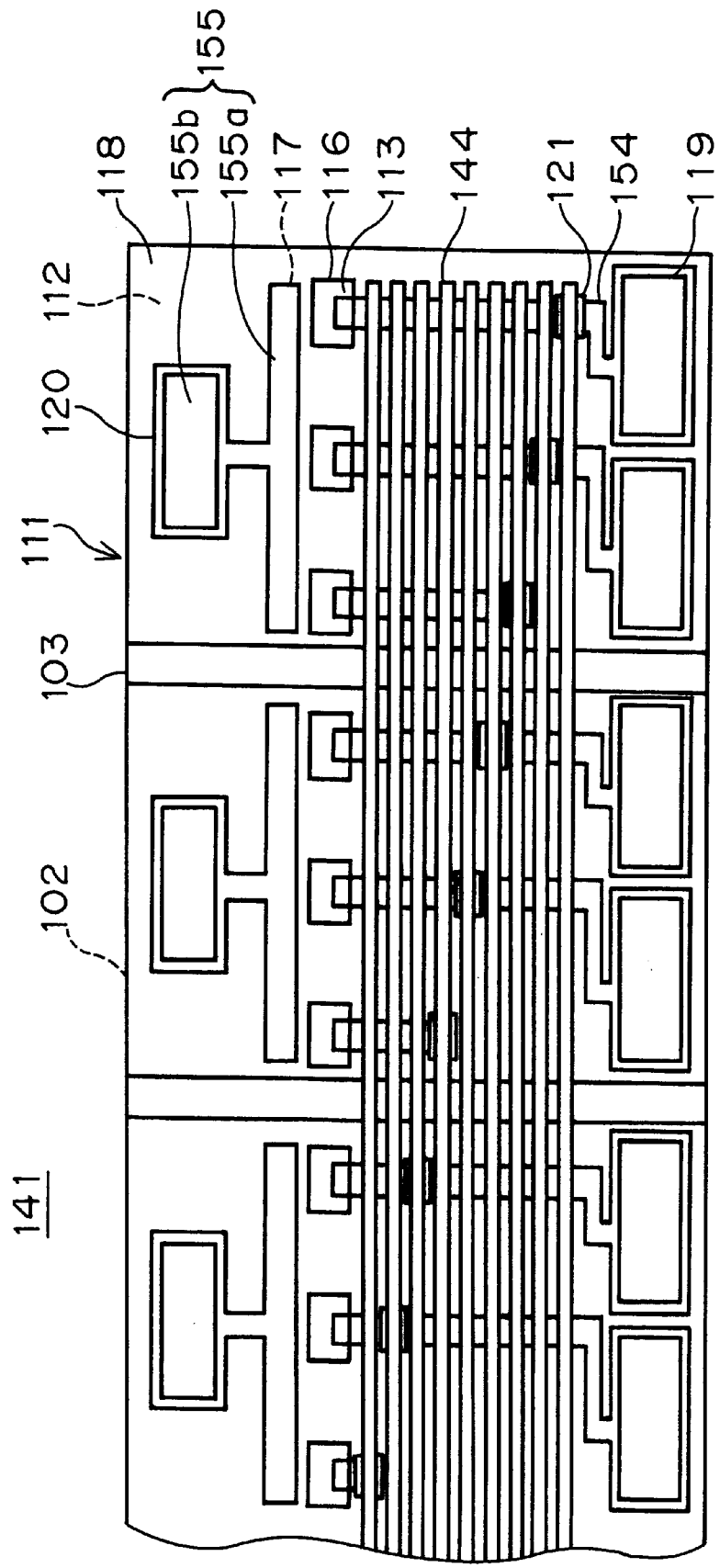
FIG. 18 is a top view illustrating the structure of the LED array in a third embodiment of the present invention.

FIG. 18 is a top view illustrating the structure of an LED array 141 in the third embodiment of the present invention. It is to be noted that in FIG. 18, the same reference numbers are assigned to components having essentially the same functions and structural features as those shown in FIGS. 5 and 18. The LED array 141 in the third embodiment is achieved by replacing the n-side electrodes 115, the p-side electrodes 114 and the p-side common wirings 104 in the LED array 100 illustrated in FIG. 3 with the n-side electrodes 155 each comprising an n-side contact electrode 155a and an n-side pad electrode 155b, p-side electrodes 154 and p-side common wirings 144 respectively.

Unlike LED arrays in the prior art, the LED array 141 adopts a single-layer structure for the n-side electrodes 155 by forming the n-side contact electrodes 155a and the n-side pad electrodes 155b constituting the n-side electrodes 155 using a single conductive film material in an integrated manner. A conductive film that can achieve ohmic contact with the n-type semiconductor blocks 111, e.g. Au alloy film, should be used to constitute the n-side contact electrodes 155a and the n-side pad electrodes 155b. Examples of the Au alloy film that may be employed include a Ti/Pt/Au film, an AuGeNi/Au film and an AuGe/Ni/Au film. In addition, the same conductive film material as that constituting the n-side electrodes 165 may be used to constitute the p-side electrodes 154, or a different conductive film material may be used to constitute the p-side electrodes 154. It is to be noted that the operation of the LED array 141 is identical to that of the LED array 100 in the first embodiment.

Processes for manufacturing the LED array 141 in the third embodiment illustrated in FIG. 18 are now explained. FIGS. 20 through 24 illustrate individual steps in the process for manufacturing the LED array 141. In the individual figures, (a) presents a top view, (b) presents a cross section through line A–A' in (a) and (c) presents a cross section through line B–B' in (a).

Figure 20:
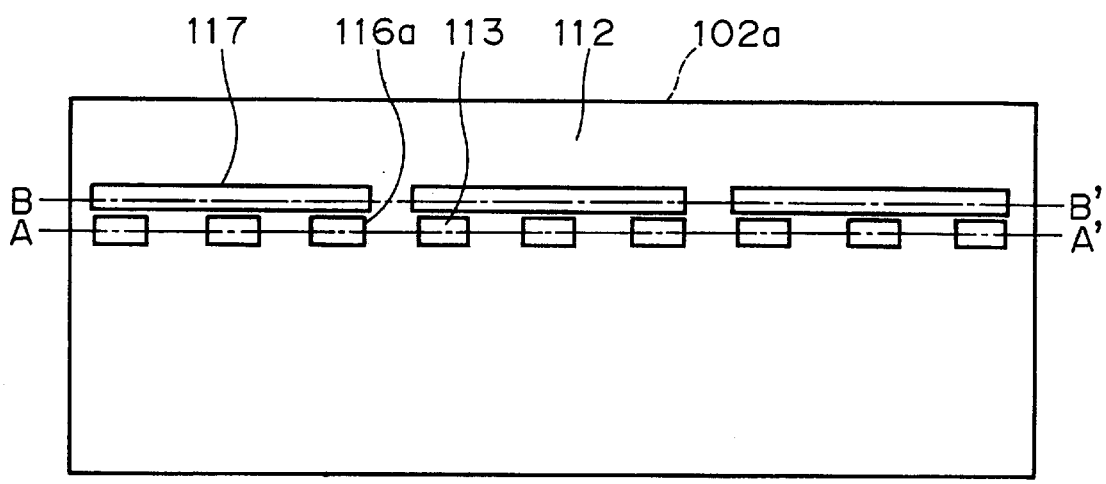
FIG. 20 illustrates an example of a step in the process for manufacturing the LED array in the third embodiment.
Figure 20:
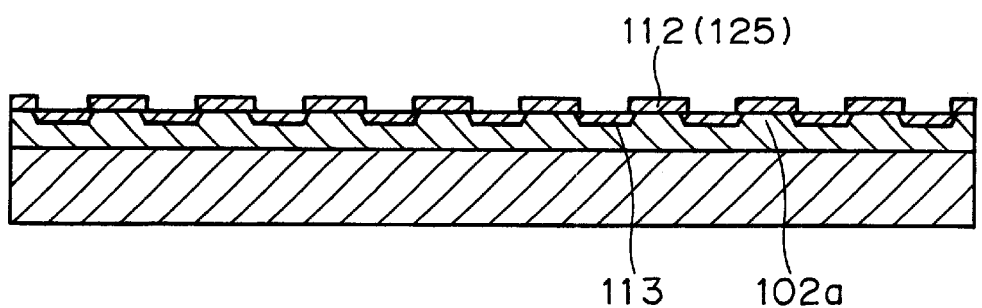
Figure 20:
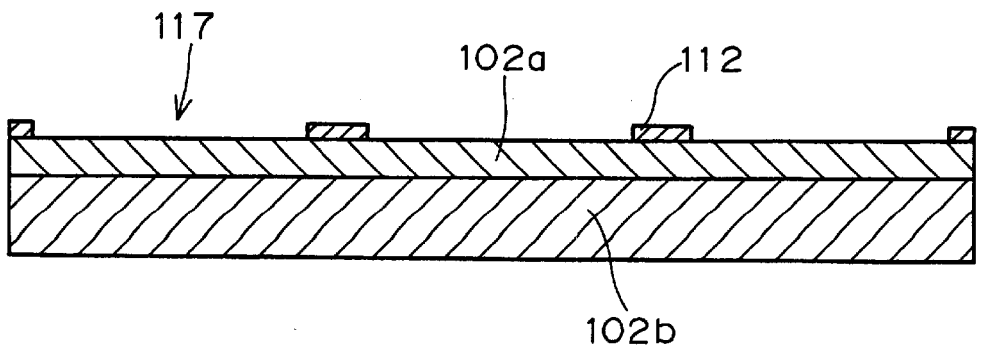

First, as illustrated in FIG. 20, a semiconductor substrate 102 which is constituted by forming an n-type semiconductor substrate 102a constituted of an n-type AlGaAs epitaxial layer on a high resistance semiconductor substrate 102b constituted of a semi-insulating GaAs substrate is prepared, a diffusion mask 125 (a first insulating film layer 112) and first opening portions 116a are formed at the surface of the n-type semiconductor substrate 102a, p-side semiconductor layers 113 are formed in the areas corresponding to the first opening portions 116a at the n-type semiconductor substrate 102a through a Zn solid phase diffusion method and the n-side opening portion 117 are formed in the first insulating film layer 112 by following the manufacturing steps illustrated in FIGS. 6 through 12 that have been explained earlier in reference to the first embodiment.

Figure 21:
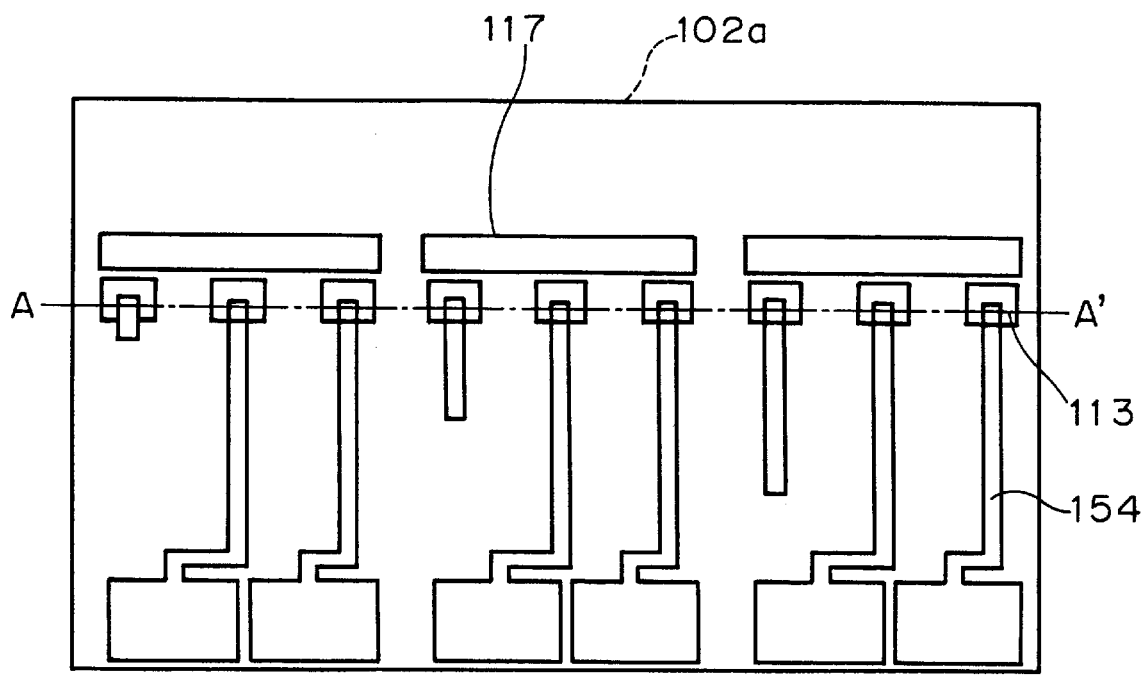
FIG. 21 illustrates a step in the process of manufacturing the LED array in the third embodiment of the present invention, which follows the step illustrated in FIG. 20.
Figure 21:
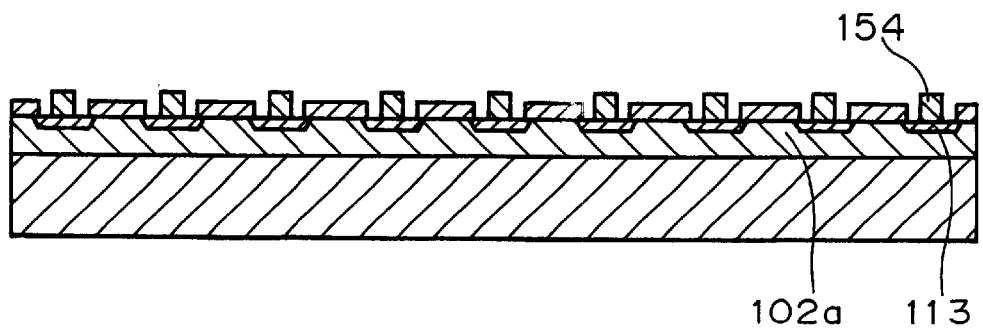

Next, as illustrated in FIG. 21, a conductive film that is to constitute the p-side electrodes 154 is formed at the surface of the n-type semiconductor substrate 102a where the formation of the n-side opening portions 117 has been completed, and the conductive film is patterned through a lift-off method to form the p-type electrodes 154. An Al film, for instance, may be used to constitute the conductive film, although it is obvious that an Au alloy may be employed instead as in the first embodiment.

Figure 22:
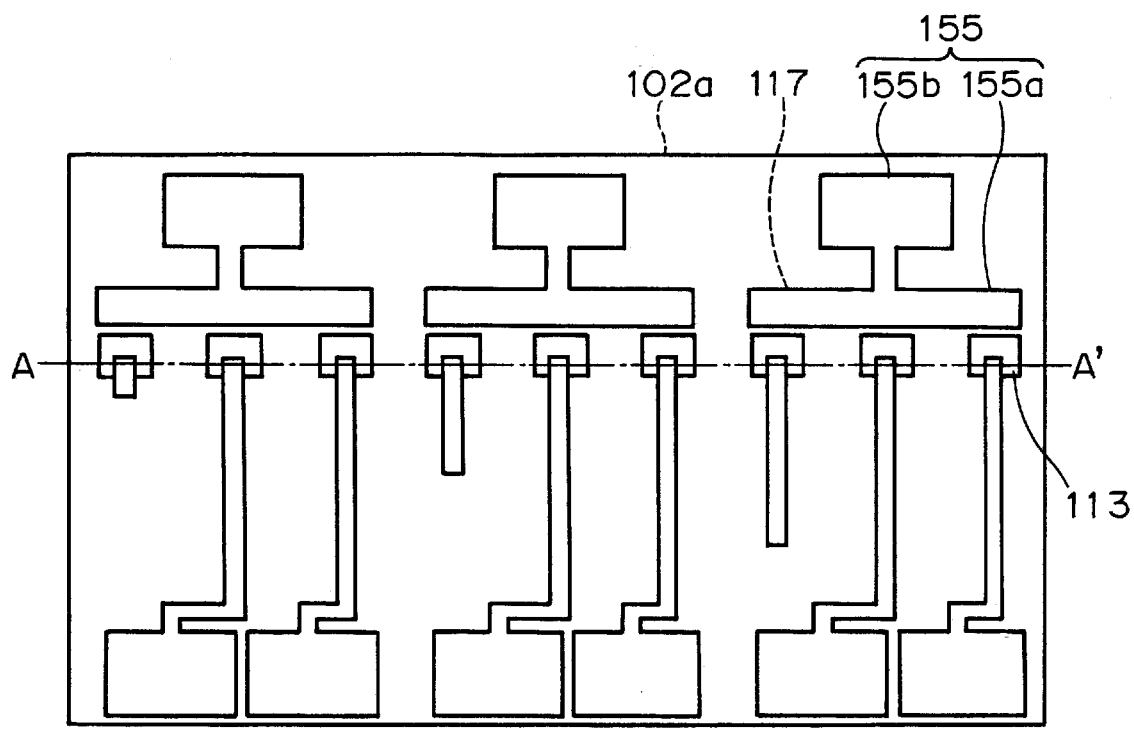
FIG. 22 illustrates a step in the process of manufacturing the LED array in the third embodiment of the present invention, which follows the step illustrated in FIG. 21.
Figure 22:
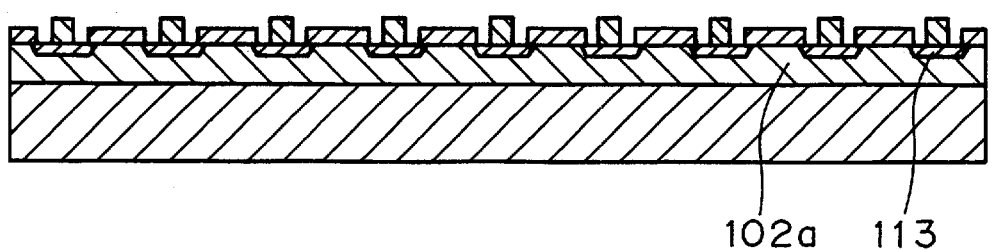

Then, as illustrated in FIG. 22, a conductive film that is to constitute the n-side electrodes 155 (the n-side contact electrodes 155a and the n-side pad electrodes 155b) is formed at the surface of the n-type semiconductor substrate 102a where the formation of the p-type electrodes 154 has been completed, and this conductive film is patterned through a lift-off method to form n-side electrodes 155 having a single-layer structure. The n-side contact electrodes 155a are each formed to cover the entire surface of the n-side opening portions 117 and are ohmic connected to the n-type semiconductor substrate 102a at the n-side opening portion 117. In addition, the n-side pad electrodes 155b, each of which is continuous to its corresponding n-side contact electrode 155a, are formed on the first layer insulating film 112 on the opposite side from the p-side electrodes 154 relative to the p-type semiconductor layers 113. One of the Au alloy films mentioned earlier, for instance, may be used to form the conductive film that is to constitute the n-type electrodes 155.

Thus, unlike in methods for manufacturing LED arrays in the prior art, in the method for manufacturing the LED array 141, the n-side contact electrodes 155a and the n-side pad electrodes 155b are formed at the same time in an integrated manner by using a single conductive film material (an Au alloy in this example) and a single-layer structure is adopted for the n-side electrodes 155 instead of the laminated structure. While it is necessary to implement a process of forming a conductive film and patterning it twice in order to form the n-side electrodes through lamination, as in the prior art, the process for film formation and patterning only needs to be implemented once by forming the n-side contact electrodes 155a and the n-side pad electrodes 155b from the same conductive film material and adopting a single-layer structure for the n-side electrodes 155, as in the LED array 141, to achieve simplification in the manufacturing method.

Figure 23:
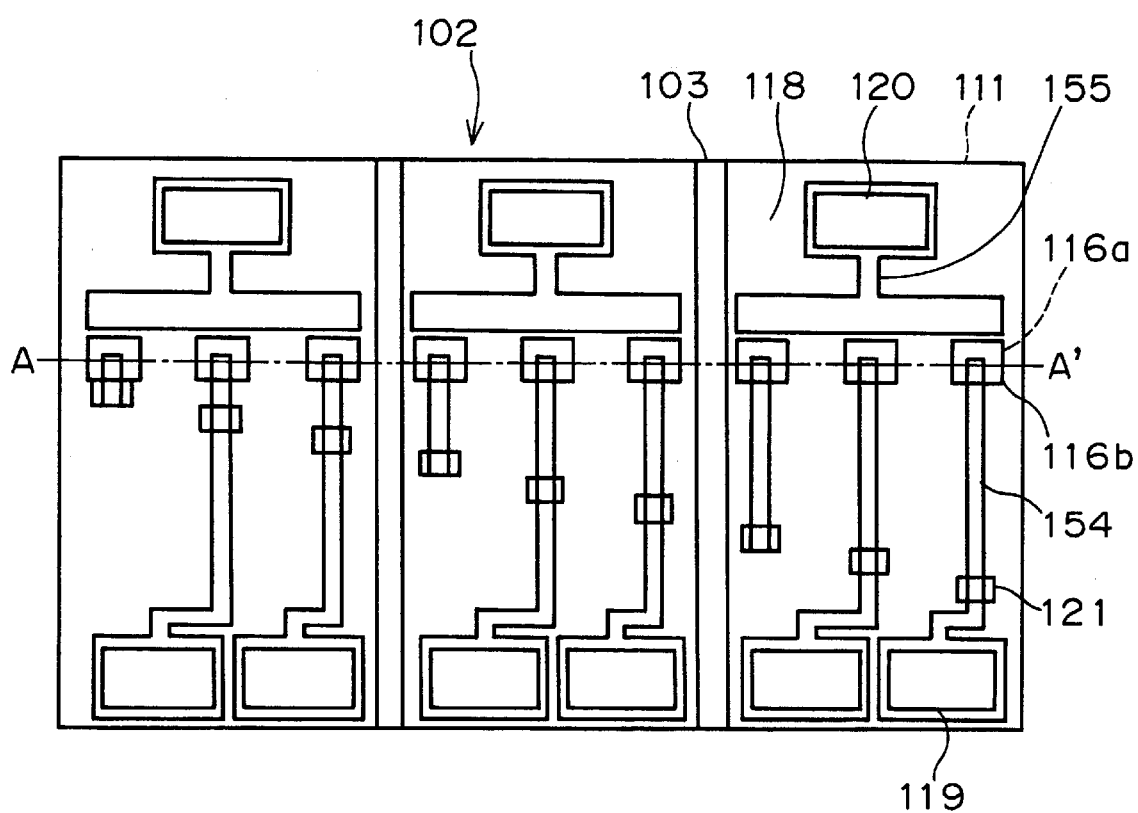
FIG. 23 illustrates a step in the process of manufacturing the LED array in the third embodiment of the present invention, which follows the step illustrated in FIG. 22.
Figure 23:
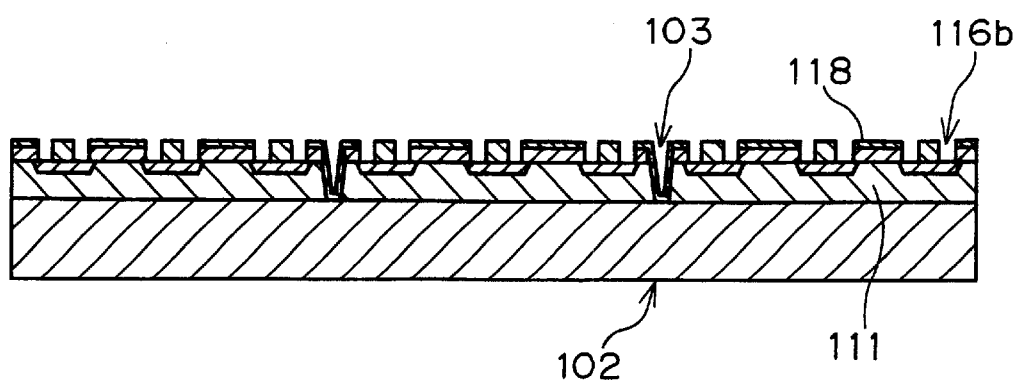

Then, as illustrated in FIG. 23, block separating grooves 103 are formed at the semiconductor substrate 102 where the formation of the n-type electrodes 155 has been completed, a second insulating film layer 118 is formed thereupon and second opening portions 116b, p-side pad openings 119, n-side pad openings 120 and via holes 121 are formed at the second layer insulating film 118, by following the procedure illustrated in FIGS. 15 and 16 explained earlier in reference to the first embodiment.

Figure 24:
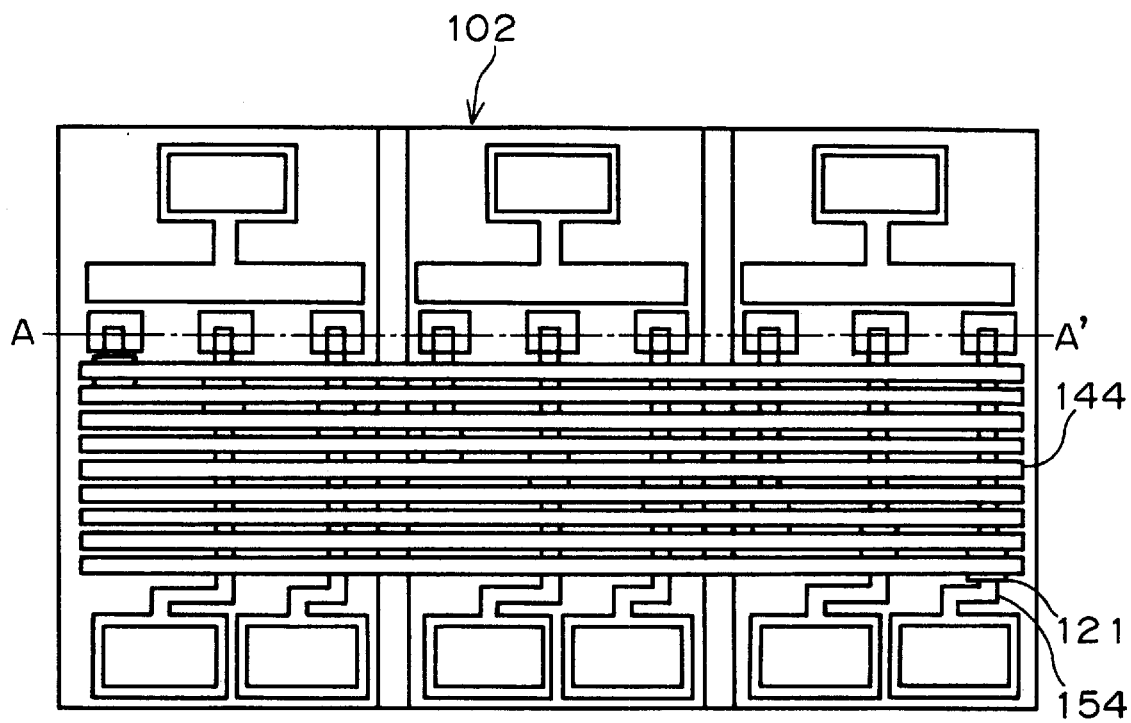
FIG. 24 illustrates a step in the process of manufacturing the LED array in the third embodiment of the present invention, which follows the step illustrated in FIG. 23.
Figure 24:
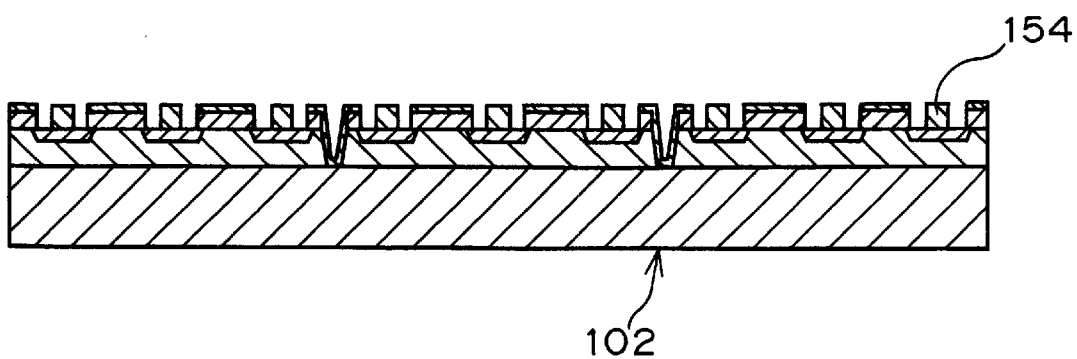

Lastly, as illustrated in FIG. 24, a conductive film that is to constitute the p-side common wirings 144 is formed over the entire surface of the semiconductor substrate 102 where the patterning of the second layer insulating film 118 has been completed and this conductive film is patterned through a lift-off method to form the p-side common wirings 144. An Al film, for instance, may be used as the conductive film that is to constitute the p-type common wirings 144. However, it is obvious that conductive film other than the Al film may be used to constitute the p-side common wirings 144, as long as it can achieve ohmic contact to the p-side electrodes 144 without causing a disconnection at the connecting portions. The LED array illustrated in FIG. 18 is manufactured through the steps described above.

Thus, in the third embodiment, the manufacturing method can be simplified by forming the n-side contact electrodes 155a and the n-side pad electrodes 155b from a single conductive film through virtually one and the same process in an integrated manner and adopting a single-layer structure for the n-side electrodes 155, to achieve a reduction in the production cost. In addition, by forming the n-side contact electrodes 155a and the n-side pad electrodes 155b through one and the same process, the degree of inconsistency in characteristics among the individual substrates (wafers) can be reduced.

It is to be noted that while in the LED array 141 in the third embodiment described above, the p-side electrodes and the n-side pad electrodes are formed on the opposite side from each other relative to the p-type semiconductive layers, the n-side pad electrodes may be provided on the same side as p-side electrodes relative to the p-type semiconductor layers instead.

Figure 19:
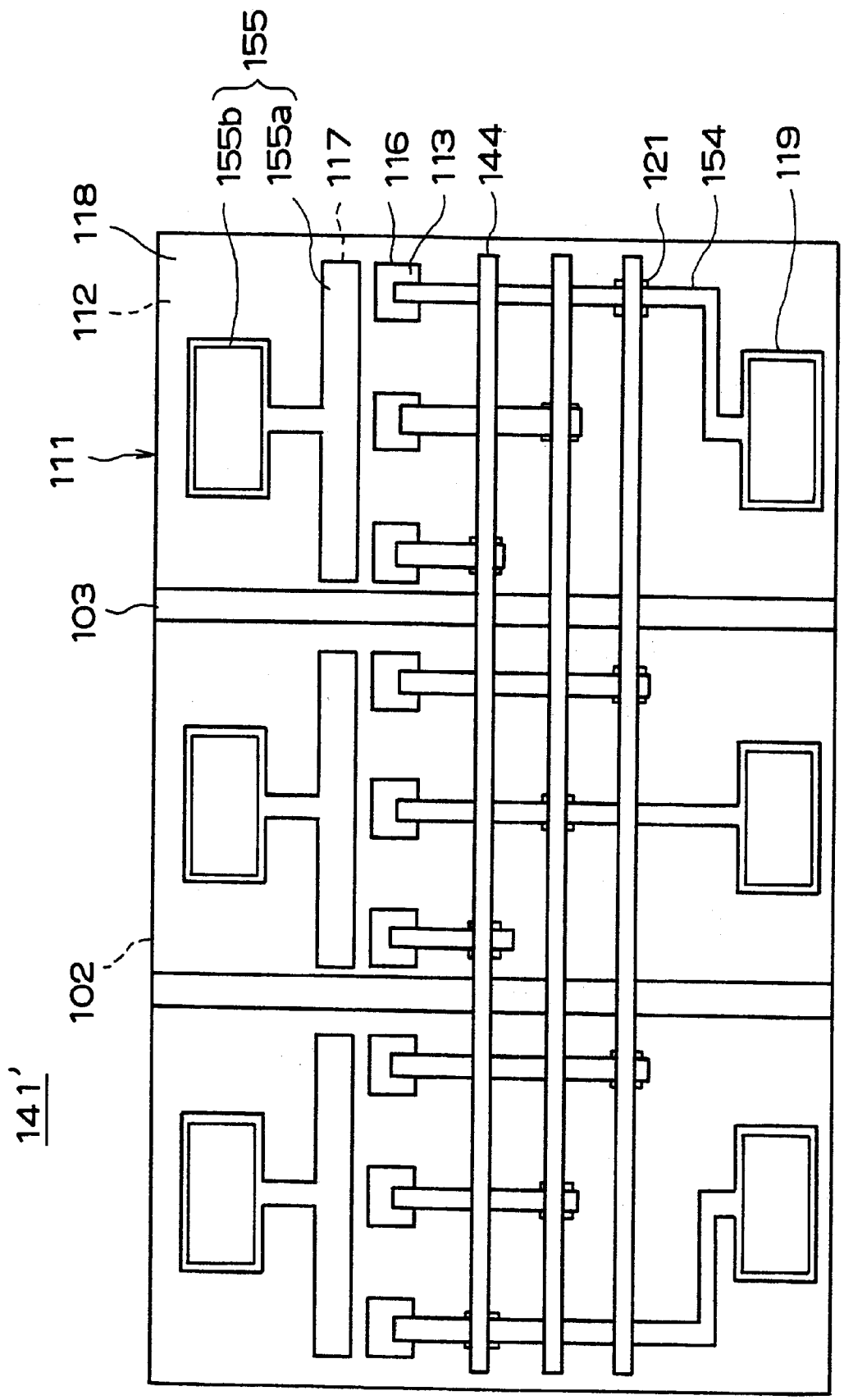
FIG. 19 illustrates another version of the third embodiment of the present invention illustrated in FIG. 18.

In the above embodiment, the structure of LED array 141 which has two p-side electrodes 119 in each n-type semiconductor block 111 is disclosed. The present invention, however, is not limited to such structure. The number of p-side electrodes is freely selected according to the design of the LED array. For, example, as illustrated in FIG. 19, the structure of LED array 141' which has single p-side electrode 119 in each n-type semiconductor block 111 is properly applied to the present invention.

(Fourth Embodiment)

Figure 25:
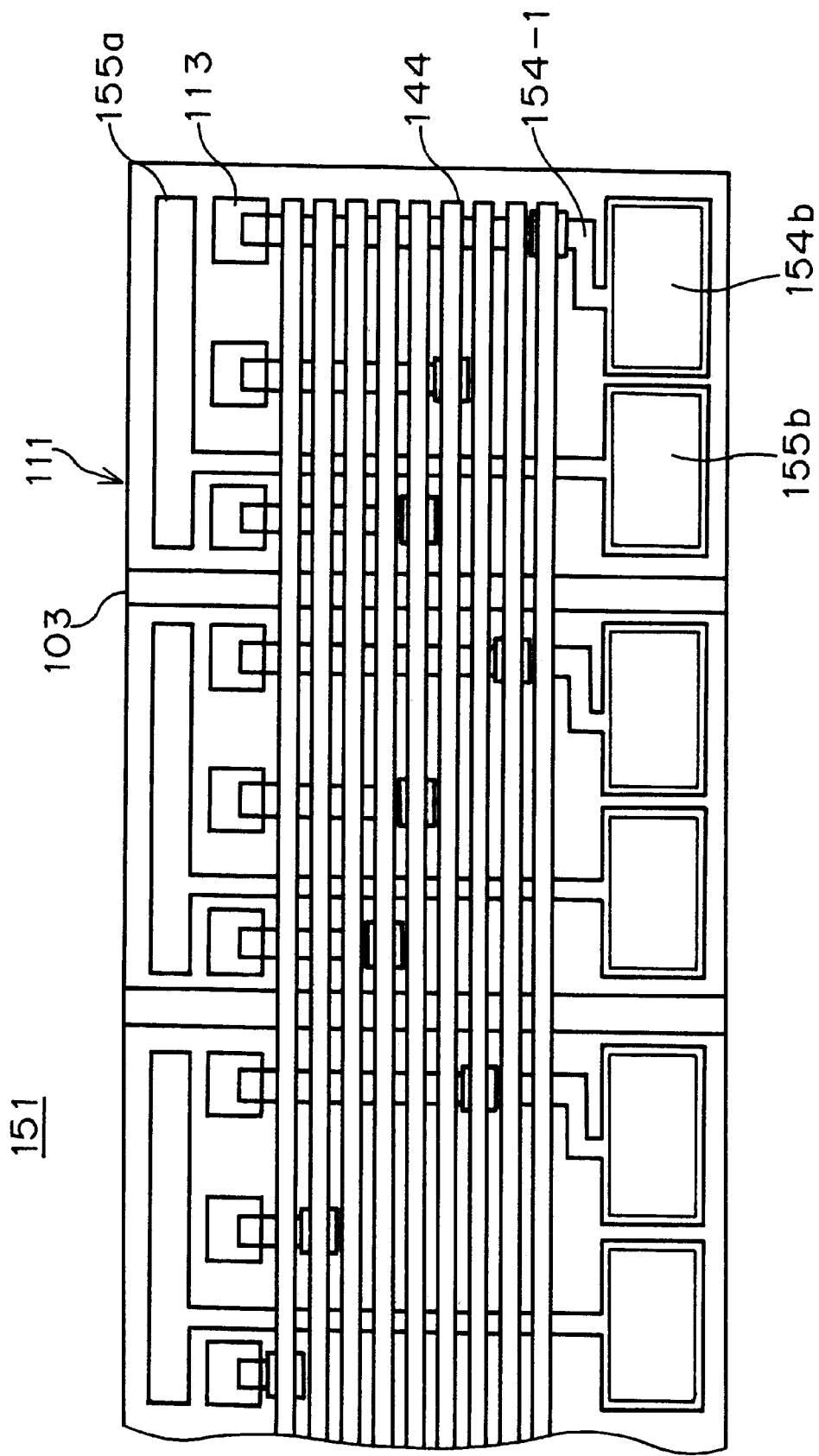
FIG. 25 is a top view illustrating the structure of the LED array in a fourth embodiment of the present invention.

FIG. 25 is a top view illustrating the structure of an LED array 151 in the fourth embodiment of the present invention. It is to be noted that in FIG. 25, the same reference numbers are assigned to components having essentially the same functions and structural features as those shown in FIG. 3, 18 and 19. The LED array 151 is constituted by providing the n-side pad electrodes 115b in the LED array 141 in the third embodiment illustrated in FIG. 18 on the same side as the p-side electrodes 154 relative to the p-type semiconductor layers 113. Consequently, of the three p-side electrodes 154 in an n-type semiconductor block 111, the number of p-side electrodes 154 having a p-side pad electrode 154b is reduced from two to one, as in the LED array 131 in the second embodiment illustrated in FIG. 17. In other words, in the n-type semiconductor block 111, only the p-side electrode 154-1 is provided with a p-side pad electrode 114a. It is to be noted that the operation of the LED array 151 is identical to that of the LED array 131 in the second embodiment. In addition, the LED array 151 may be manufactured through essentially the same manufacturing steps as those implemented in the third embodiment.

Thus, in the fourth embodiment, by adopting a structure in which the n-side pad electrodes 155b are provided on the same side as the p-side electrodes 154 relative to the p-type semiconductor layers 113, a reduction in the chip size compared to that in the third embodiment is achieved.

(Fifth Embodiment)

Figure 26:
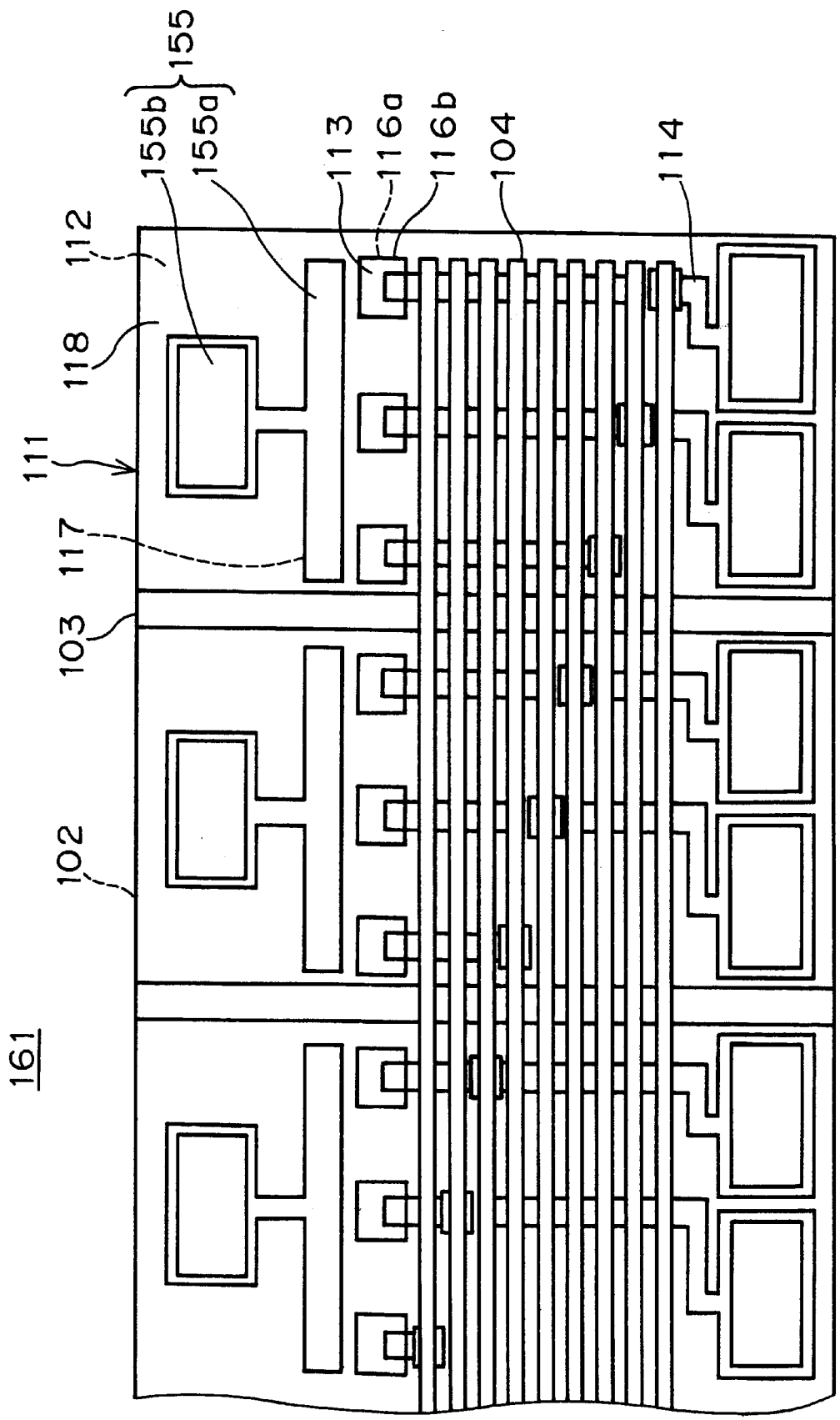
FIG. 26 is a top view illustrating the structure of the LED array in a fifth embodiment of the present invention.

FIG. 26 is a top view illustrating the structure of an LED array 161 in the fifth embodiment of the present invention. It is to be noted that in FIG. 26, the same reference numbers are assigned to components having essentially the same functions and structural features as those shown in FIGS. 5 and 18, 19 and 25. The LED array 161 in the fifth embodiment is achieved by replacing the n-side electrodes 115 in the LED array 100 illustrated in FIG. 3 with n-side electrodes 155 each comprising an n-side contact electrode 155a and an n-side pad electrode 155b.

Unlike LED arrays in the prior art, the LED array 161 adopts a single-layer structure for the n-side electrodes 155 by forming the n-side contact electrodes 155a and the n-side pad electrodes 155b constituting the n-side electrodes 155 from one and the same conductive film material in an integrated manner and uses the same conductive film material to form the n-side electrodes 155 and the p-side electrodes 114. A conductive film which can achieve ohmic contact with both the n-type semiconductor blocks 111 and the p-type semiconductor layers 113, e.g., an Au alloy film, should be used to form the conductive film that is to constitute the n-side contact electrodes 155a, n-side pad electrodes 155b and the p-side electrodes 114. Examples of the Au alloy film that may be employed include a Ti/Pt/Au film, an AuGeNi/Au film and an AuGe/Ni/Au film. It is to be noted that the operation of the LED array 161 is identical to that of the LED array 100 in the first embodiment.

The steps for manufacturing the LED array 161 in the fifth embodiment illustrated in FIG. 26 are now explained. FIGS. 27 through 30 illustrate individual steps in the process for manufacturing the LED array 161. In the individual figures, (a) presents a top view, (b) presents a cross section through line A–A' in (a) and (c) presents a cross section through line B–B' in (a).

Figure 28:
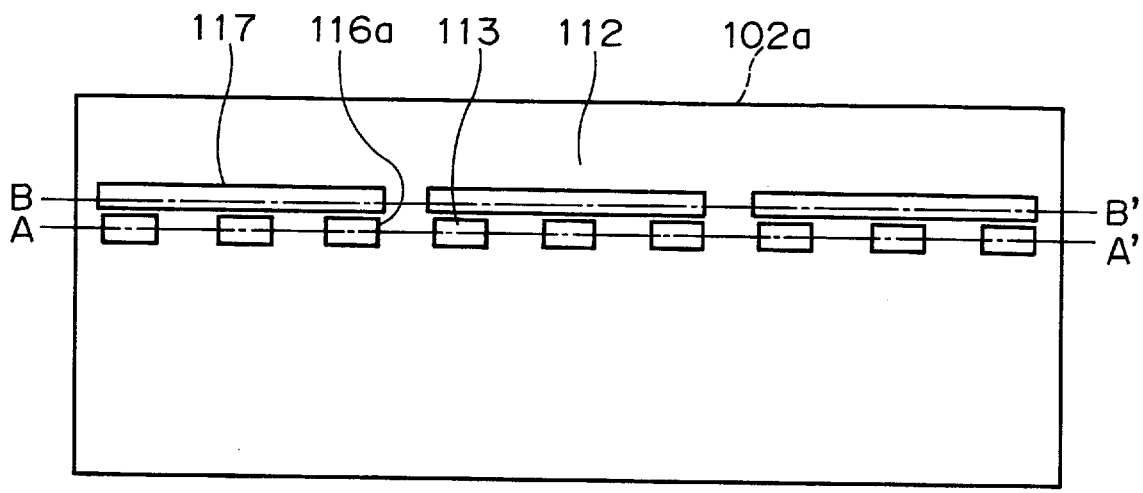
FIG. 28 illustrates a step in the process of manufacturing the LED array in the fifth embodiment of the present invention.
Figure 28:
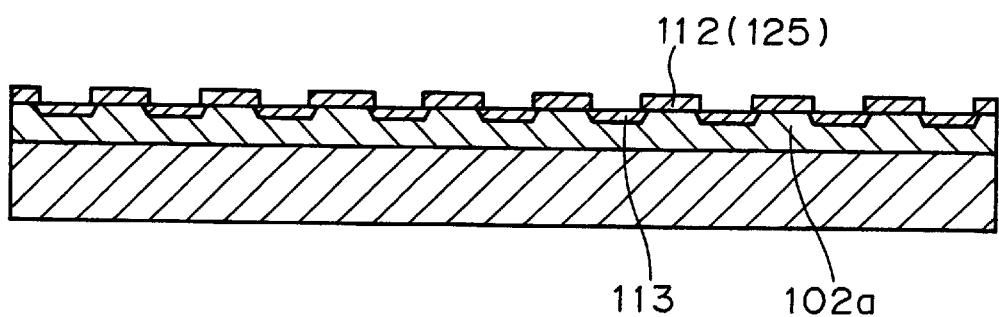
Figure 28:
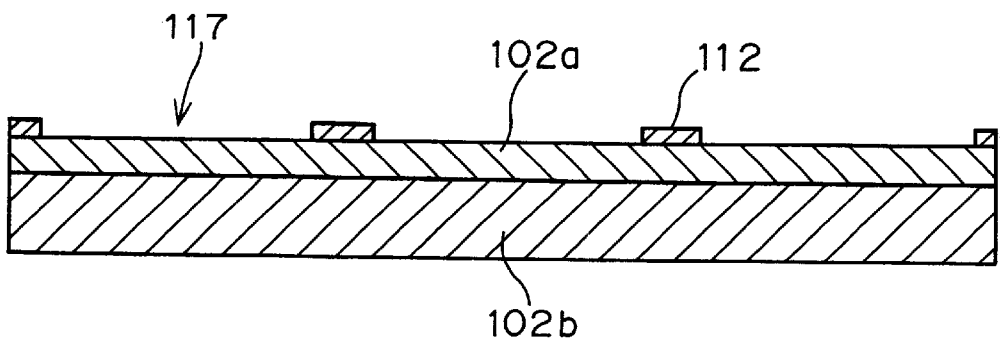

First, as illustrated in FIG. 28, a semiconductor substrate 102 which is constituted by forming an n-type semiconductor substrate 102a constituted of an n-type AlGaAs epitaxial layer on a high resistance semiconductor substrate 102b constituted of a semi-insulating GaAs substrate is prepared, a diffusion mask 125 (a first layer insulating film 112) and first opening portions 116a are formed at the surface of the n-type semiconductor substrate 102a, p-side semiconductor layers 113 are formed in the areas corresponding to the first opening portions 116a at the n-type semiconductor substrate 102a through a Zn solid phase diffusion method and the n-side opening portion 117 are formed in the first layer insulating film 112 by following the manufacturing steps illustrated in FIGS. 6 through 12 that have been explained earlier in reference to the first embodiment.

Figure 29:
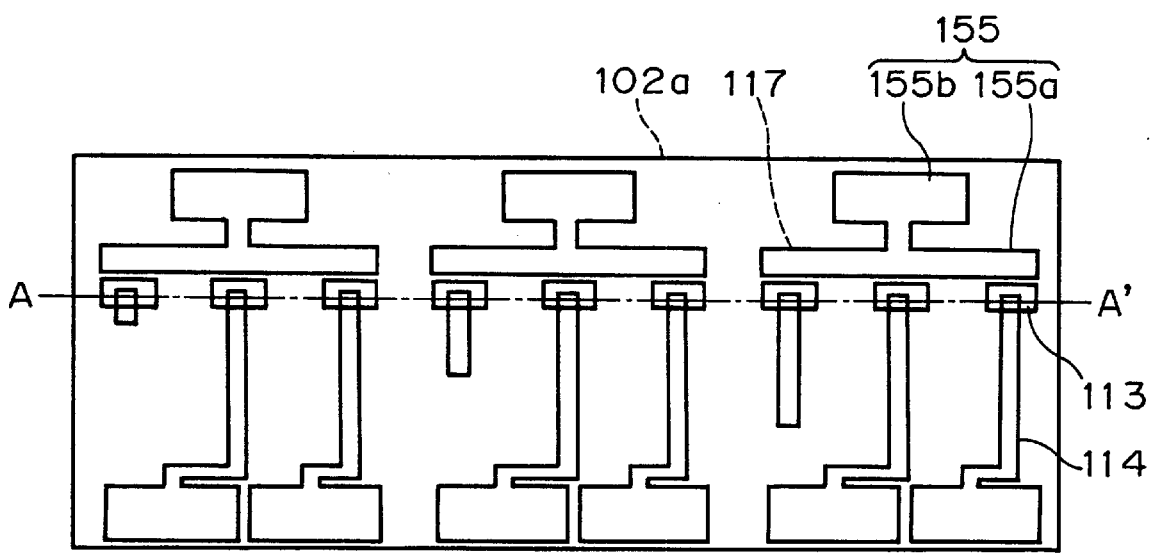
FIG. 29 illustrates a step in the process of manufacturing the LED array in the fifth embodiment of the present invention, which follows the step illustrated in FIG. 28.
Figure 29:
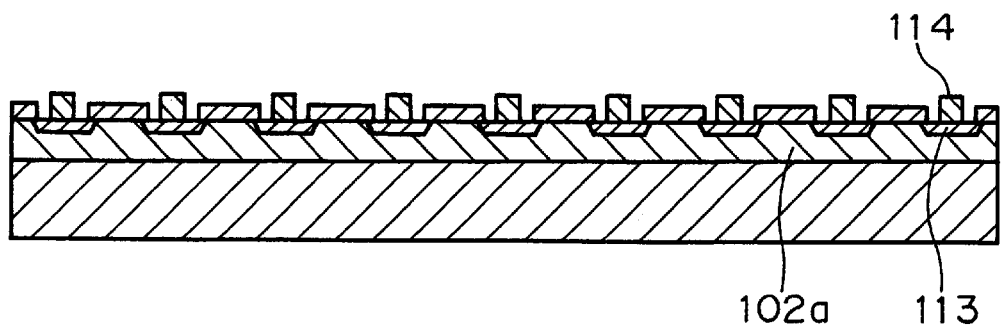

Next, as illustrated in FIG. 29, a conductive film that is to constitute the n-side electrodes 155 (the n-side contact electrodes 155a and the n-side pad electrodes 155b) and the p-side electrodes 114 is formed at the surface of the n-type semiconductor substrate 102a where the formation of the n-side opening portion 117 has been completed, and this conductive film is patterned through a lift-off method to form the n-side electrodes 155 and the p-side electrodes 114. One of the Au alloy films described earlier, for instance, may be used to constitute the conductive film.

Thus, unlike in methods for manufacturing LED arrays in the prior art, in the method for manufacturing the LED array 161, the n-side contact electrodes 155a, the n-side pad electrodes 155b and the p-side electrodes 114 are formed at the same time in an integrated manner by using a single conductive film material (an Au alloy in this example) and a single-layer structure is adopted for the n-side electrodes 155. While it is necessary to implement a process of forming a conductive film and patterning it a total of three times in order to form the p-side electrodes and the n-side electrodes having a laminated structure, as in the prior art, the process for film formation and patterning only needs to be implemented once by forming the n-side electrodes 155 and the p-side electrodes 114 from the same conductive film material and adopting a single-layer structure for the n-side electrodes 155, as in the LED array 161, to achieve simplification in the manufacturing method.

Figure 30:
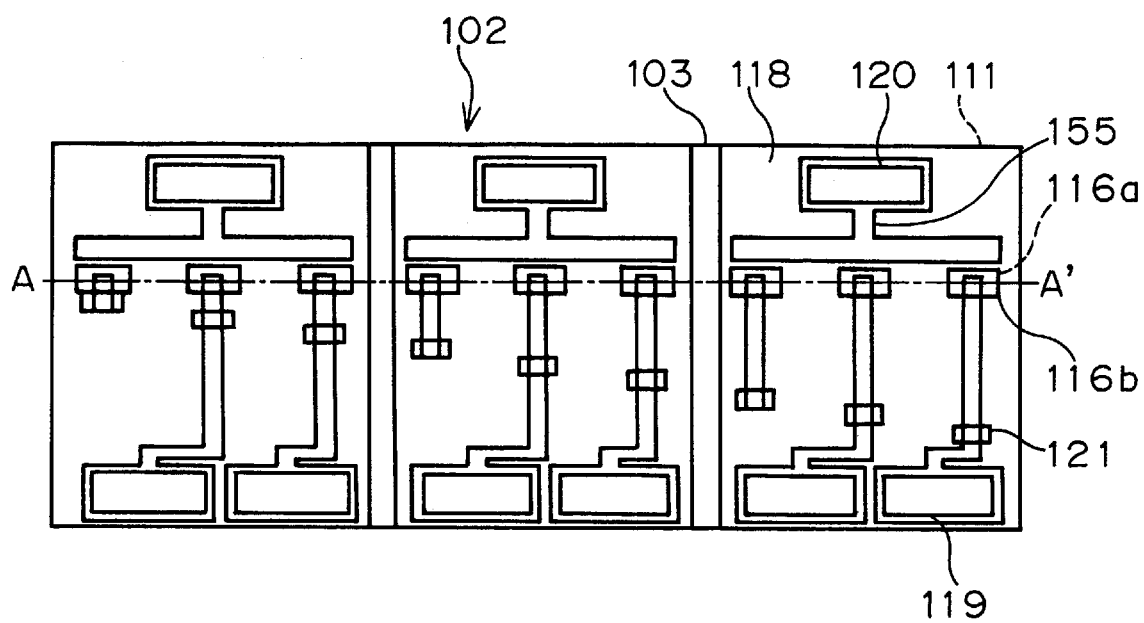
FIG. 30 illustrates a step in the process of manufacturing the LED array in the fifth embodiment of the present invention, which follows the step illustrated in FIG. 29.
Figure 30:
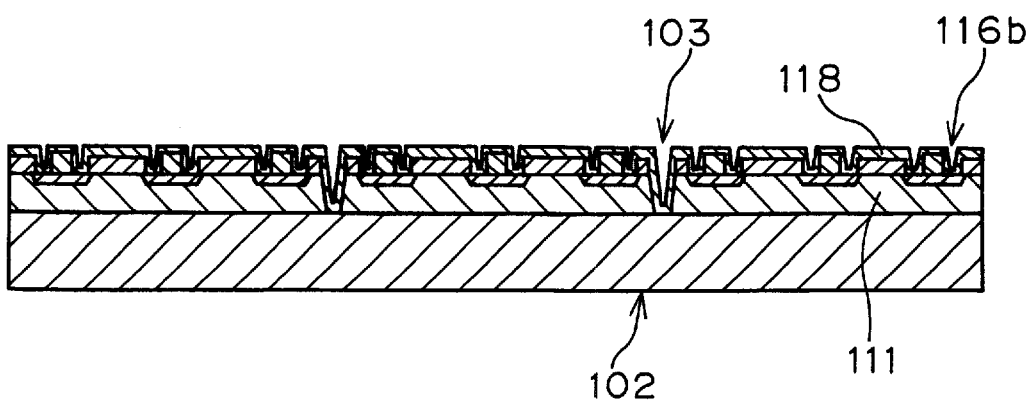

Then, as illustrated in FIG. 30, block separating grooves 103 are formed at the n-type semiconductor substrate 102a where the formation of the n-type electrodes 155 has been completed, a second layer insulating film 118 is formed thereupon and second opening portions 116b, p-side pad openings 119, n-side pad openings 120 and via holes 121 are formed at the second layer insulating film 118, by following essentially the procedure illustrated in FIGS. 15 and 16 explained earlier in reference to the first embodiment.

Figure 31:
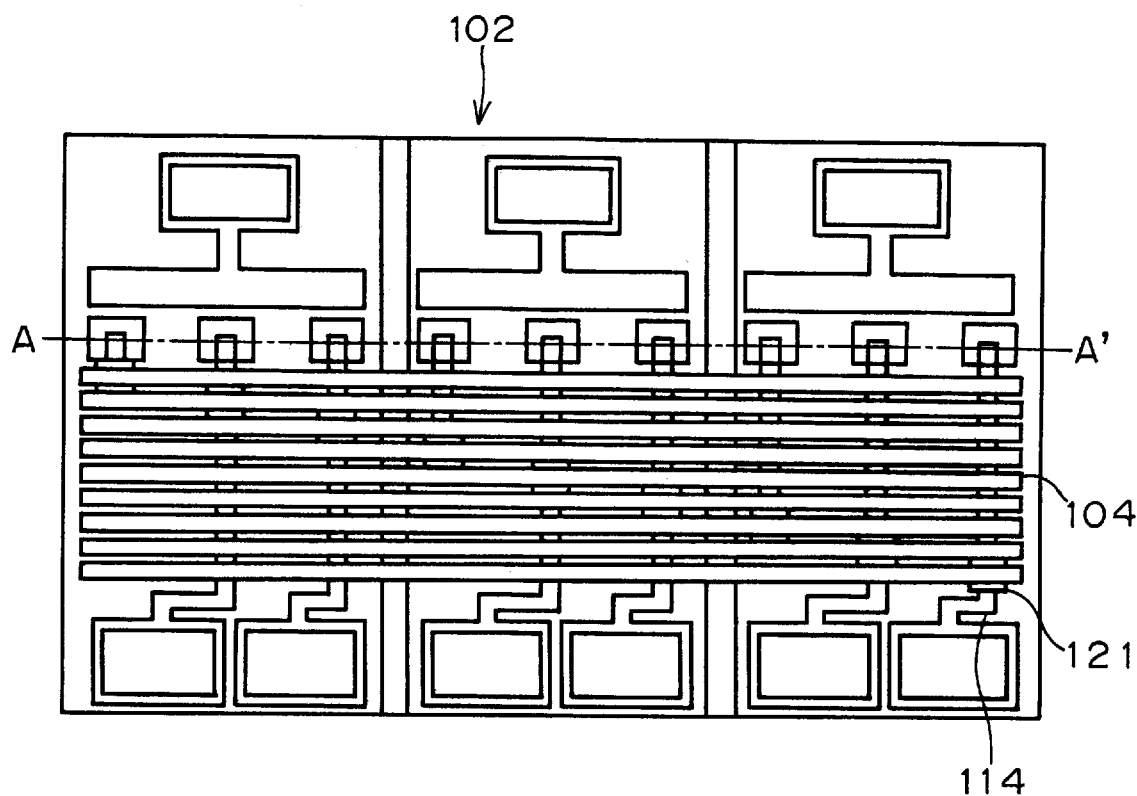
FIG. 31 illustrates a step in the process of manufacturing the LED array in the fifth embodiment of the present invention, which follows the step illustrated in FIG. 30.
Figure 31:
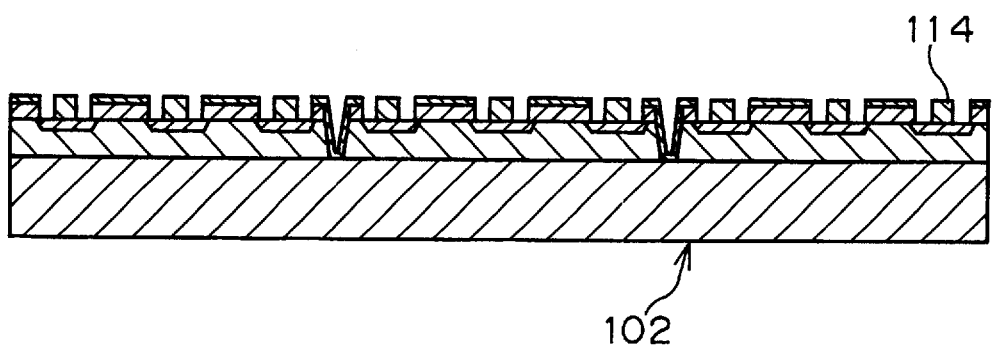

Lastly, as illustrated in FIG. 31, a conductive film that is to constitute the p-side common wirings 104 is formed over the entire surface of the semiconductor substrate 102 where the patterning of the second layer insulating film 118 has been completed and this conductive film is patterned through a lift-off method to form the p-side common wirings 104. The LED array 161 illustrated in FIG. 26 is manufactured through the steps described above.

Thus, in the fifth embodiment, the manufacturing method can be further simplified compared to the first through fourth embodiments by forming the p-side electrodes 114, the n-side contact electrodes 155a and the n-side pad electrodes 155b from a single conductive film through virtually one and the same process in an integrated manner, to achieve a reduction in the production cost. In addition, by forming the p-side electrodes 114, the n-side contact electrodes 155a and the n-side pad electrodes 155b through one and the same process, the degree of inconsistency in characteristics among the individual substrates (wafers) can be further reduced.

Figure 27:
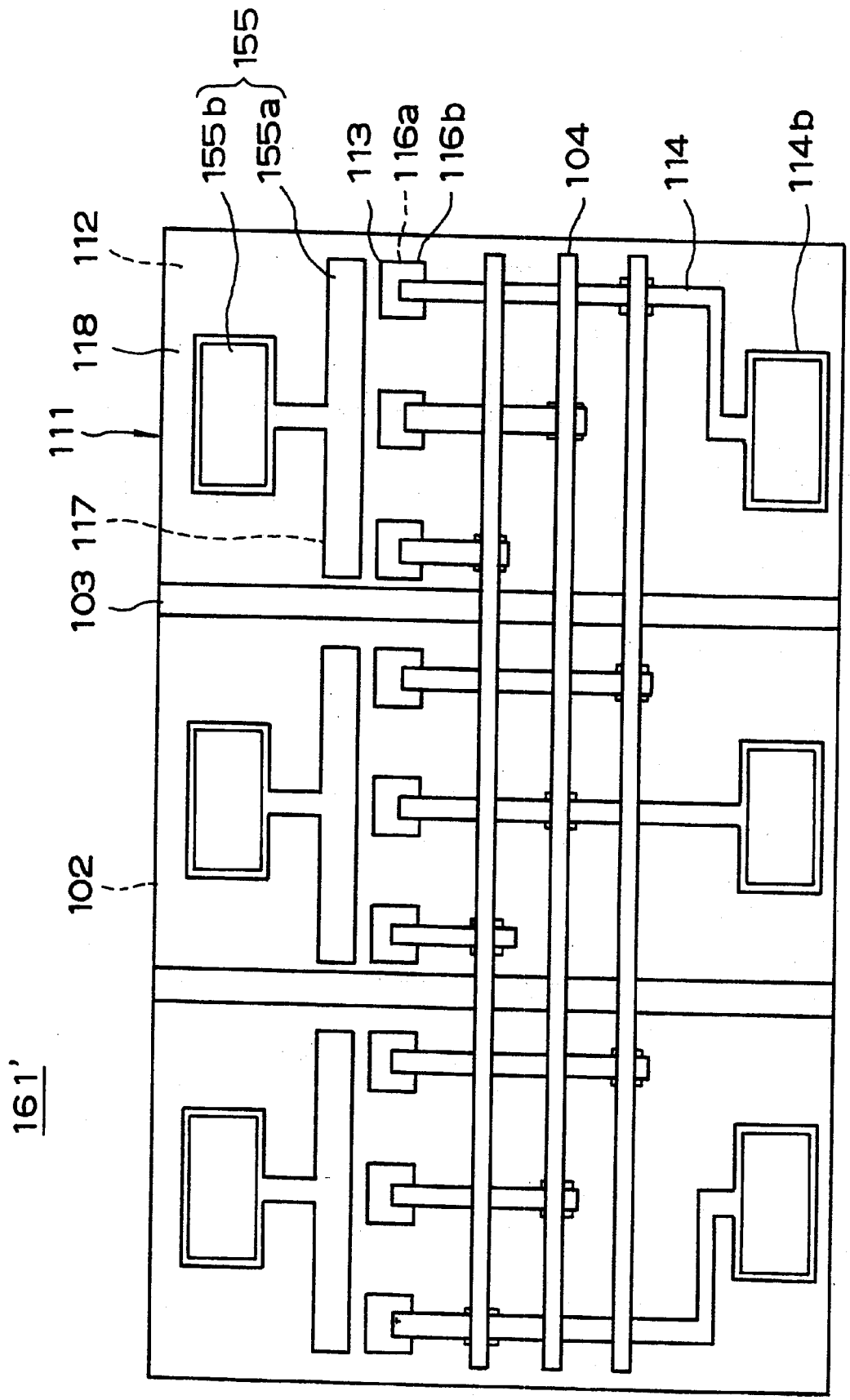
FIG. 27 illustrates another version of the fifth embodiment of the present invention illustrated in FIG. 26.

In the above embodiment, the structure of LED array 161 which has two p-side electrodes 114b in each n-type semiconductor block 111 is disclosed. The present invention, however, is not limited to such structure. The number of p-side electrodes is freely selected according to the design of the LED array. For, example, as illustrated in FIG. 27, the structure of LED array 161' which has single p-side electrode 114b in each n-type semiconductor block 111 is properly applied to the present invention.

(Sixth Embodiment)

Figure 32:
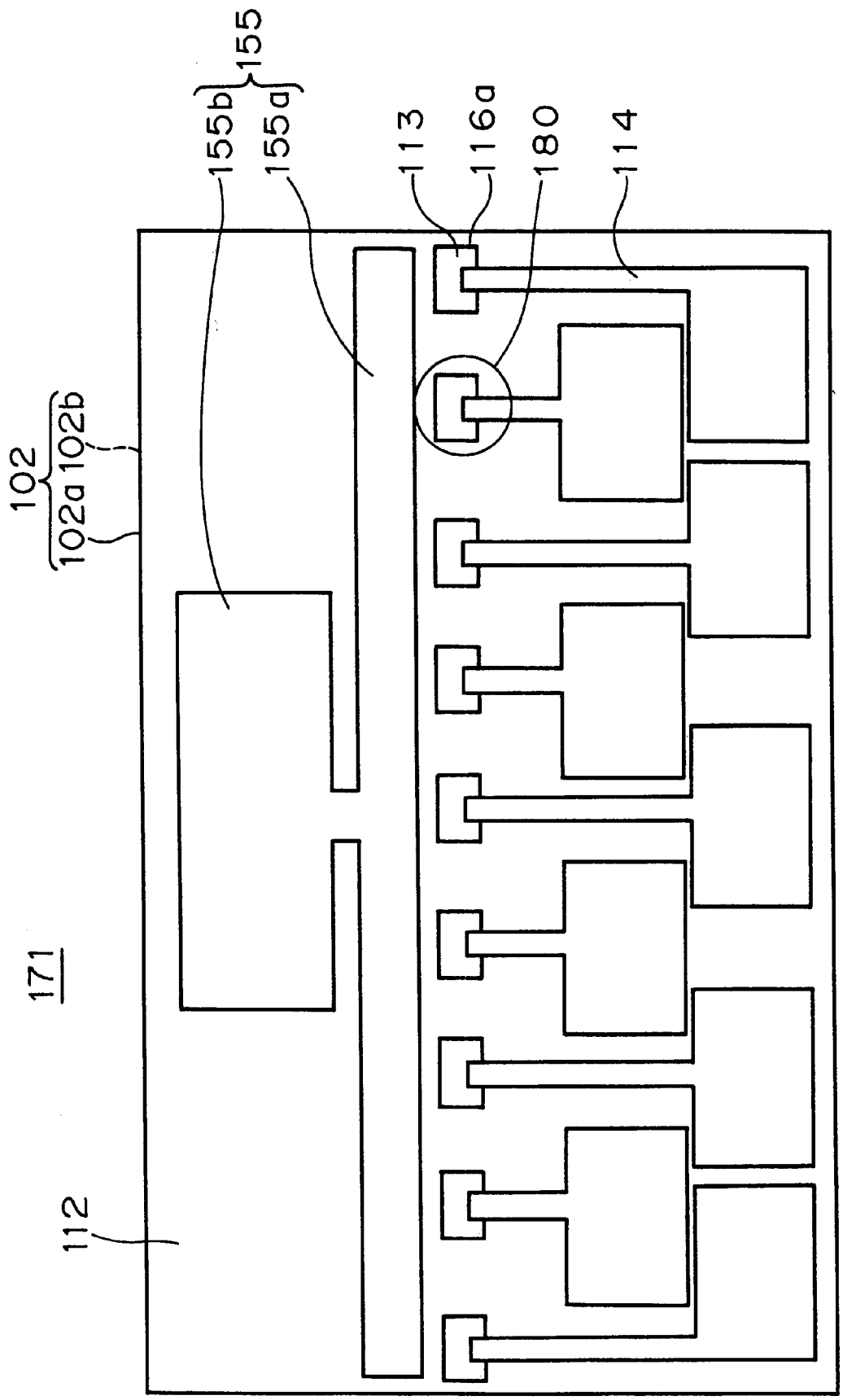
FIG. 32 is a top view illustrating the structure of the LED array in a sixth embodiment of the present invention.

FIG. 32 is a top view illustrating the structure of an LED array 171 in the sixth embodiment of the present invention. It is to be noted that in FIG. 32, the same reference numbers are assigned to components having essentially the same functions and structural features as those shown in FIGS. 5 and 18, 19, 25 and 26. The LED array 171, which is constituted by providing a plurality of LEDs 180 in a single row on a semiconductor substrate 102, supports 600 DPI. In addition, the LED array 171 adopts a structure in which the p-side electrodes 114 and the n-side electrodes 155 of the LEDs 180 are formed on the same surface of the semiconductor substrate 102. Unlike LED arrays supporting 1200 DPI, such as the LED array 100 in the first embodiment, the LED array 171 supporting 600 DPI adopts a structure in which all the p-side electrodes are each provided with a p-side pad electrode, thereby precluding the necessity for forming the separating grooves, the p-side common wirings and the second layer insulating film. It is to be noted that in the LED array 171, a first conductive-type is assigned as n-type and a second conductive-type is assigned as p-type.

Q (Q is a positive integer) LEDs 180 are formed in a single row at an n-type semiconductor substrate 102a of the semiconductor substrate 102. In FIG. 32, Q=9. At the n-type semiconductor substrate 102a, Q p-type semiconductor layers 113 are formed in a single row as in the LED array 100 in the first embodiment illustrated in FIG. 3. In addition, a first layer insulating film 112 having first opening portions 116a and an n-side opening portion 117 is formed on the n-type semiconductor substrate 102a. Q p-side electrodes 114, an n-side contact electrode 155a and an n-side pad electrode 155b are formed on the first layer insulating film 112. The p-side electrodes 114 are each connected with a p-type semiconductor layer 113 at a corresponding first opening portion 116a. The n-side contact electrode 155a, which is formed to cover the entire surface of the n-side opening portion 117, is in ohmic contact with the n-type semiconductor substrate 102a at the n-side opening portion 117. In addition, the n-side pad electrode 155b, which is continuous to the n-side contact electrode 155a is formed on the first layer insulating film 112. The n-side contact electrode 155a and the n-side pad electrode 155b constitute an n-side electrode 155 having a single-layer structure.

The LEDs 180 are each constituted of the n-type semiconductor substrate 102a which is commonly shared by the Q LEDs 180, one of the p-type semiconductor layers 113 individually formed at the n-type semiconductor substrate 102a, a p-type electrode 114 formed at the p-type semiconductor layer 113 and the n-type electrode 155 formed to be shared by the Q LEDs 180. When a voltage is applied between a p-type electrode 114 and the n-type electrode 155, a light emitting phenomenon occurs at the bonding surface of the p-type semiconductor layer 113 and the n-type semiconductor substrate 102a, and this emitted light is radiated to the outside through the surface of the p-type semiconductor layer 113.

In the prior art, in an LED array supporting 600 DPI or lower, an n-type semiconductor substrate without a high resistance semiconductor substrate is employed, p-type semiconductor layers and p-side electrodes are formed at a surface of the n-type semiconductor substrate and the rear surface of the n-type semiconductor substrate is polished to form an n-side electrode constituted of a conductive film which is different from the p-type electrodes over the entire rear surface. However, in the LED array 171, the p-side electrodes 114 and the n-side electrodes 155 constituted of one and the same conductive film material are formed at the same time on the same surface of the semiconductor substrate 102 through one cycle of conductive film formation and patterning process. Thus, the step for polishing the rear surface of the semiconductor substrate and the step for forming the conductive film to constitute the n-side electrodes at the rear surface of the semiconductor substrate can be omitted. A conductive film which can be ohmic contacted with both the p-type semiconductor layers 113 and the n-type semiconductor substrate 102a, e.g., an Au alloy film should be used to form the conductive film that is to constitute the p-side electrodes 114 and the n-side electrode 155. Examples of the Au alloy film described above include a Ti/Pt/Au film, an AuGeNi/Au film and an AuGe/Ni/Au film.

Thus, in the sixth embodiment, the manufacturing method can be simplified by forming the n-side electrodes which are formed at the rear surface of an n-type semiconductor substrate in the prior art on the same surface where the p-side electrodes and the p-type semiconductor layers are formed and forming the p-side electrodes 114 and the n-side electrodes 155 from a single conductive film through one and the same process, to realize a reduction in production cost.

(Seventh Embodiment)

FIG. 33 illustrates the structure of an LED array 200 in the seventh embodiment of the present invention, with FIG.

33(a) presenting its top view and FIG. 33(b) presenting a cross section through line A–A' in FIG. 33(a). The LED array 200, which is constituted by forming a plurality of LEDs 210 in each of n-type semiconductor blocks 211 that are provided in a single row on a semiconductor substrate 202, supports 1200 DPI. In addition, the LED array 200 adopts a structure in which p-side electrodes 214 and n-side electrodes 215 in the LEDs 210 are formed on the same surface of the semiconductor substrate 202. The semiconductor substrate 202 is constituted by forming an n-type semiconductor substrate 202a constituted of an epitaxial layer or the like on a high resistance semiconductor substrate 202b. The n-type semiconductor blocks 211 are achieved by dividing the n-type semiconductor substrate 202a. The n-type semiconductor blocks 211 are electrically isolated from one another by the high resistance semiconductor substrate 202b and separating grooves (etching grooves) 203. It is to be noted that in the LED array 200, a first conductive-type is assigned as n-type and a second conductive-type is assigned as p-type.

In each n-type semiconductor block 211, N (N is a positive integer) LEDs 210 are formed in a single row. In FIG. 33, N=3. In the n-type semiconductor block 211, N p-type semiconductor layers (p-type semiconductor areas) 213 are formed in a single row through dispersion. In addition, on the n-type semiconductor block 211, a first layer insulating film 212 is formed. In the first layer insulating film 212, first opening portions 216a for exposing almost the entire surfaces of the p-type semiconductor layers 213 and an n-side opening portion 217 for exposing the surface of the n-type semiconductor block 211 are formed. The n-type opening portion 217 is constituted of a first contact opening portion 217a and a second contact opening portion 217b that are continuous to each other.

N p-side electrodes 214 are formed on the first layer insulating film 212. The p-side electrodes 214 are connected with the p-type semiconductor layers 213 at the first opening portions 216a. An n-side pad electrodes 215b is provided for connection with an external circuit and formed by partially overlapping an n-side contact electrode 215a. The n-side contact electrode 215a and the n-side pad electrode 215b constitute an n-side electrode 215 having a laminated structure. The n-side contact electrode 215a is formed within the first contact opening portion 217a of the n-side opening portion 217, whereas the n-side pad electrode 215b is formed within the second contact opening portion 217b of the n-side opening portion 217. The n-side contact electrode 215a and n-side pad electrode 215b are both formed and bonded at the surface of the n-type semiconductor block 211 and are ohmic connected to the n-type semiconductor block 211. Generally speaking, a semiconductor such as the n-type semiconductor block 211 achieves a high degree of bonding with the conductive film that is to constitute the n-side contact electrode 215a.

Thus, the LED array 200 differs from LED arrays in the prior art in that its n-type contact electrodes 215a are formed and bonded at the surface of the n-type semiconductor blocks 211 instead of on the layer insulating film 212. While the n-side pad electrodes 215b are formed on the layer insulating film sometimes become peeled off, as in the prior art, such peeling of the n-side pad electrodes 215b can be prevented by forming and bonding the n-side contact electrodes 215a at the surface of the n-type semiconductor blocks 211 as in the LED array 200.

A second layer insulating film 218 is formed on the first layer insulating film 212 in which the p-side electrodes 214 are formed. In the second layer insulating film 218, second opening portions 216b for exposing almost the entire areas of the first opening portions 216a, p-side pad opening portions 219 for exposing the pad electrodes of the p-side electrodes 214, an n-side pad opening portion 220 for exposing the n-side pad electrode 215b and via holes 221 for exposing the portions of the p-side electrodes 214 that are formed on the first layer insulating film 212 are formed. The first opening portions 216a and the second opening portions 216b constitute p-side opening portions 216. In addition, on the second layer insulating film 218, M (M is an integer equal to or greater than N) p-side common wirings 204 are formed. In the LED array 200 in FIG. 33, M=9. The p-side common wirings 204 are formed over all the n-type semiconductor blocks 211, and are connected with the p-side electrodes 214 at the via holes 221.

The LEDs 210 are constituted in an n-type semiconductor block 211 which is common to N LEDs 210, one of the p-side semiconductor layers 213 individually formed at the n-type semiconductor block 211, a p-side electrode 214 formed at the p-type semiconductor layer 213 and the n-type electrode 215 formed to be shared by the N LEDs 210 within the n-type semiconductor block 211. The depth of the p-type semiconductor layers 213 is less than the thickness of the n-type semiconductor block 211. Thus, the p-type semiconductor layers 213 are formed in a shoal at the n-type semiconductor block 211. When a voltage is applied between the p-type electrodes 214 an the n-type electrode 215, a light emitting phenomenon occurs at the bonding surface of the p-type semiconductor layers 213 and the n-type semiconductor block 211, and this emitted light is radiated to the outside through the surface of the p-type semiconductor layers 213.

The following is an explanation of the manufacturing process for manufacturing the LED array 200 in the seventh embodiment illustrated in FIG. 33. FIGS. 33 through 44 illustrate individual steps in the manufacturing process for manufacturing the LED array 200. In these figures, (a) presents a top view and (b) presents a cross section through line A–A' in (a). In addition, FIG. 41(c) is a cross section through line B–B' in FIG. 41(a) and FIG. 43(c) is a cross section through line B–B' in FIG. 43(a).

Figure 35:
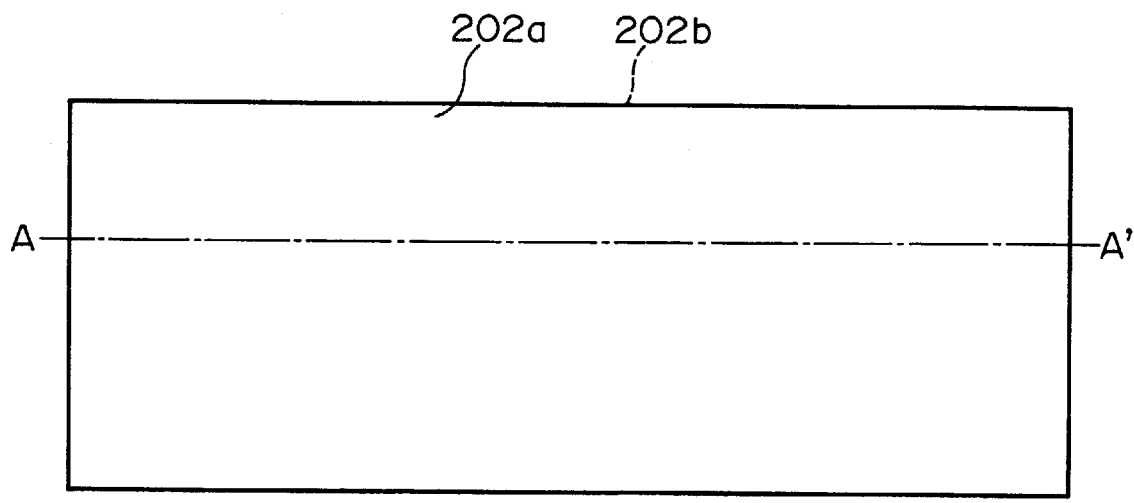
FIG. 35 illustrates a step in the process of manufacturing the LED array in the seventh embodiment of the present invention.
Figure 35:
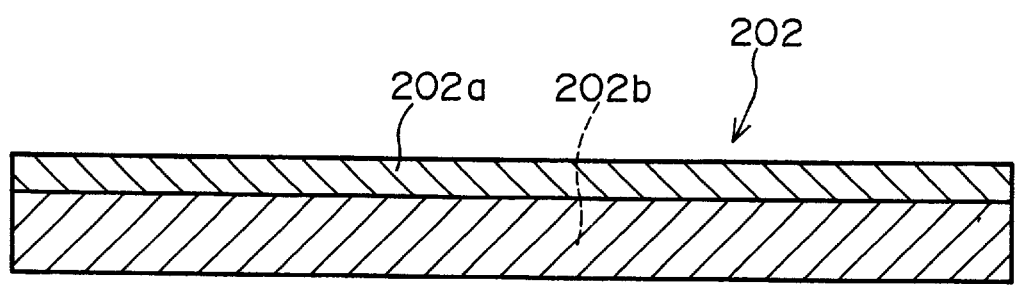

First, as shown in FIG. 35, the semiconductor substrate 202 constituted by providing the n-type semiconductor substrate 202a on the high resistance semiconductor substrate 202b is prepared. In this example, a semi-insulating GaAs substrate is employed to constitute the high resistance semiconductor substrate 202b. In addition, an n-type AlGaAs layer is formed through epitaxial growth on the semi-insulating GaAs substrate, and this AlGaAs epitaxial layer is used as the n-type semiconductor substrate 202a. The thickness of the n-type semiconductor substrate 202a (n-type epitaxial layer) may be, for instance, approximately 3 micro-meter.

Figure 36:
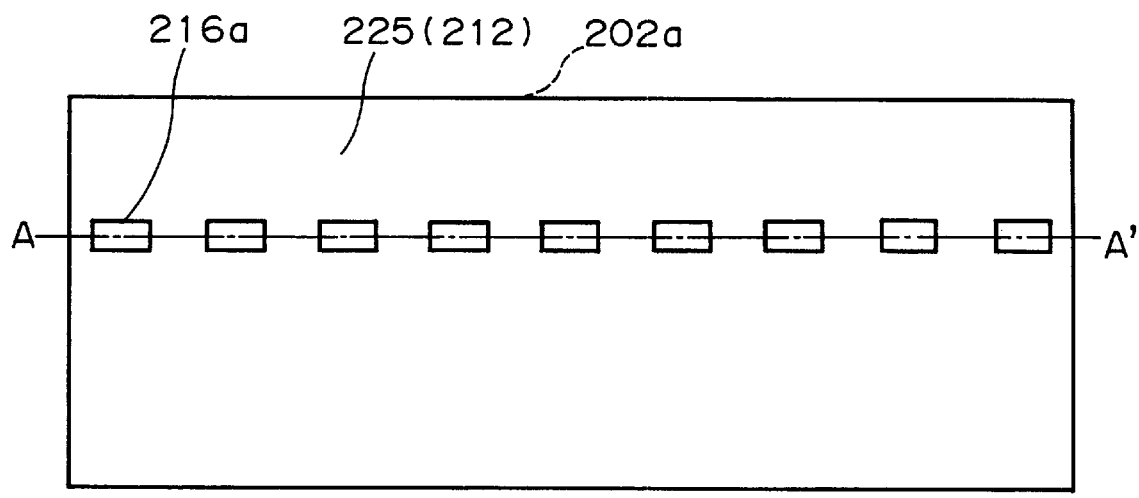
FIG. 36 illustrates a step in the process of manufacturing the LED array in the seventh embodiment of the present invention, which follows the step illustrated in FIG. 35.
Figure 36:
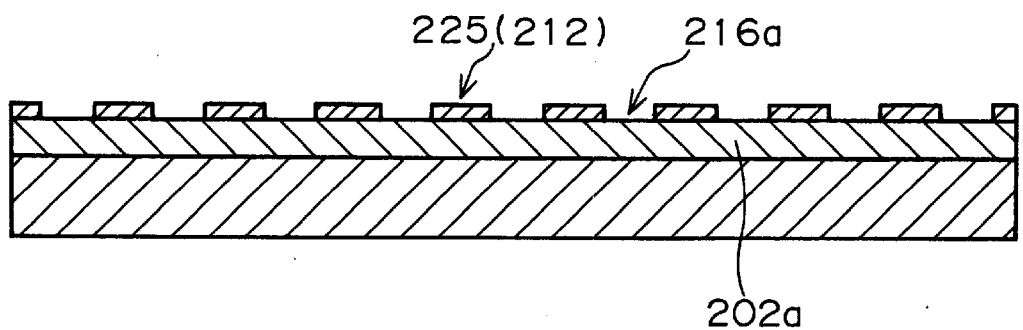

Next, as illustrated in FIG. 36, the first layer insulating film 212 which is to constitute a diffusion mask 225 is formed at a surface of the n-type semiconductor substrate 202a, and the first layer insulating film 212 is patterned through photolithography and etching to form the first opening portions 216a and the diffusion mask 225. A SiN film, for instance, may be used to constitute the first layer insulating film 212 (diffusion mask 225). The SiN film is formed through the CVD method, and its film thickness may be, for instance, 500–3000 angstrom.

Figure 37:
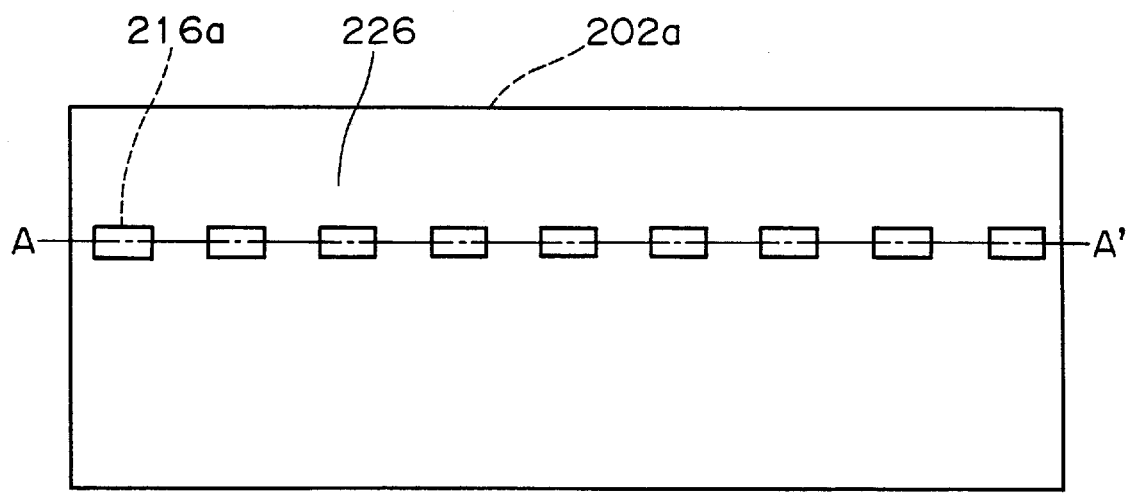
FIG. 37 illustrates a step in the process of manufacturing the LED array in the seventh embodiment of the present invention, which follows the step illustrated in FIG. 36.
Figure 37:
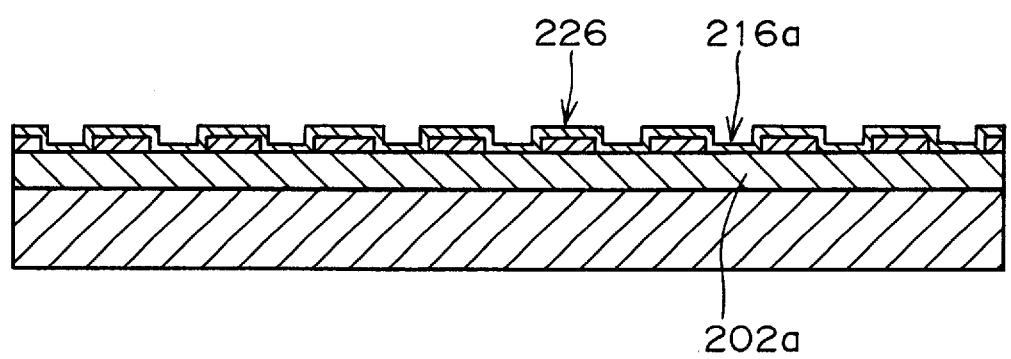
Figure 38:
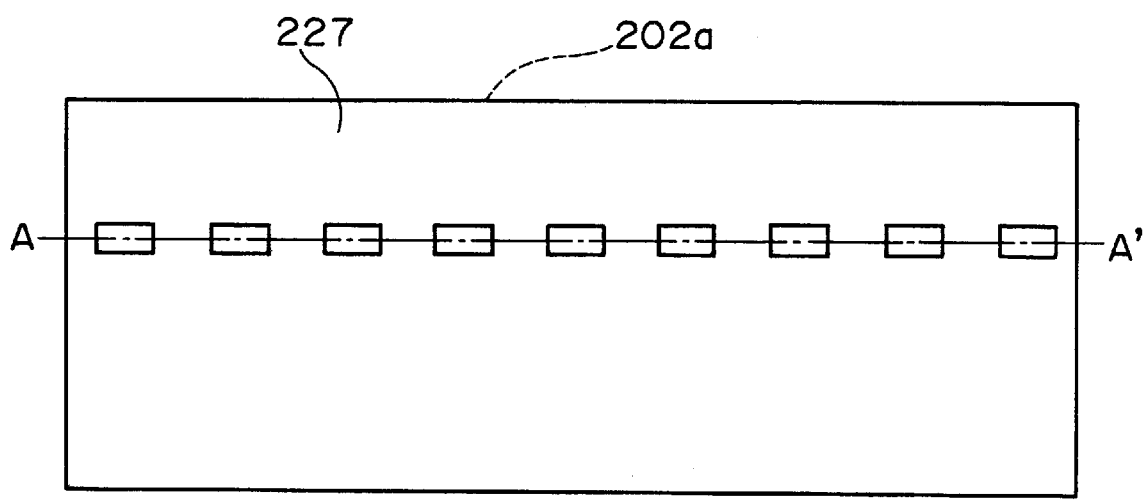
FIG. 38 illustrates a step in the process of manufacturing the LED array in the seventh embodiment of the present invention, which follows the step illustrated in FIG. 37.
Figure 38:
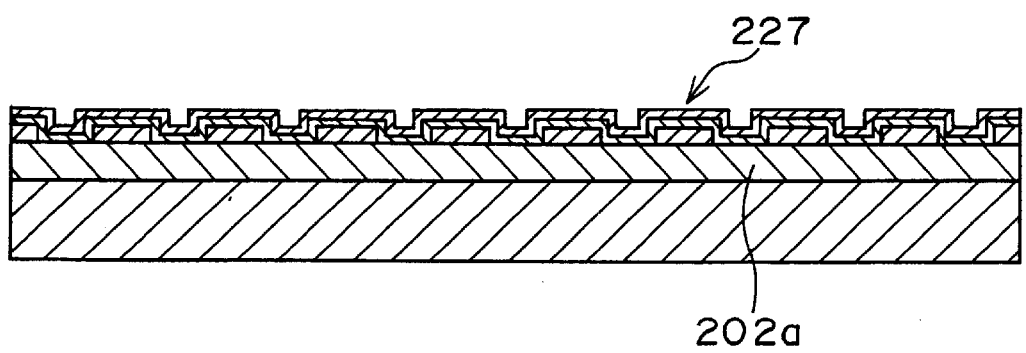
Figure 39:
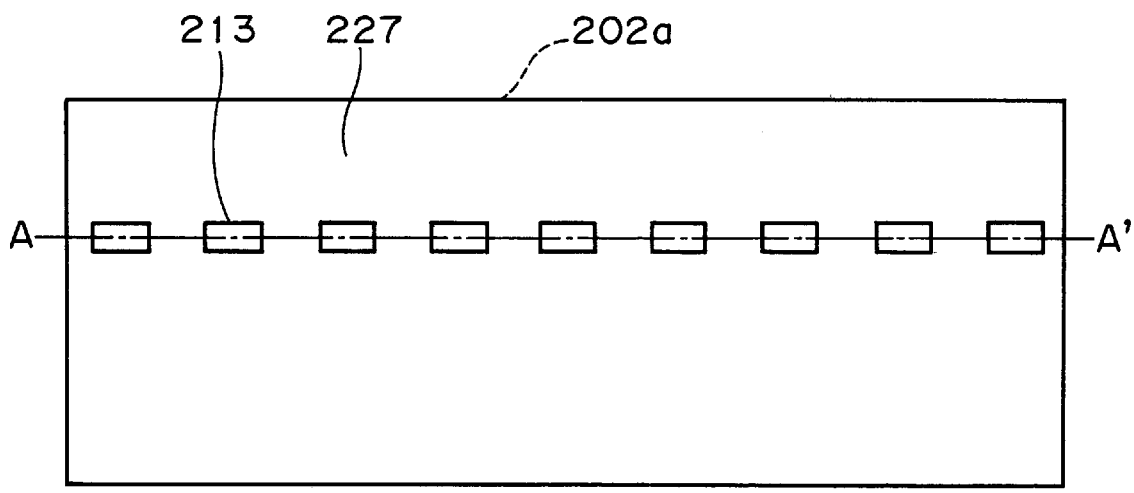
FIG. 39 illustrates a step in the process of manufacturing the LED array in the seventh embodiment of the present invention, which follows the step illustrated in FIG. 38.
Figure 39:
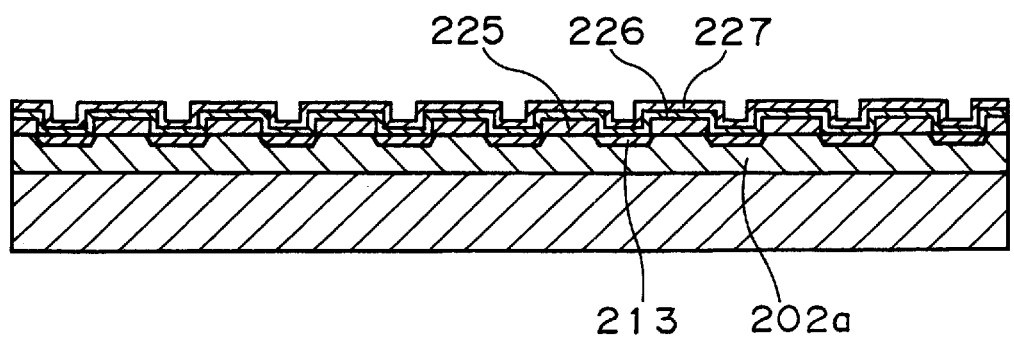

Then, as illustrated in FIGS. 35 through 37, the p-type semiconductor layers 213 are formed at the n-type semiconductor substrate 202a, by adopting an Zn solid phase diffusion method in this embodiment. Namely, after the formation of the first opening portions 216a is completed, a Zn diffusion source film 226 is formed at the surface of the n-type semiconductor substrate 202a, and an anneal cap film 227 is formed over the Zn diffusion source film 226. A ZnO—SiO$_2$, compound film, for instance, may be formed to constitute the Zn diffusion source film 226. This ZnO—SiO$_2$, compound film is achieved by mixing zinc oxide (ZnO) and silicon oxide (SiO$_2$) at a ratio of 1:1 and is formed through sputtering. An aluminum nitride (AlN) film formed through, for instance,sputtering, may be used to constitute the anneal cap film 227. The thickness of the ZnO—SiO$_2$ compound film may be approximately 500–3000 angstrom and the film thickness of the SiN film, too, may be set at approximately 500–3000 angstrom.

Next, high temperature annealing is implemented on the n-type semiconductor substrate 202a where the anneal cap film 227 has been formed, to diffuse Zn from the Zn diffusion source film 226 into the n-type semiconductor substrate 202a. Since, while Zn becomes diffused into the n-type semiconductor substrate 202a at the first opening portions 216a, Zn is not diffuse in the area where the diffusion mask 225 is formed, the p-type semiconductor layers 213 are selectively formed in the areas that correspond to the first opening portions 216a of the n-type semiconductor substrate 202a. The high temperature annealing should be performed at an annealing temperature of 700° C. in a nitrogen environment, for instance, for two hours. Under these annealing conditions, the p-type semiconductor layers 213 having a depth of approximately 1 micro-meter and a surface Zn concentration of $10^{20}$ cm$^3$ are formed. Since the thickness of the n-type semiconductor substrate 202a is approximately 3 micro-meter as mentioned earlier, the depth of the p-type semiconductor layers is smaller than the thickness of the n-type semiconductor substrate 202a. It is to be noted that the anneal cap film 227 prevents Zn from becoming diffused into an annealing atmosphere.

Figure 40:
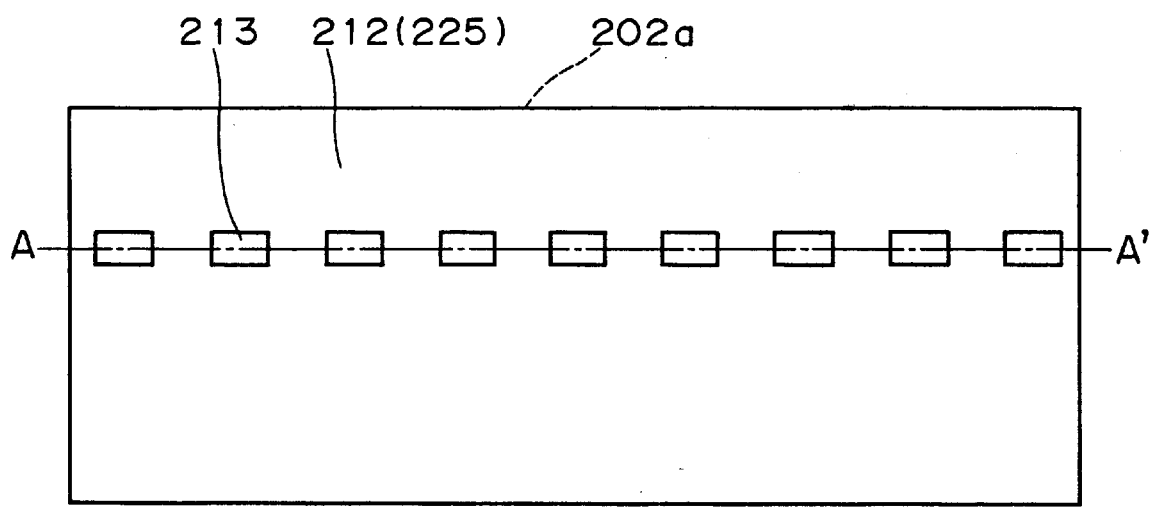
FIG. 40 illustrates a step in the process of manufacturing the LED array in the seventh embodiment of the present invention, which follows the step illustrated in FIG. 39.
Figure 40:
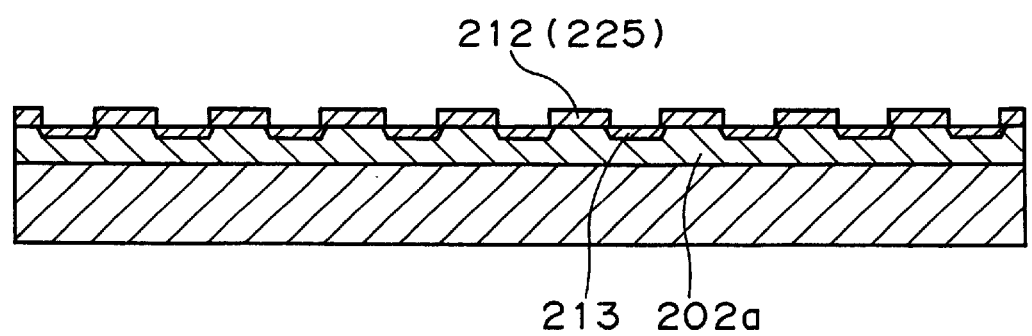
Figure 41:
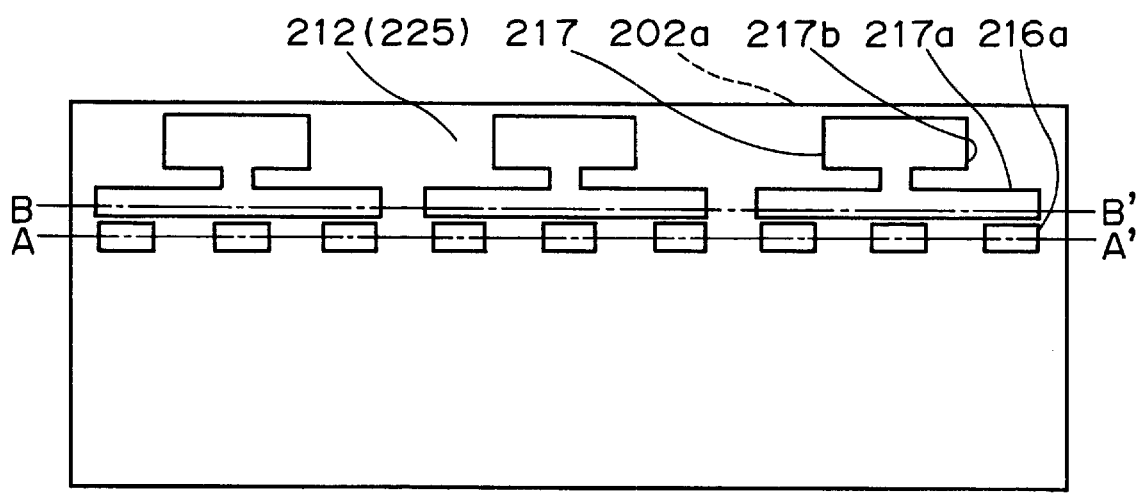
FIG. 41 illustrates a step in the process of manufacturing the LED array in the seventh embodiment of the present invention, which follows the step illustrated in FIG. 40.
Figure 41:
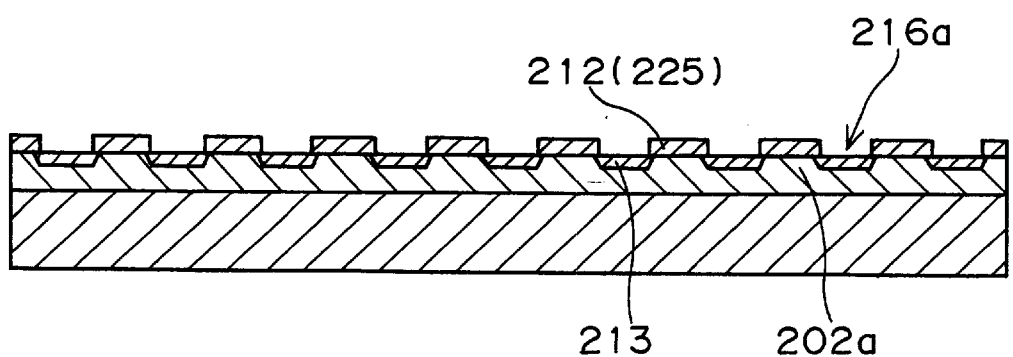
Figure 41:
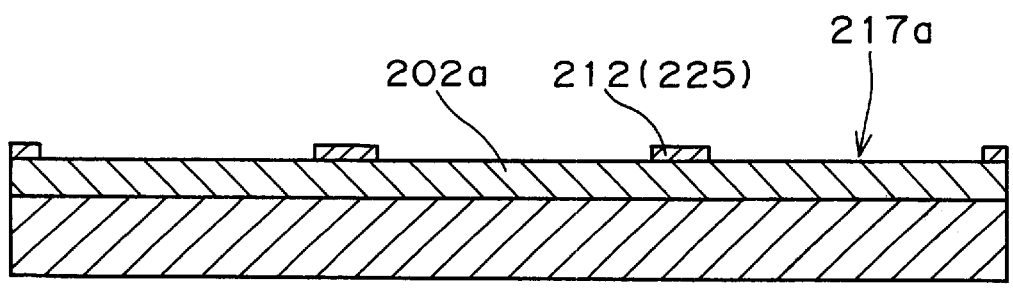

Next, as illustrated in FIG. 40, the diffusion source film 226 and the anneal cap film 227 formed at the surface of the n-type semiconductor substrate 211a where the formation of the p-type semiconductor layers 213 has been completed are completely removed by employing, for instance, a selective wet etching method, leaving only the first layer insulating film 212 (diffusion mask 225).

Then, as illustrated in FIG. 41,the n-side opening portions 217 are formed at the layer insulating film 212 through photolithography and etching at the n-type semiconductor substrate 202a where the removal of the diffusion source film 226 and the anneal cap film 227 has been completed. The n-side opening portions 217 are each constituted of a first contact opening portion 217a and a second contact opening portion 217b that are continuous to each other.

The first contact opening portions 217a are formed in anticipated formation areas for the n-type contact electrodes 215a and the second contact opening portions 217b are formed in anticipated formation areas for the n-type pad electrodes 215b. Thus, at the layer insulating film 212, the first opening portions 216a opening at the surface of the p-type semiconductor layers 213 and the n-side opening portions 217 that open at the anticipated formation areas for the n-side electrodes 215 (the n-type contact electrodes 215a and the n-side pad electrodes 215b) at the surface of the n-type semiconductor substrate 202a are formed.

Figure 42:
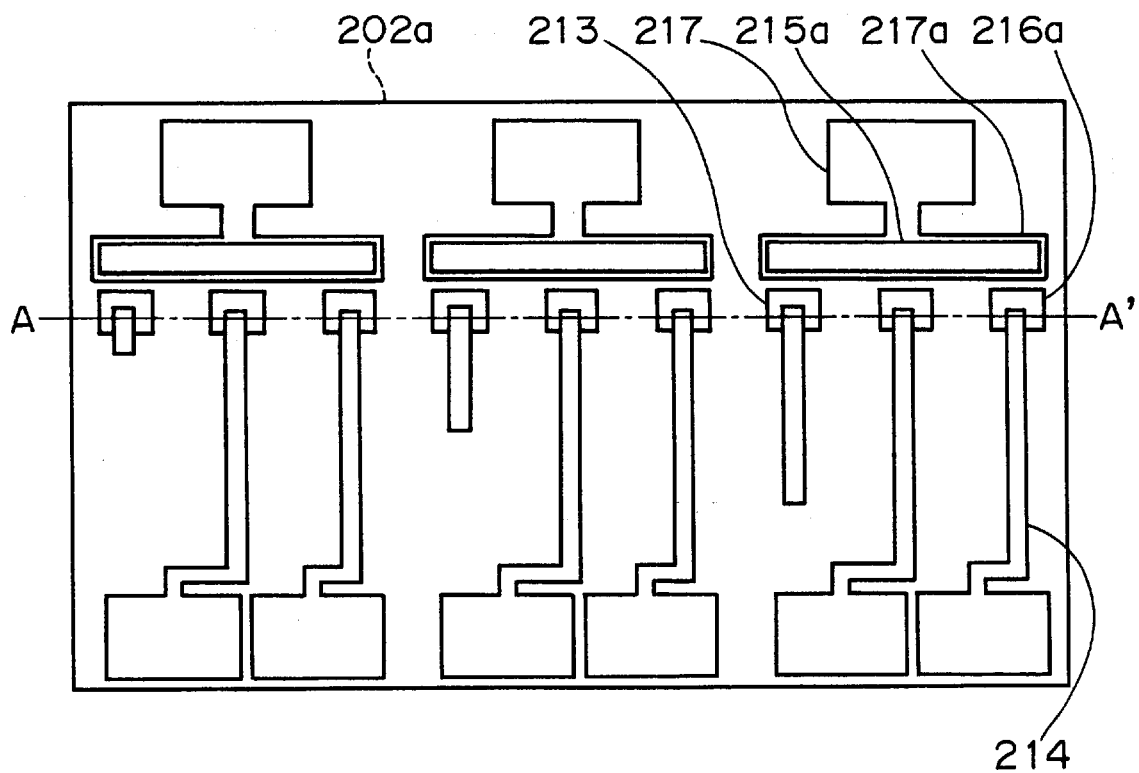
FIG. 42 illustrates a step in the process of manufacturing the LED array in the seventh embodiment of the present invention, which follows the step illustrated in FIG. 41.
Figure 42:
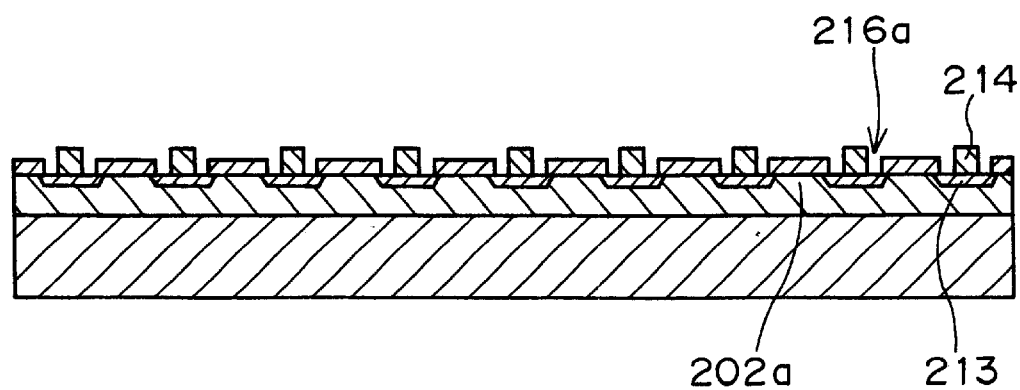
Figure 43:
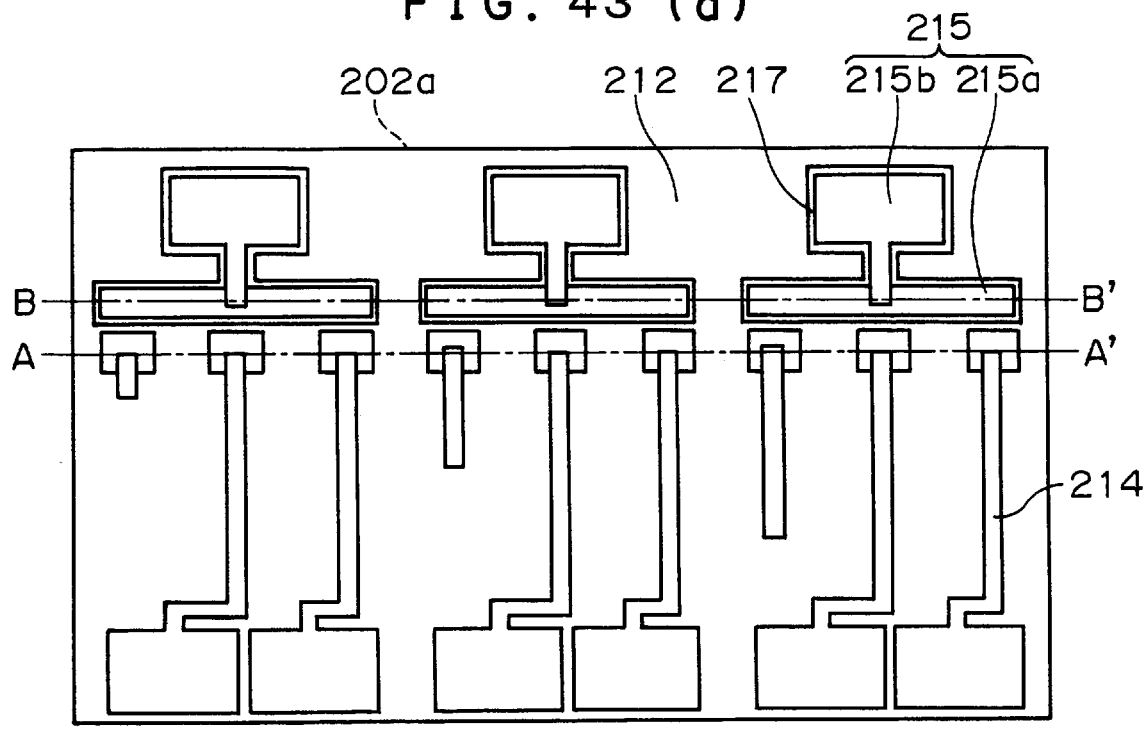
FIG. 43 illustrates a step in the process of manufacturing the LED array in the seventh embodiment of the present invention, which follows the step illustrated in FIG. 42.
Figure 43:
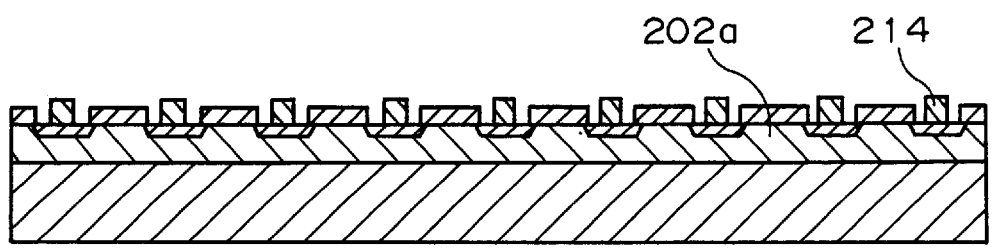
Figure 43:
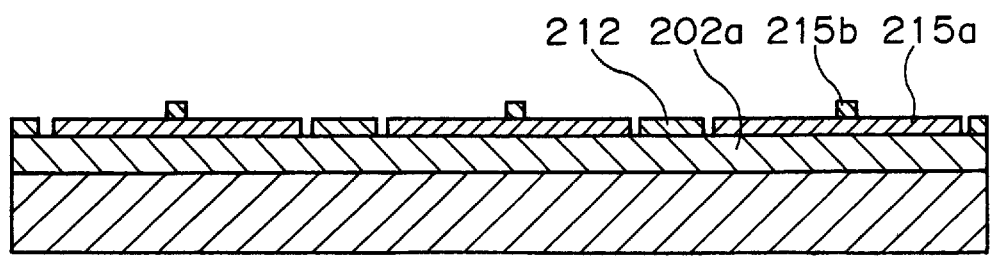

Next, as illustrated in FIG. 42, a conductive film that is to constitute the p-side electrodes 214 is formed at the surface of the n-type semiconductor substrate 202a where the formation of the n-side opening portions 217 has been completed, and the conductive film is patterned through a lift-off method to form the p-side electrodes 214. Namely, a photoresist pattern with areas other than anticipated formation areas for the p-side electrodes 214 are formed as a blank pattern, the conductive film that is to constitute the p-side electrodes 214 is formed over the entire upper surface of the photoresist pattern and the photoresist and the conductive film formed over it are lifted off to form the p-side electrodes 214. The p-side electrodes 214 are formed to partially overlap the surfaces of the p-side semiconductor layers 213 at the first opening portions 216a. An Au alloy film, for instance, should be used to form the conductive film for constituting the p-side electrodes 214.

Next, a conductive film that is to constitute the n-side contact electrodes 215a is formed over the entire surface of the n-type semiconductor substrate 202a where the formation of the p-side electrodes 214 has been completed, and this conductive film is patterned through a lift-off method to form the n-side contact electrodes 215a. The n-type contact electrodes 215a are formed within the first contact opening portions 217a of the n-side opening portions 217 and are connected with the n-type semiconductor substrate 202a. A conductive film that can achieve ohmic contact with the n-type semiconductor substrate 202a, e.g., an Au alloy film, is used to form the conductive film that is to constitute the n-type contact electrodes 215a. The Au alloy film as referred to in this context includes a laminated metal film and a laminated alloy film. Such an Au alloy film may be a laminated metal film comprising titanium (Ti), platinum (Pt) and Au laminated metal film (Ti/Pt/Au film), an AuGeNi/Au film, a laminated alloy film comprising an Au—Ge alloy film, an Ni film and an Au film (AuGe/Ni/Au film) or the like.

Next, as illustrated in FIG. 43, a conductive film that is to constitute the n-side pad electrodes 215b are formed at the n-type semiconductor substrate 202a where the formation of the n-type contact electrodes 215a has been completed, and the conductive film is patterned through a lift-off method to form the n-side pad electrodes 215b. The n-side pad electrodes 215b, which are formed within the second contact opening portions 217b of the n-side opening portions 217 are formed to partially overlap the n-side contact electrodes 215a at the first contact opening portions 217a. Each set of an n-side contact electrode 215a and the corresponding n-side pad electrode 215b constitutes an n-side electrode 215 having a laminated structure. An Au alloy film may be used to form the conductive film for constituting the n-side pad electrodes 215b.

Thus, the method for manufacturing the LED array 200 differs from methods for manufacturing LED arrays in the prior art in that, the n-side opening portions 217 are provided in the areas that contain the anticipated formation areas for the n-side pad electrodes 215b as well as the anticipated formation areas for the n-side contact electrodes 215a (see FIG. 41) and that the n-side pad electrodes 215b are formed and bonded at the surface of the n-type semiconductor substrate 202a instead of on the layer insulating film 212 (see FIG. 43). While the n-side pad electrodes formed on the layer insulating film sometimes become peeled off, as in the prior art, such peeling of the n-side pad electrodes 215b can be prevented by forming the n-side pad electrodes 215a on the n-type semiconductor substrate 202a that achieves a high degree of bonding with the conductive film that is to constitute the n-side contact electrodes 215a as in the LED array 200.

Figure 44:
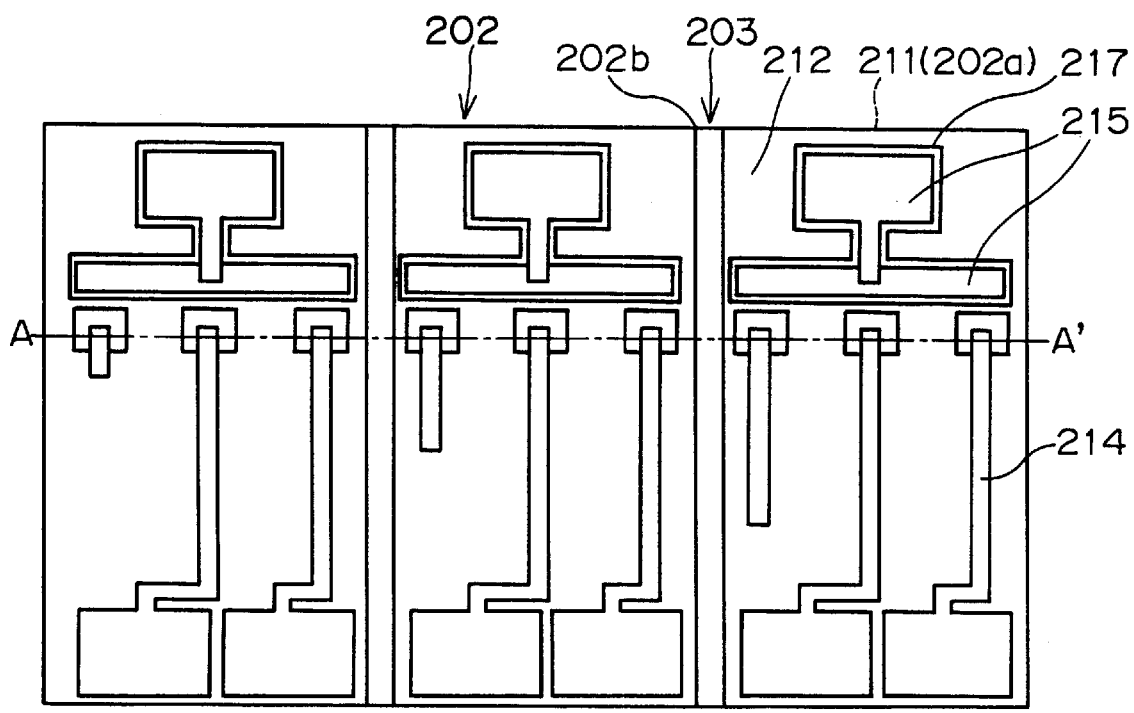
FIG. 44 illustrates a step in the process of manufacturing the LED array in the seventh embodiment of the present invention, which follows the step illustrated in FIG. 43.
Figure 44:
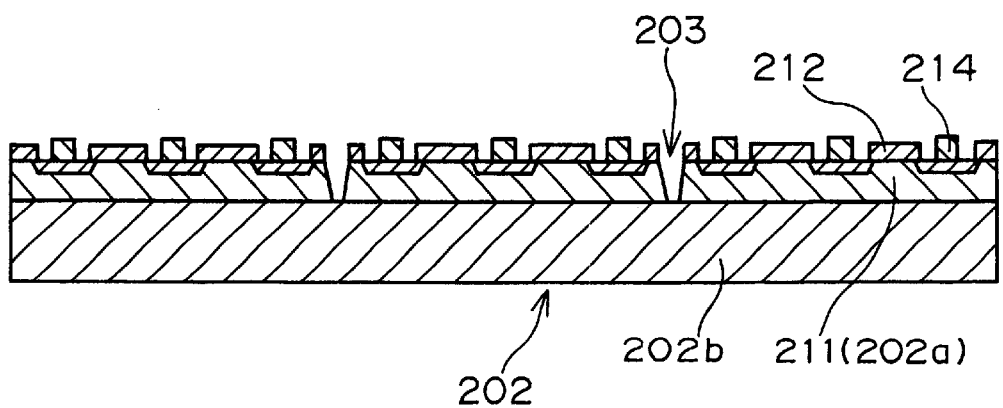

Next, as illustrated in FIG. 44, the separating grooves 203 that extend to the high resistance semiconductor substrate 202b are formed at the n-type semiconductor substrate 202a where the formation of the n-side electrodes 215 has been completed to divide the n-type semiconductor substrate 202a into a plurality of n-type semiconductor blocks 211. In other words, the first layer insulating film 212 formed in anticipated separating groove formation areas and the n-type semiconductor substrate 202a underneath are etched through photolithography and etching to expose the high resistance semiconductor substrate 202b. Thus, the n-type semiconductor blocks 211 are electrically isolated from one another by the separating grooves 203 and the high resistance semiconductor substrate 202b. The depth of the separating grooves 203 should be set at, for instance, approximately 3.5 micro-meter when the thickness of the n-type semiconductor blocks 211 (n-type semiconductor substrate 202a) is set at approximately 3 micro-meter and the first layer insulating film 212 is formed to have a film thickness of approximately 500–3000 angstrom. In addition, the width of the separating grooves 203 is subject to restriction imposed by the distance between the p-type semiconductor layers 213. In an LED array with a resolution of 1200 DPI, the pitch dimension of the p-type semiconductor layers 113 is approximately 21 micro-meter, and thus, the width of the separating grooves 203 must be less than 13 micro-meter when the width of the p-type semiconductor layers 213 is approximately 8 micro-meter.

Figure 45:
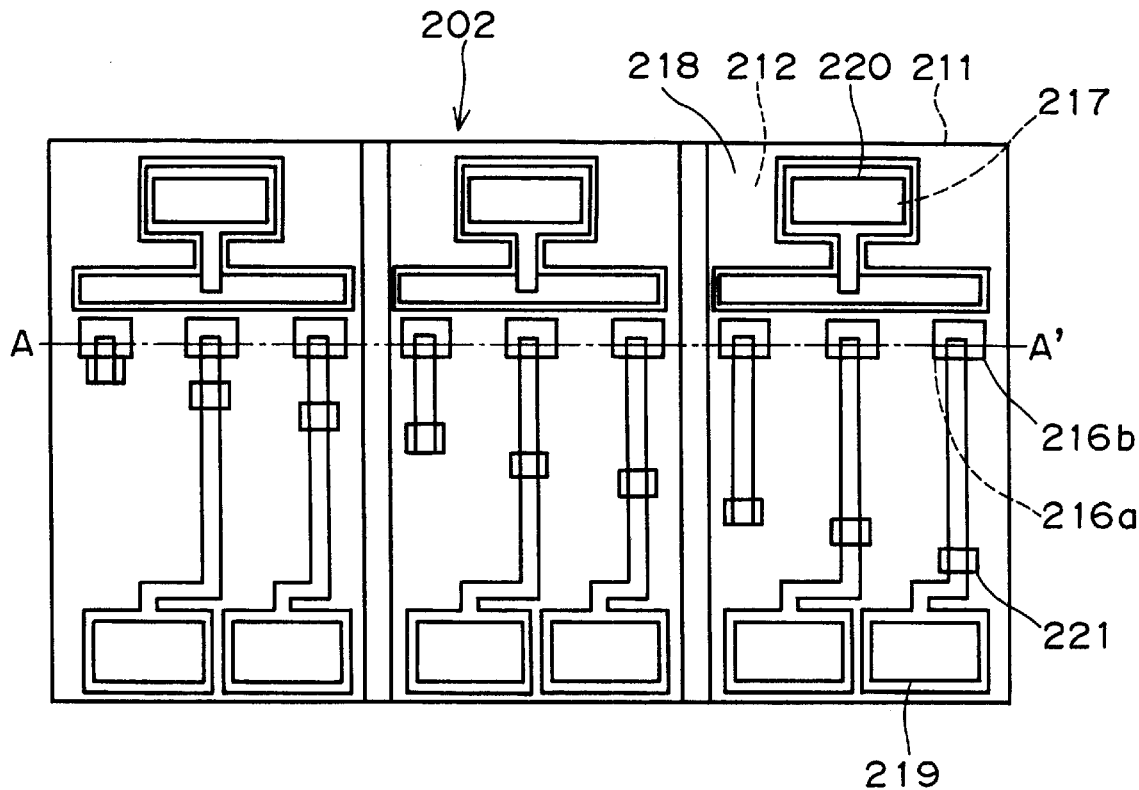
FIG. 45 illustrates a step in the process of manufacturing the LED array in the seventh embodiment of the present invention, which follows the step illustrated in FIG. 44.
Figure 45:
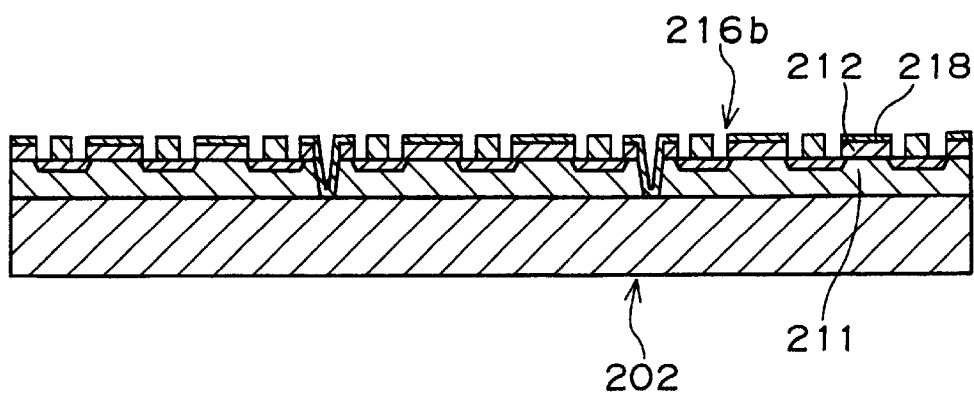

Then, as illustrated in FIG. 45, the second layer insulating film 218 is formed over the entire surface of the semiconductor substrate 202 where the formation of the separating grooves 203 has been completed, and the second opening portions 216b opening over almost the same areas as the first opening portions 216a, the p-side opening portions 219 opening at the pad electrode portions of the p-side electrodes 214, the n-side pad opening portions 220 opening at the n-side pad electrodes 215b and the via holes 221 reaching the p-side electrodes 214 are formed in the second layer insulting film 218. A polyimide film, for instance, may be used to constitute the second layer insulating film 218. The polyimide film may be formed and patterned as described below by using polyimide that dissolves in a photoresist developing solution (alkaline solution). A polyimide source is spin coated onto the semiconductor substrate 202 (wafer) and pre-baking is performed at a temperature of approximately 100° C. Next, a photoresist is spin coated over the polyimide film that has been pre-baked and exposure is performed on the photoresist in such a manner that the opening portions and the via holes 221 described above constituted an blank pattern. When developing the photoresist, the areas covered with the polyimide film where the resist is not formed, are also removed to pattern the polyimide film. Then, the remaining resist is peeled and the patterned polyimide film is baked at a temperature of approximately 350° C.

Figure 46:
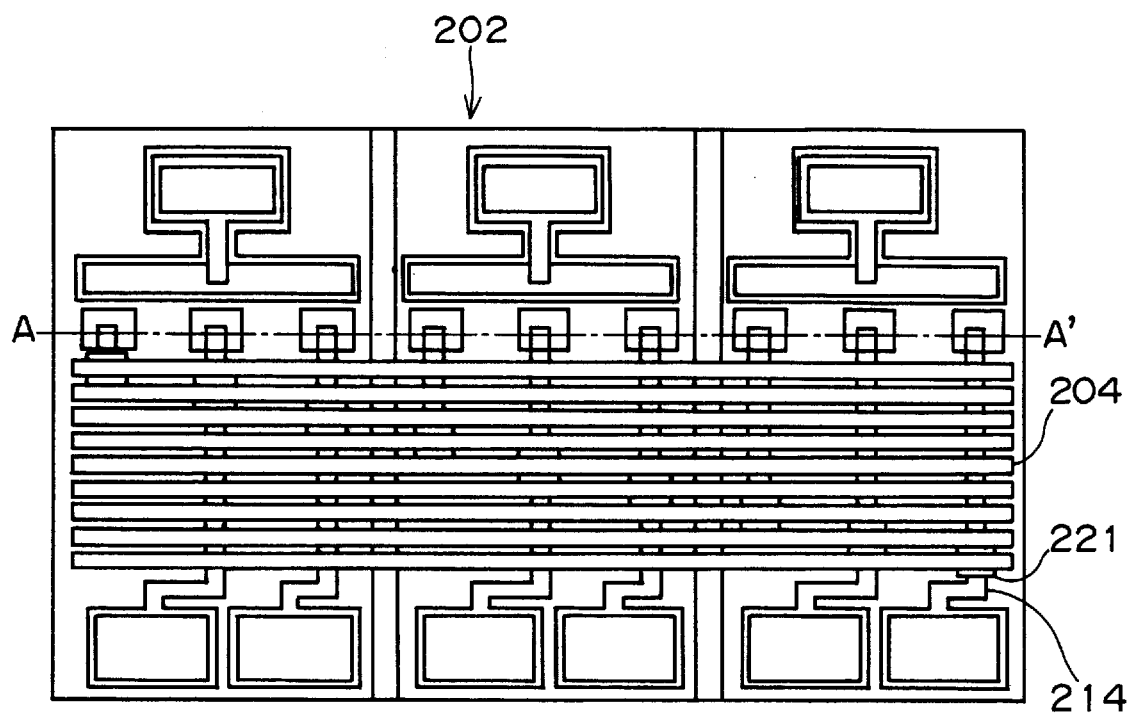
FIG. 46 illustrates a step in the process of manufacturing the LED array in the seventh embodiment of the present invention, which follows the step illustrated in FIG. 45.
Figure 46:
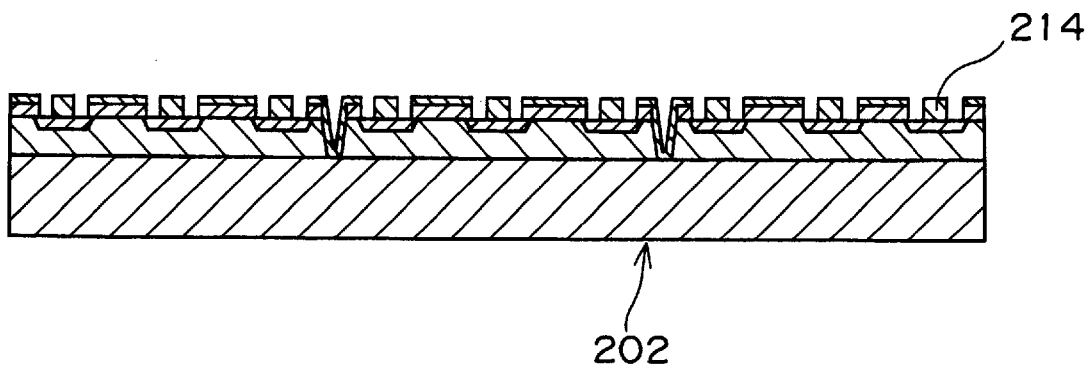

Finally, as illustrated in FIG. 46, a conductive film that is to constitute the p-side common wirings 204 is formed over the entire surface of the semiconductor substrate 202 where the patterning of the second layer insulating film 218 has been completed and the conductive film is patterned through a lift-off method to form the p-side common wirings 204. An Al film, for instance, may be used to constitute the conductive film for forming the p-type common wirings 204. It is obvious, however, that a material other than an Al film may be used to constitute the conductive film for forming the p-side common wirings 204, as long as the material can achieve ohmic contact with the p-side electrodes 214 and does not cause disconnection at the connecting portions. Through the steps described above, the LED array 200 illustrated in FIG. 33 is manufactured.

Now, a brief explanation is given on the operation of the LED array 200. The n-type semiconductor blocks 211 are assigned with reference numbers 211-1, 211-2, 211-3 . . . starting from the right side in FIG. 33. In addition, within each n-type semiconductor block 211, the individual LEDs 210 are assigned with reference numbers 210-1, 210-2, 210-3 from the right side in FIG. 33, the individual n-side electrodes 214 are assigned with reference numbers 214-1, 214-2, 214-3 starting from the right side in FIG. 33 and the individual p-side pad electrodes 214b are assigned the reference numbers 214b-1, 214b-2 starting from the right side in FIG. 33. In addition, the individual p-side common wirings 204 are assigned with reference numbers 204-1, 204-2 . . . 204-9 starting from the bottom side in FIG. 33.

In the n-type semiconductor block 211-1, the p-side electrode 214-1 is connected to the p-side common wirings 204-1, the p-side electrode 214-2 is connected to the p-side common wirings 204-2 and the p-side electrode 214-3 is connected to the p-side common wirings 204-3. In the n-type semiconductor block 211-2, the p-side electrode 214-1 is connected to the p-side common wirings 204-4 and in the n-type semiconductor block 211-3, the n-side electrode 214-1 is connected to the p-side common wirings 204-7. Furthermore, in the n-side semiconductor block 211-4 (not shown), the p-side electrode 214-1 is connected to the p-side common wirings 204-1, the p-side electrode 214-2 is connected to the p-side matrix wirings 204-2 and the p-side electrode 214-3 is connected to the p-side common wirings 204-3 as in the n-type semiconductor block 211-1.

In each of the n-type semiconductor blocks 211-1–211-3, the p-side electrode 214-1 and the p-side electrode 214-2 are each provided with a p-side pad electrode.

For instance, in order to light the LED 210-1 at the n-type semiconductor block 211-1, a voltage must be applied between the p-side electrode 214-1 (its p-side pad electrode 214b-1) at the n-type semiconductor block 211-1 and the n-side electrode 215 (its n-side pad electrode 215b) of the n-type semiconductor block 211-1. At this point, the LED 210-1 of the n-type semiconductor block 211-4 (not shown) can be lit at the same time by setting the potential of the n-side electrode 215 of the n-type semiconductor block 211-4 equal to the potential at the n-side electrode 215 of the n-type semiconductor block 211-1, since the p-side electrode 214-1 of the n-type semiconductor block 211-4 is connected to the p-side electrode 214-1 of the n-type semiconductor block 211-1 through the p-side common wirings 204-1. The LED 210-1 of the n-type semiconductor block 211-4 can be left unlit while the LED 210-1 of the n-type semiconductor block 211-1 is lit by setting the n-side electrode 215 of the n-type semiconductor block 211-4 in an open state.

In addition, the LED 210-3 of the n-type semiconductor block 211-1 is lit by applying a voltage between a p-side electrode 214 of another n-type semiconductor block 211 that is connected to the p-side common wirings 204-3 and is provided with a p-side pad electrode 214b, e.g. the p-side electrode 214-3 of the n-type semiconductor block 211-4 (not shown), and the n-side electrode 215 of the n-type semiconductor block 211-1.

Thus, in the seventh embodiment, the peeling of the n-side pad electrodes is prevented by providing the opening portions 217 in the anticipated formation areas for the n-side electrodes 215 that contain the n-side pad electrodes 215b, forming the n-side electrodes 215 within the opening portions 217 and forming and bonding the n-side pad electrodes 215b at the surface of the n-type semiconductor blocks 211 instead of on the layer insulating film 212, to achieve an LED array that realizes a high yield.

Figure 34:
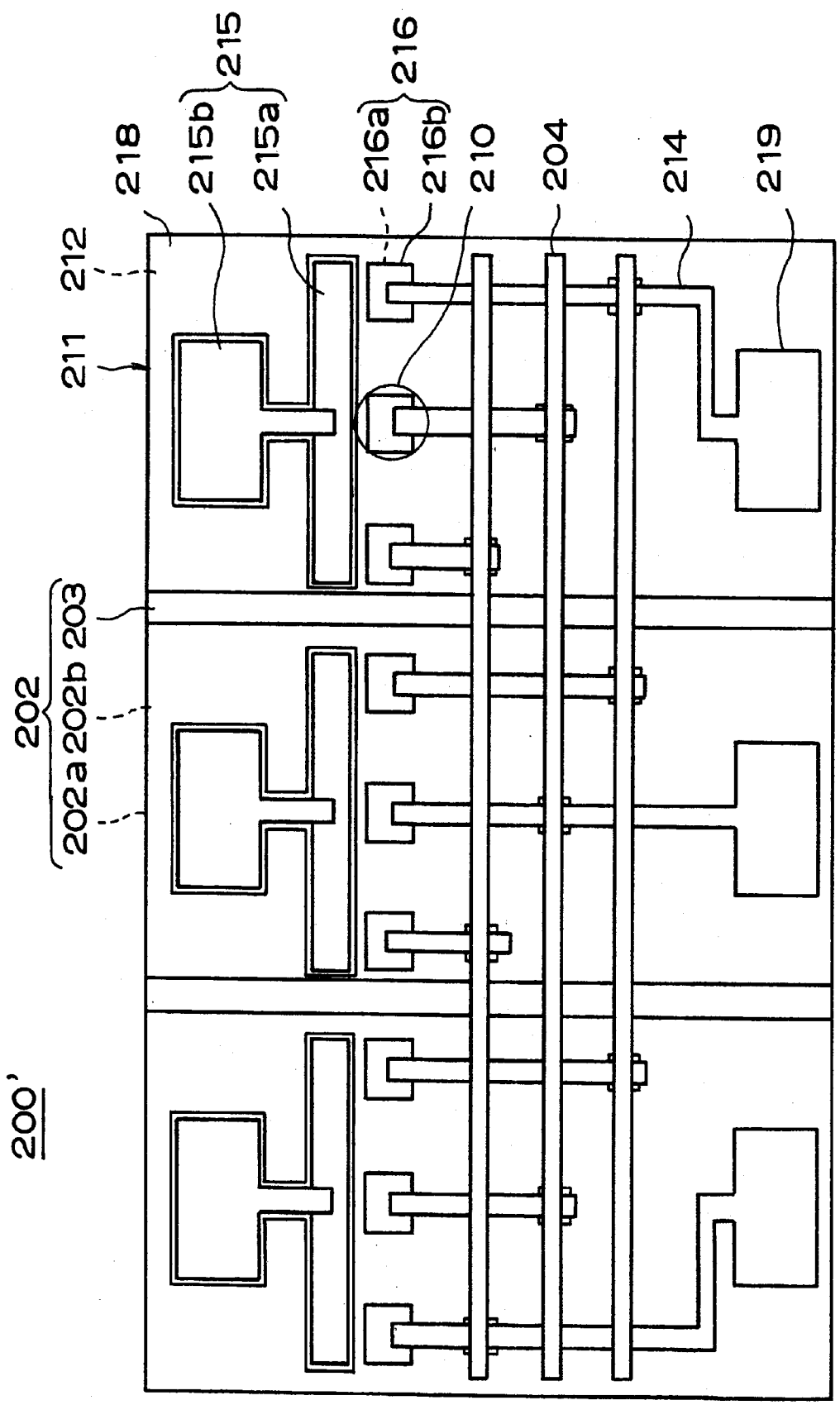
FIG. 34 illustrates another version of the seventh embodiment of the present invention illustrated in FIG. 33.

In the above embodiment, the structure of LED array 200 which has two p-side electrodes 219 in each n-type semiconductor block 211 is disclosed. The present invention, however, is not limited to such structure. The number of p-side electrodes is freely selected according to the design of the LED array. For, example, as illustrated in FIG. 34, the structure of LED array 200' which has single p-side electrode 219 in each n-type semiconductor block 211 is properly applied to the present invention.

(Eighth Embodiment)

Figure 47:
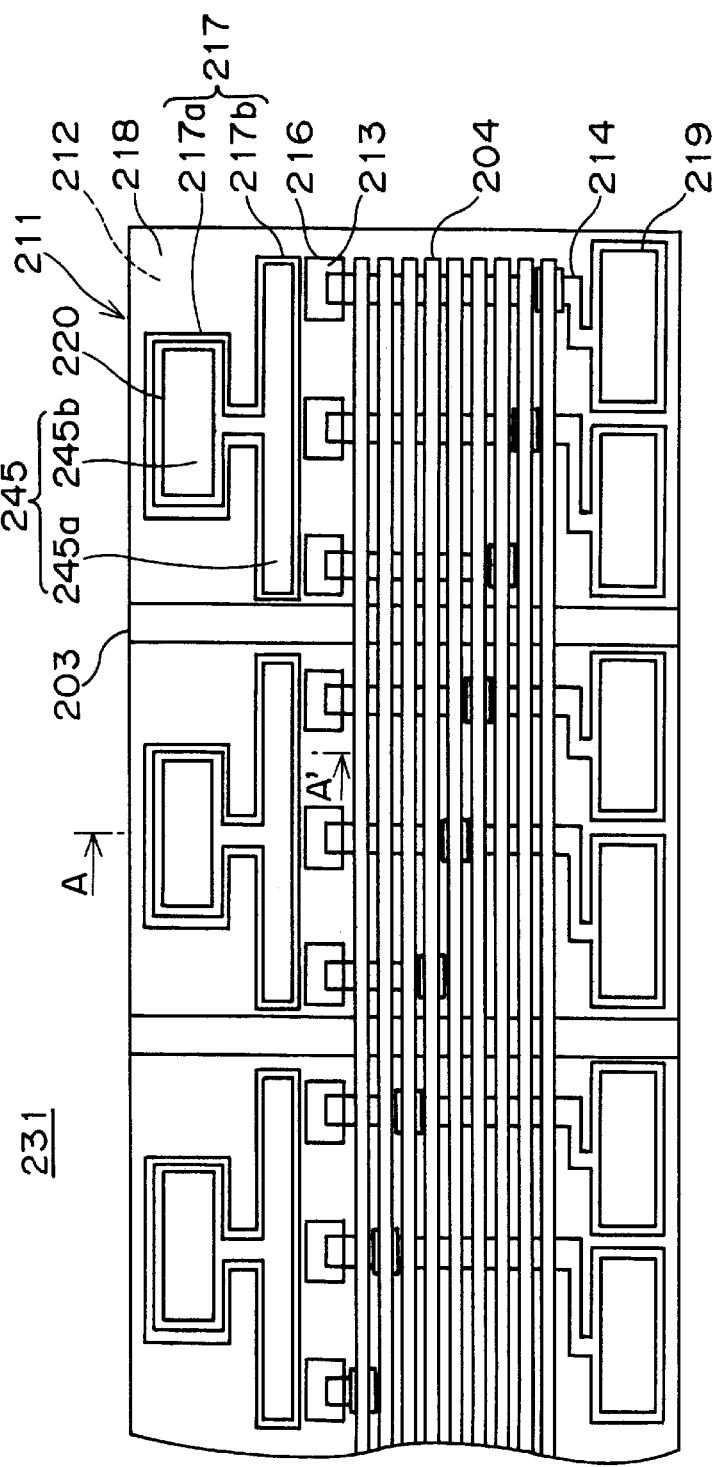
FIG. 47 illustrates the structure of the LED array in an eighth embodiment of the present invention.
Figure 47:
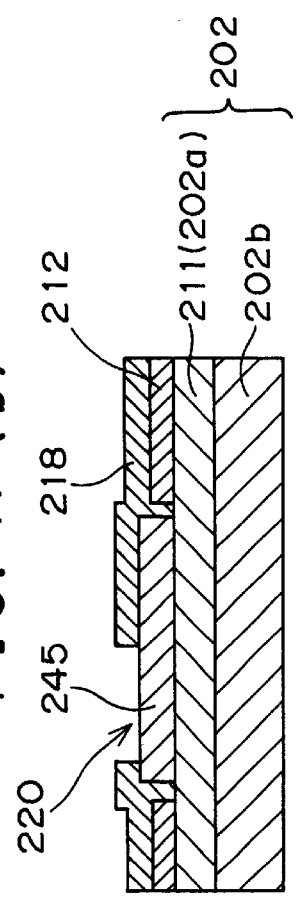

FIG. 47 illustrates the structure of an LED array 231 in the eighth embodiment of the present invention, with FIG. 47(*a*) presenting its top view and FIG. 47(*b*) presenting a cross section through line A–A' in FIG. 47(*a*). It is to be noted that in FIG. 47, the same reference numbers are assigned to components having essentially the same functions and structural features as those shown in FIG. 33. The LED array 231 is constituted by replacing the n-side electrodes 215 in the LED array 200 in the seventh embodiment illustrated in FIG. 33 with n-side electrodes 245.

The LED array 231 is characterized in that its n-side electrodes 245 adopt a single-layer structure. The n-side electrodes 245 are each constituted of an n-side contact electrode 245*a* formed within a first contact opening portion 217*a* of an n-side opening portion 217 and an n-side pad electrode 245*b* formed within a second contact opening portion 217*b* of the n-side opening portion 217. The n-side electrodes 245 adopting the single-layer structure are formed by forming a conductive film that is to constitute the n-side contact electrodes 245*a* and the n-side pad electrodes 245*b* and patterning this conductive film. The entirety of each n-side electrode 245 having the single-layer structure is formed within the n-side opening portion 217 bonded with the n-type semiconductor block 211 and is in ohmic contact with the n-type semiconductor block 211. A conductive film that can achieve ohmic contact to the n-type semiconductor blocks 211 such as an Au alloy film, may be used to constitute the n-side electrodes 245. It is to be noted that the operation of the LED array 231 is essentially identical to that of the LED array 200 in the seventh embodiment.

Thus, in the eighth embodiment, the peeling of the n-side pad electrodes is prevented by providing the opening portions 217 in the anticipated formation areas for the n-side electrodes 245 that contain the n-side pad electrodes 245*b*, forming the n-side electrodes 245 within the opening portions 217 and forming and bonding the n-side pad electrodes 245*b* at the surface of the n-type semiconductor blocks 211 instead of on the layer insulating film 212, to achieve an LED array that realizes superior yield.

In addition, by adopting a single-layer structure for the n-side electrodes 245, it becomes possible to form the n-side contact electrodes 245*a* and the n-side pad electrodes 245*b* through essentially one and the same process (the process for forming the conductive film and its patterning), thereby achieving simplification in the manufacturing method, and consequently, an LED array is achieved at a lower cost compared to that required in the first embodiment.

Figure 48:
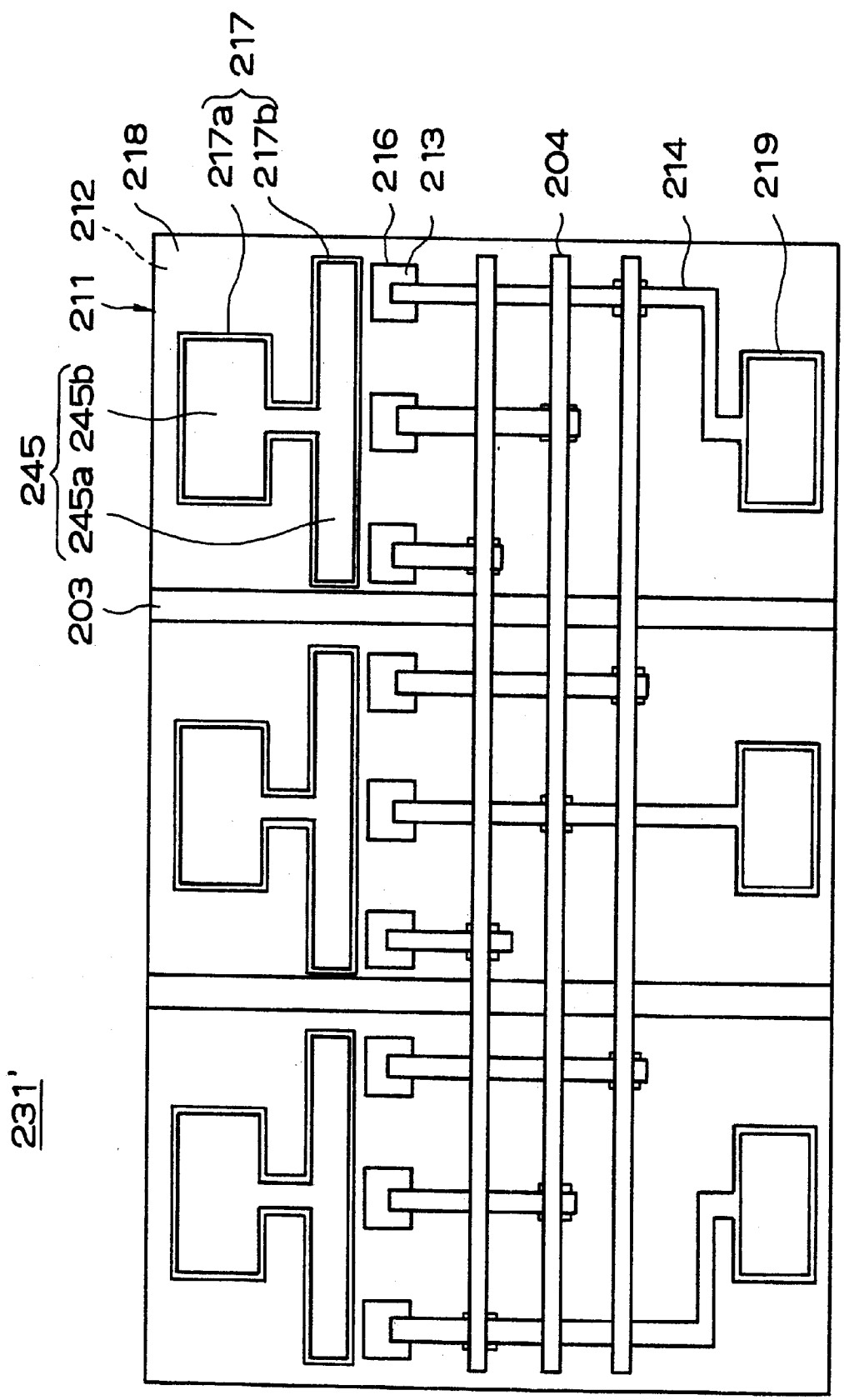
FIG. 48 illustrates another version of the eighth embodiment of the present invention illustrated in FIG. 47.

In the above embodiment, the structure of LED array 231 which has two p-side electrodes 219 in each n-type semiconductor block 211 is disclosed. The present invention, however, is not limited to such structure. The number of p-side electrodes is freely selected according to the design of the LED array. For, example, as illustrated in FIG. 48, the structure of LED array 231' which has single p-side electrode 219 in each n-type semiconductor block 211 is properly applied to the present invention.

(Ninth Embodiment)

Figure 49:
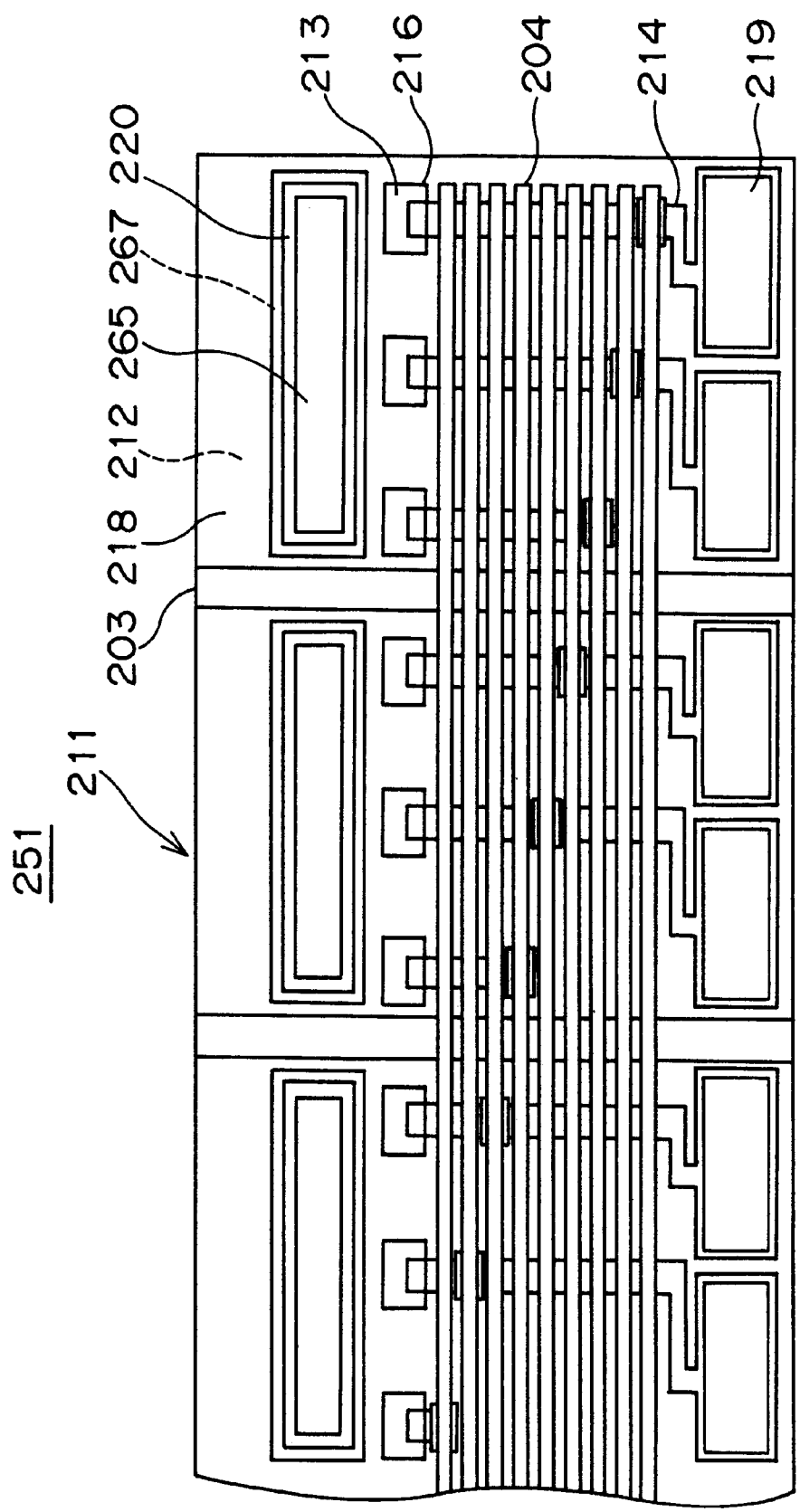
FIG. 49 is a top view illustrating the structure of the LED array in a ninth embodiment of the present invention.

FIG. 49 is a top view illustrating the structure of an LED array 251 in the ninth embodiment of the present invention. It is to be noted that in FIG. 49, the same reference numbers are assigned to components having essentially the same functions and structural features as those illustrated in FIGS. 32 and 45. The LED array 251 in the ninth embodiment is constituted by replacing the n-side electrodes 215 and the n-side opening portions 217 in the LED array 200 illustrated in FIG. 33 with n-side electrodes 265 and n-side opening portions 267 respectively.

The LED array 251 is characterized in that flat planar shapes of the n-side electrodes 265 and the n-side opening portions 267 achieve simple graphic forms and that the n-side electrodes 265 adopt a single-layer structure. The simple graphic shapes in this context refer to polygons whose internal angles are all set at less than 180°, circles or ovals. In this example, the n-side electrodes 265 and the n-side opening portions 267 are formed in quadrangular shapes. The n-side electrodes 265 are formed and bonded at the n-type semiconductor blocks 211 within the n-side opening portions 267 and are in ohmic contact with the n-type semiconductor blocks 211. The n-side electrodes 265 each function as an n-side contact electrode and an n-side pad electrode as a whole, without being divided into an n-side contact electrode and an n-side pad electrode, as is the case with the n-side electrodes 245 illustrated in FIG. 47. Consequently, the n-side opening portions 267, too, each function both as a first contact opening portion and a second contact opening portion as a whole without being divided into a first contact opening portion and a second contact opening portion as is the case with the n-side opening portions 217 illustrated in FIG. 33. In addition, while the n-side contact electrodes are provided in the vicinity of the p-type semiconductor layers 213 and the n-side pad electrodes are provided on the opposite side from the p-type semiconductor layers 213 relative to the n-side contact electrodes in the LED array 200 in the seventh embodiment and the LED array 231 in the eighth embodiment, the n-side electrodes 265 each constituting an n-type pad electrode as a whole are provided in the vicinity of the p-type semiconductor layers 213. It is to be noted that the operation of the LED array 251 is identical to that of the LED array 200 in the seventh embodiment.

The method for manufacturing the LED array 251 in the ninth embodiment illustrated in FIG. 49 is now explained. FIGS. 47 through 51 illustrate individual steps in the method for manufacturing the LED array 251. In the individual figures, (a) presents a top view, (b) presents a cross section through line A–A' in (a) and (c) presents a cross section through line B–B' in (a).

Figure 51:
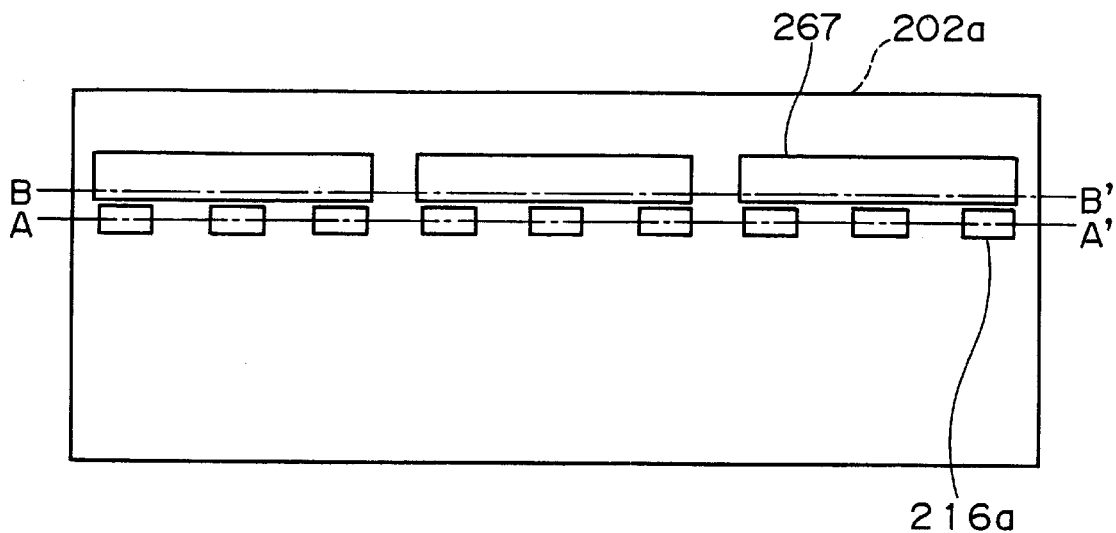
FIG. 51 illustrates a step in the process of manufacturing the LED array in the ninth embodiment of the present invention.
Figure 51:
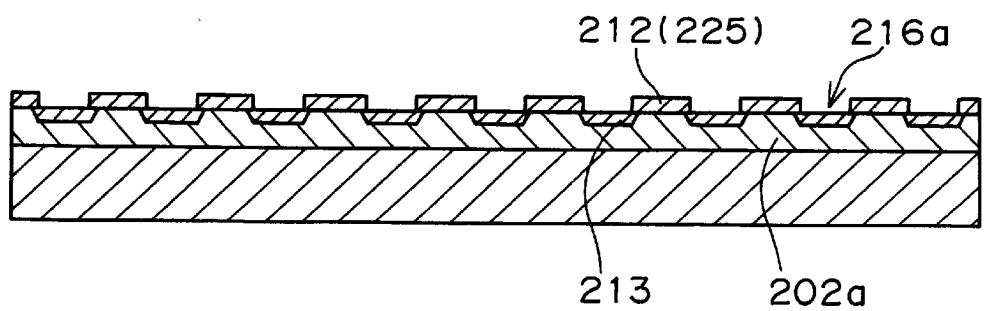
Figure 51:
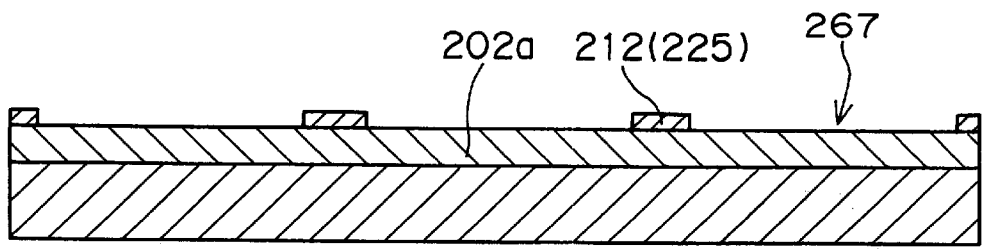

First, as illustrated in FIG. 51, the semiconductor substrate 202 which is constituted by forming an n-type semiconductor substrate 202*a* constituted of an n-type AlGaAs epitaxial layer on a high resistance semiconductor substrate 202*b* constituted of a semi-insulating GaAs substrate is prepared, a diffusion mask 225 (the first layer insulating film 212) and first opening portions 216*a* are formed at the surface of the n-type semiconductor substrate 202*a*, p-side semiconductor layers 213 are formed in the areas corresponding to the first opening portions 216*a* at the n-type semiconductor substrate 202*a* through a Zn solid phase diffusion method and quadrangular n-side opening portions 267 are formed in the first layer insulating film 212 by following the manufacturing steps illustrated in FIGS. 33 through 39 that have been explained earlier in reference to the first embodiment.

Figure 52:
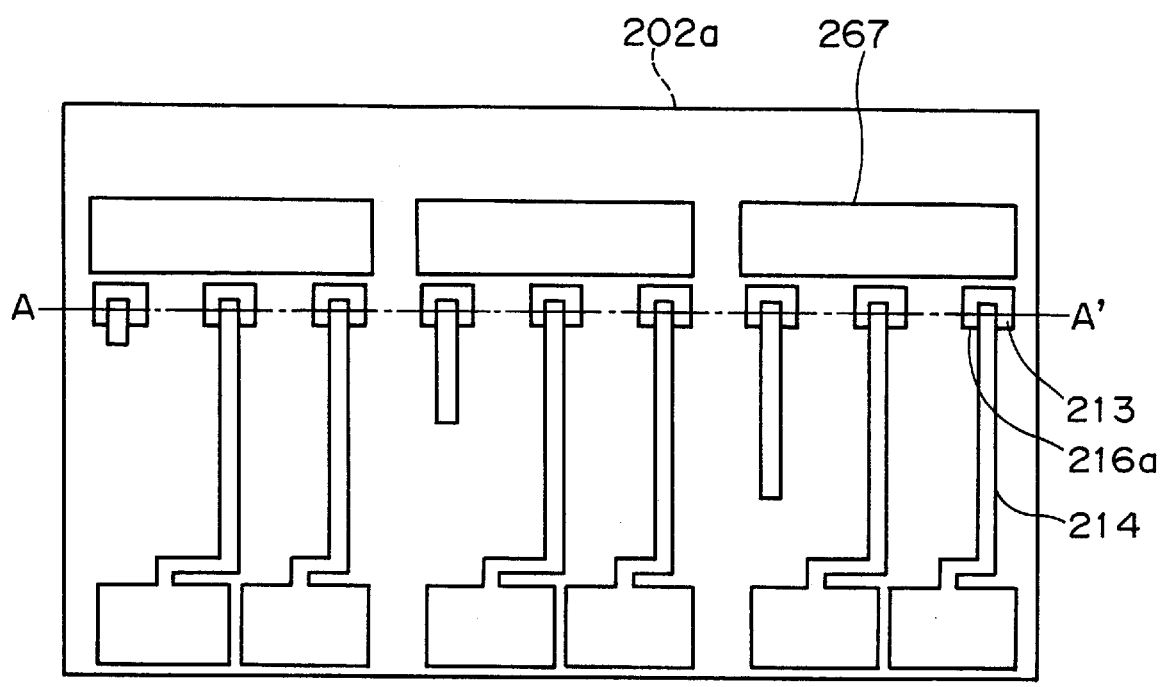
FIG. 52 illustrates a step in the process of manufacturing the LED array in the ninth embodiment of the present invention, which follows the step illustrated in FIG. 51.
Figure 52:
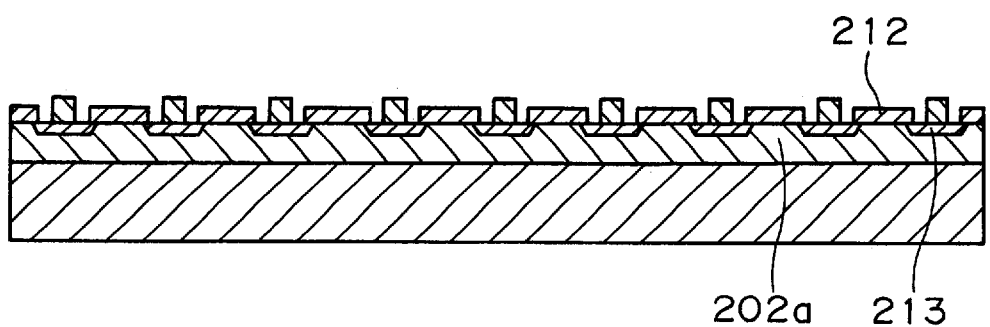

Next, as illustrated in FIG. 52, a conductive film that is to constitute the p-side electrodes 214 is formed at the surface of the n-type semiconductor substrate 202a where the formation of the n-side opening portions 267 has been completed and this conductive film is patterned through a lift-off method to form the p-type electrodes 214. An Al film, for instance, may be used to constitute the conductive film.

Figure 53:
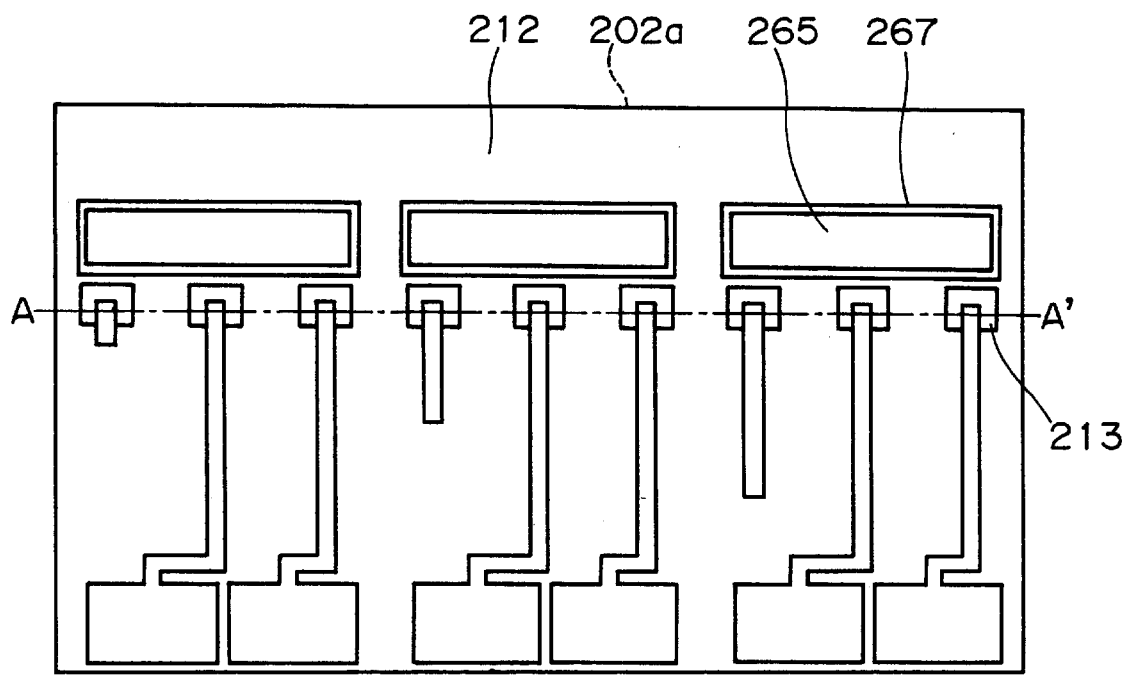
FIG. 53 illustrates a step in the process of manufacturing the LED array in the ninth embodiment of the present invention, which follows the step illustrated in FIG. 52.
Figure 53:
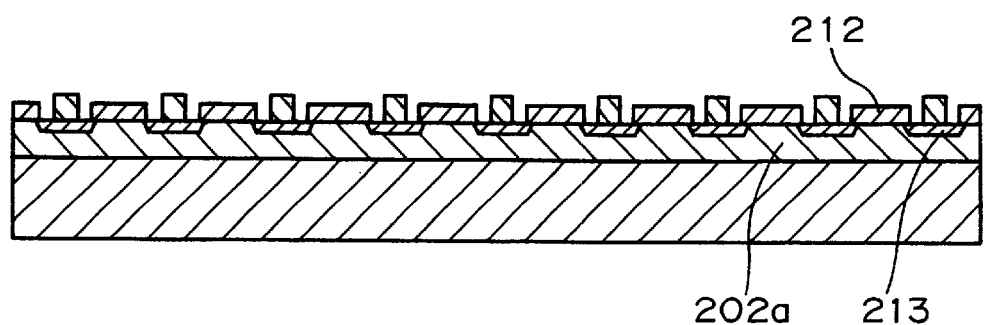

Then, as illustrated in FIG. 53, a conductive film that is to constitute the n-side electrodes 265 is formed at the surface of the n-type semiconductor substrate 202a where the formation of the p-type electrodes 214 has been completed and this conductive film is patterned in quadrangular shapes through a lift-off method to form the n-side electrodes 265 having a single-layer structure. The entirety of each n-side electrode 265 is formed within the corresponding n-side opening portion 267 bonded with the n-type semiconductor substrate 202a. One of the Au alloy films mentioned earlier may be used to form that conductive film that is to constitute the n-type electrodes 265. By adopting a single-layer structure for the n-side electrodes 265, the number of cycles of conductive film formation and patterning can be reduced by one compared to that required in the seventh embodiment, to achieve a simplification in the manufacturing process.

It is to be noted that the step illustrated in FIG. 52 and the step illustrated in FIG. 53 may be incorporated so that the n-type electrodes 265 and the p-type electrodes 214 are formed at the same time. Namely, the conductive film that is to constitute the n-type electrodes 265 and the p-side electrodes 214 may be formed at the surface of the n-type semiconductor substrate 202a where the formation of the n-side opening portions 267 has been completed to perform patterning on this conductive film through a lift-off method. However, in this case, a conductive film that can achieve ohmic contact with both the n-type semiconductor blocks 211 and the p-type semiconductor layers. e. g., an Au alloy film must be employed to constitute the conductive film. By forming the n-type electrodes 265 and the p-type electrodes 214 at the same time in this manner, the number of cycles of conductive film formation and patterning can be reduced by one, achieving a further simplification in the manufacturing process.

Figure 54:
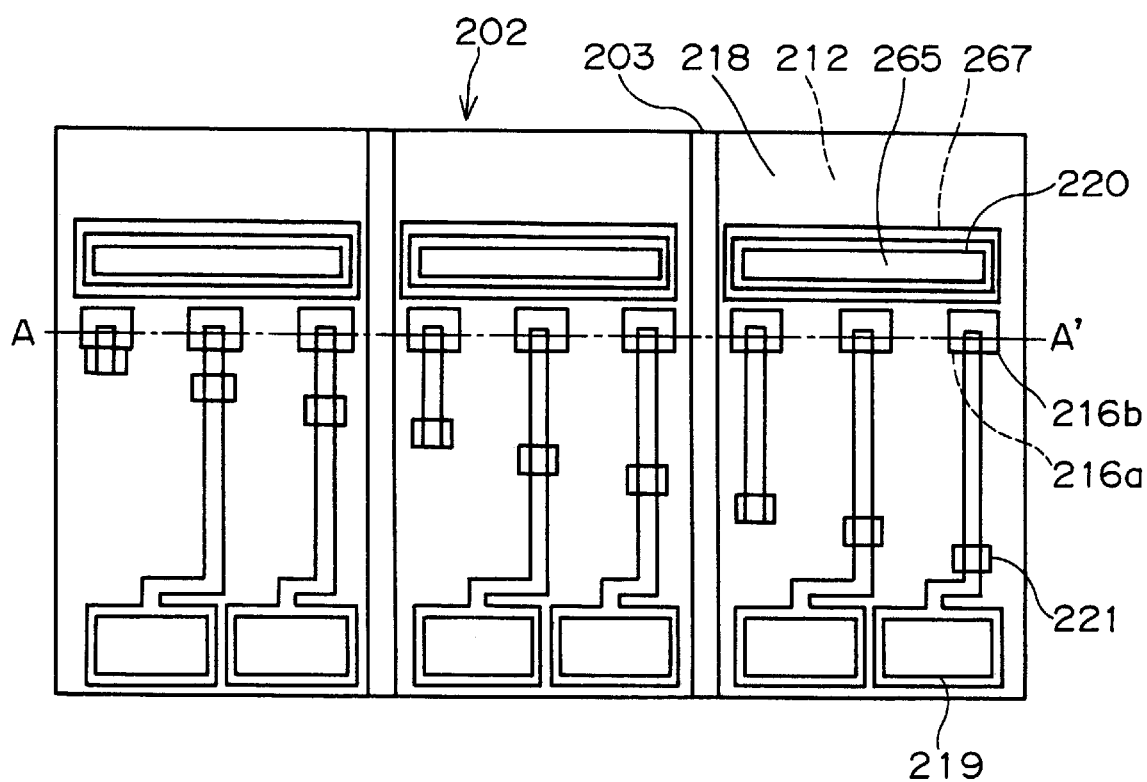
FIG. 54 illustrates a step in the process of manufacturing the LED array in the ninth embodiment of the present invention, which follows the step illustrated in FIG. 53.
Figure 54:
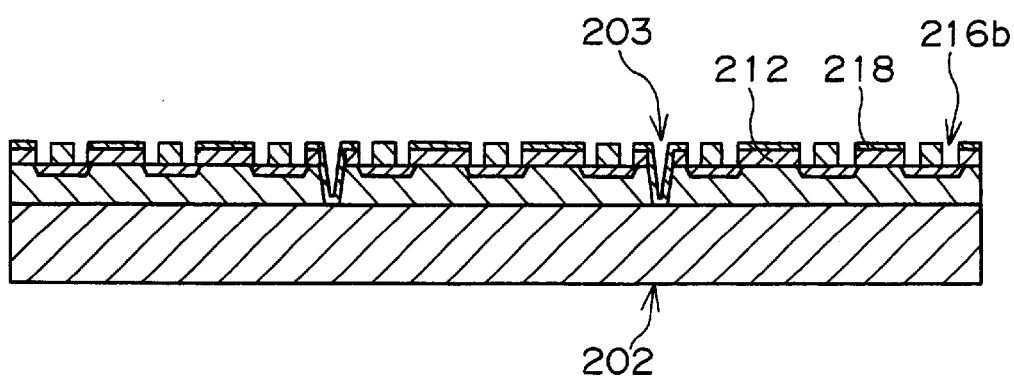

Next, as illustrated in FIG. 54, the block separating grooves 203 are formed at the semiconductor substrate 202 where the formation of the n-type electrodes 265 has been completed, a second layer insulating film 218 formed thereupon and the second opening portions 216b, p-side pad opening portions 219, the n-side pad opening portions 220 and the via holes 221 are formed in the second layer insulating film 218 through a procedure that is essentially identical to that illustrated in FIGS. 42 through 44 explained in reference to the seventh embodiment.

Figure 55:
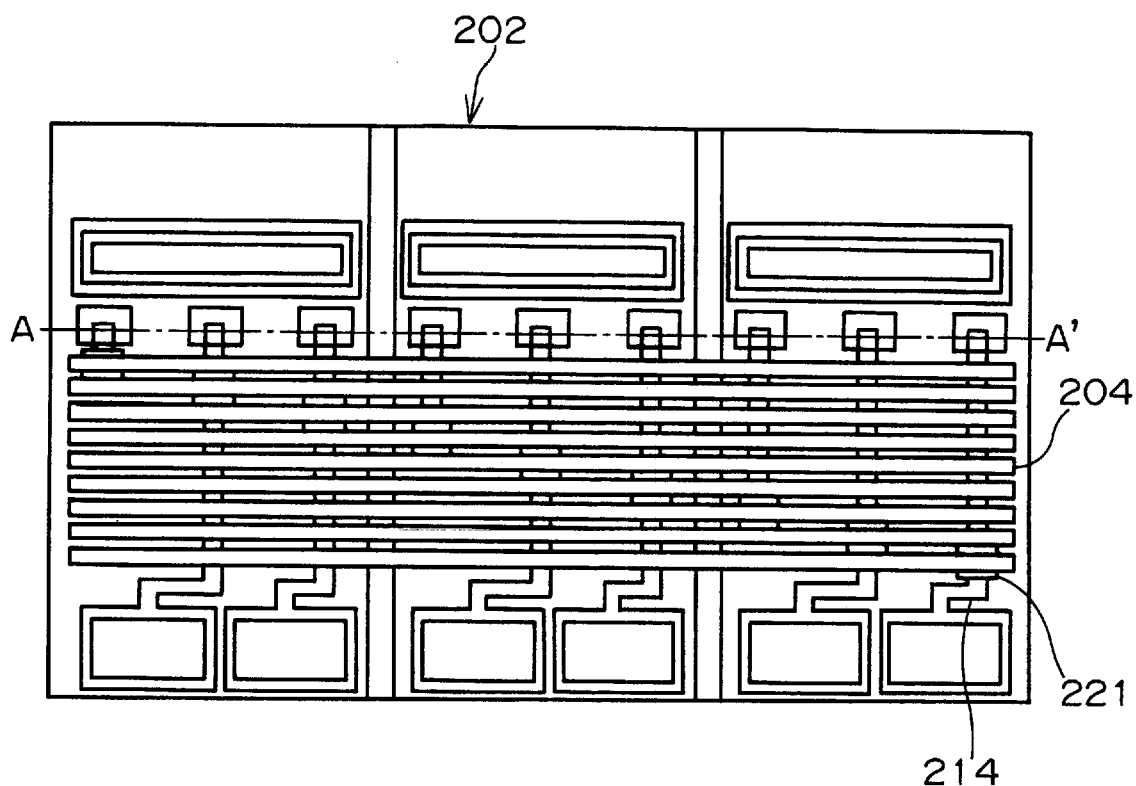
FIG. 55 illustrates a step in the process of manufacturing the LED array in the ninth embodiment of the present invention, which follows the step illustrated in FIG. 54.
Figure 55:
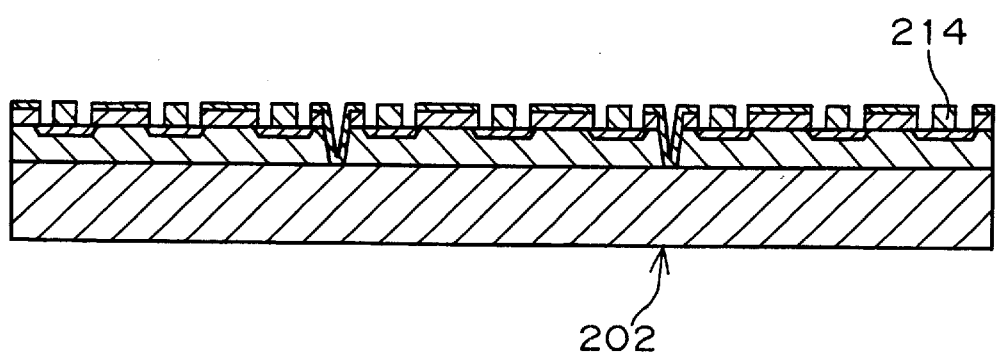

Lastly, as illustrated in FIG. 55, a conductive film that is to constitute the p-side common wirings 204 is formed over the entire surface of the semiconductor substrate 202 where the patterning of the second layer insulating film 218 has been completed and the conductive film is patterned through a lift-off method to form the p-side common wirings 204. An Al film, for instance, may be used to form the conductive film for constituting the p-side common wirings 204. The LED array 251 illustrated in FIG. 49 is manufactured through the steps described above. It is to be noted that the manufacturing method in the eighth embodiment is essentially identical to that in the ninth embodiment.

Figure 56:
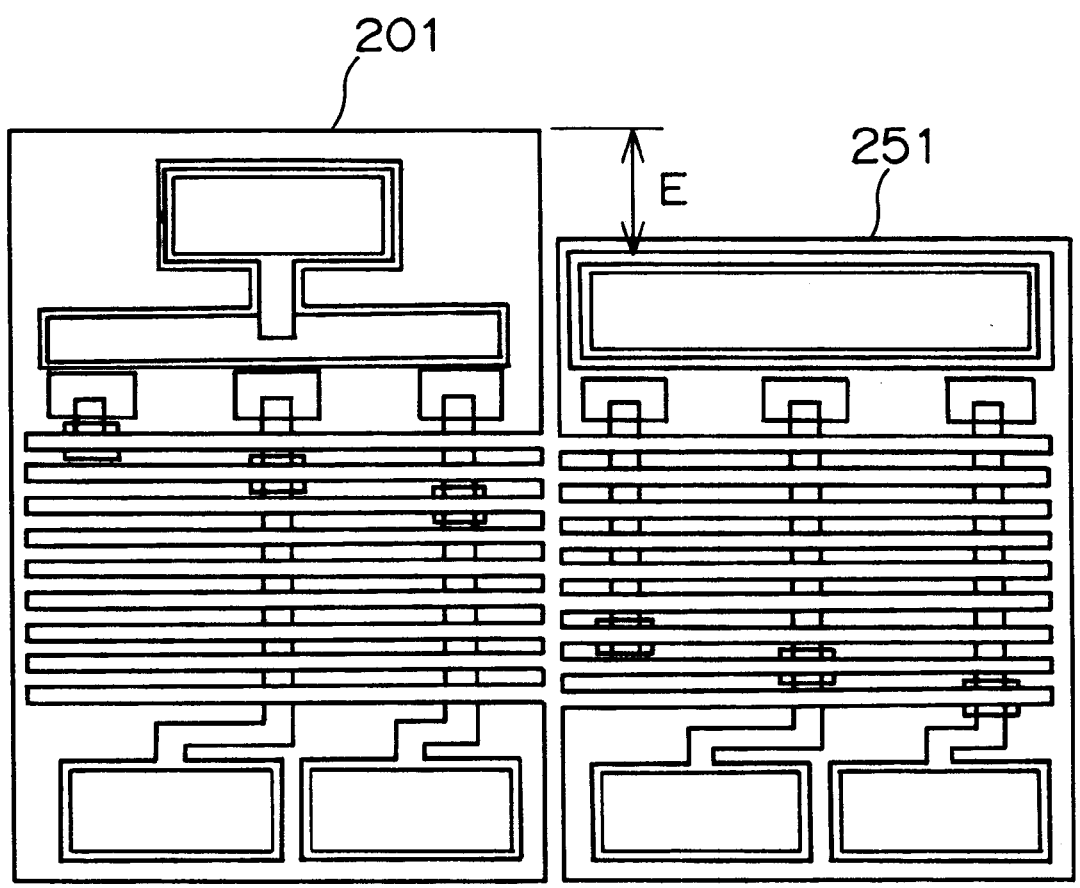
FIG. 56 presents a comparison of the chip sizes of the LED array in the ninth embodiment of the present invention and of an LED array in the prior art.

The LED array 251, in which the n-side electrodes 265 and the n-side opening portions 267 are formed in simple graphic shapes (both are formed in quadrangular shapes in FIG. 49) and the n-side electrodes 265 each of which constitutes an n-side pad electrode as a whole and the n-side opening portions 267 each of which constitutes a second contact opening portion as a whole are provided in the vicinity of the p-type semiconductor layers 213, achieves a reduction in the chip size compared to LED arrays in the prior art. FIG. 56 presents a comparison of chip sizes in the LED array 251 in the ninth embodiment and the LED array 201 in the prior art. As FIG. 56 clearly indicates, the chip size of the LED array 251 is reduced by the distance E in the figure.

Figure 57:
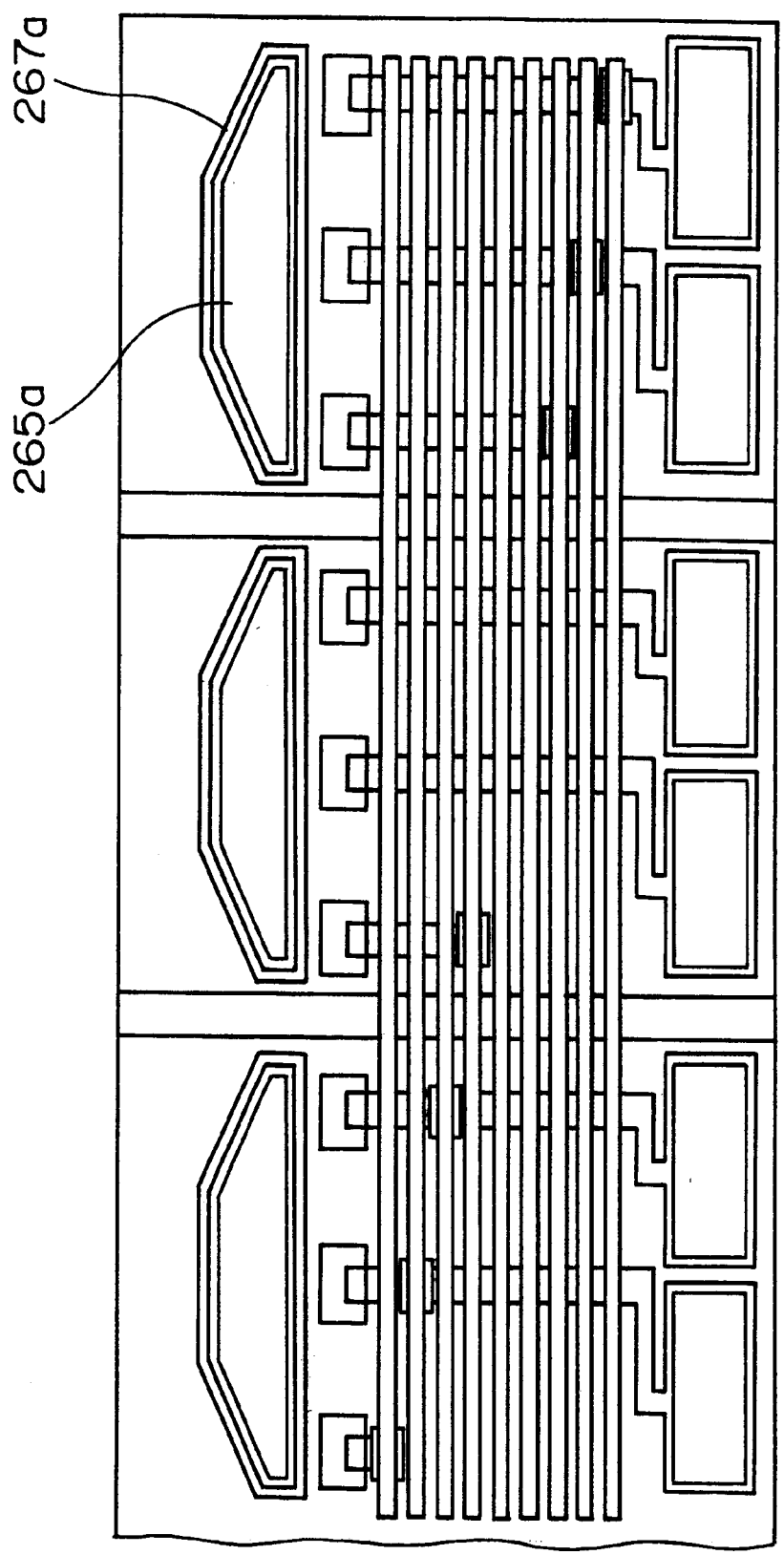
FIG. 57 is a top view illustrating another LED array structure adopted in the ninth embodiment of the present invention.
Figure 58:
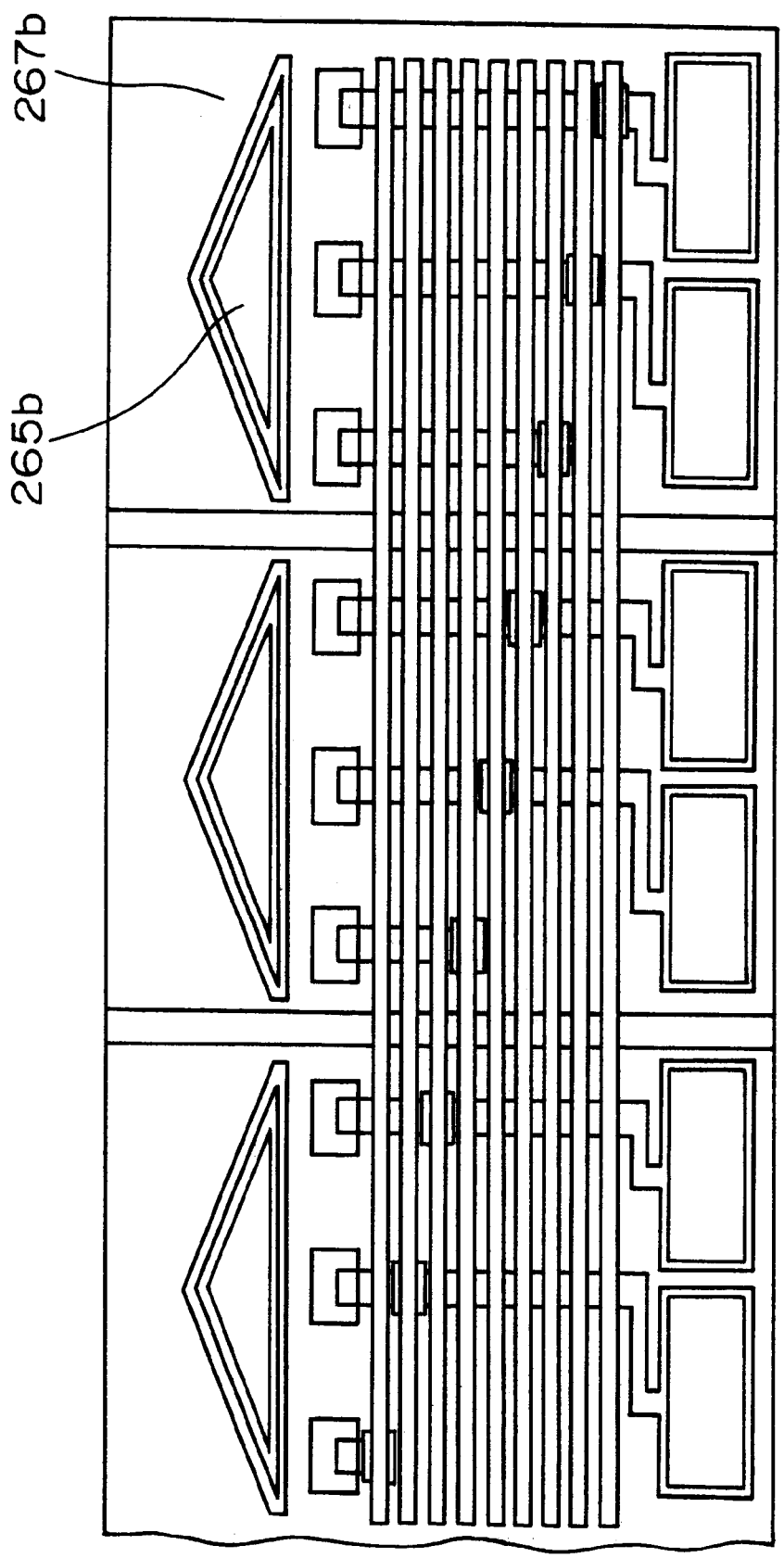
FIG. 58 is a top view illustrating yet another LED array structure adopted in the ninth embodiment of the present invention.
Figure 59:
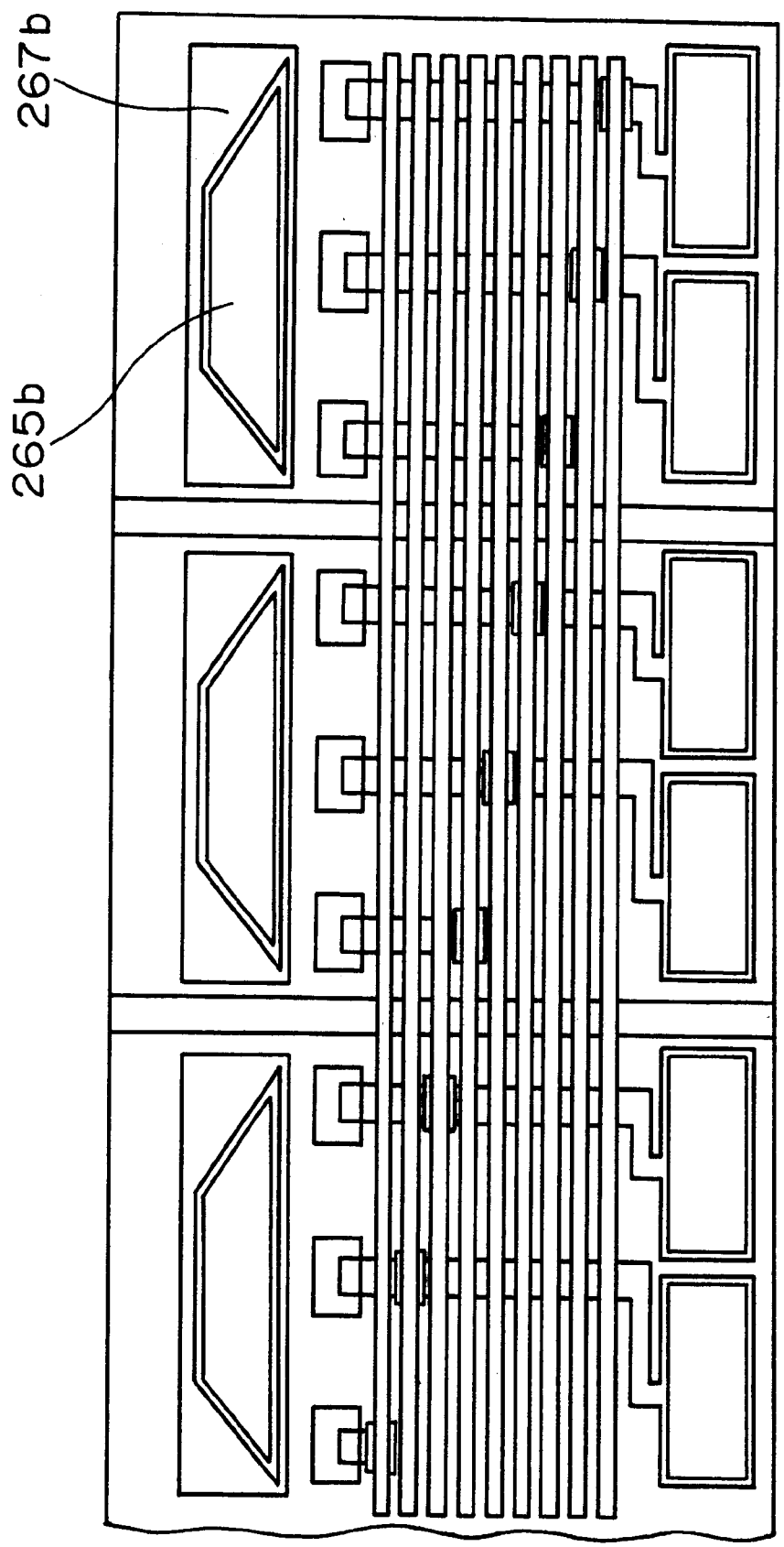
FIG. 59 is a top view illustrating yet another LED array structure adopted in the ninth embodiment of the present invention.

In addition, the n-side electrodes 265 and the n-side opening portions 267 may be formed to have planar shapes that are simple graphic shapes other than rectangles. Namely, they may be formed as polygons whose internal angles are all less than 180°, circles or ovals. Polygons whose internal angles are all less than 180° include triangles, trapezoids, parallelograms, shapes achieved by combining a trapezoid and a quadrangle and the like. FIGS. 53 through 55 are top views of LED arrays that are different from the LED array 251 in FIG. 49 only in the planar shapes of the n-side electrodes and the n-side opening portions. In the LED array illustrated in FIG. 57, the n-side electrodes 265a and the n-side opening portions 267a are both formed in a shape achieved by combining a trapezoid and a quadrangle. In the LED array illustrated in FIG. 58, the n-side electrodes 265b and the n-side opening portions 267b are both formed in a triangular shape. In addition, in the LED array illustrated in FIG. 58, n-side electrodes 265c are shaped in a trapezoidal shape and n-side opening portions 267c are formed in a quadrangular shape. It has been confirmed that the LED arrays illustrated in FIGS. 46 and 53 through 55 all achieve good light emitting characteristics comparable to those achieved by LED arrays in the prior art.

Thus, in the ninth embodiment peeling of the n-side pad electrodes is prevented by providing the opening portions 267 in the anticipated formation areas for the n-side electrodes 265 and forming the n-side electrode 265 within the opening portions 267 bonded with the surface of the n-type semiconductor blocks 211, to achieve an LED array that realizes a high yield. In addition, since simplification of the manufacturing process can be achieved by adopting a single-layer structure for the n-side electrodes 265, a low cost LED array can be realized. Furthermore, by forming the n-side electrodes 265 and the n-side opening portions 267 in simple graphic shapes and forming the n-side electrodes 265 in such a manner that each of them as a whole constitutes an n-side pad electrode, the chip size can be reduced.

Figure 50:
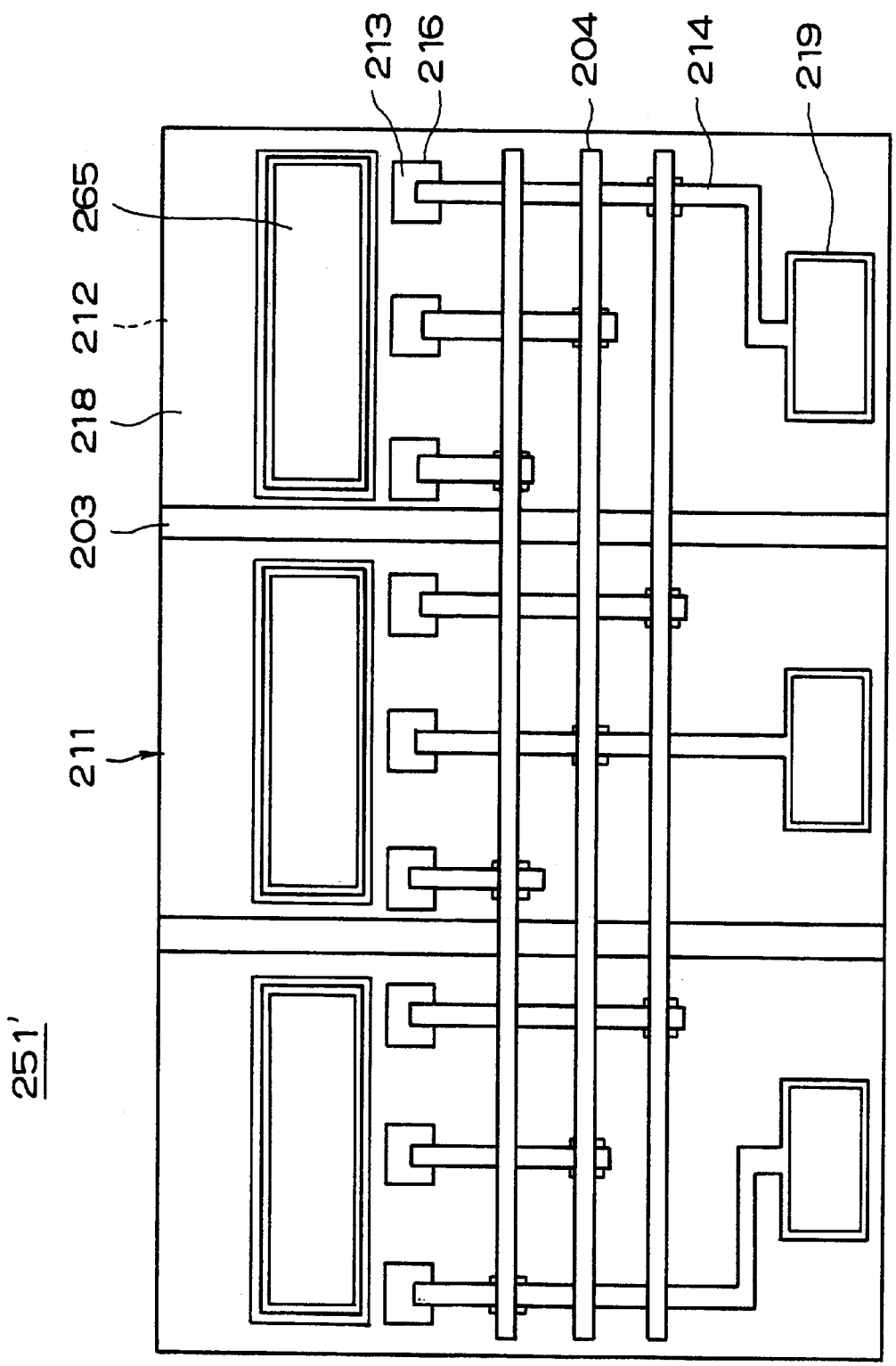
FIG. 50 illustrates another version of the ninth embodiment of the present invention illustrated in FIG. 49.

In the above embodiment, the structure of LED array 251 which has two p-side electrodes 219 in each n-type semiconductor block 211 is disclosed. The present invention, however, is not limited to such structure. The number of p-side electrodes is freely selected according to the design of the LED array. For, example, as illustrated in FIG. 50, the structure of LED array 251' which has single p-side electrode 219 in each n-type semiconductor block 211 is properly applied to the present invention.

(Tenth Embodiment)

Figure 60:
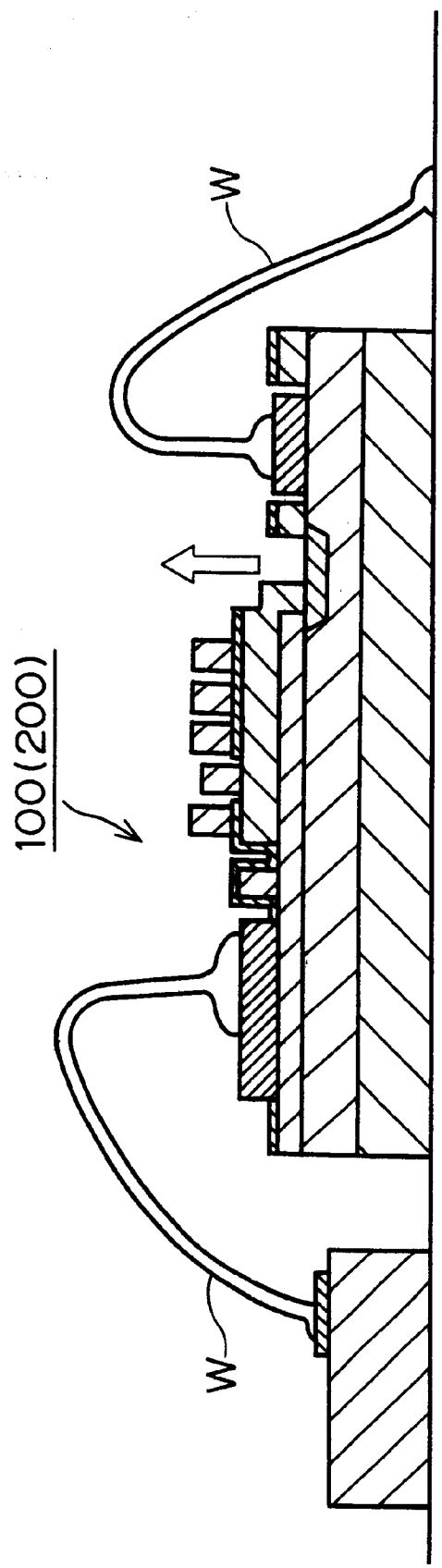
FIG. 60 is a cross section illustrating the structure through which an LED array is mounted at a printer head in the prior art.

Now, in the LED array in the embodiments described above, in which the p-side pad electrodes of the p-side electrodes and the n-side electrodes (n-side pad electrodes) are provided on opposite sides from each other relative to the p-type semiconductor layers (light emitting portions), wires W to be bonded to the drive circuit must be drawn out from the two sides of the LED array 100 (200) as illustrated in FIG. 60 when mounting the LED array at a printer head. In contrast, in the embodiment to be detailed below, the p-side pad electrodes and the n-side electrodes are provided on the same side relative to a row of light emitting portions formed at high density to provide an LED array with an even smaller chip width size.

Figure 61:
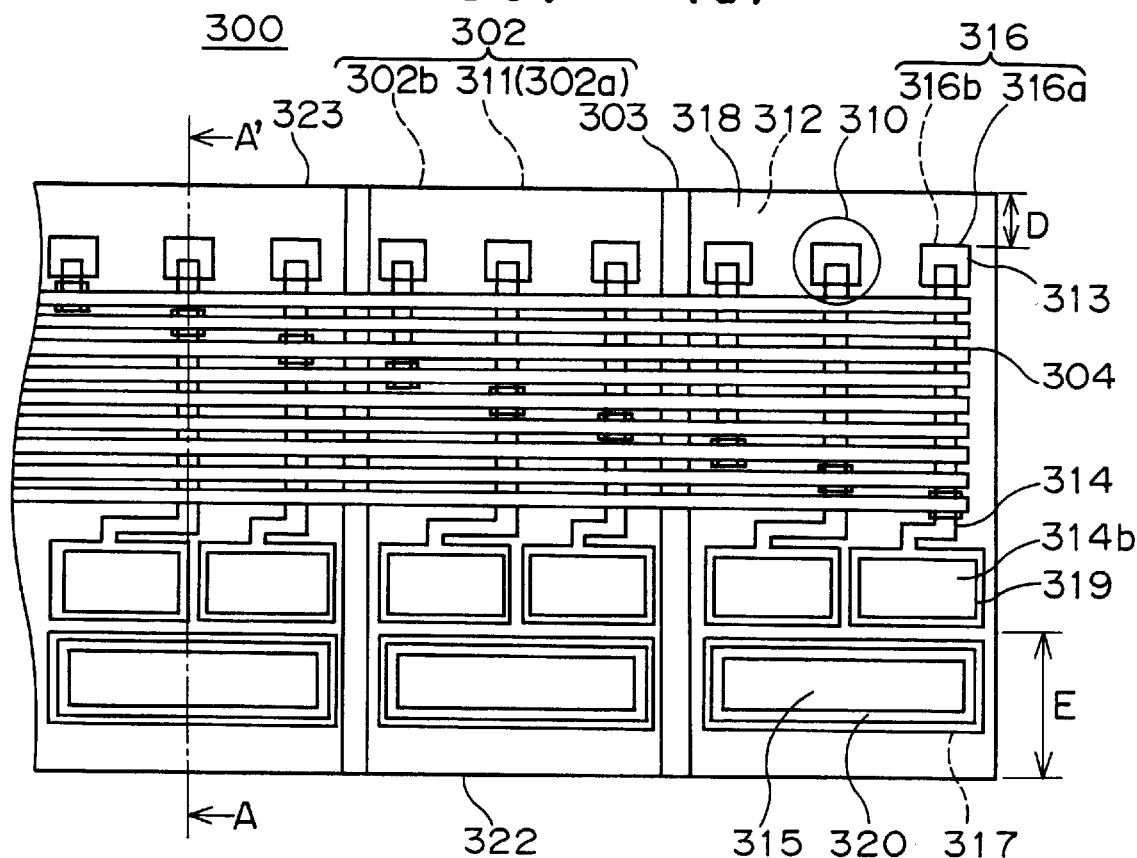
FIG. 61 illustrates the structure of the LED array in a tenth embodiment of the present invention.
Figure 61:
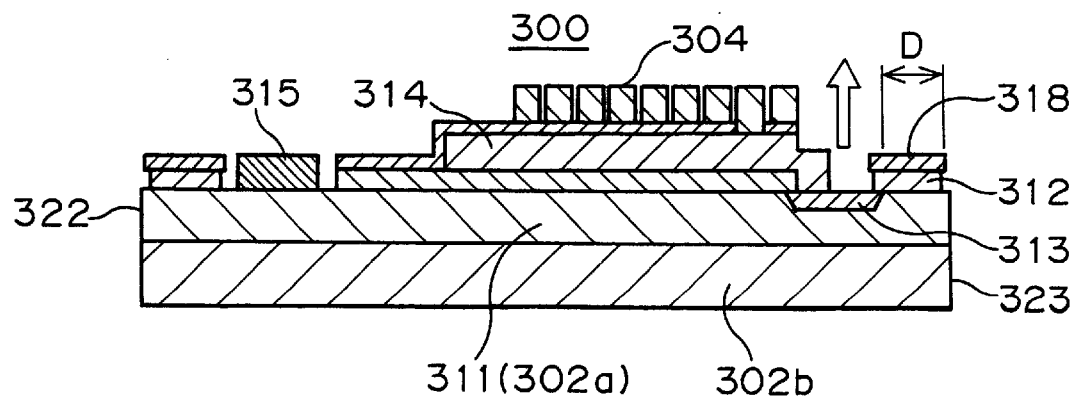

FIG. 61 illustrates the structure of an LED array 300 in the tenth embodiment of the present invention, with FIG. 61(a) presenting its top view and FIG. 61(b) presenting a cross section through, line A–A' in FIG. 61(a). The LED array 300 supports 1200 DPI and is constituted by forming a plurality of LEDs 310 in each of n-type semiconductor blocks 311 that are provided in a single row on a semiconductor substrate 302. The semiconductor substrate 302 is constituted by forming an n-type semiconductor substrate 302a constituted of an epitaxial layer or the like on a high resistance semiconductor substrate 302b. The n-type semiconductor blocks 311 are formed by dividing the n-type semiconductor substrate 302a. The n-type semiconductor blocks 311 are electrically isolated from one another by the high resistance semiconductor substrate 302b and separating grooves (etching grooves) 303. It is to be noted that in the LED array 300 is a matrix type LED array in which a first conductive-type is assigned as n-type a second conductive-type is assigned as p-type.

In each n-type semiconductor block 311, N (N is a positive integer) LEDs 310 are formed in a single row. In FIG. 61, N=3. In the n-type semiconductor block 311, N light emitting portions 313 constituted of p-type semiconductor layers (p-type semiconductor areas) are formed in a single row through dispersion. In addition, on the n-type semiconductor block 311, a first layer insulating film 312 is formed. In the first layer insulating film 312, first opening portions 316a for exposing almost the entire surfaces of the light emitting portions 313 and an n-side opening portion 317 for exposing the surface of the n-type semiconductor block 311 are formed.

On the surface of each n-type semiconductor block 311 where the first layer insulating film 312 has been formed, N p-side electrodes 314 and an n-side electrode 315 is formed. The p-side electrodes 314 are individually connected with light emitting portions 313 at the first opening portions 316a. At least one of the N p-side electrodes 314, a p-side pad electrode 314b for connection with an external circuit is formed as an integrated part. In FIG. 61, two p-side electrodes 314 are formed to have a p-side pad electrode 314b each and one p-side electrode 314 without a p-side pad electrode 314b is formed. The N p-side electrodes 314 are formed on the same side relative to the row of the light emitting portions 313 (under the row of the light emitting portions 313 in FIG. 61). The n-side electrode 315 is formed within the n-side opening portion 317 and constitute a pad electrode for connecting the n-type semiconductor block 311 to an external circuit (drive circuit, for instance). This n-side electrode 315 is in ohmic contact with the n-type semiconductor block 311 within the n-side opening portion 317b. The n-side electrode 315 and the n-side opening portion 317 are formed on the same side as the p-side pad electrodes 314b relative to the row of the light emitting portions 313. In FIG. 61, the p-side pad electrodes 314b and the n-side electrode 315 are both formed under the row of the light emitting portions 313. In addition, the n-side electrode 315 is formed under the p-side pad electrodes 314b. It is to be noted that the planar shapes of the n-side electrode 315 and the n-side opening portion 317 are not restricted to the quadrangles shown in FIG. 61.

As described above, the LED array 300 differs from LED arrays in the prior art in that the n-side electrode 315 is formed on the same side as the p-side pad electrodes 314b relative to the row of the light emitting portions 313 and that the n-side electrode 315 is connected with the semiconductor block 311 on the same side as the p-side pad electrodes 314b. This ensures that even when the row of the light emitting portions 313 is formed at a high degree of density of 1200 DPI, the p-side pad electrodes 314b and the n-side electrode 315 can be formed on the same side relative to the row of the light emitting portions 313. Consequently, the wire bonded to the p-side pad electrodes 314b and the wire bonded to the n-side electrode 315 can be drawn out from one side of the LED array 300. In FIG. 61, the wires mentioned above can both be drawn out from the lower side of the LED array 300, i.e., from the side where an end surface 322 is present.

It is to be noted that since the p-side pad electrodes 314b and the n-side electrode 315 are formed at the end surface 322 of the two end surfaces 322 and 323 of the LED array 300 in the lengthwise direction, the end surface 322 will be referred to as an electrode side end surface. The end surface 323, on the other hand, is to be referred to as the light emitting portion side end surface since the light emitting portions 313 are formed at the end surface 323. It is to be noted that light emitting characteristics that compare favorably to those achieved in LED arrays in the prior art are achieved in the LED array 300 in which the n-side electrode 315 is formed away from the light emitting portions 313 instead of in the vicinity of the light emitting portions 313, as has already been confirmed by the inventor of the present invention.

A second layer insulating film 318 is formed on the first layer insulating film 312, the p-side electrodes 314 and the n-side electrode 315. In the second layer insulating film 318, second opening portions 316b for exposing almost the entire areas of the first opening portions 316a, p-side pad opening portions 319 for exposing the p-side electrodes 314b, an n-side pad opening portion 320 for exposing the n-side electrode 315 and via holes 321 for exposing the p-side electrodes 314 are formed. The first opening portions 316a and the second opening portions 316b constitute p-side opening portions 316. In addition, on the second layer insulating film 318, M (M is an integer equal to or larger than N) p-side common wirings 304 are formed. In the LED array 300 in FIG. 61, M=9. The p-side common wirings 304 are formed over all the n-type semiconductor blocks 311, and are connected with the p-side electrodes 314 at the via holes 321.

The LEDs 310 are constituted in an n-type semiconductor block 311 which is common to N LEDs 310, one of the light emitting portions 313 individually formed at the n-type semiconductor block 311, a p-side electrode 314 formed at the p-type semiconductor layer 313 and the n-side electrode 315 formed to be shared by the N LEDs 310 within the n-type semiconductor block 311. The depth of the light emitting portions (p-type semiconductor layers) 313 is less than the thickness of the n-type semiconductor block 311. Thus, the light emitting portions 313 are formed in a shoal at the n-type semiconductor block 311. When a voltage is applied between the p-type electrodes 314 an the n-type electrode 315, a light emitting phenomenon occurs at the bonding surface of the p-type semiconductor layers 313 and the n-type semiconductor block 311, and this emitted light is radiated to the outside through the surface of the p-type semiconductor layers 313. In other words, as illustrated in FIG. 61(b) the emitted light is radiated upward in the vertical direction from the light emitting portion 313.

The following is an explanation of the manufacturing processes implemented for manufacturing the LED array 300 in the tenth embodiment illustrated in FIG. 61. FIGS. 58 through 69 illustrate individual steps in the process for manufacturing the LED array 300. In these figures, (a) presents a top view and (b) presents a cross section through line A–A' in (a). In addition, FIG. 69(c) is a cross section through line B–B' in FIG. 69(a).

Figure 63:
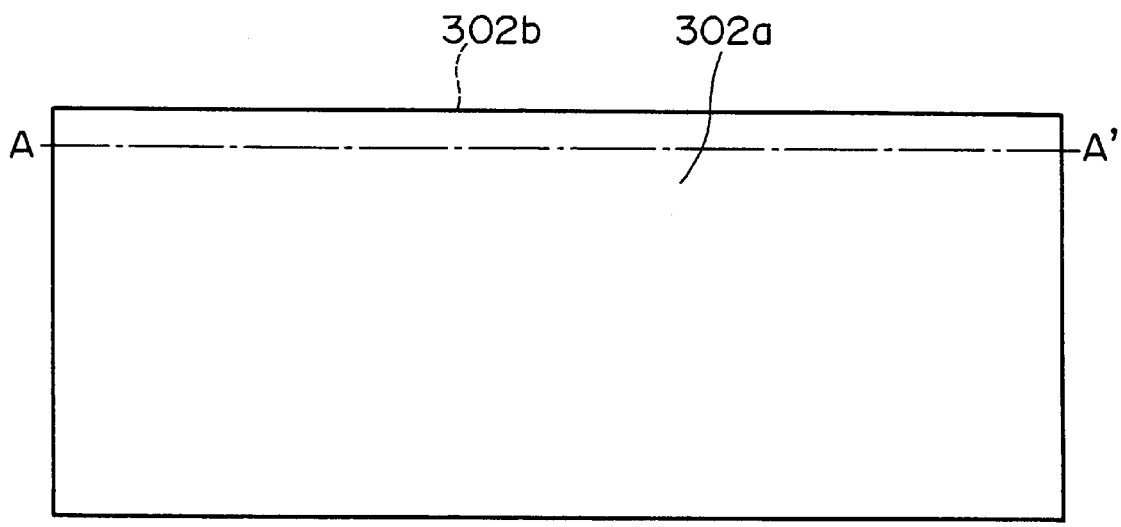
FIG. 63 illustrates a step in the process of manufacturing the LED array in the tenth embodiment of the present invention.
Figure 63:
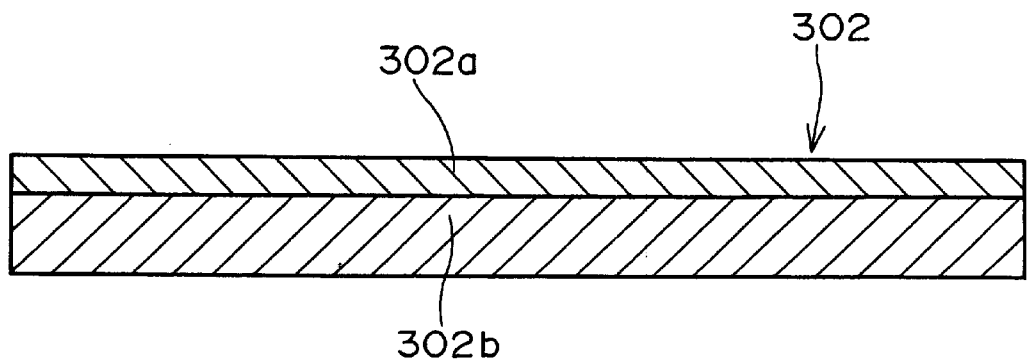

First, as shown in FIG. 63, the semiconductor substrate 302 provided with the n-type semiconductor substrate 302a on high resistance semiconductor substrate 302b is prepared. A semi-insulating gallium arsenide substrate (GaAs substrate) is employed to constitute the high resistance semiconductor substrate 302b. In addition, an n-type AlGaAs layer is formed through epitaxial growth on the semi-insulating GaAs substrate, and this AlGaAs epitaxial layer is used as the n-type semiconductor substrate 302a. The thickness of the n-type semiconductor substrate 302a (n-type epitaxial layer) may be, for instance, approximately 3 micro-meter.

Figure 64:
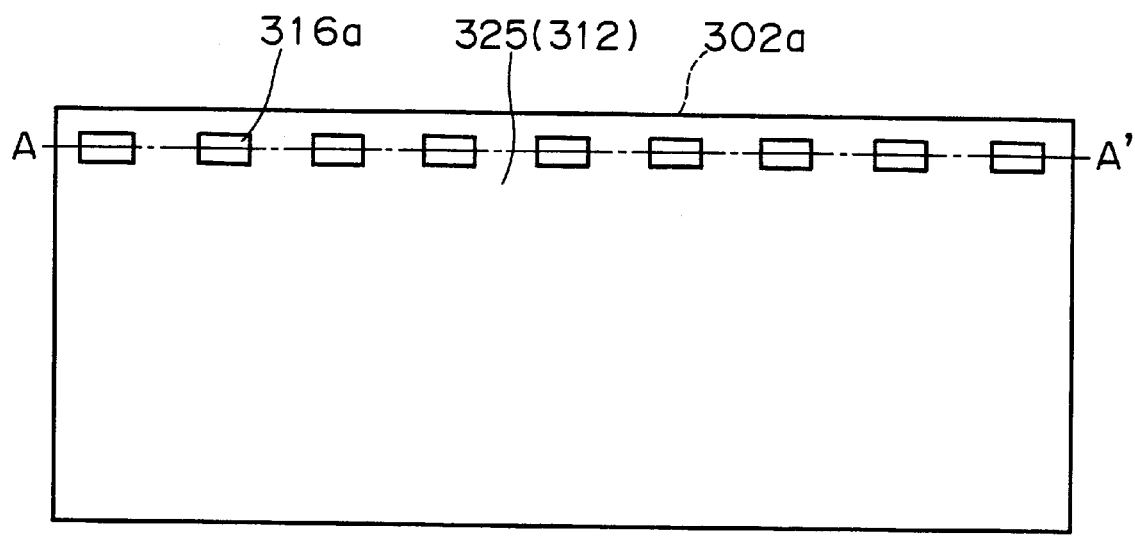
FIG. 64 illustrates a step in the process of manufacturing the LED array in the tenth embodiment of the present invention, which follows the step illustrated in FIG. 63.
Figure 64:
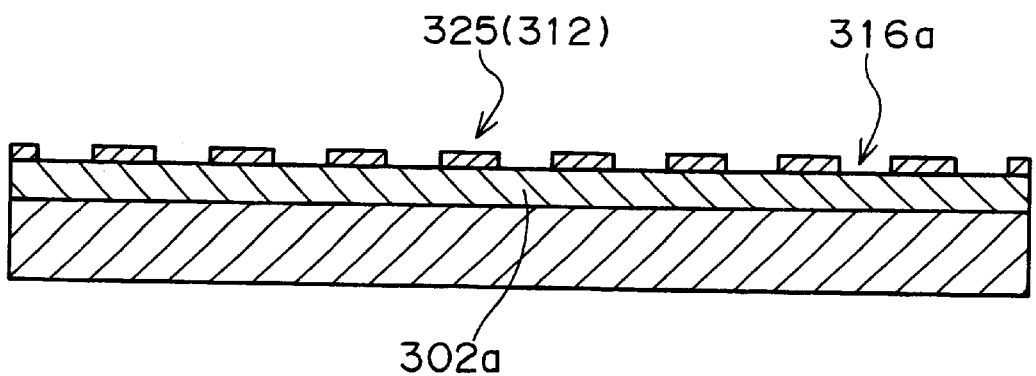
Figure 65:
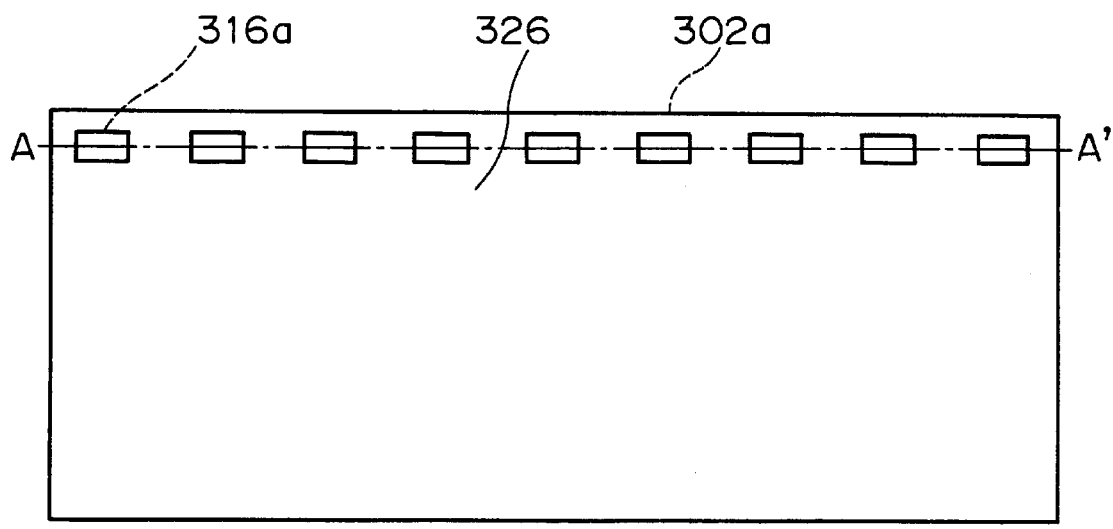
FIG. 65 illustrates a step in the process of manufacturing the LED array in the tenth embodiment of the present invention, which follows the step illustrated in FIG. 64.
Figure 65:
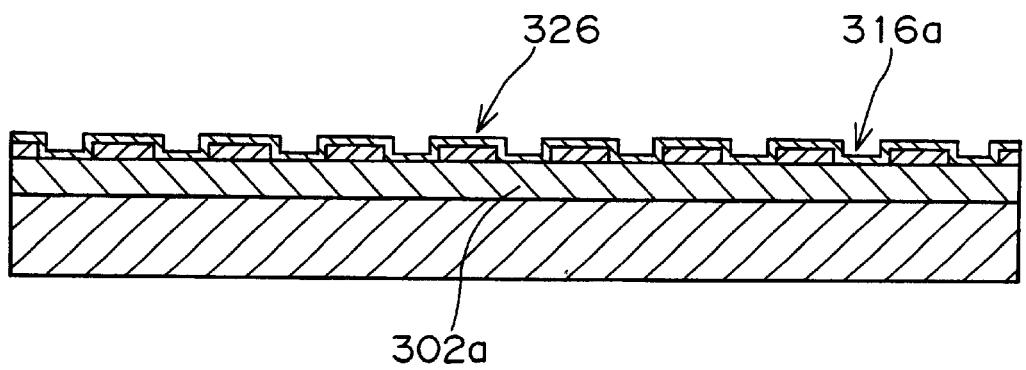
Figure 66:
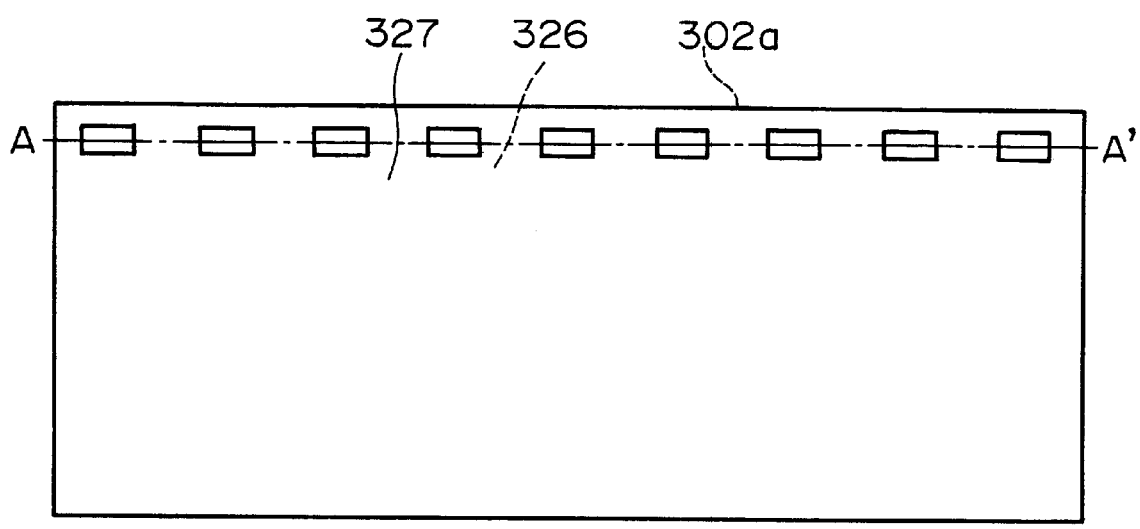
FIG. 66 illustrates a step in the process of manufacturing the LED array in the tenth embodiment of the present invention, which follows the step illustrated in FIG. 65.
Figure 66:
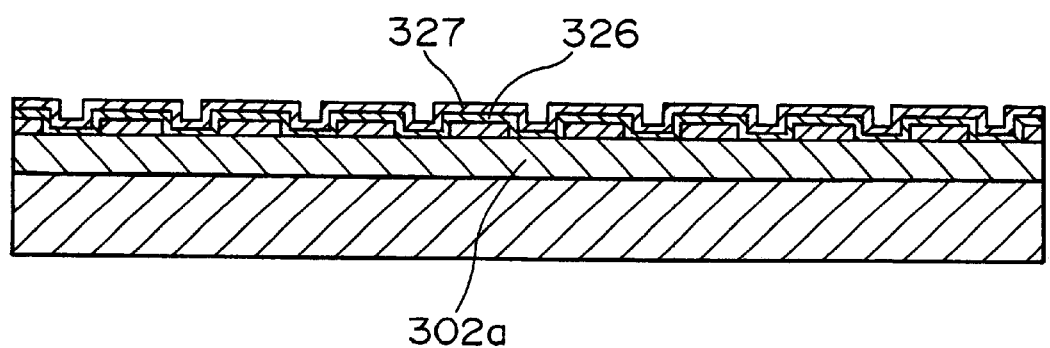

Next, as illustrated in FIG. 64, the first layer insulating film 312 which is to constitute a diffusion mask 325 is formed at a surface of the n-type semiconductor substrate 302a, and the first layer insulating film 312 is patterned through photolithography and etching to form first opening portions 316a and the diffusion masks 325. A SiN film, for instance, may be used to constitute the first layer insulating film 312 (diffusion masks 325). The SiN film is formed through the CVD method, and its film thickness may be, for instance, 500–3000 angstrom.

Figure 62:
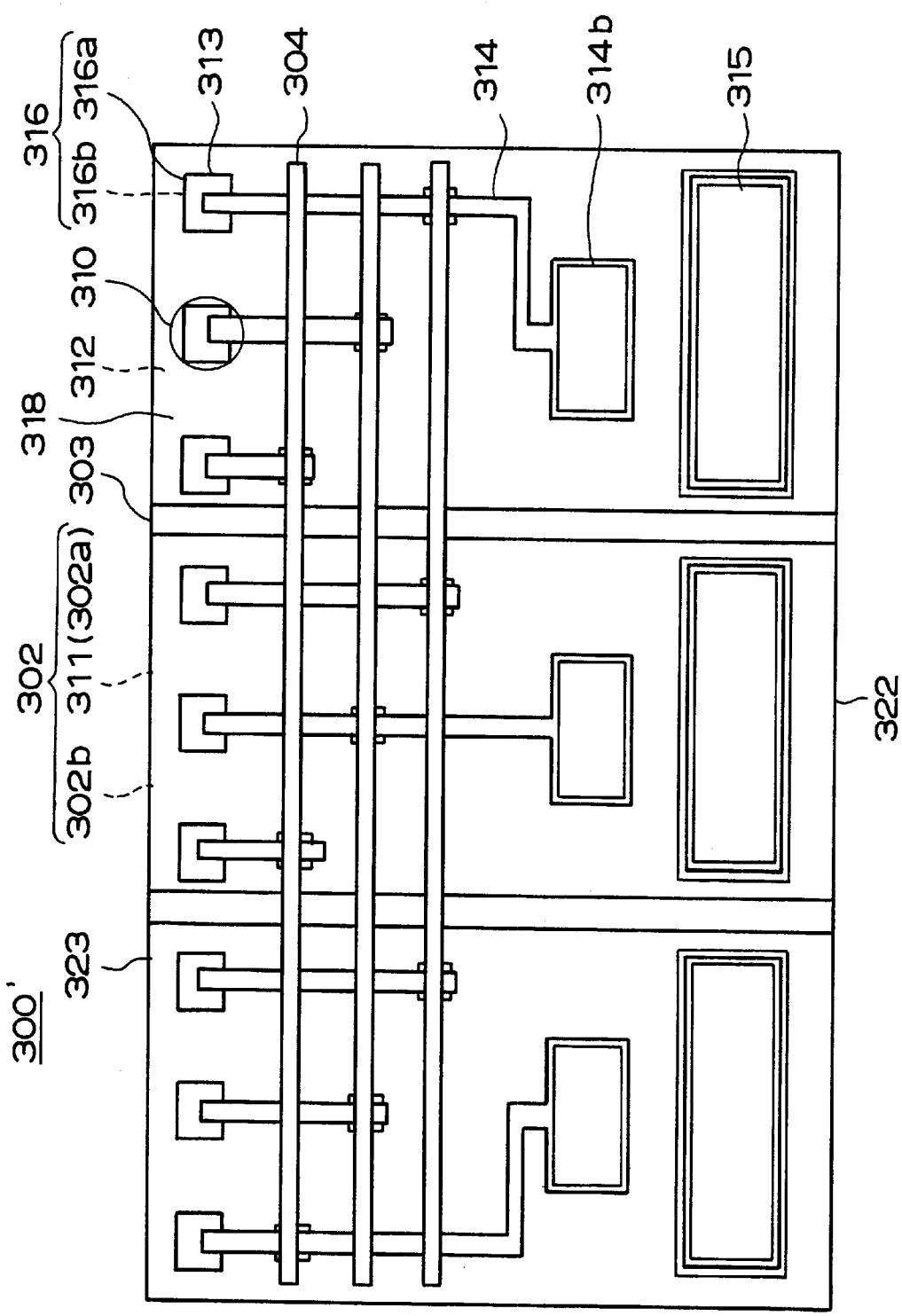
FIG. 62 illustrates another version of the tenth embodiment of the present invention illustrated in FIG. 61.

Then, as illustrated in FIGS. 60 through 62, p-type semiconductor layers (light emitting portions) 313 are formed toward the surface substrate of the n-type semiconductor substrate 302a, by adopting a Zn solid phase diffusion method in this embodiment. Namely, after the formation of the first opening portions 316a is completed, a Zn diffusion source film 326 is formed at the surface of the n-type semiconductor substrate 302a, and an anneal cap film 327 is formed over the Zn diffusion source film 326. A ZnO—SiO$_2$ compound film, for instance, may be formed to constitute the Zn diffusion source film 326. This ZnO—SiO$_2$ compound film is achieved by mixing a zinc oxide (ZnO) and silicon nitride film (SiO$_2$) at a ratio of 1:1 and is formed through sputtering. An aluminum nitride (AlN) film formed through, for instance, sputtering, may be used to constitute the anneal cap film 327. The thickness of the ZnO—SiO$_2$ compound film may be approximately 500–3000 angstrom and the film thickness of the AlN film, too, may be set at approximately 500–3000 angstrom.

Next, high temperature annealing is implemented on the n-type semiconductor substrate 302a where the annealing cap film 327 has been formed to diffuse Zn from the Zn diffusion source film 326 into the n-type semiconductor substrate 302a. Since, while Zn becomes diffused into the n-type semiconductor substrate 302a at the first opening portions 316a, Zn is not diffused in the area where the diffusion mask 325 is formed, the p-type semiconductor layers (light emitting portions) 313 are selectively formed in the areas that correspond to the first opening portions 316a of the n-type semiconductor substrate 302a. The high temperature annealing should be performed at an annealing temperature of 700° C. in a nitrogen environment, for instance, for two hours. Under these annealing conditions, the p-type semiconductor layers (light emitting portions) 313 having a depth of approximately 1 micro-meter and a surface Zn density of $10^{20}$ cm$^3$ are formed. Since the thickness of the n-type semiconductor substrate 302a is approximately 3 micro-meter as mentioned earlier, the depth of the p-type semiconductor layers is smaller than the thickness of the n-type semiconductor substrate 302a. It is to be noted that the anneal cap film 327 prevents Zn from becoming diffused into an annealing atmosphere.

Figure 68:
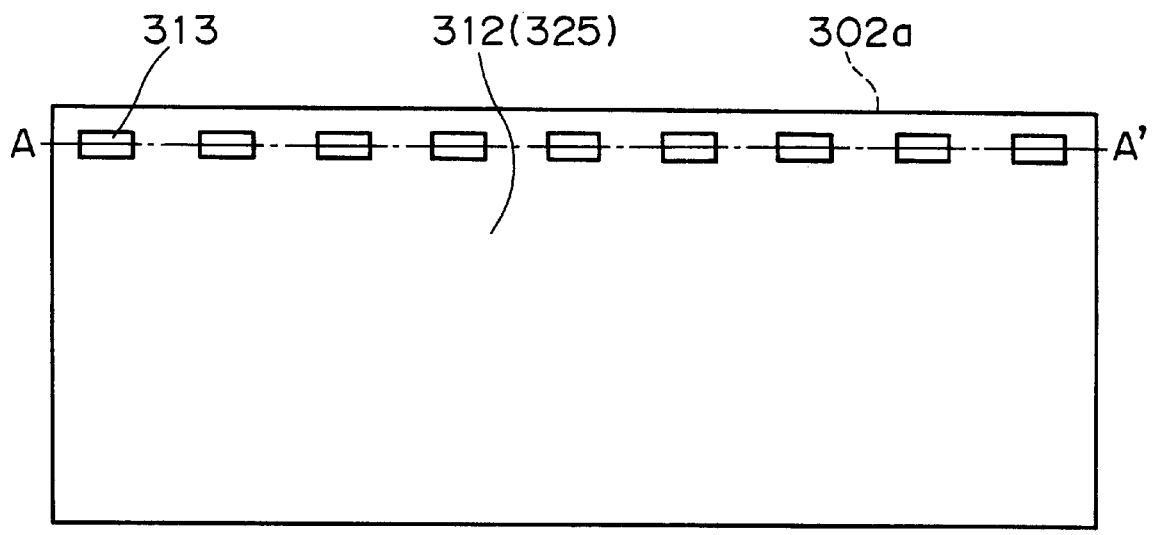
FIG. 68 illustrates a step in the process of manufacturing the LED array in the tenth embodiment of the present invention, which follows the step illustrated in FIG. 67.
Figure 68:
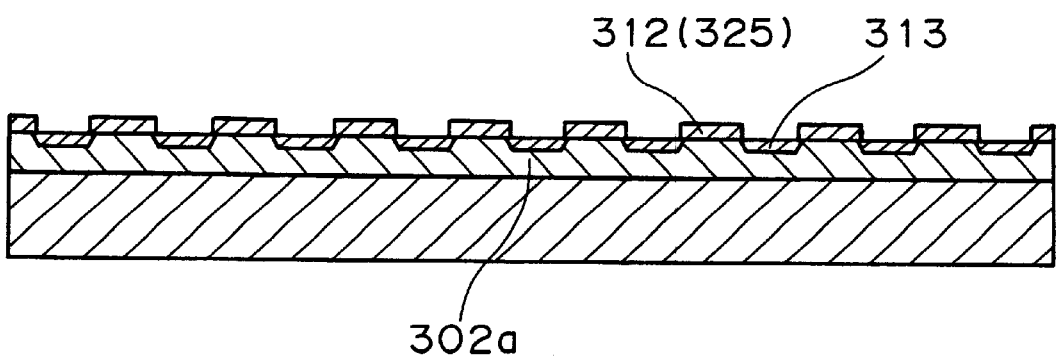
Figure 69:
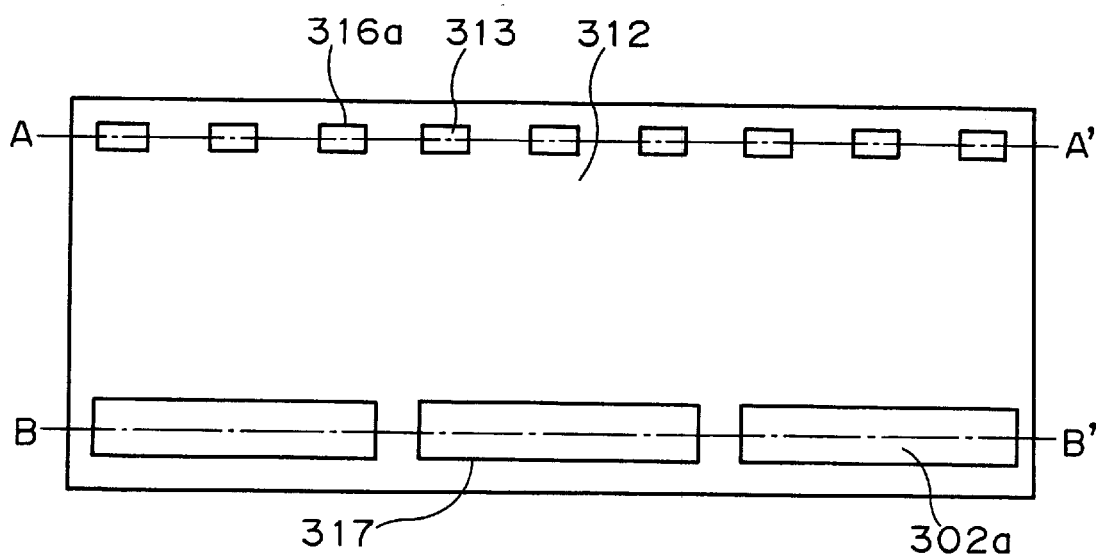
FIG. 69 illustrates a step in the process of manufacturing the LED array in the tenth embodiment of the present invention, which follows the step illustrated in FIG. 68.
Figure 69:
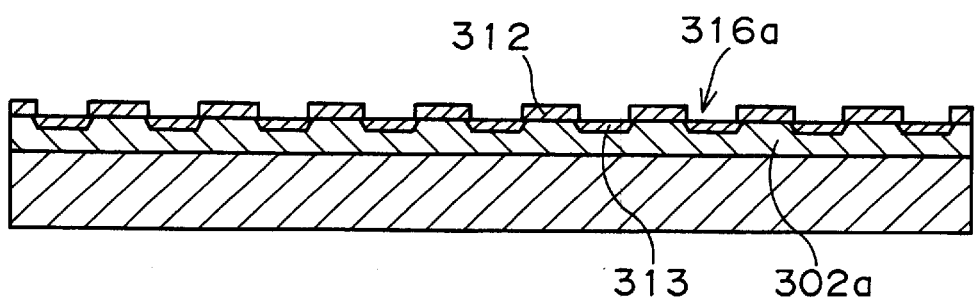
Figure 69:
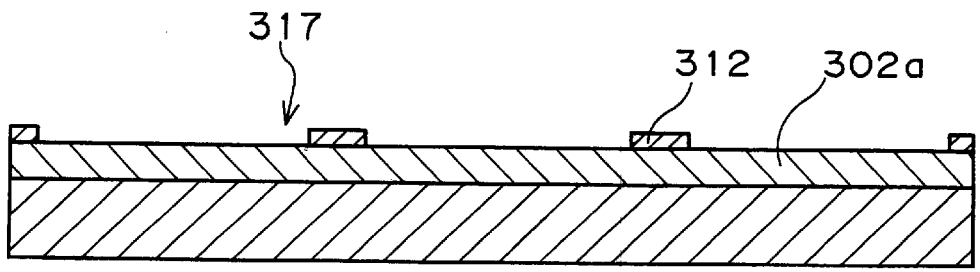

Next, as illustrated in FIG. 68, the diffusion source film 326 and the anneal cap film 327 formed at the surface of the n-type semiconductor substrate 302a where the formation of the light emitting portions 313 has been completed are completely removed by employing, for instance, a selective wet etching method, leaving only the first layer insulating film 312 (diffusion mask 325).

Then, as illustrated in FIG. 69, the n-side opening portions 317 are formed through photolithography and etching in the layer insulating film 312 at the n-type semiconductor substrate 302a where the removal of the diffusion source film 326 and the anneal cap film 327 has been completed. The n-type opening portions 317 are formed in anticipated formation areas for the n-side formation electrodes 315 to expose the n-type semiconductor substrate 302a in these areas. The anticipated formation areas for the n-side electrodes 315 are set on the same side as the anticipated formation areas for the p-side pad electrodes 314b relative to the row of the light emitting portions 313 (the row of the first opening portions 316a).

In FIG. 69(a), the anticipated formation areas for the p-side pad electrodes 314b and the anticipated formation areas for the n-side electrode 315 are both set below the row of the light emitting portions 313, and consequently, the n-side opening portions 317 are formed below the row of the light emitting portions 313.

Figure 70:
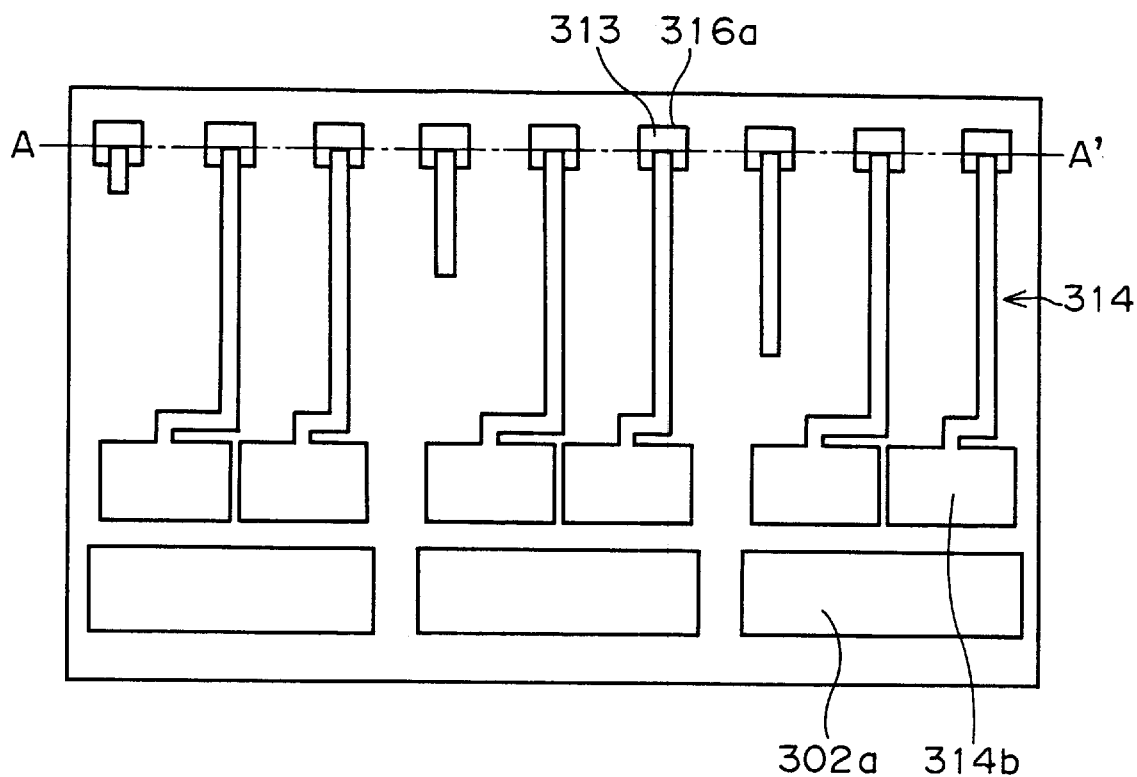
FIG. 70 illustrates a step in the process of manufacturing the LED array in the tenth embodiment of the present invention, which follows the step illustrated in FIG. 69.
Figure 70:
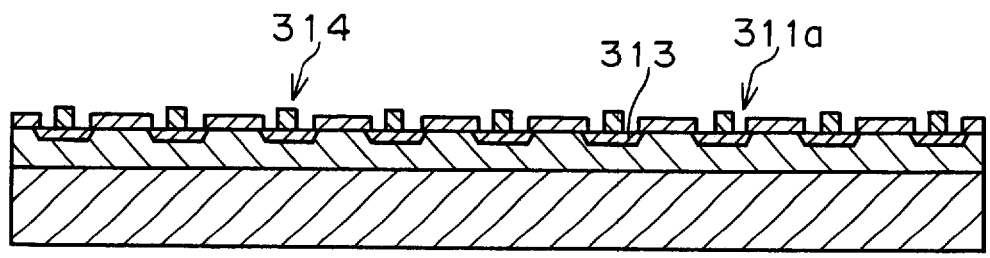

Next, as illustrated in FIG. 70, a conductive film that is to constitute the p-side electrodes 314 is formed at the surface of the n-type semiconductor substrate 302a where the formation of the n-side opening portions 317 has been completed and this conductive film is patterned through a lift-off method to form the p-side electrodes 314. In other words, a photoresist pattern in which the areas other than the anticipated formation areas for the p-side electrodes 314 constitute a trim pattern is formed, the conductive film that is to constitute the p-side electrodes 314 is formed over the entire upper surface of the photoresist pattern and the photoresist and the conductive film formed on it are lifted off to form p-side electrodes 314 having a p-side pad electrode 314b and p-side electrodes 314 without a p-side pad electrode 314b.

The p-side electrodes 314 are formed so that they partially overlap the surfaces of the light emitting portions 313 at the first opening portions 316a. An Al film, for instance, may be used to form the conductive film that is to constitute the p-side electrodes 314.

Figure 71:
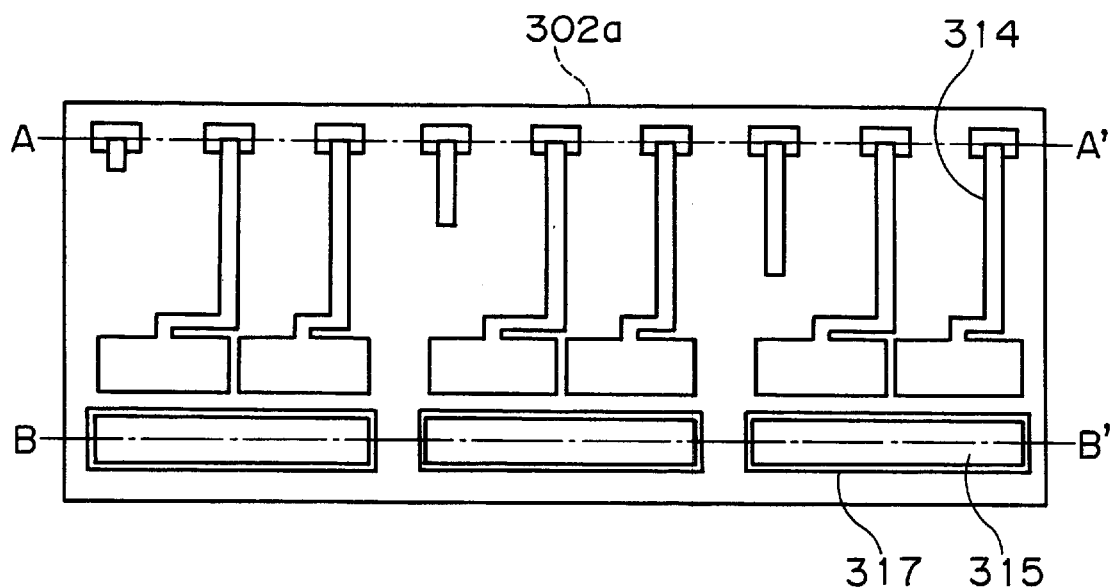
FIG. 71 illustrates a step in the process of manufacturing the LED array in the tenth embodiment of the present invention, which follows the step illustrated in FIG. 70.
Figure 71:
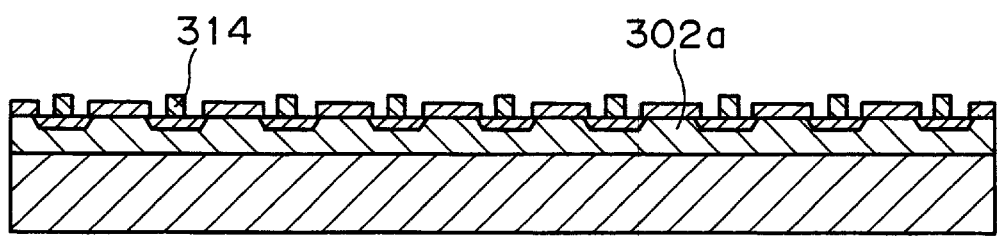
Figure 71:
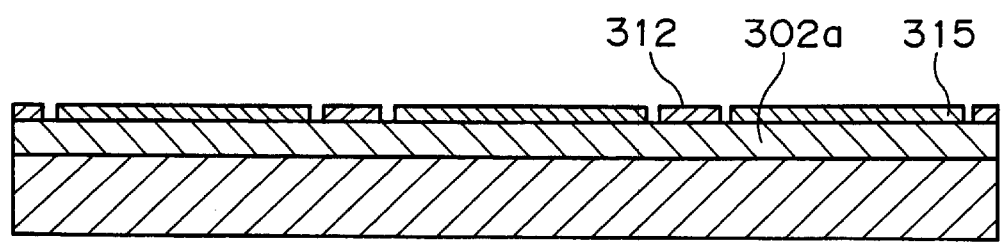

Then, as illustrated in FIG. 71, a conductive film that is to constitute the n-side electrodes 315 is formed over the surface of the n-type semiconductor substrate 302a where the formation of the p-side electrodes 314 has been completed and this conductive film is patterned through a lift-off method to form the n-side electrodes 315. The n-side electrodes 315 are formed within the n-side opening portions 317 and are bonded to the surface the n-type semiconductor substrate 302a. A conductive film that can achieve ohmic contact with the n-type semiconductor substrate 302a, e.g., an Au alloy film, is used to form the conductive film that is to constitute the n-type contact electrodes 315. Such an Au alloy film may be a laminated metal film comprising a titanium (Ti) film, a platinum (Pt) film and an Au film, a laminated alloy film comprising an alloy film constituted of Au, germanium (Ge) and nickel (Ni) and an Au film (AuGeNi/Au film), a laminated alloy film comprising an alloy film and an Au film (AuGe/NiAu film) or the like. The n-side electrodes 315 are formed on the same side as the p-side pad electrodes 314b relative to the row of the light emitting portions 313 (the row of the first opening portions 316a). In FIG. 71(a), the p-side pad electrodes 314b and the n-side electrodes 315 are both formed below the row of the light emitting portions 313. In addition, the n-side electrodes 315 are formed below the p-side pad electeodes 314b.

As described above, the process for manufacturing the LED array differs from methods for manufacturing LED arrays in the prior art in that the n-side electrodes 315 are formed in the anticipated formation areas set on the same side as the p-side pad electrodes 314b relative to the row of the light emitting portions 313 and that the n-side electrodes 315 thus formed are connected to the semiconductor blocks 311 on the same side as the p-side pad electrodes 314b. This makes it possible to form the p-side pad electrodes 314b and the n-side electrodes 315 on the same side relative to the row of the light emitting portions 313 even when the light emitting portions 313 in the row are formed to achieve a high density of 1200 DPI.

It is to be noted that the step illustrated in FIG. 70 and the step illustrated in FIG. 71 may be incorporated so that the n-side electrodes 315 and the p-side electrodes 314 are formed at the same time. Namely, the conductive film that is to constitute the n-side electrodes 315 and the p-side electrodes 314 may be formed at the surface of the n-type semiconductor substrate 302a where the formation of the n-side opening portions 317 has been completed to be patterned through a lift-off method. However, in this case, it is necessary to employ a conductive film that can be in ohmic contact with both the n-type semiconductor substrate 302a and the p-type semiconductor layers (light emitting portions) 313, such as an Au alloy film, to constitute the conductive film described above. By forming the n-side electrodes 315 and the p-side electrodes 314 at the same time in this manner, the number of cycles of conductive film formation and patterning can be reduced by one, to simplify the manufacturing process.

Figure 72:
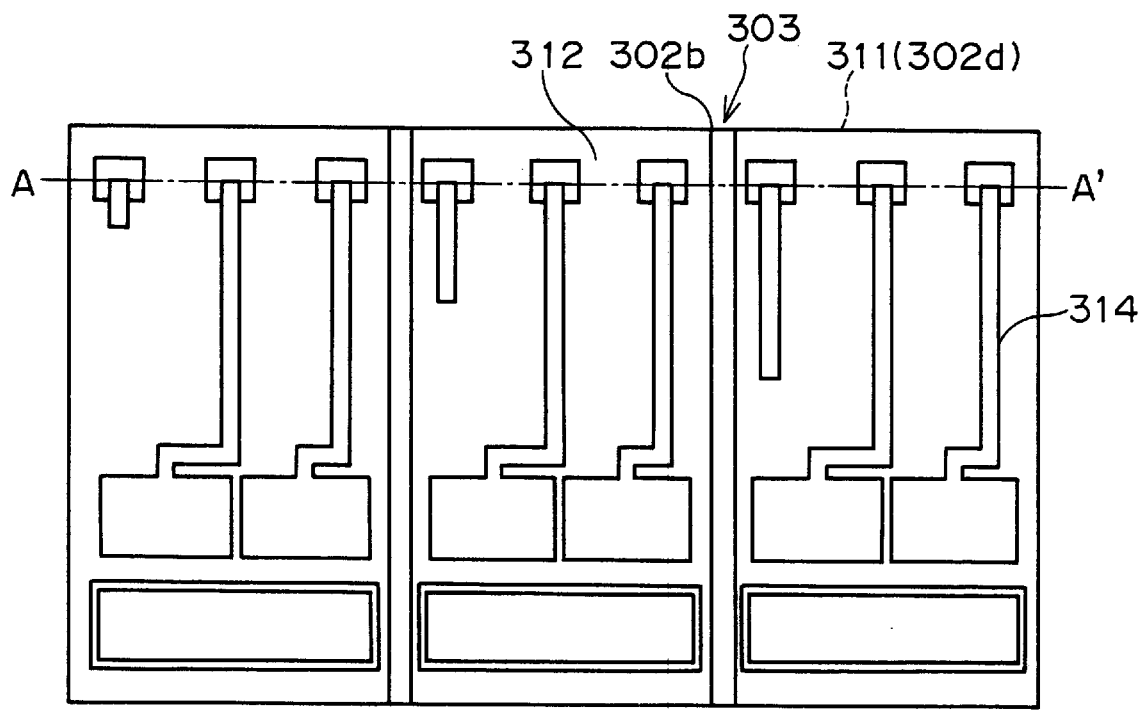
FIG. 72 illustrates a step in the process of manufacturing the LED array in the tenth embodiment of the present invention, which follows the step illustrated in FIG. 71.
Figure 72:
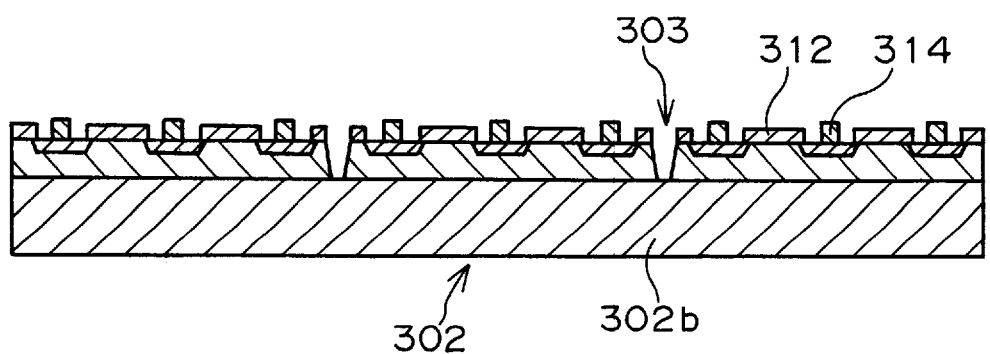

Next, as illustrated in FIG. 72, the separating grooves 303 that extend to the high resistance semiconductor substrate 302b are formed at the n-type semiconductor substrate 302a where the formation of the n-side electrodes 315 has been completed to divide the n-type semiconductor substrate 302a into a plurality of n-type semiconductor blocks 311. In other words, the first layer insulating film 312 formed in anticipated separating groove formation areas and the n-type semiconductor substrate 302a underneath are etched through photolithography and etching to expose the high resistance semiconductor substrate 311b. Thus, the n-type semiconductor blocks 311 are electrically isolated from one another by the separating grooves 303 and the high resistance semiconductor substrate 302b. The depth of the separating grooves 303 should be set at, for instance, approximately 3.5 micro-meter when the thickness of the n-type semiconductor blocks 311 (n-type semiconductor substrate 302a) is set at approximately 3 micro-meter and the first layer insulating film 312 is formed to have a film thickness of approximately 500–3000 angstrom. In addition, the width of the separating grooves 303 is subject to restriction imposed by the distance between the light emitting portions 313. In an LED array with a resolution of 1200 DPI, the pitch dimension of the light emitting portions 313 is approximately 21 micro-meter, and thus, the width of the separating grooves 303 must be less than 13 micro-meter when the width of the light emitting portions 313 is approximately 8 micro-meter.

Figure 73:
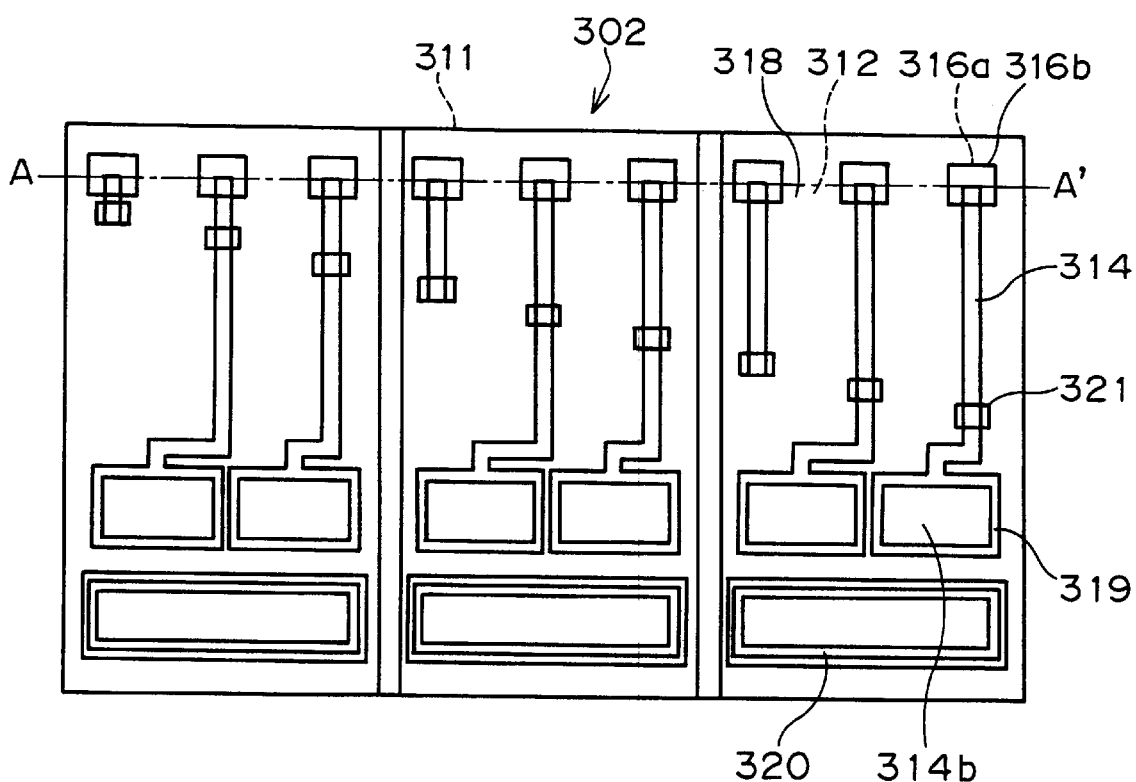
FIG. 73 illustrates a step in the process of manufacturing the LED array in the tenth embodiment of the present invention, which follows the step illustrated in FIG. 72.
Figure 73:
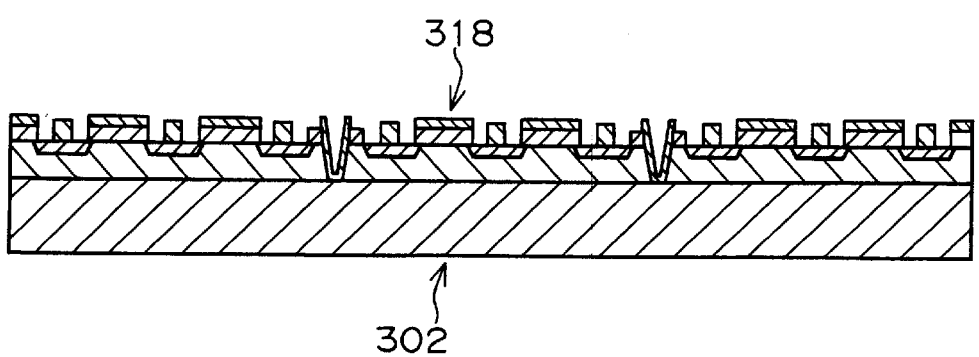

Then, as illustrated in FIG. 73, the second layer insulating film 318 is formed on the surface of the semiconductor substrate 302 where the formation of the separating grooves 303 has been completed, and the second opening portions 316b opening over almost the same areas as the first opening portions 316a, the p-side opening portions 319 opening at the pad electrode portions of the p-side pad electrodes 314b, the n-side pad opening portions 320 opening at the n-side electrodes 315 and the via holes 321 reaching the n-side electrodes 314 are formed. A polyimide film, for instance, may be used to constitute the second layer insulating film 318. The polyimide film may be formed and patterned as described below by using polyimide that dissolves in a photoresist developing solution (alkaline solution). A polyimide source is spin coated onto the semiconductor substrate 302 (wafer) and pre-baking is performed at a temperature of approximately 100° C. Next, a photoresist is spin coated over the polyimide film that has been pre-baked and exposure is performed on the photoresist in such a manner that the opening portions and the via holes 321 described above constituted an blank pattern. When developing the photoresist, the areas covered with the polyimide film where the resist is not formed, are also removed to pattern the polyimide film. Then, the remaining resist is peeled and the patterned polyimide film is baked at a temperature of approximately 350° C.

Figure 74:
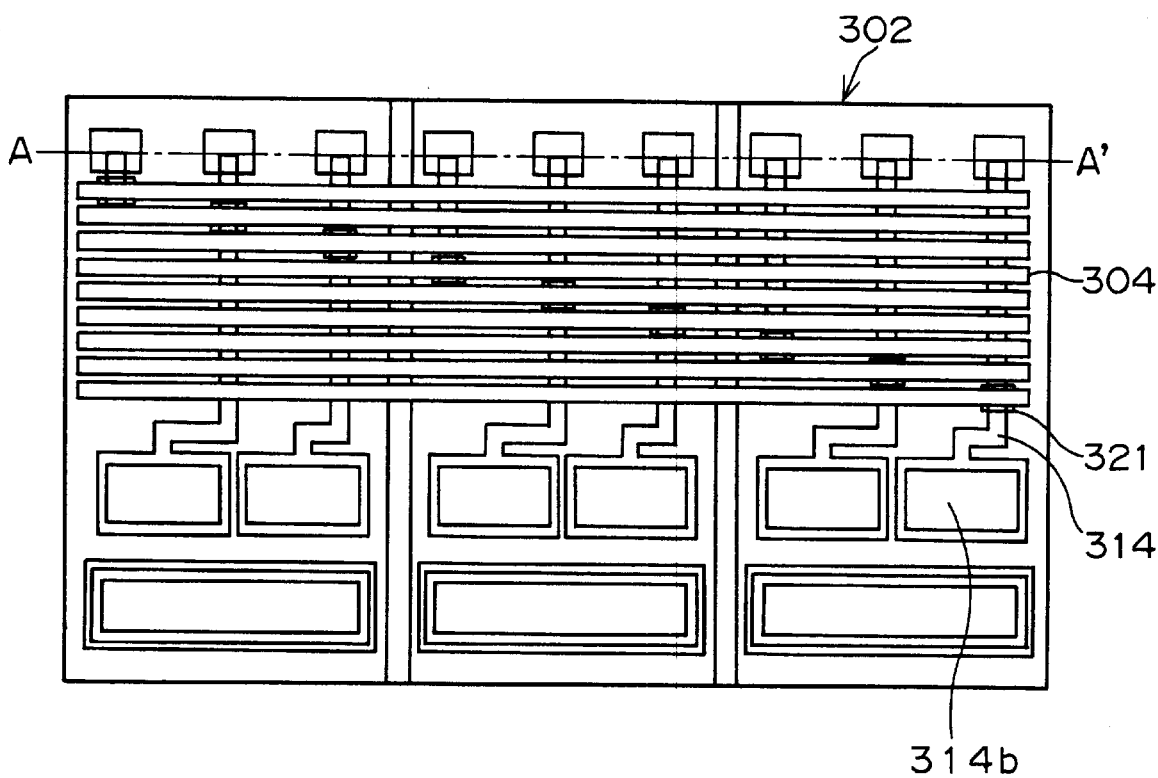
FIG. 74 illustrates a step in the process of manufacturing the LED array in the tenth embodiment of the present invention, which follows the step illustrated in FIG. 73.
Figure 74:
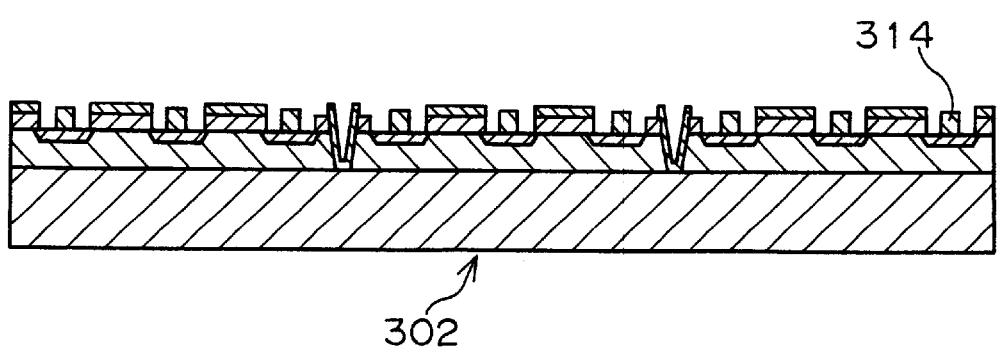

Finally, as illustrated in FIG. 74, a conductive film that is to constitute the p-side common wirings 304 is formed over the entire surface of the semiconductor substrate 302 where the patterning of the second layer insulating film 318 has been completed and the conductive film is patterned through a lift-off method to form the p-side common wirings 304. An Al film, for instance, may be used to constitute the conductive film for forming the p-type common wirings 304. It is obvious, however, that a material other than an Al film may be used to constitute the conductive film for forming the p-side common wirings 304, as long as the material can achieve ohmic contact with the p-side electrodes 314 and does not cause disconnection at the connecting portions. Through the steps described above, the LED array 300 illustrated in FIG. 33 is manufactured.

Figure 75:
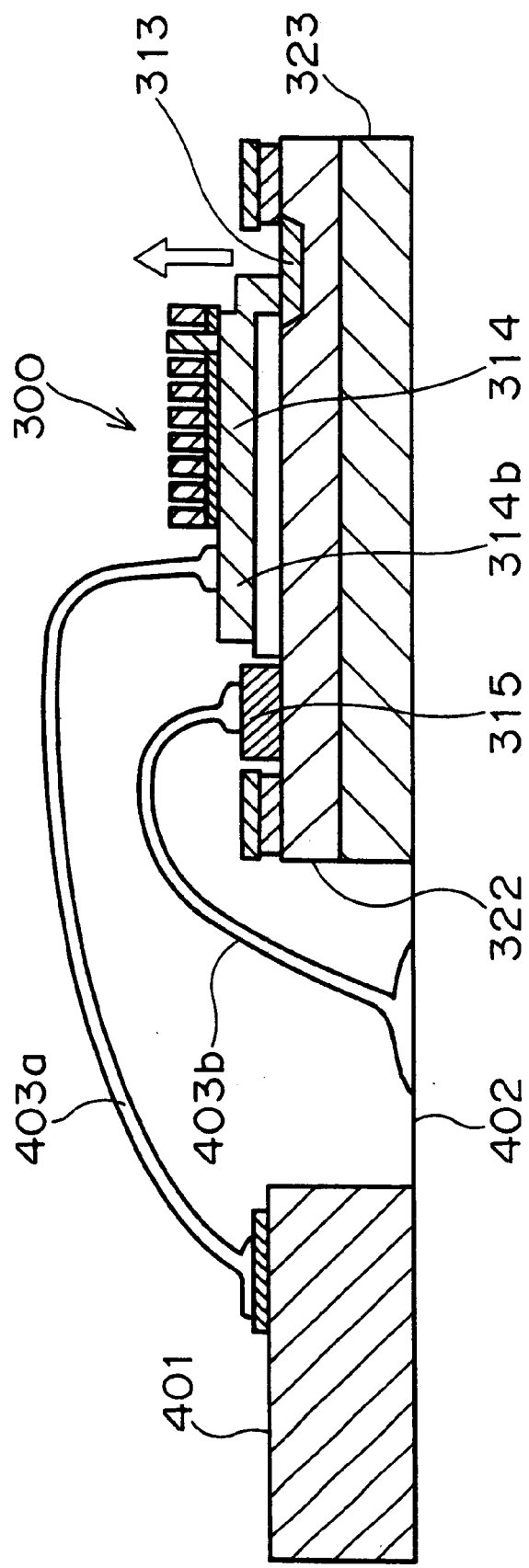
FIG. 75 is a cross section illustrating a structure through which the LED array in the tenth embodiment of the present invention is mounted at a printer head.

FIG. 75 is a cross section illustrating the structure achieved when the LED array 300 in the tenth embodiment of the present invention is mounted at a printer head. The printer head shown in FIG. 75 is provided with the LED array 300 and a drive circuit for driving the LED array 300. The drive circuit is provided with a drive IC 401 and a block ground 402. The p-side pad electrodes 403b of the LED array 300 are bonded to the drive IC 401 through an Au wire 403a, whereas the n-side electrodes 315 are bonded to the block ground 402 through an Au wire 403. The printer head illustrated in FIG. 75 is characterized in that the wire 403a bonded to the p-side pad electrodes 314b and the wire 403b bonded to the n-side electrodes 315 are drawn out from one side of the LED array 300 supporting 1200 DPI. In other words, the wires are drawn out only from the electrode side end surface 322 of the LED array 300, and no wire is drawn out from the light emitting portion side end surface 323.

By constituting the printer head by using the LED array 300, it becomes possible to draw out the wires from one side of the LED array even when the LED array supports a high density, to achieve a reduction in the size of the printer head. In addition, since the LED array can be mounted with a greater degree of ease compared to an LED array which necessitates wires to be drawn out from the two sides of the LED array, the cost required for the mounting can be reduced.

Now, a brief explanation is given on the operation of the LED array 300. The n-type semiconductor blocks 311 are assigned with reference numbers 311-1, 311-2, 311-3 . . . starting from the right side in FIG. 61. In addition, within each n-type semiconductor block 311, the individual LEDs 310 are assigned with reference numbers 310-1, 310-2, 310-3 from the right side in FIG. 61, the individual p-side electrodes 314 are assigned with reference numbers 314-1 ,314-2, 314-3 starting from the right side in FIG. 61 and the individual p-side pad electrodes 314b are assigned the reference numbers 314b-1, 314b-2 starting from the right side in FIG. 61. In addition, the individual p-side common wirings 304 are assigned with reference numbers 304-1, 304-2 . . . 304-9 starting from the bottom side in FIG. 61.

In the n-type semiconductor block 311-1, the p-side electrode 314-1 is connected to the p-side common wirings 304-1, the p-side electrode 314-2 is connected to the p-side common wirings 304-2 and the p-side electrode 314-3 is connected to the p-side common wirings 304-3. in the n-type semiconductor block 311-2, the p-side electrode 314-1 is connected to the p-side common wirings 304-4 and in the n-type semiconductor block 311-3, the p-side electrode 314-1 is connected to the p-side common wirings 304-7. Furthermore, in the n-side semiconductor block 311-4 (not shown), the p-side electrode 314-1 is connected to the p-side common wirings 304-1, the p-side electrode 314-2 is connected to the p-side common wirings 304-2 and the p-side electrode 314-3 is connected to the n-side common wirings 304-3 as in the n-type semiconductor block 311-1.

In each of the n-type semiconductor blocks 311-1–311-3, the p-side electrode 314-1 and the p-side electrode 314-2 are each provided with a p-side pad electrode 314b.

For instance, in order to light the LED 310-1 at the n-type semiconductor block 311-1, a voltage must be applied between the p-side electrode 314-1 (its p-side pad electrode 314b-1) at the n-type semiconductor block 311-1 and the n-side electrode 315 (its n-side pad electrode 315b) of the n-type semiconductor block 311-1. At this point, the LED 310-1 of the n-type semiconductor block 311-4 (not shown) can be lit at the same time by setting the potential of the n-side electrode 315 of the n-type semiconductor block 311-4 equal to the potential at the n-side electrode 315 of the n-type semiconductor block 311-1, since the p-side electrode 314-1 of the n-type semiconductor block 311-4 is connected to the p-side electrode 314-1 of the n-type semiconductor block 311-1 through the p-side common wirings 304-1. The LED 310-1 of the n-type semiconductor block 311-4 can be left unlit while the LED 310-1 of the n-type semiconductor block 311-1 is lit by setting the n-side electrode 315 of the n-type semiconductor block 311-4 in an open state. In addition, the LED 310-3 of the n-type semiconductor block 311-1 is lit by applying a voltage between a p-side electrode 314 of another n-type semiconductor block 311 that is connected to the p-side common wirings 304-3 and is provided with a p-side pad electrode 314b, e.g. between the p-side electrode 314b of the p-side electrode 314-3 of the n-type semiconductor block 311-4 (not shown), and the n-side electrode 315 of the n-type semiconductor block 311-1.

Thus, in the tenth embodiment, by forming the n-side electrodes 315 on the same side as the p-side pad electrodes 314b relative to the row of the light emitting portions 313 and connecting them to the n-type semiconductor blocks 311 on the same side as the p-side pad electrodes 314b, an LED array capable of supporting a high density in which the n-side electrodes 315p are provided on the same side as the p-side pad electrodes 314b is achieved. In addition, by constituting a printer head with this high density LED array, it becomes possible to draw out the bonding wire from one side of the LED array, to reduce the head size of the printer head. Furthermore, since the mounting process is facilitated, the cost required for mounting can be reduced.

In the above embodiment, the structure of LED array 300 which has two p-side electrodes 314b in each n-type semiconductor block 311 is disclosed. The present invention, however, is not limited to such structure. The number of p-side electrodes is freely selected according to the design of the LED array. For, example, as illustrated in FIG.62, the structure of LED array 300' which has single p-side electrode 314b in each n-type semiconductor block 311 is properly applied to the present invention.

(Eleventh Embodiment)

By adopting the tenth embodiment in which the n-side electrodes and the p-side pad electrodes are provided on the same side relative to the row of light emitting portions, an end surface light emission type LED array in which the emitted light is radiated in the horizontally direction from an end surface of the LED array can be achieved. It is to be noted that the LED array illustrated in FIG. 61 is referred to as an upper surface light emission type LED array as opposed to the end surface light emission type. An end surface light emission type LED array is characterized in that, since the p-side electrodes can be formed over the entire surfaces of the light emitting portions (p-type semiconductor layers), the connection areas of the light emitting portions and the p-side electrodes can be increased to achieve a reduction in the threshold voltage compared to that required in an upper surface emission type LED array.

Figure 76:
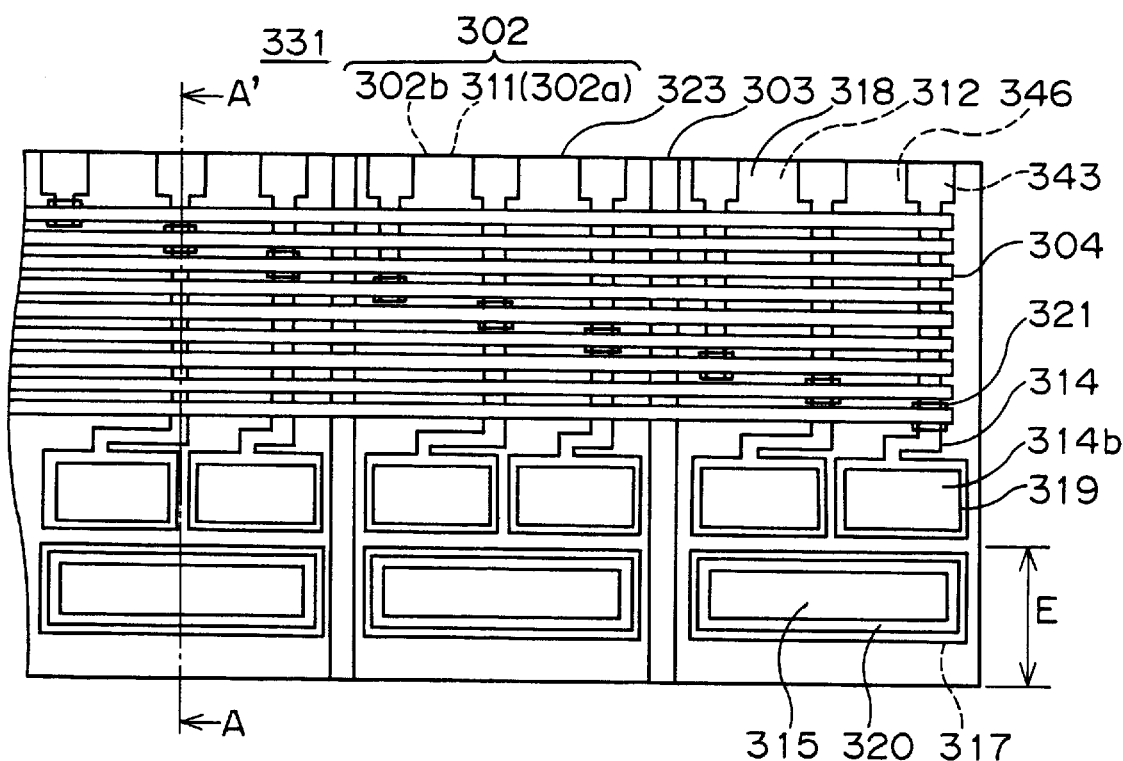
FIG. 76 illustrates the structure of the LED array in an eleventh embodiment of the present invention.
Figure 76:
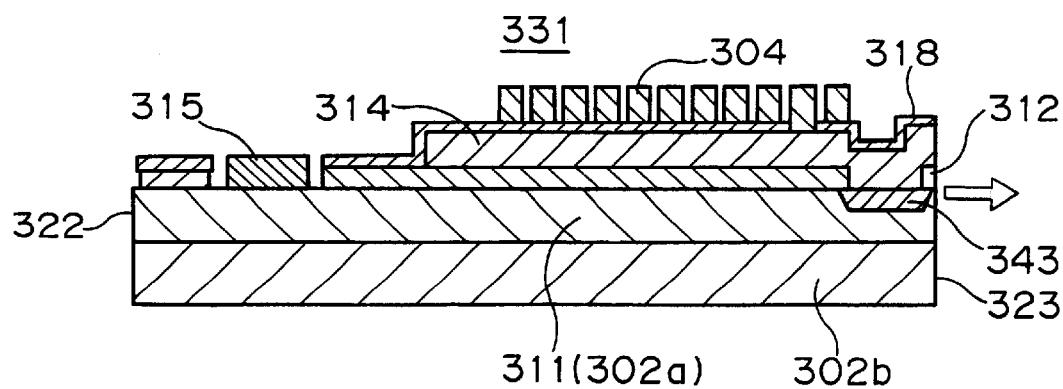

FIG. 76 illustrates the structure of an LED array 331 in the eleventh embodiment of the present invention, with FIG. 76(a) presenting its top view and FIG. 76(b) presenting a cross section through line A–A' in FIG. 76(a). It is to be noted that the same reference numbers are assigned to components that are identical to those illustrated in FIG. 61. The LED array 331 adopts the end surface light emission system, and is constituted by replacing the light emitting portions 313 and the p-side opening portions 316 in the LED array 300 in FIG. 61 with light emitting portions 43 and p-side opening portions 46 respectively.

The light emitting portions (p-type semiconductor layers) 43 are formed in close proximity to the light emitting portion side end surface 323 of an n-type semiconductor block 311 (n-type semiconductor substrate 302a). The p-type opening portions 46 are provided at the first layer insulating film 312, and correspond to the first opening portions 316a in FIG. 61. The surfaces of the light emitting portions 43 within the opening portions 46 are entirely covered by the p-side electrodes 314. It is not necessary to provide openings that will correspond to the second opening portions 316b in FIG. 61 in the second layer insulating film 318. In the LED array 331, the emitted light is radiated from the end surface 323 at the light emitting portion side. In other words, it is radiated to the right in the horizontal direction in FIG. 76(b). The light emitting characteristics of the end surface light emission type LED array 331 have already been verified by the inventor of the present invention and the like to compare favorably to those achieved by LED arrays in the prior art. It is to be noted that the manufacturing processes for achieving the LED 331 are basically identical to those adopted in the tenth embodiment. However, a process for machining the light emitting portion side end surface 323 may have to be added. In addition, the operation of the LED array 331 is identical to that of the LED array 300 in the tenth embodiment except for that the emitted light is radiated from the end surface at the light emitting portion side.

By forming the n-side electrodes 315 and the p-side pad electrodes 314b on the same side relative to the light emitting portions 343 and forming the light emitting portions (p-type semiconductor layers) 343 in close proximity to the light emitting portion side end surface 323 in this manner, it becomes possible to manufacture an end surface light emission type LED array 331 having a row of the light emitting portions 343 formed with a high density. In addition, by adopting the end surface light emission system, the width of the LED array 331 can be reduced by the length corresponding to the distance from the light emitting portions 313 to the light emitting portion side end surface 323 (the length D in FIG. 61) compared to the width of the LED array 300 illustrated in FIG. 61.

Figure 78:
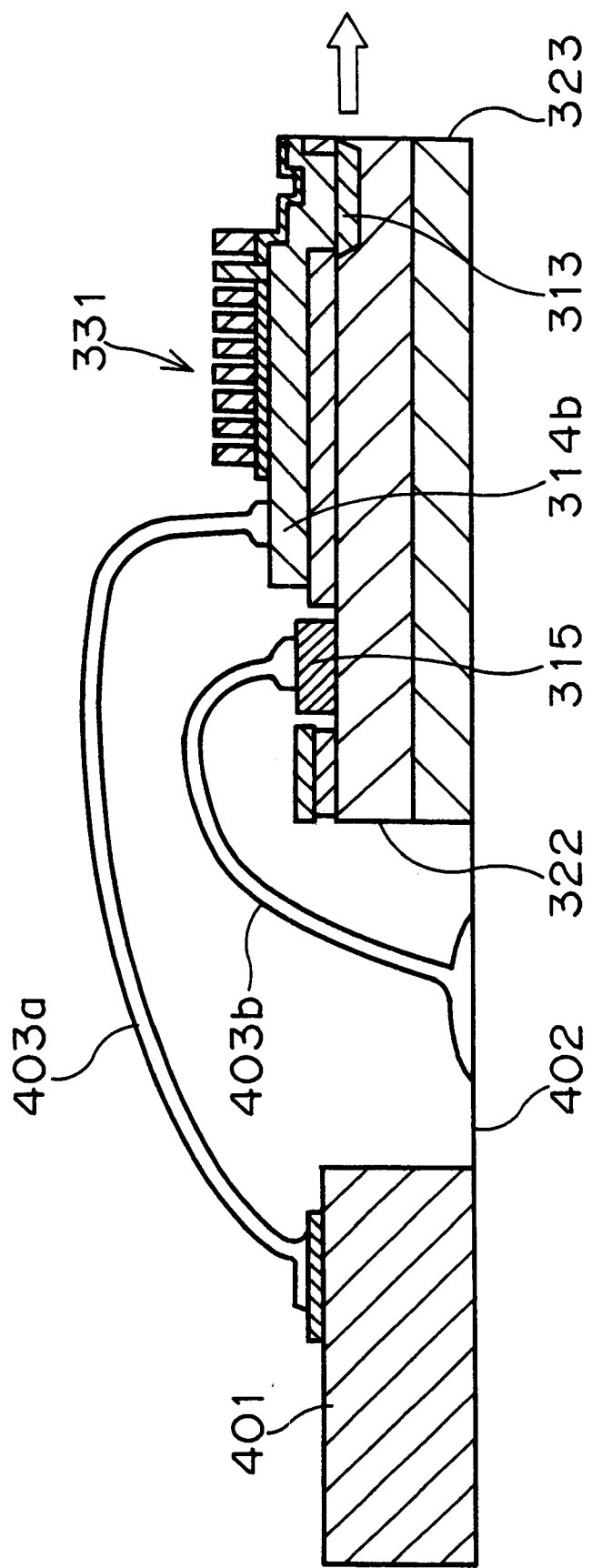
FIG. 78 is a cross section illustrating a structure through which the LED array in the eleventh embodiment of the present invention is mounted at a printer head.

FIG. 78 is a cross section illustrating the structure achieved when mounting the LED array 331 in the eleventh embodiment of the present invention at a printer head. It is to be noted that in FIG. 78, the same reference numbers are assigned to components having essentially the same functions and structural features as those shown in FIG. 75. As illustrated in FIG. 78, in the LED array 331 adopting the end surface light emission system, too, the wires can be drawn out from one side of the LED 331, i.e., from the electrode side toward the end surface 322, as in the tenth embodiment. In addition, since the width of the LED array itself can be reduced by the length D in FIG. 61, the head size of the printer head can be further reduced compared to that in the tenth embodiment.

Thus, in the eleventh embodiment, by forming the n-side electrodes 315 and the p-side pad electrodes 314b on the same side relative to the light emitting portions 343 and forming the light emitting portions 343 in close proximity to the light emitting portion side end surface 323, it becomes possible to manufacture an end surface light emission type LED array 331 having a row of the light emitting portions 343 formed at high density. In addition, by adopting the end surface light emission system, the width of the LED array itself can be reduced compared to that in the tenth embodiment, thereby achieving a further reduction in the head size of the printer head.

Figure 77:
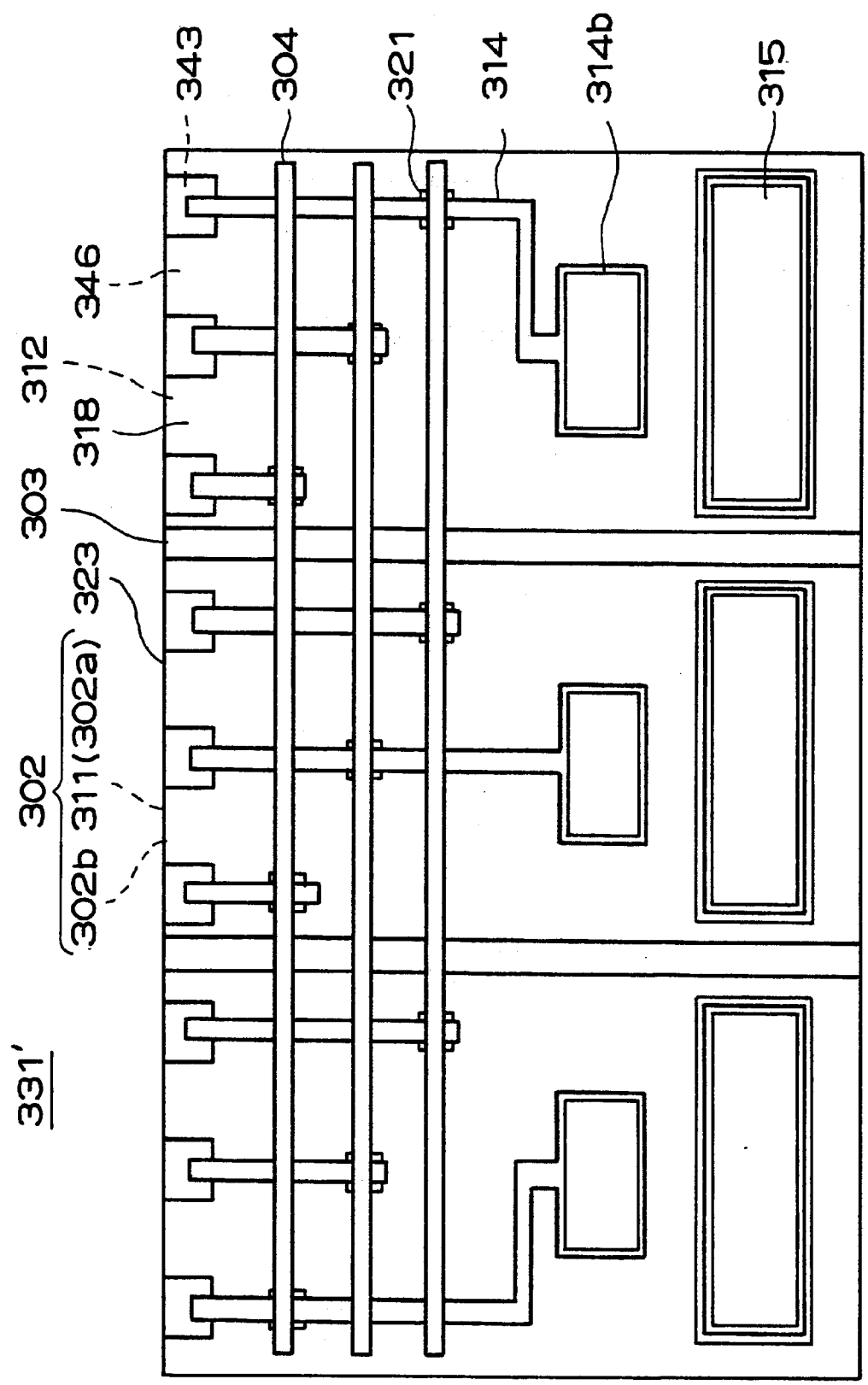
FIG. 77 illustrates another version of the eleventh embodiment of the present invention illustrated in FIG. 76.

In the above embodiment, the structure of LED array 331 which has two p-side electrodes 314b in each n-type semiconductor block 311 is disclosed. The present invention, however, is not limited to such structure. The number of p-side electrodes is freely selected according to the design of the LED array. For, example, as illustrated in FIG. 77, the structure of LED array 331' which has single p-side electrode 314b in each n-type semiconductor block 311 is properly applied to the present invention.

(Twelfth Embodiment)

FIG. 79 is a top view illustrating the structure of an LED array 351 in the twelfth embodiment of the present invention. It is to be noted that in FIG. 79, the same reference numbers are assigned to components having essentially the same functions and structural features as those shown in FIGS. 57 and 71. The LED array 351 is achieved by replacing the n-side electrodes 315, the n-side opening portions 317, the p-side electrodes 314 and the p-side pad electrodes 314b in the LED array 300 illustrated in FIG. 61 with n-side electrodes 365, n-side opening portions 367, p-side electrodes 364 and p-side pad electrodes 364b respectively.

In FIG. 79, 5 LEDs 310 (N=5) are provided in each n-type semiconductor block 311 and five p-side common wirings 314 (M=5) are provided. Furthermore, two n-side electrodes 365 and two p-side pad electrodes 364b are formed in each n-type semiconductor block 311. It is to be noted that no particular restrictions are imposed upon the number of n-side electrodes 365 and the number of p-side pad electrodes 364b within an n-type semiconductor block 311 as long as they are equal to each other, and therefore, one each or three each of them or more may be provided. In addition, while the number N of the LEDs 310 within an n-type semiconductor block 311, the number M of the p-side common wirings 304 and the positions where the via holes 321 are formed in the LED array 351 illustrated in FIG. 79 are different from those in the LED array 300 illustrated in FIG. 61, the operation of the LED array 351 is basically identical to that of the LED array 300 in FIG. 61.

The LED array 351 in the twelfth embodiment is characterized in that the n-side electrodes 365 and the p-side pad electrodes 364b are provided in a signal row. In addition, it is characterized in that the n-side electrodes 365 and the p-side pad electrodes 364b are positioned alternately with each other. In other words, it is characterized in that, in the row of the p-side pad electrodes 364b, the n-side electrodes 365 are formed between the p-side pad electrodes 364b. This makes it possible to reduce the width of the LED array 351 by the distance E in FIG. 61 compared to the width of the LED array 300 illustrated in FIG. 61. It is to be noted that the light emitting characteristics achieved by the LED array 351 have already been confirmed to compare favorably with those achieved by LED arrays in the prior art by the inventor of the present invention and the like.

Figure 81:
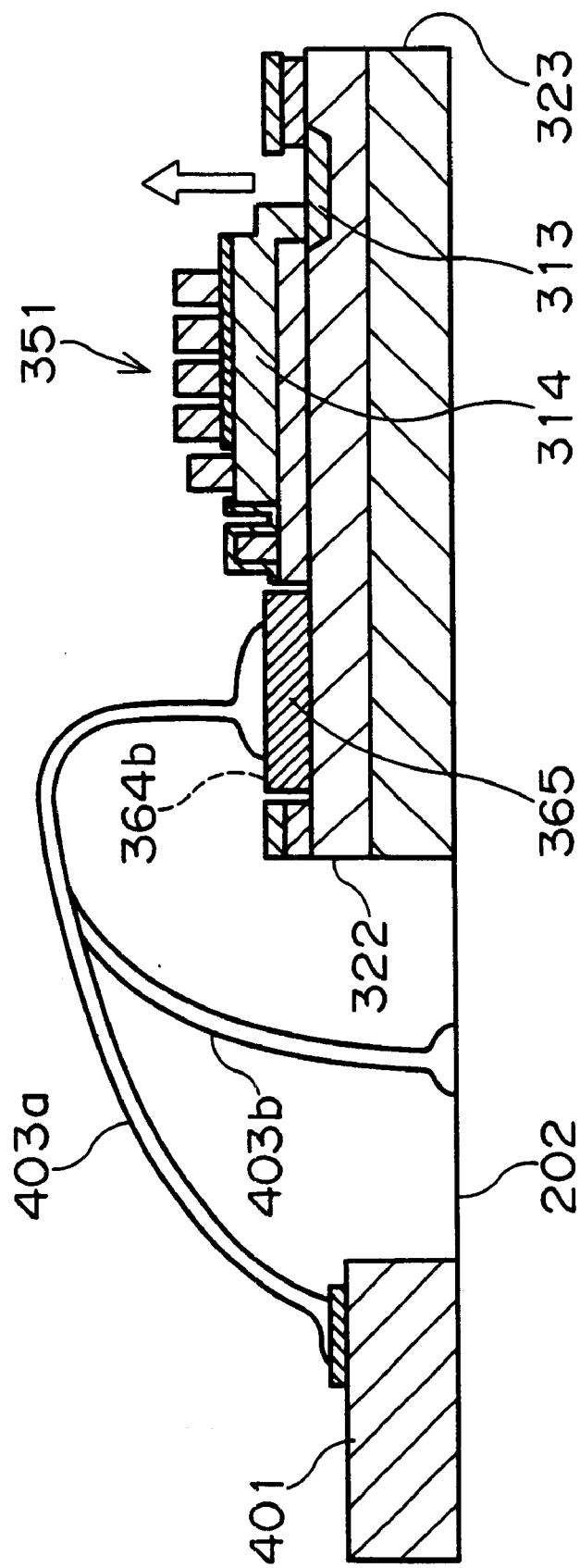
FIG. 81 is a cross section illustrating a structure through which the LED array in the twelfth embodiment of the present invention is mounted at a printer head.

FIG. 81 is a cross section illustrating the structure achieved when mounting the LED array 351 in the twelfth embodiment of the present invention at a printer head. It is to be noted that in FIG. 81, the same reference numbers are assigned to components having essentially the same functions and structural features as those shown in FIG. 75 and 72. As illustrated in FIG. 81, in the LED array 351, too, the wires can be drawn out from one side of the LED 351, i.e., from the electrode side toward the end surface 322, as in the tenth and eleventh embodiments. In addition, since the width of the LED array itself can be reduced by the length E in FIG. 61, the head size of the printer head can be further reduced compared to that in the tenth embodiment.

Thus, in the twelfth embodiment, since the width of the LED array itself can be reduced compared to that in the tenth embodiment by providing the n-side electrodes 365 and the p-side pad electrodes 364b in a single row, the head size of the printer head can be further reduced.

Figure 80:
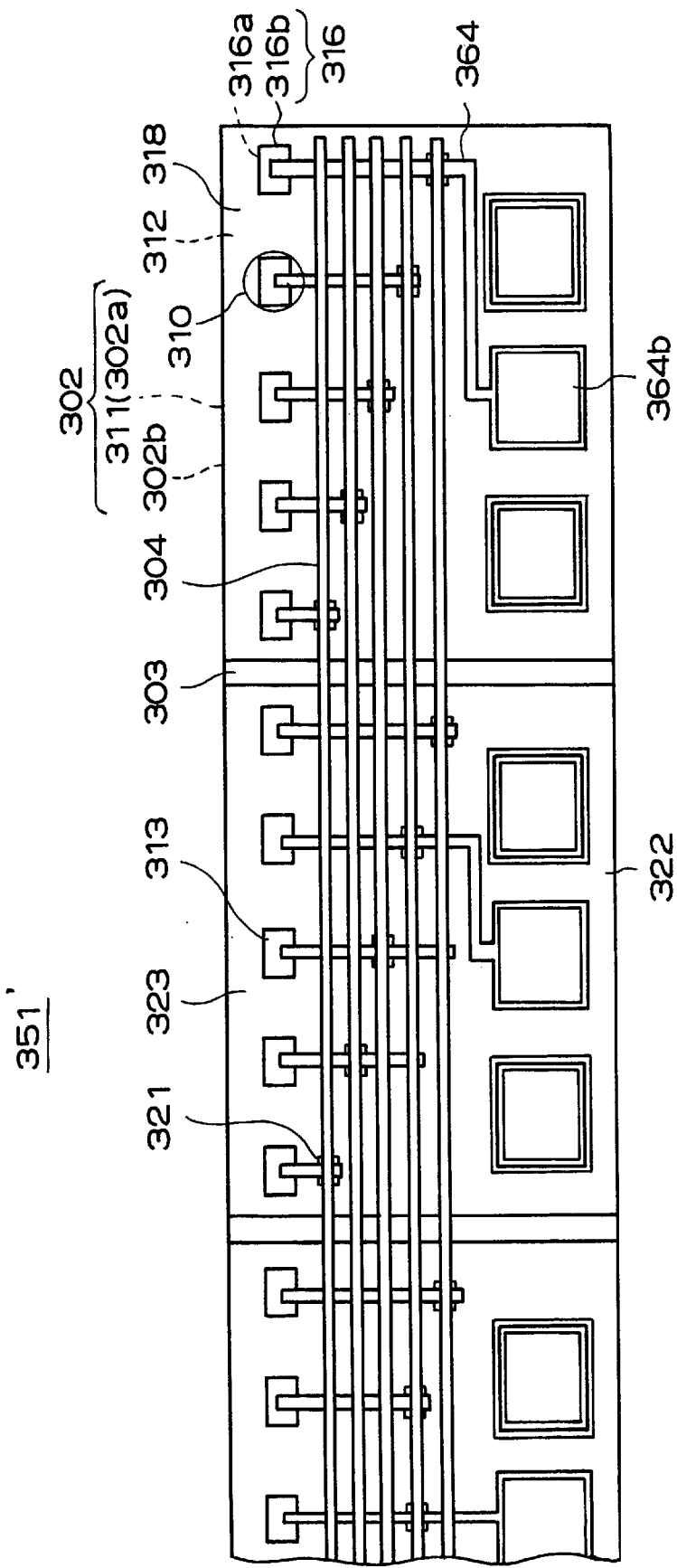
FIG. 80 illustrates another version of the twelfth embodiment of the present invention illustrated in FIG. 79.

In the above embodiment, the structure of LED array 351 which has two p-side electrodes 364b in each n-type semiconductor block 311 is disclosed. The present invention, however, is not limited to such structure. The number of p-side electrodes is freely selected according to the design of the LED array. For, example, as illustrated in FIG. 80, the structure of LED array 351' which has single p-side electrode 364b in each n-type semiconductor block 311 is properly applied to the present invention.

(Thirteenth Embodiment)

Figure 82:
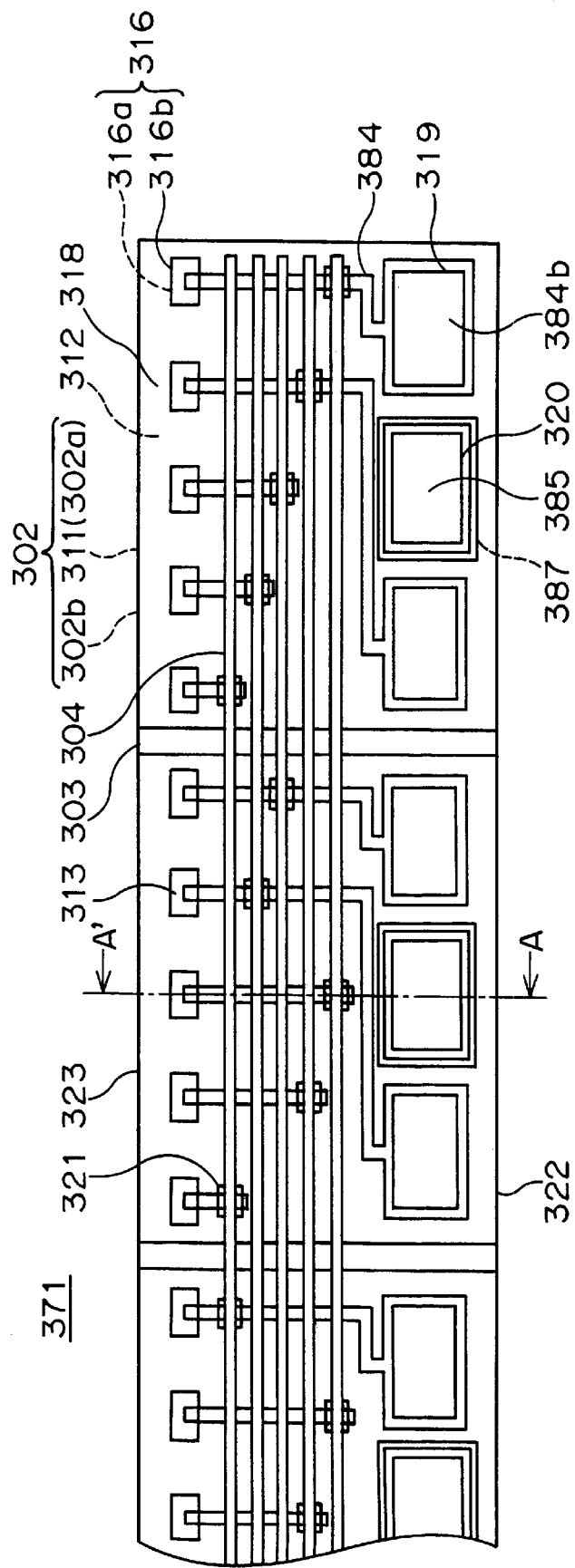
FIG. 82 illustrates the structure of the LED array in a thirteenth embodiment of the present invention.
Figure 82:
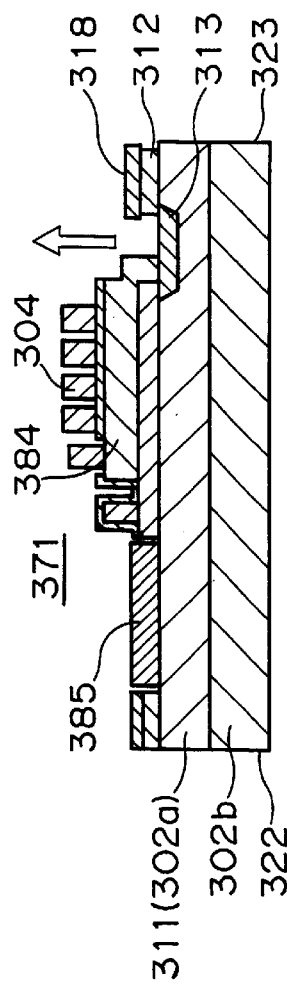

FIG. 82 is a top view illustrating the structure of an LED array 371 in the thirteenth embodiment of the present invention. It is to be noted that in FIG. 82, the same reference numbers are assigned to components having essentially the same functions and structural features as those shown in FIGS. 57, 71 and 73. The LED array 371 in the thirteenth embodiment is achieved by replacing the n-side electrodes 365, the n-side opening portions 367, the p-side electrodes 364 and the p-side pad electrodes 364b in the LED array 351 illustrated in FIG. 79 with n-side electrodes 385, n-side opening portions 387, p-side electrodes 384 and p-side pad electrodes 384b respectively. It is to be noted that the operation of the LED array 371 is essentially identical to that of the LED array 351 in the twelfth embodiment. In addition, the structure achieved when mounting the LED array 371 at a printer head is essentially identical to that illustrated in FIG. 81.

The LED array 371 in the thirteenth embodiment is characterized in that the n-side electrodes 385 and the p-side pad electrodes 384b are provided in a single row and that one n-side electrode 385 is provided in each n-type semiconductor block 311. This makes it possible to increase the electrode pitch or the electrode intervals in the electrode row comprising the p-side pad electrode 384b and the n-side electrodes 385 and to increase the sizes of the electrodes in the direction in which the row extends.

Consequently, since when the LED array 371 is mounted at a printer head, the clearance of the wires is increased to allow the wires to be retrieved with ease in the event of a wire bonding defect, the mounting cost can be further reduced compared to that required in the twelfth embodiment. It is to be noted that the light emitting characteristics achieved by the LED array 371 have been already confirmed by the inventor of the present invention to compare favorably with those achieved by LED arrays in the prior art.

The following is an explanation of the method for manufacturing the LED array 371 in the thirteenth embodiment illustrated in FIG. 82. FIGS. 76 through 80 illustrate individual steps in the method for manufacturing the LED array 371. In the individual figures, (a) presents a top view, (b) presents a cross section through line A–A' in (a) and (c) presents a cross section through line B–B' in (a).

Figure 84:
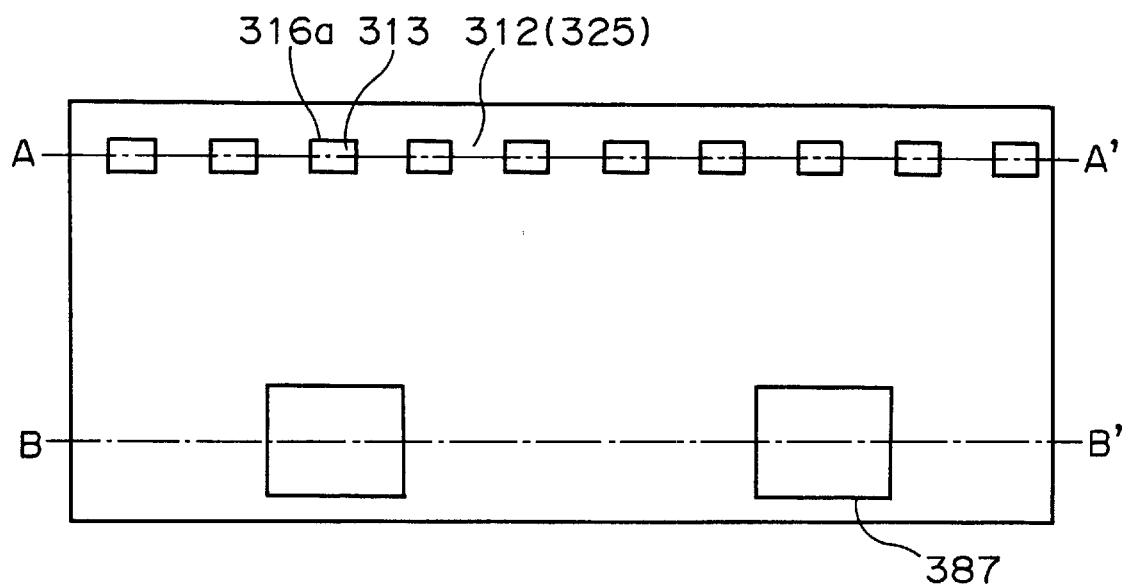
FIG. 84 illustrates a step in the process of manufacturing the LED array in the thirteenth embodiment of the present invention.
Figure 84:
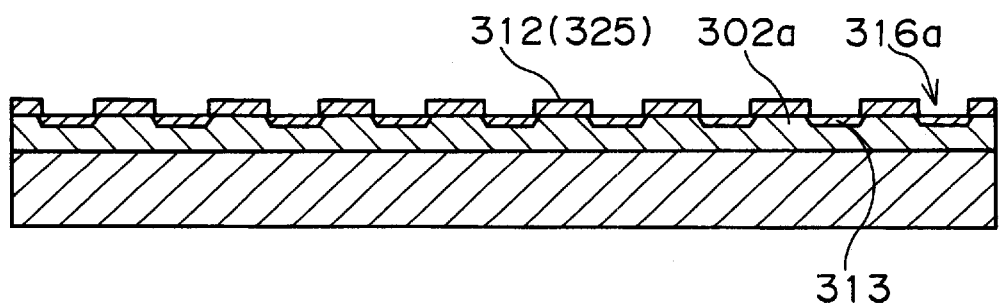
Figure 84:
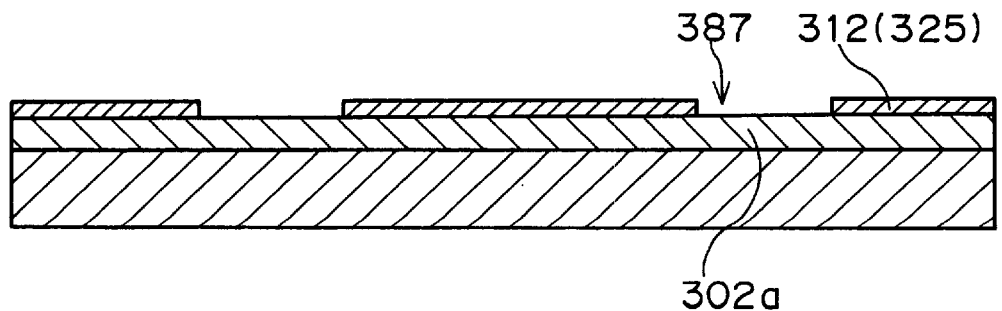

First, as illustrated in FIG. 84, by following through manufacturing steps that are essentially identical to those illustrated in FIGS. 58 through 64 explained earlier in reference to the tenth embodiment, a semiconductor substrate 302, which is constituted by forming an n-type semiconductor substrate 302b constituted of an n-type AlGaAs epitaxial layer on a high resistance semiconductor substrate 302b constituted of a semi-insulating GaAs substrate is prepared, a diffusion mask 325 (the first layer insulating film 312 and first opening portions 316a are formed at the surface of the n-type semiconductor substrate 302a, light emitting portions (p-type semiconductor layers) 313 are formed in the areas corresponding to the first opening portions 316a at the n-type semiconductor substrate 302a by employing the Zn solid phase diffusion method and n-side opening portions 387 are formed at the first layer insulating film 312. The n-side opening portions 387 are formed so that the anticipated formation areas for the p-side pad electrodes 384b and the n-side opening portions 387 form a single row, and one of them is formed in the anticipated formation area for each n-type semiconductor block 311.

Figure 85A:
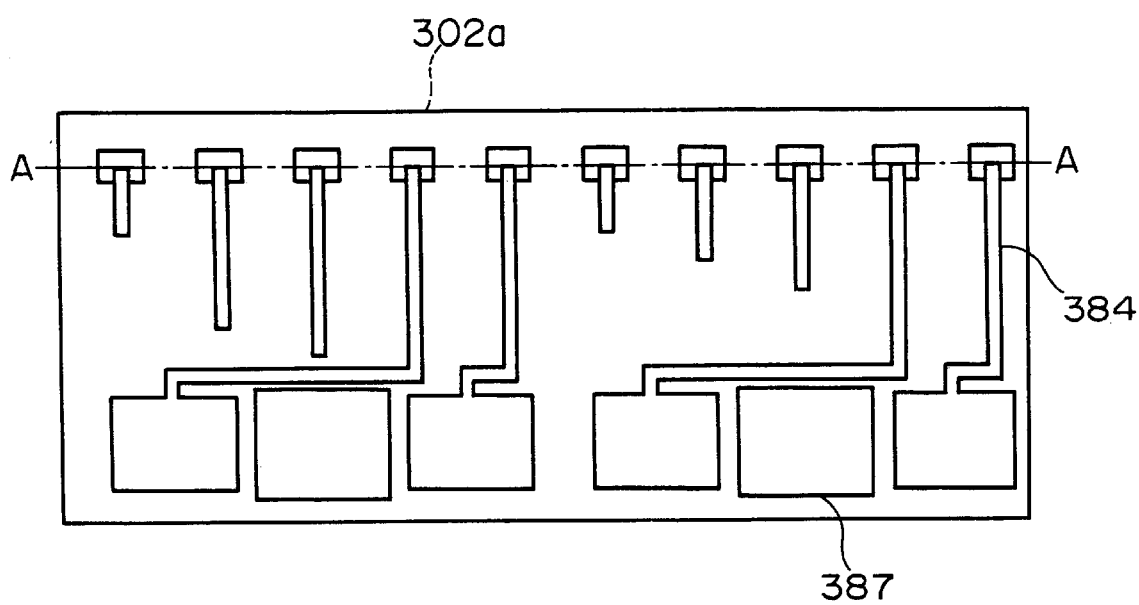
FIG. 85 illustrates a step in the process of manufacturing the LED array in the thirteenth embodiment of the present invention, which follows the step illustrated in FIG. 84.
Figure 85B:
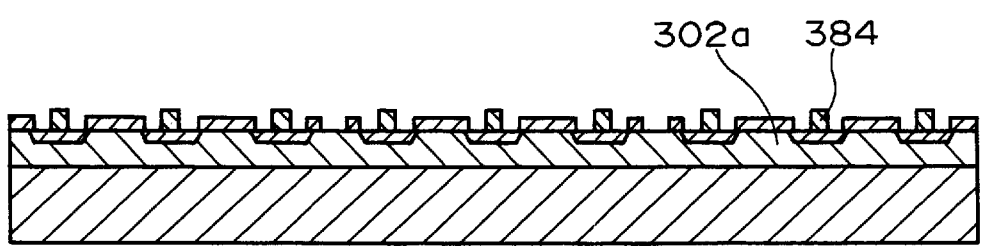

Next, as illustrated in FIG. 85, a conductive film that is to constitute the p-side electrodes 384 is formed at the surface of the n-type semiconductor substrate 302a where the formation of the n-side opening portions 387 has been completed and this conductive film is patterned through a lift-off method to form the p-side electrodes 384. An Al film, for instance, may be used to form the conductive film.

Figure 86:
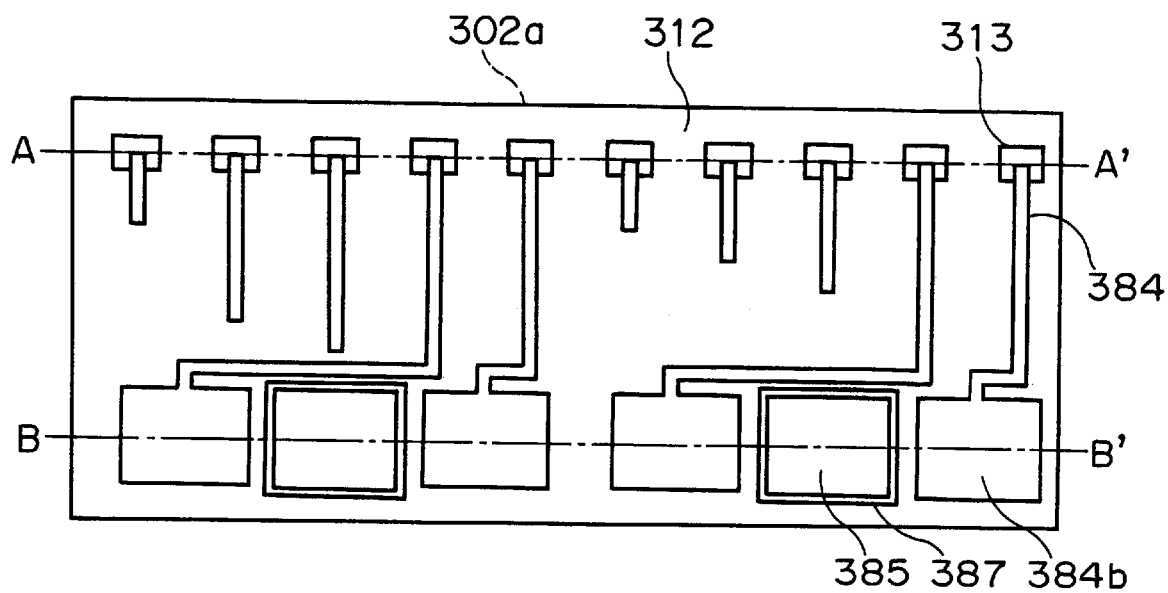
FIG. 86 illustrates a step in the process of manufacturing the LED array in the thirteenth embodiment of the present invention, which follows the step illustrated in FIG. 85.
Figure 86:
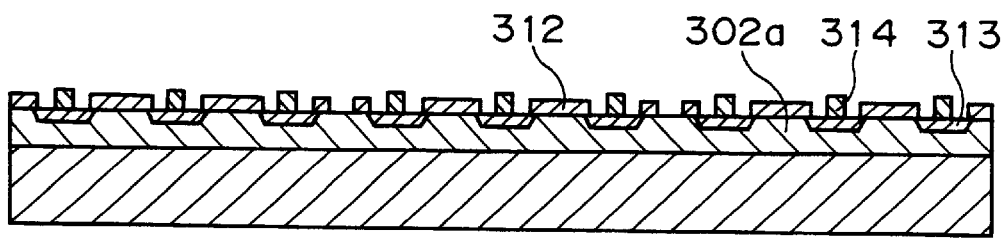
Figure 86:
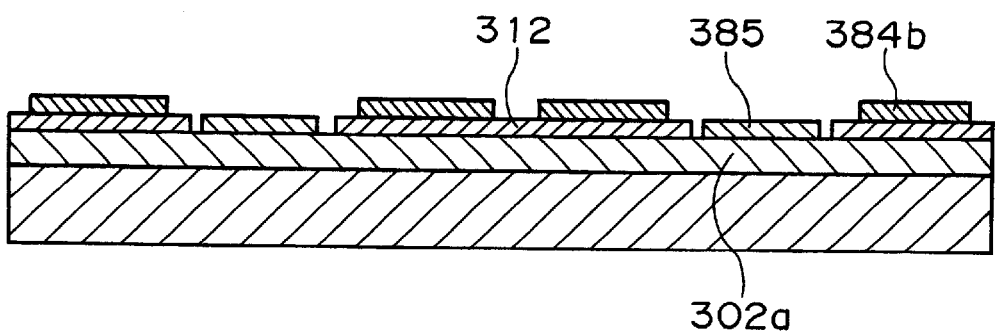

Next, as illustrated in FIG. 86, a conductive film that is to constitute the n-side electrodes 385 is formed at the surface of the n-type semiconductor substrate 302a where the formation of the p-side electrodes 384 has been completed and this conductive film is patterned through a lift-off method to form the n-side electrodes 385 within the n-side opening portions 387. An Au alloy film, for instance, may be used to form the conductive film that is to constitute the n-side electrodes 385. The p-side pad electrodes 384b of the p-side electrodes 384 and the n-side electrodes 385 are provided in a single row. It is to be noted that the step illustrated in FIG. 85 and the step illustrated in FIG. 86 may be incorporated so that the n-side electrodes 385 and the p-side electrodes 384 are formed at the same time. Since this will reduce the number of cycles of conductive film formation and patterning by one, the manufacturing process is simplified.

Figure 67A:
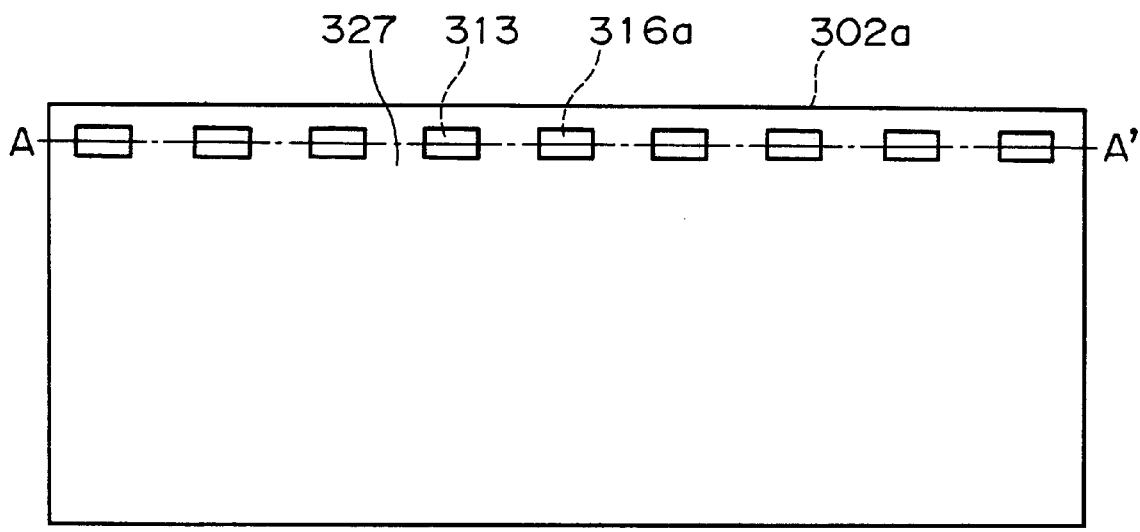
FIG. 67 illustrates a step in the process of manufacturing the LED array in the tenth embodiment of the present invention, which follows the step illustrated in FIG. 66.
Figure 67B:
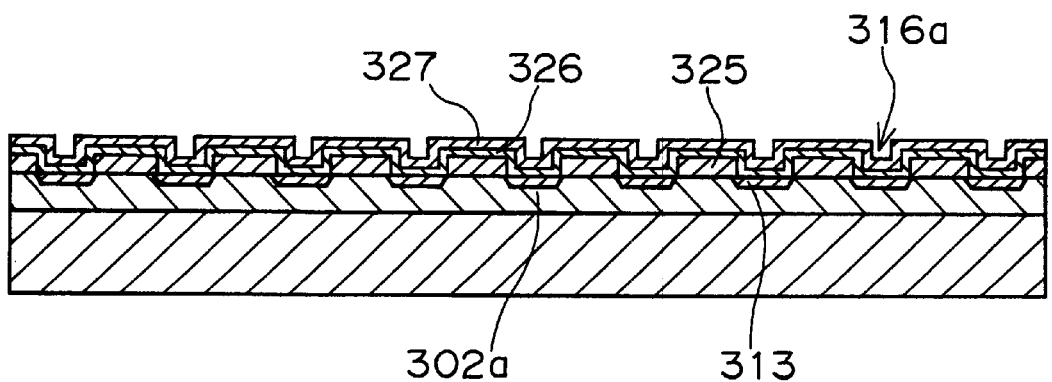
Figure 87:
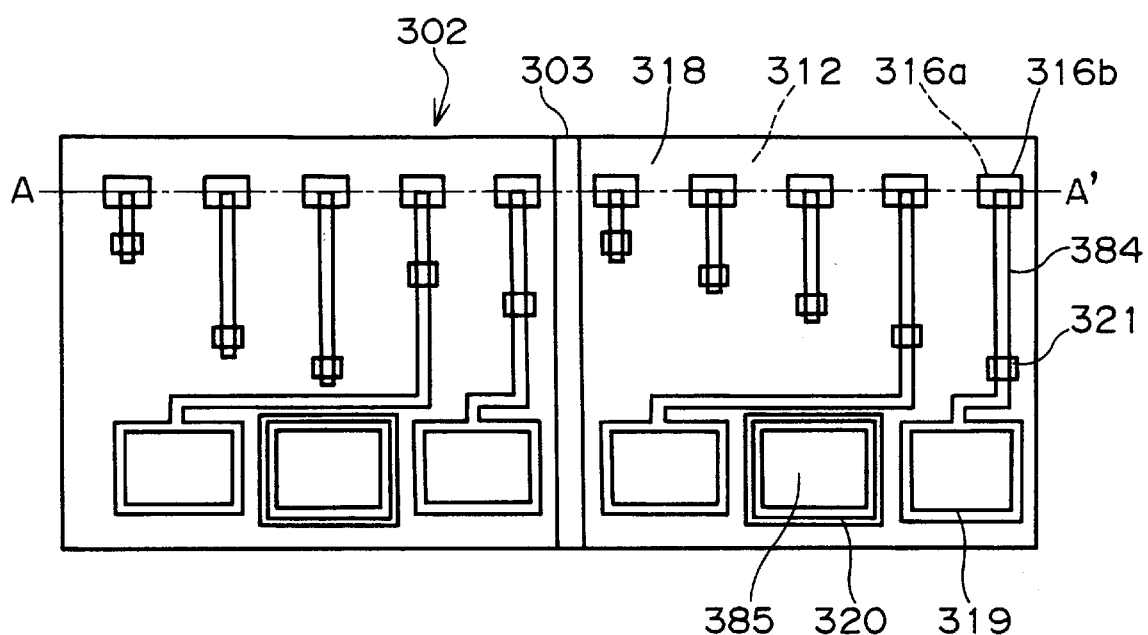
FIG. 87 illustrates a step in the process of manufacturing the LED array in the thirteenth embodiment of the present invention, which follows the step illustrated in FIG. 86.
Figure 87:
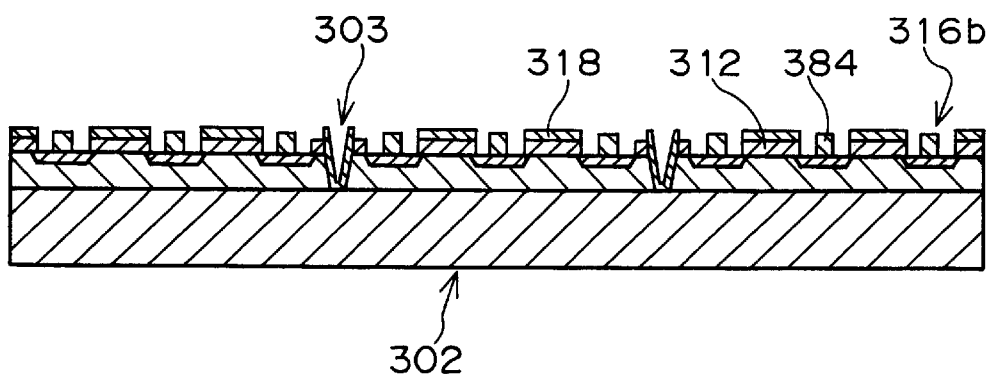

Next, as illustrated in FIG. 87, block separating grooves 303 are formed at the semiconductor substrate 302 where the formation of the n-side electrodes 385 has been completed, a second layer insulating film 318 is formed thereupon, and second opening portions 316b, p-side pad opening portions 319, n-side pad opening portions 320 and via holes 321 are formed in the second layer insulating film 318, by following through a procedure similar to that illustrated in FIGS. 67 through 69 explained earlier in reference to the eleventh embodiment.

Figure 88:
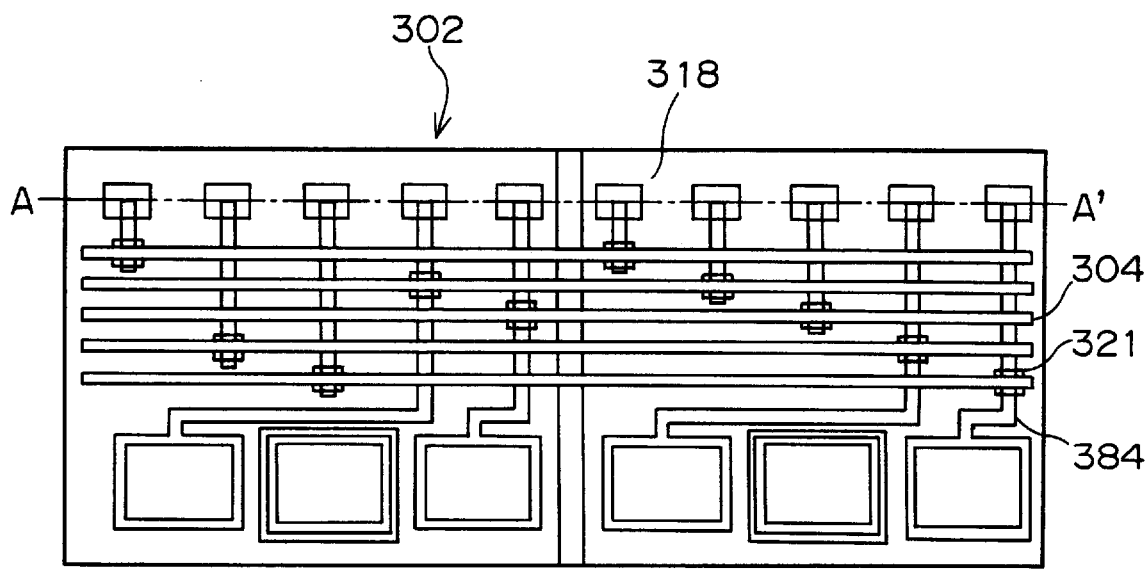
FIG. 88 illustrates a step in the process of manufacturing the LED array in the thirteenth embodiment of the present invention, which follows the step illustrated in FIG. 87.
Figure 88:
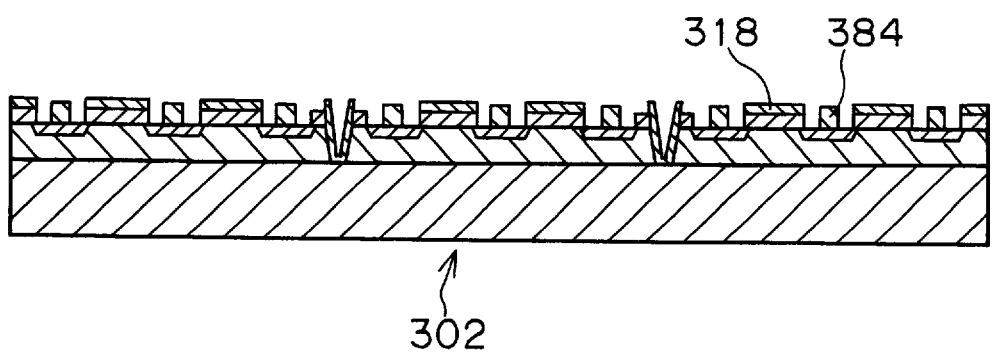

Finally, as illustrated in FIG. 88, a conductive film that is to constitute p-side common wirings 304 is formed at the surface of the semiconductor substrate 302 where the patterning of the second layer insulating film 318 has been completed, and this conductive film is patterned through a lift-off method to form the p-side common wirings 304. The LED array 371 illustrated in FIG. 82 is manufactured by following through the steps explained above. It is to be noted that the manufacturing steps implemented in the twelfth embodiment are identical to those in the thirteenth embodiment.

Thus, in the thirteenth embodiment, by providing the n-side electrodes 385 and the p-side pad electrodes 384b in a single row and providing one n-side electrode 385 in each n-type semiconductor block 311, the electrode pitch or the electrode intervals in the electrode row comprising the p-side pad electrodes 384b and the n-side electrodes 385 can be increased. In addition, the sizes of the electrodes in the direction in which the row extends can be increased. As a result, since, when the LED array 371 is mounted at a printer head, the clearance distance of the wires is increased to allow easy retrieval of a wire in the event of a wire bonding defect, the mounting cost can be further reduced compared to that required in the twelfth embodiment.

Figure 83:
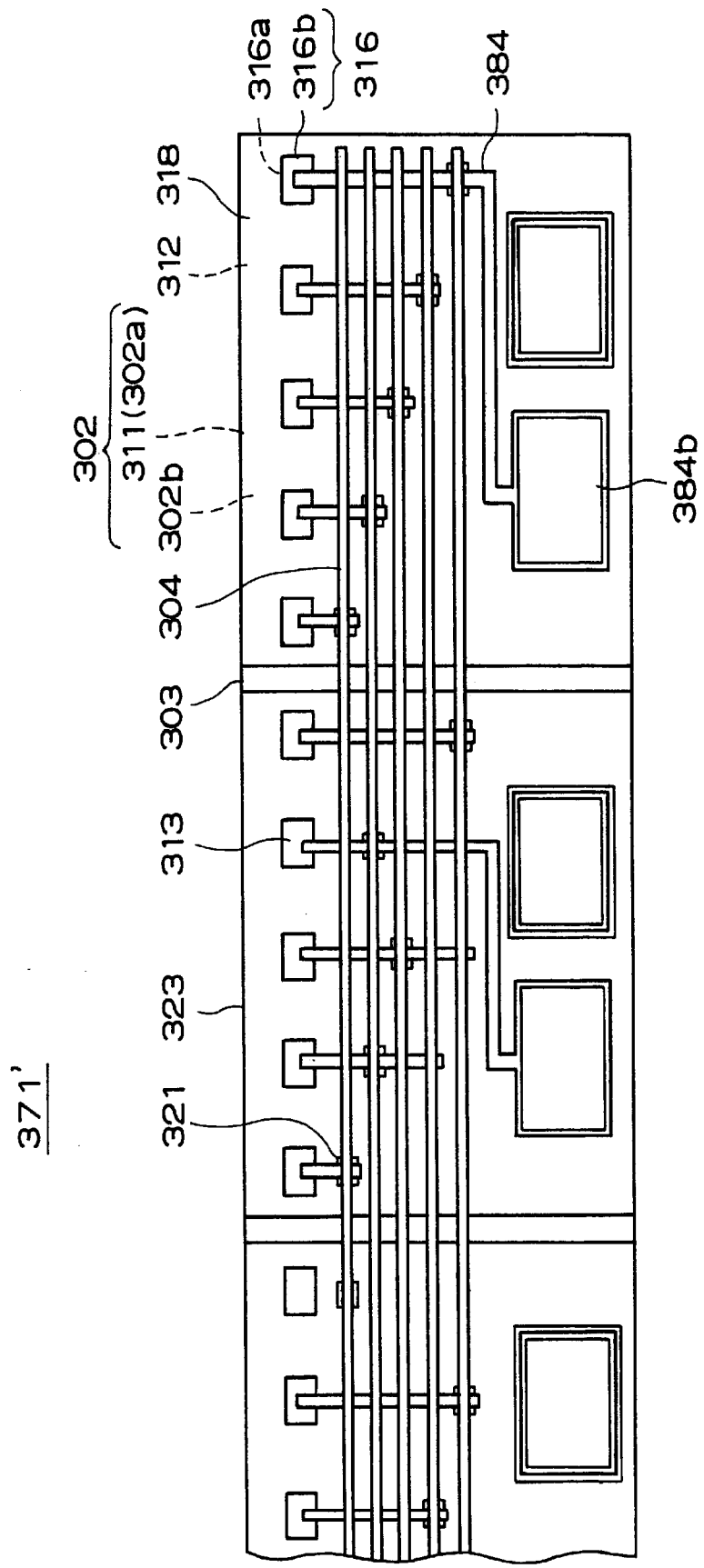
FIG. 83 illustrates another version of the thirteenth embodiment of the present invention illustrated in FIG. 82.

In the above embodiment, the structure of LED array 371 which has two p-side electrodes 384b in each n-type semiconductor block 311 is disclosed. The present invention, however, is not limited to such structure. The number of p-side electrodes is freely selected according to the design of the LED array. For, example, as illustrated in FIG. 83, the structure of LED array 371' which has single p-side electrode 384b in each n-type semiconductor block 311 is properly applied to the present invention.

(Fourteenth Embodiment)

FIG. 89 illustrates the structure of an LED array 391 in the fourteenth embodiment of the present invention, with FIG. 89(a) presenting its top view and FIG. 89(b) presenting a cross section through line A–A' in FIG. 89(a). It is to be noted that in FIG. 89, the same reference numbers are assigned to components having essentially the same functions and structural features as those shown in FIGS. 71 and 75.

The LED array 391 in the fourteenth embodiment is achieved by adopting the thirteenth embodiment in an end surface light emission type LED array. Thus, the LED array 391, which employs the end surface light emission system, is achieved by replacing the light emitting portions 313 and the p-side opening portions 316 in the LED array 371 in FIG. 82 with light emitting portions 343 and p-side opening portions 346 respectively.

The light emitting portions (p-type semiconductor layers) 343 and the p-side opening portions 346 are identical to those shown in FIG. 76, and are formed in close proximity to the light emitting portion side end surface 323 of each n-type semiconductor block 311 (n-type semiconductor substrate 302a). The surfaces of the light emitting portions 343 within the opening portions 346 are entirely covered by the p-side electrodes 384. The light emitting characteristics achieved by the end surface light emission type LED array 391 have already been verified by the inventor of the present invention and the like to compare favorably with those achieved by LED arrays in the prior art. It is to be noted that the manufacturing steps implemented for manufacturing the LED array 391 are basically identical to those in the thirteenth embodiment. However, a step for machining the light emitting portion side end surface 323 may have to be added. In addition, the operation of the LED array 391 is identical to that of the LED array 371 in the thirteenth embodiment, except for that the emitted light is radiated from the light emitting portion at the side end surface 323.

By forming the n-side electrodes 385 and the p-side pad electrodes 384b in a single row on the side toward the electrode side end surface 322 and forming the light emitting portions (p-type semiconductor layers) 343 in close proximity to the light emitting portion side end surface 323, as illustrated in FIG. 89, the LED array 391 adopting the end surface light emission system can be manufactured. In addition, by adopting the end surface light emission system, the width of the LED array 391 can be reduced compared to that of the LED array 371 which adopts an upper surface light emission system illustrated in FIG. 82.

Figure 91:
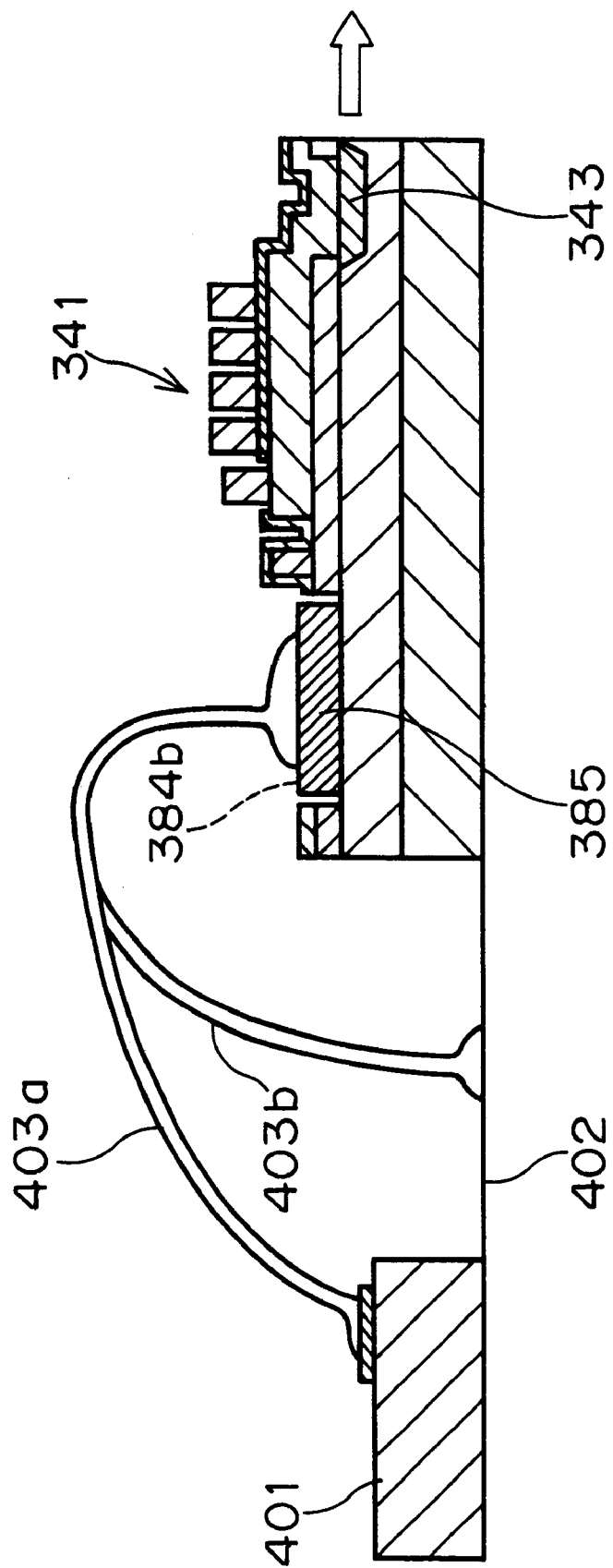
FIG. 91 is a cross section illustrating a structure through which the LED array in the fourteenth embodiment of the present invention is mounted at a printer head.

FIG. 91 is a cross section illustrating the structure achieved when the LED array 391 in the fourteenth embodiment of the present invention is mounted at a printer head. It is to be noted that in FIG. 91, the same reference numbers are assigned to components having essentially the same functions and structural features as those shown in FIG. 78. As illustrated in FIG. 91, the wires can be drawn out from one side of the end surface light emission type LED array 391, i.e., from the electrode side end surface 322. In addition, compared to a printer head employing the upper surface light emission type LED array 371 illustrated in FIG. 82, the head size of the printer head can be further reduced since the width of the LED array itself can be reduced.

Thus, in the fourteenth embodiment, by forming the n-side electrodes 385 and the p-side pad electrodes 384b in a single row on the side toward the electrode side end surface 322 and forming the light emitting portions (p-type semiconductor layers) 343 in close proximity to the light emitting portion side end surface 323, the LED array 391 adopting the end surface light emission system can be manufactured. In addition, by adopting the end surface light emission system, the width of the LED array itself can be further reduced compared to that in the thirteenth embodiment, thereby achieving a further production in the head size of the printer head.

Figure 90:
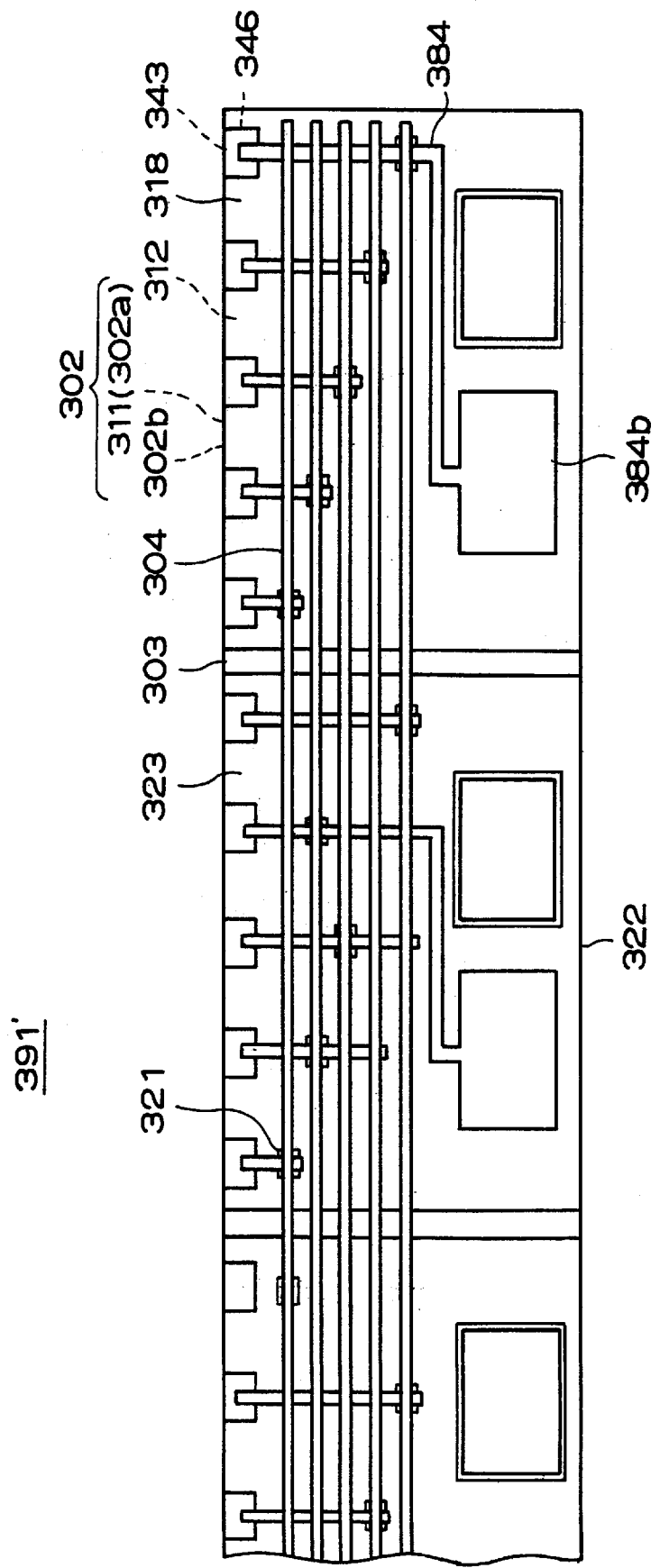
FIG. 90 illustrates another version of the fourteenth embodiment of the present invention illustrated in FIG. 89.

In the above embodiment, the structure of LED array 391 which has two p-side electrodes 384b in each n-type semiconductor block 311 is disclosed. The present invention, however, is not limited to such structure. The number of p-side electrodes is freely selected according to the design of the LED array. For, example, as illustrated in FIG. 90, the structure of LED array 391' which has single p-side electrode 384b in each n-type semiconductor block 311 is properly applied to the present invention.

While the invention has been particularly shown and described with respect to preferred embodiments of the LED array and the LED printer head by referring to the attached drawings, the present invention is not limited to these examples and it will be understood by those skilled in the art that various changes in form and detail may be made therein without departing from the spirit, scope and teaching of the invention.

It is to be noted that while a homogeneous junction structure constituted of a single crystal material is adopted for the pn junction structure in the LED arrays in all the embodiments of the present invention, it is obvious that the present invention may be adopted in a hetero junction structure constituted by linking different materials.

The present invention permits other constructions. For example, in FIGS. 3, 18, 26, 33, 47, 49, 57, 58, 59, 61, 76, 79, 82, 89, two p-side pad electrodes are provided in each n-type semiconductor block, respectively and each p-side pad electrode is electrically connected to a corresponding p-side common wiring. Therefore, in case that each p-side common wiring is common one in each n-type semiconductor block in a LED array, the number of the p-side pad electrode corresponds to at least the number of p-side common wiring. In the above examples illustrated in the FIGS. 3, 18, 26, 33, 47, 49, 57, 58, 59, 61, 76, 79, 82, 89, it is possible that a LED array includes blocks which include one p-side pad electrode or blocks which include none p-side electrode.

Further, in FIGS. 4, 19, 27, 34, 48, 50, 62, 77, 80, 83, 90, one p-side pad electrode is provided in each n-type semiconductor block, respectively and each p-side pad electrode is electrically connected to a corresponding p-side common wiring. Therefore, in case that each p-side common wiring is common one in each n-type semiconductor block in a LED array, the number of the p-side pad electrode corresponds to at least the number of p-side common wiring. In the above examples illustrated in the FIGS. 4, 19, 27, 34, 48, 50, 62, 77, 80, 83, 90, it is possible that a LED array includes blocks which include none p-side electrode.

Figure 92:
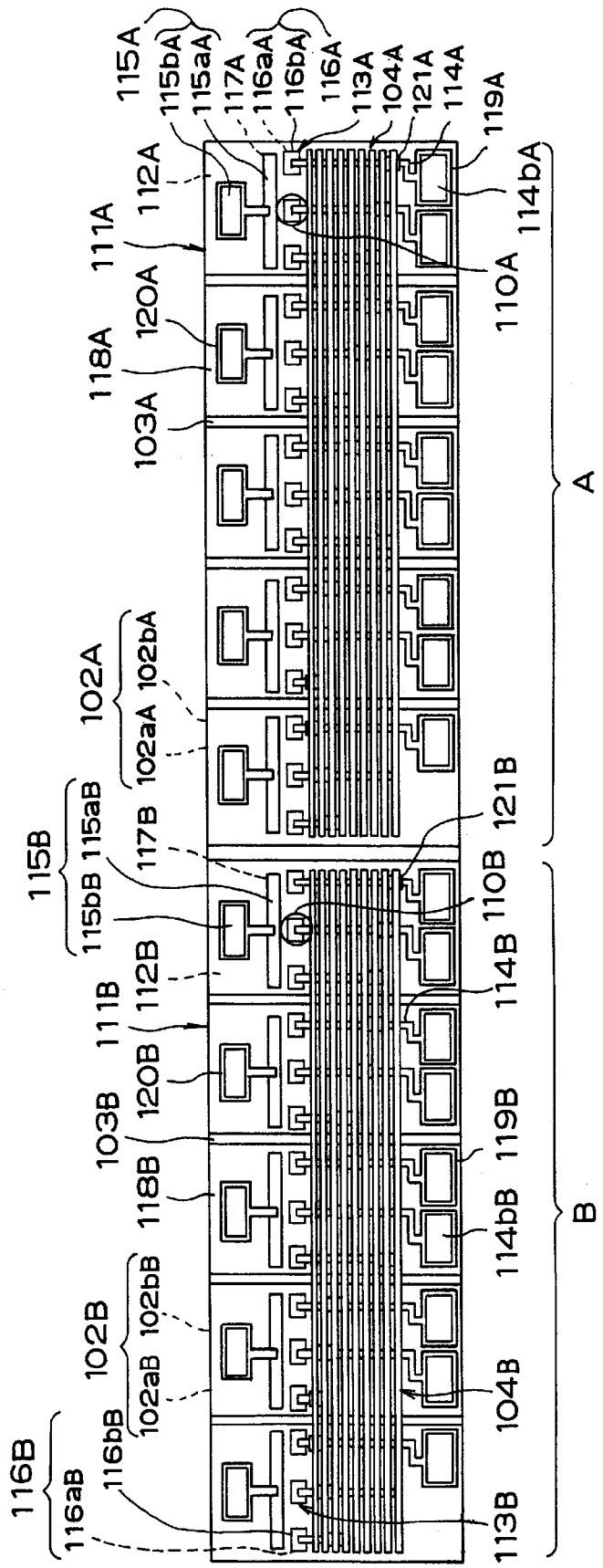
FIG. 92 illustrates a LED array constructed by two large blocks.
Figure 93:
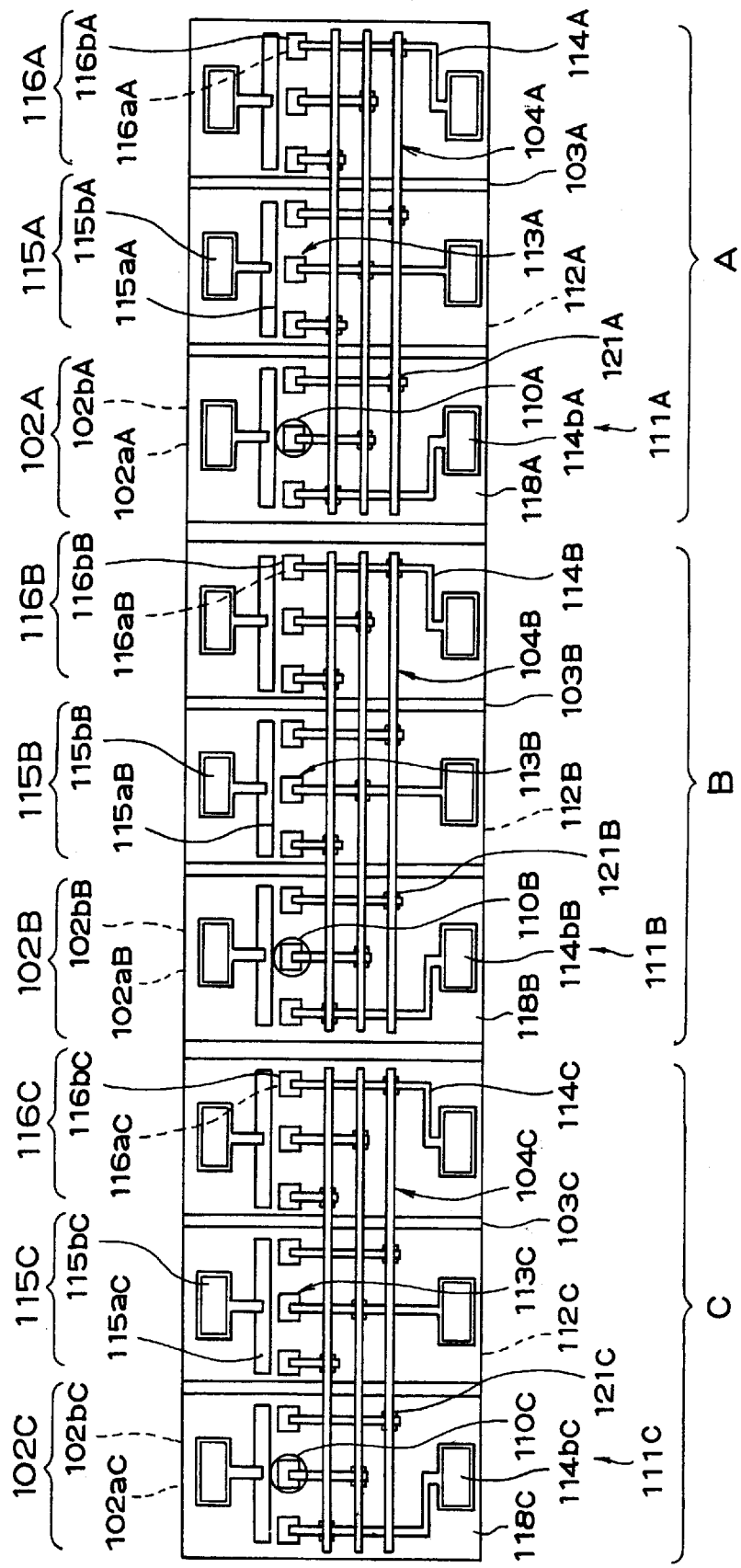
FIG. 93 illustrates a LED array constructed by three large blocks.

And further, it is to be noted that in FIG. 92, and FIG. 93, the same reference numbers with the symbols of each block are assigned to components having essentially the same functions and structural features to preclude the necessity for repeated explanation thereof. In FIG. 92, a LED array is constructed by two large blocks (A, B), each large block is provided with four n-type semiconductor blocks including two p-side pad electrodes and one n-type semiconductor block including one p-side pad electrode. Further, in FIG. 93, a LED array is constructed by three large blocks (A, B, C,), each large block is provided with three n-type semiconductor blocks including one p-side pad electrode, respectively. In the above-mentioned embodiments, it is to be noted that separate common wirings are provided in each large block, respectively.

It is to be noted that in FIG. 92, a LED array is constructed by two large blocks and in FIG. 93, a LED array is constructed by three large blocks, however, the number of the large blocks of a LED array is arbitrary selected in accordance with the requirement of the design.

The entire disclosure of Japanese Patent Applications No. 9-138067 filed on May 28, 1997, No. 9-156715 filed on Jun. 13, 1997 and No. 9-138061 filed on May 28, 1997 including specifications, claims, drawings and summaries are incorporated herein by reference in its entirety.

What is claimed is:

1. An LED array comprising:

a first conductive-type semiconductor substrate;

a second conductive-type semiconductor layer formed at a surface of said semiconductor substrate;

a first conduction-side contact electrode formed on the surface of said semiconductor substrate where said semiconductor layer is formed, and connected to said semiconductor substrate; and a second conduction-side electrode formed on said surface of said semiconductor substrate where said first conduction-side contact electrode is formed, connected with said semiconductor layer, and constituted by one and the same conductive film material as that constituting said first conduction-side contact electrode.

2. An LED array according to claim 1, wherein:

said first conduction-side electrode is set on a side where said second conduction-side electrode is present, relative to a row of light emitting portions.

3. An LED array according to claim 1, wherein:

said conductive film is an Au alloy film.

4. An LED array according to claim 3, wherein:

said Au alloy film is an alloy film or laminated film containing Au, Ti and Pt, or an alloy film or laminated film containing Au, Ge and Ni.

5. An LED array comprising:

a first conductive-type semiconductor substrate;

a second conductive-type semiconductor layer formed at a surface of said semiconductor substrate;

a first conduction-side contact electrode formed on the surface of said semiconductor substrate where said semiconductor layer is formed, and connected to said semiconductor substrate; and a first conduction-side electrode, constituted of a first conduction-side pad electrode which is connected to said first conduction-side contact electrode, and that has a single-layer structure with the pad electrode achieved by forming said first conduction-side contact electrode and said first conduction-side pad electrode from a single conductive film.

6. An LED array according to claim 5, wherein:

a second conduction-side electrode connected to said semiconductor layer is formed on said surface of said semiconductor substrate where said semiconductor layer is formed; and said first conduction-side electrode and said second conduction-side electrode are constituted of one and the same conductive film material.

7. An LED array according to claim 6, wherein:

said first conduction-side electrode is set on a side where said second conduction-side electrode is present, relative to a row of light emitting portions.

8. An LED array according to claim 5, wherein:

said conductive film is an Au alloy film.

9. An LED array according to claim 8, wherein:

said Au alloy film is an alloy film or laminated film containing Au, Ti and Pt, or an alloy film or laminated film containing Au, Ge and Ni.

10. An LED array comprising:

a first conductive-type semiconductor substrate;

a second conductive-type semiconductor layer formed at a surface of said semiconductor substrate;

a first conduction-side pad electrode formed and bonded on a surface of said semiconductor substrate for connection with an external circuit; and a first conduction-side electrode formed on said surface of said semiconductor substrate where said semiconductor layer is formed, and connected with said first conductive-type semiconductor substrate.

11. An LED array according to claim 10, wherein:

the entirety of said first conduction-side electrode is formed bonded with said surface of said semiconductor substrate.

12. An LED array according to claim 11, wherein:

a layer insulating film having an n-side opening portion is formed at said surface of said semiconductor substrate; and said first conduction-side electrode is formed within said n-side opening portion.

13. An LED array according to claim 12, wherein:

a planar shape of said n-side opening portion is a polygon whose interior angles are all less than 180°, a circle or an oval.

14. An LED array according to claim 10, wherein:

said first conduction-side electrode has a single-layer structure.

15. An LED array according to claim 14, wherein:

a planar shape of said first conduction-side electrode is a polygon whose interior angles are all less than 180°, a circle or an oval.

16. An LED array according to claim 14, wherein:

a plurality of second conduction-side electrodes individually connected with said semiconductor layer are formed on said surface of said semiconductor substrate; and said first conduction-side electrode and said second conduction-side electrodes are constituted of one and the same conductive film material.

17. An LED array according to claim 16, wherein:

said first conduction-side electrode is set on a side where said second conduction-side electrodes are present, relative to a row of light emitting portions.

18. An LED array according to claim 16, wherein:

said conductive film is a Au alloy film.

19. An LED array according to claim 10, wherein:

said first conduction-side pad electrode is provided in close proximity to an area where said second conductive semiconductor layer is formed.

20. An LED array comprising:

a first conductive-type semiconductor substrate;

N (N is an integer equal to or greater than 2) light emitting portions constituted of second conductive-type semiconductor layers formed in a single row at a surface of said first conductive-type semiconductor substrate;

a first conduction-side electrode, to constitute a pad electrode for connecting said semiconductor substrate with an external circuit, formed on said surface of said semiconductor substrate;

N second conduction-side electrodes individually connected with said light emitting portions, formed on said surface of said semiconductor substrate; and at least one second conduction-side pad electrode for connecting one of said N second conduction-side electrodes with an external circuit, wherein:

said first conduction-side electrode is formed, relative to said row of light emitting portions, on a side of said light emitting portions where said second conduction-side pad electrode is present and is connected with said semiconductor substrate on said side where said second conduction-side pad electrode is present.

21. An LED array according to claim 20, wherein:

a plurality of semiconductor blocks that are each constituted of said first conductive-type semiconductor substrate where said light emitting portions, said first conduction-side electrode and said second conduction-side electrodes are formed and are electrically isolated from one another are provided in a single row; and common wirings for connecting between specific second conduction-side electrodes formed in different semiconductor blocks are formed.

22. An LED array according to claim 20, wherein:

an insulating film layer having a first conduction-side opening portion is formed on said surface of said semiconductor substrate; and said first conduction-side electrode is formed within said first conduction-side opening portion.

23. An LED array according to claim 20, wherein:

said first conduction-side electrode is formed on a side opposite from said second conduction-side pad electrode relative to said row of said light emitting portions.

24. An LED array according to claim 20, wherein:

a plurality of electrodes including said first conduction-side electrode and said second conduction-side pad electrodes are provided in a single row.

25. An LED array according to claim 24, wherein:

said first conduction-side electrodes and said second conduction-side pad electrodes are provided alternately.

26. An LED array according to claim 20, wherein:

only one first conduction-side electrode is formed.

27. An LED array according to claim 20, wherein:

said light emitting portions are formed in close proximity to an end surface of said semiconductor substrate and emitted light is radiated to the outside from said end surface.

28. An LED array according to claim 20, wherein:

said first conduction-side electrode and said second conduction-side electrode are constituted of one and the same conductive film material.

29. An LED array according to claim 20, wherein:

said first conductive-type is n-type and said second conductive-type is p-type.

30. An LED printer head comprising:

(a) an LED array provided with
   (a-1) a first conductive-type semiconductor substrate;
   (a-2) N (N is an integer equal to or greater than 2) light emitting portions constituted of second conductive-type semiconductor layers formed in a single row at a surface of said semiconductor substrate;
   (a-3) a first conduction-side electrode, to constitute a pad electrode connecting said semiconductor substrate with an external circuit, formed on said surface of said semiconductor substrate;
   (a-4) N second conduction-side electrodes, individually connected with said light emitting portions, formed on said surface of said semiconductor substrate; and
   (a-5) at least one second conduction-side pad electrode for connecting one of said N second conduction-side electrodes with an external circuit, with:
   (a-6) said first conduction-side electrode formed on a where said second conduction-side pad electrode is present, relative to said row of said light emitting portions, and said first conduction-side electrode connected with said semiconductor substrate on said side where said second conduction-side pad electrode is present;

(b) a drive circuit for driving said LED array;

(c) a first wire bonded to said first conduction-side electrode and drawn out from one side of said LED array to be bonded with said drive circuit; and (d) a second wire bonded to said second conduction-side pad electrode and drawn out from one side of said LED array to be bonded with said drive circuit.

31. An LED printer head according to claim 30, wherein:

a plurality of semiconductor blocks that are each constituted of said first conductive-type semiconductor substrate where said light emitting portions, said first conduction-side electrode and said second conduction-side electrodes are formed and are electrically isolated from one another are provided in a single row; and common wirings for connecting between specific second conduction-side electrodes formed in different semiconductor blocks are formed.

* * * * *

UNITED STATES PATENT AND TRADEMARK OFFICE
CERTIFICATE OF CORRECTION

PATENT NO. : 6,388,696 B1
DATED : May 14, 2002
INVENTOR(S) : Masumi Taninaka et al.

It is certified that error appears in the above-identified patent and that said Letters Patent is hereby corrected as shown below:

<u>Title page,</u>
Item [73], Assignee, delete "Oki Electric Industry Co., Ltd." and insert
-- Oki Data Corporation --.

Signed and Sealed this

Twenty-seventh Day of May, 2003

JAMES E. ROGAN
*Director of the United States Patent and Trademark Office*